United States Patent
Chaves et al.

(10) Patent No.: US 7,380,962 B2
(45) Date of Patent: *Jun. 3, 2008

(54) OPTICAL MANIFOLD FOR LIGHT-EMITTING DIODES

(75) Inventors: Julio C. Chaves, Santa Ana, CA (US);
Waqidi Falicoff, Newport Beach, CA (US); Juan C. Minano, Madrid (ES); Pablo Benitez, Madrid (ES); William A. Parkyn, Jr., Lomita, CA (US); Roberto Alvarez, Glendale, CA (US); Oliver Dross, Madrid (ES)

(73) Assignee: Light Prescriptions Innovators, LLC, Altadena, CA (US)

( * ) Notice: Subject to any disclaimer, the term of this patent is extended or adjusted under 35 U.S.C. 154(b) by 199 days.

This patent is subject to a terminal disclaimer.

(21) Appl. No.: 11/329,294

(22) Filed: Jan. 11, 2006

(65) Prior Publication Data

US 2006/0239006 A1   Oct. 26, 2006

Related U.S. Application Data

(63) Continuation-in-part of application No. 11/115,055, filed on Apr. 25, 2005, now Pat. No. 7,286,296.

(60) Provisional application No. 60/658,713, filed on Mar. 3, 2005, provisional application No. 60/614,565, filed on Sep. 29, 2004, provisional application No. 60/612,558, filed on Sep. 22, 2004, provisional application No. 60/564,847, filed on Apr. 23, 2004.

(51) Int. Cl.
*F21V 9/00* (2006.01)

(52) U.S. Cl. .................. 362/293; 362/84; 362/230; 362/268; 362/346

(58) Field of Classification Search ................ 362/293, 362/84, 268, 346, 230, 231; 359/722
See application file for complete search history.

(56) References Cited

U.S. PATENT DOCUMENTS

| | | | |
|---|---|---|---|
| 5,813,753 | A | 9/1998 | Vriens et al. ............... 362/293 |
| 6,350,041 | B1 * | 2/2002 | Tarsa et al. ................. 362/231 |
| 7,080,932 | B2 | 7/2006 | Keuper ....................... 362/613 |
| 7,144,131 | B2 | 12/2006 | Rains ......................... 362/231 |
| 2004/0145308 | A1 | 7/2004 | Rossner et al. ............. 313/512 |
| 2004/0174696 | A1 * | 9/2004 | Buelow et al. ............... 362/84 |
| 2005/0269582 | A1 | 12/2005 | Mueller et al. ............... 257/94 |
| 2006/0002101 | A1 | 1/2006 | Wheatley et al. ............. 362/84 |

* cited by examiner

*Primary Examiner*—Y My Quach Lee
*Assistant Examiner*—Leah S Lovell
(74) *Attorney, Agent, or Firm*—Drinker Biddle & Reath LLP

(57) ABSTRACT

An optical manifold for efficiently combining a plurality of blue LED outputs to illuminate a phosphor for a single, substantially homogeneous output, in a small, cost-effective package. Embodiments are disclosed that use a single or multiple LEDs and a remote phosphor, and an intermediate wavelength-selective filter arranged so that backscattered photoluminescence is recycled to boost the luminance and flux of the output aperture. A further aperture mask is used to boost phosphor luminance with only modest loss of luminosity. Alternative non-recycling embodiments provide blue and yellow light in collimated beams, either separately or combined into white.

63 Claims, 82 Drawing Sheets

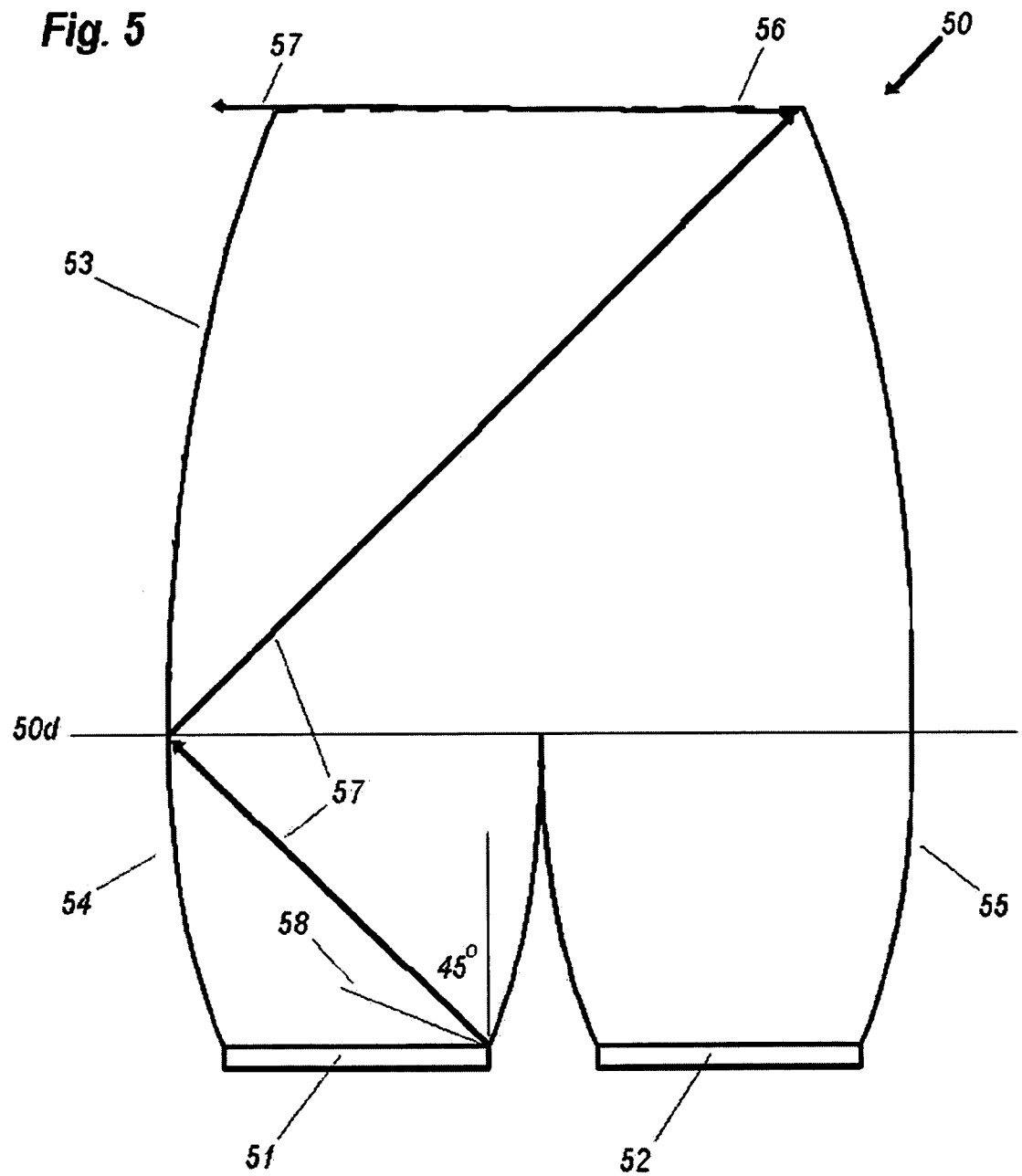

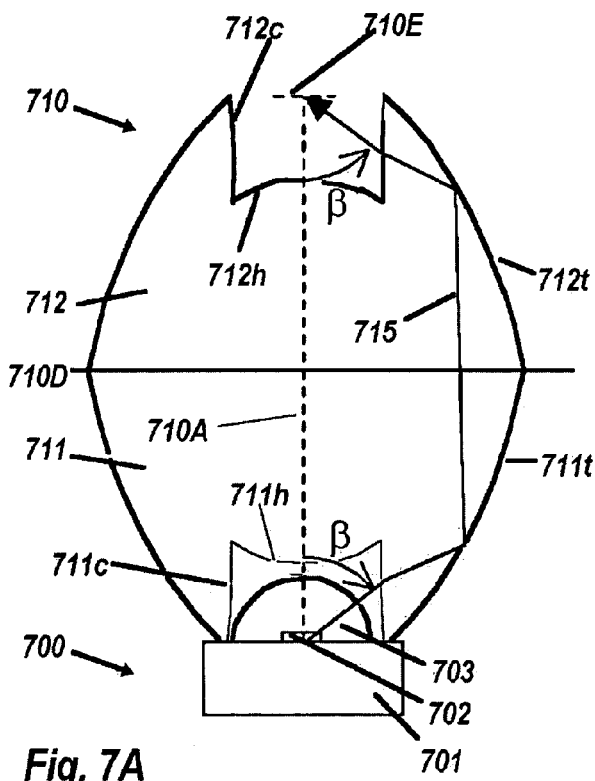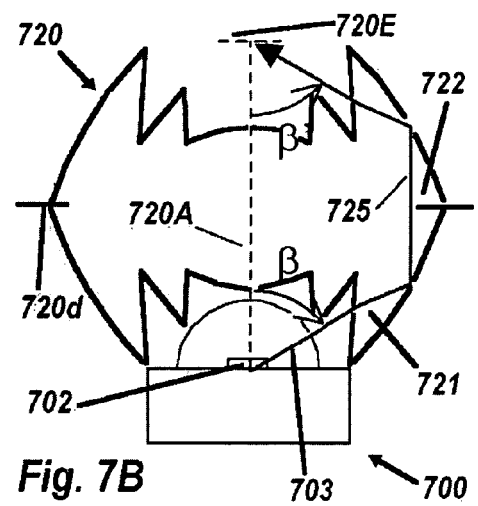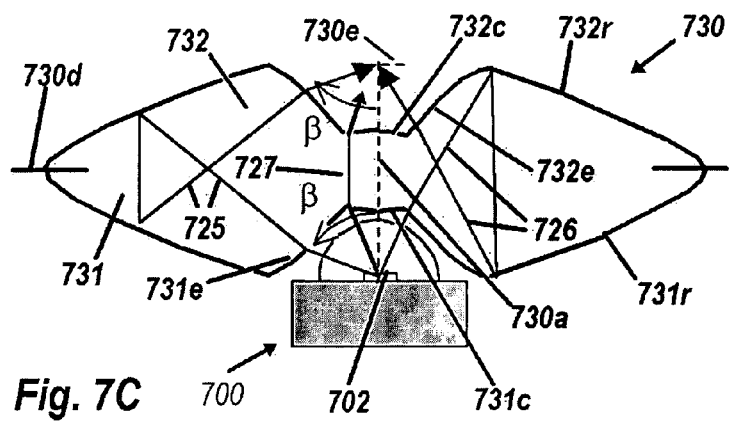

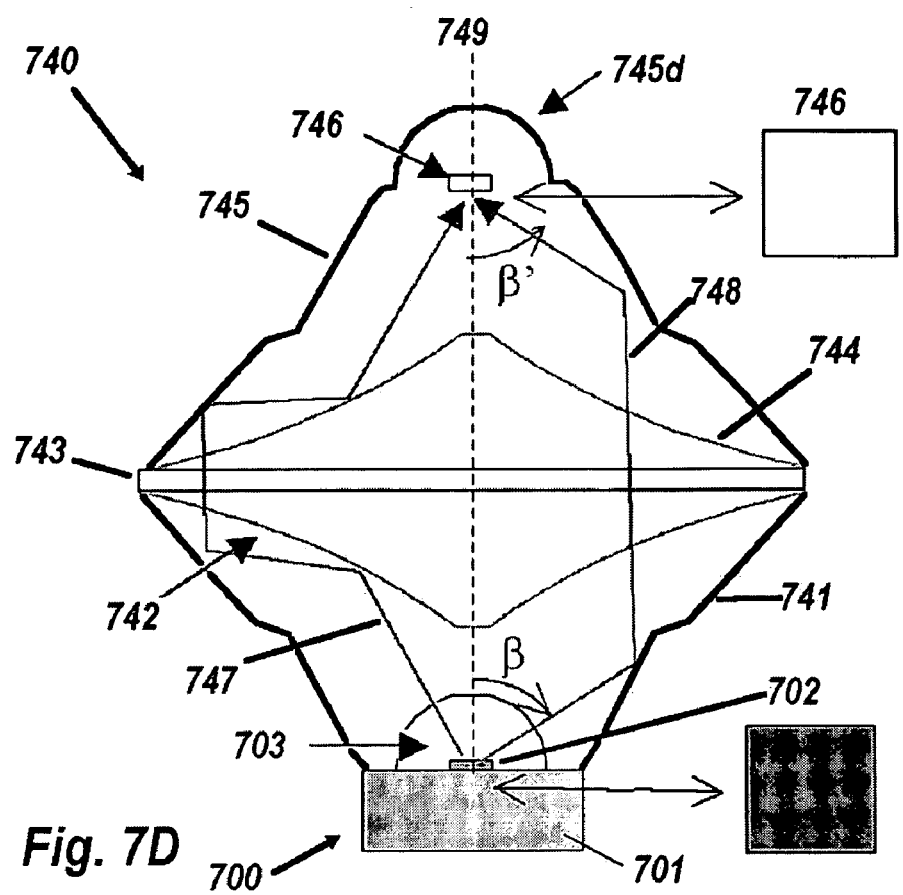
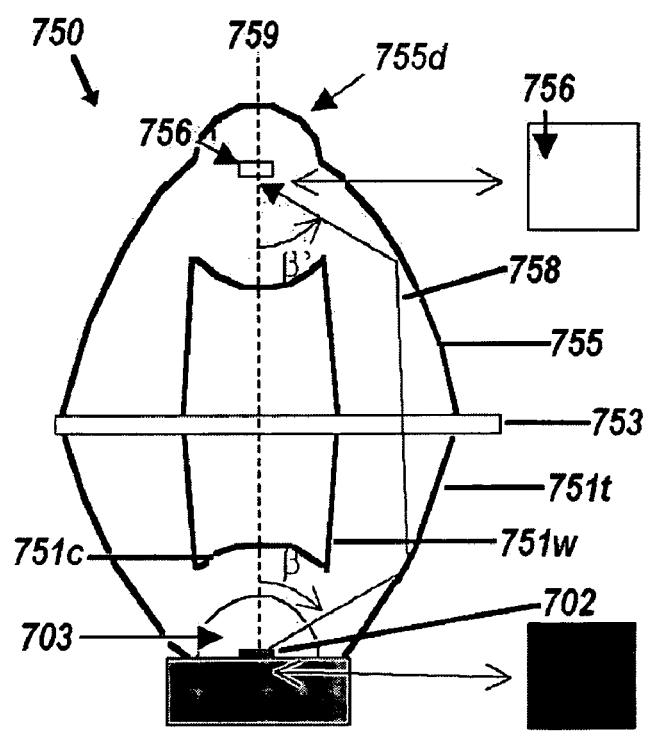
Fig. 7D
Fig. 7E

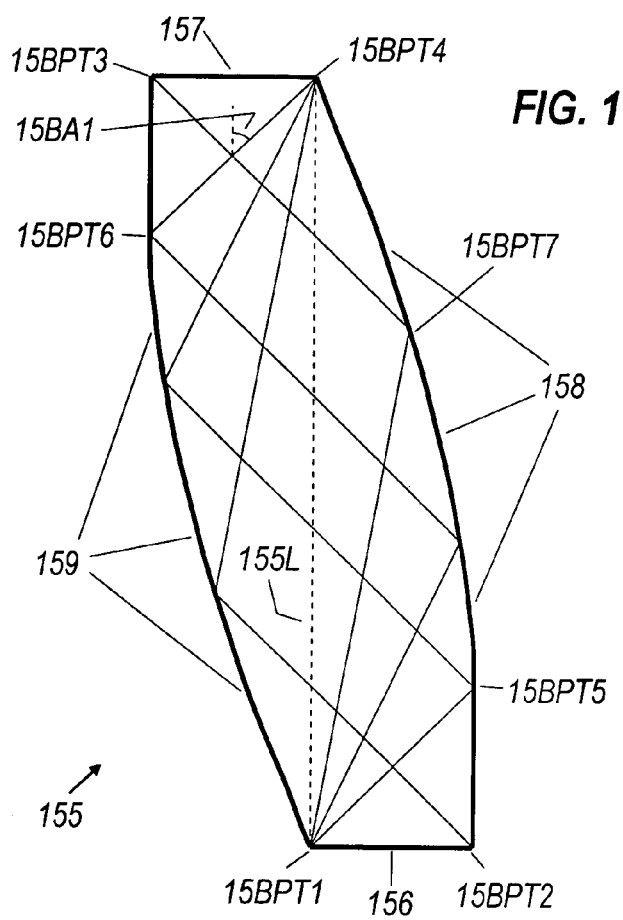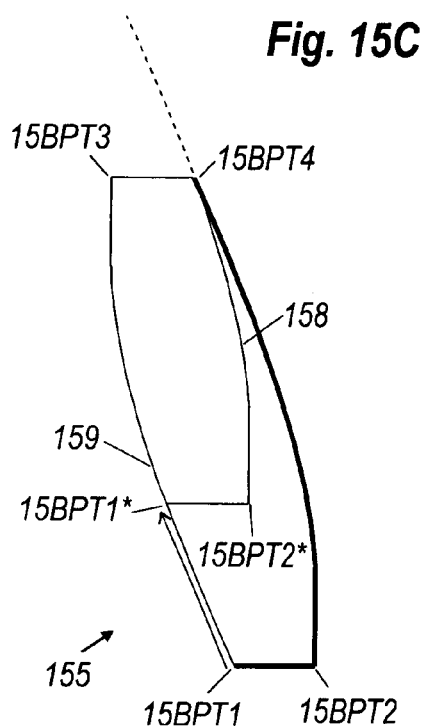
FIG. 15B
Fig. 15C

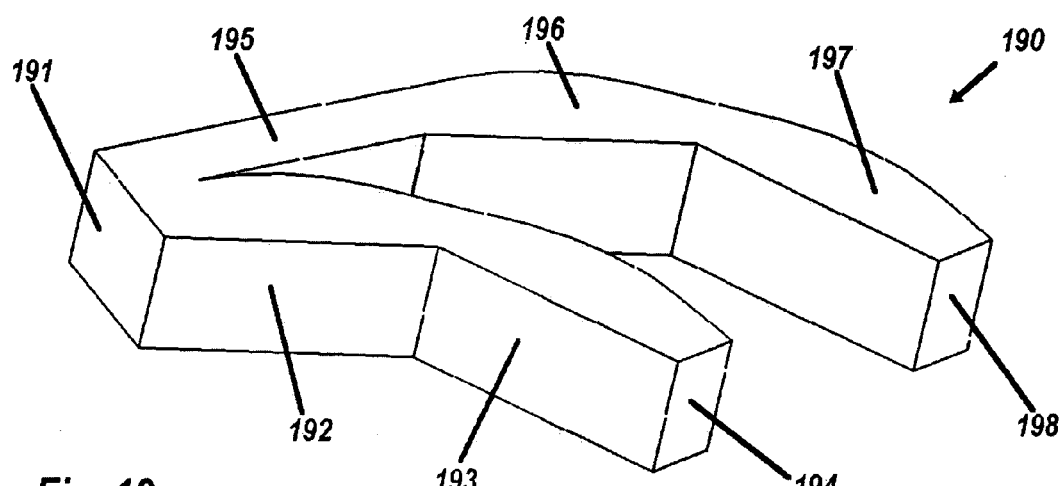
Fig. 19
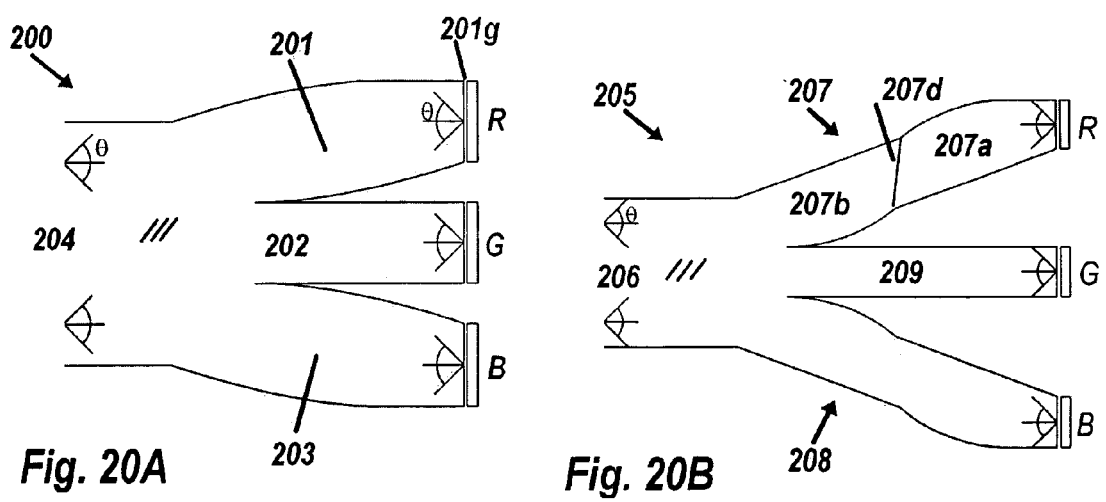
Fig. 20A
Fig. 20B

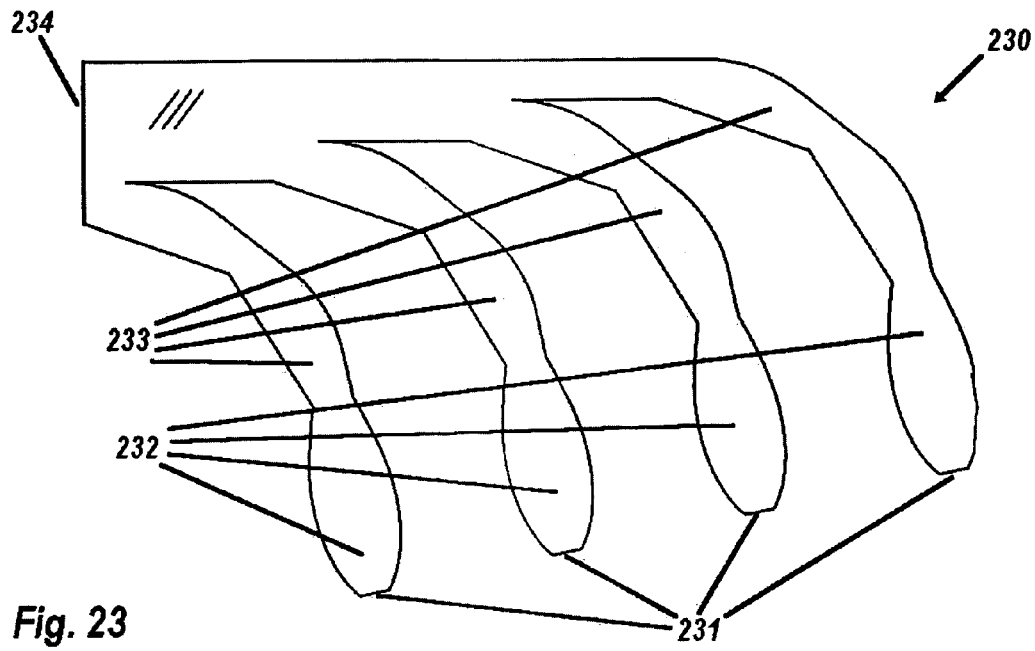
Fig. 23
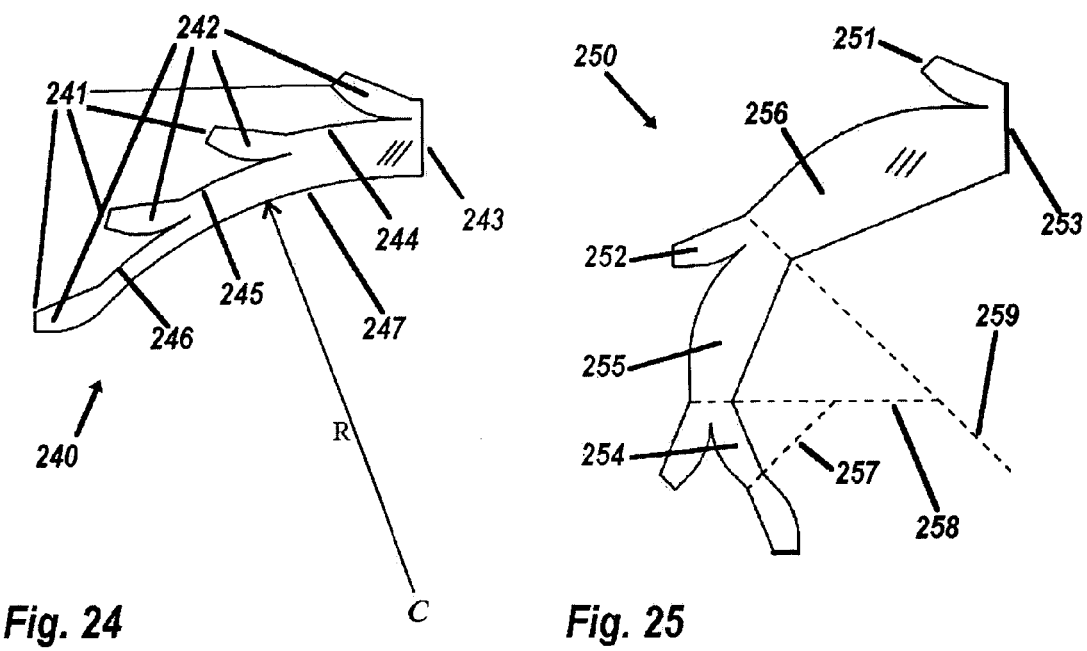
Fig. 24
Fig. 25

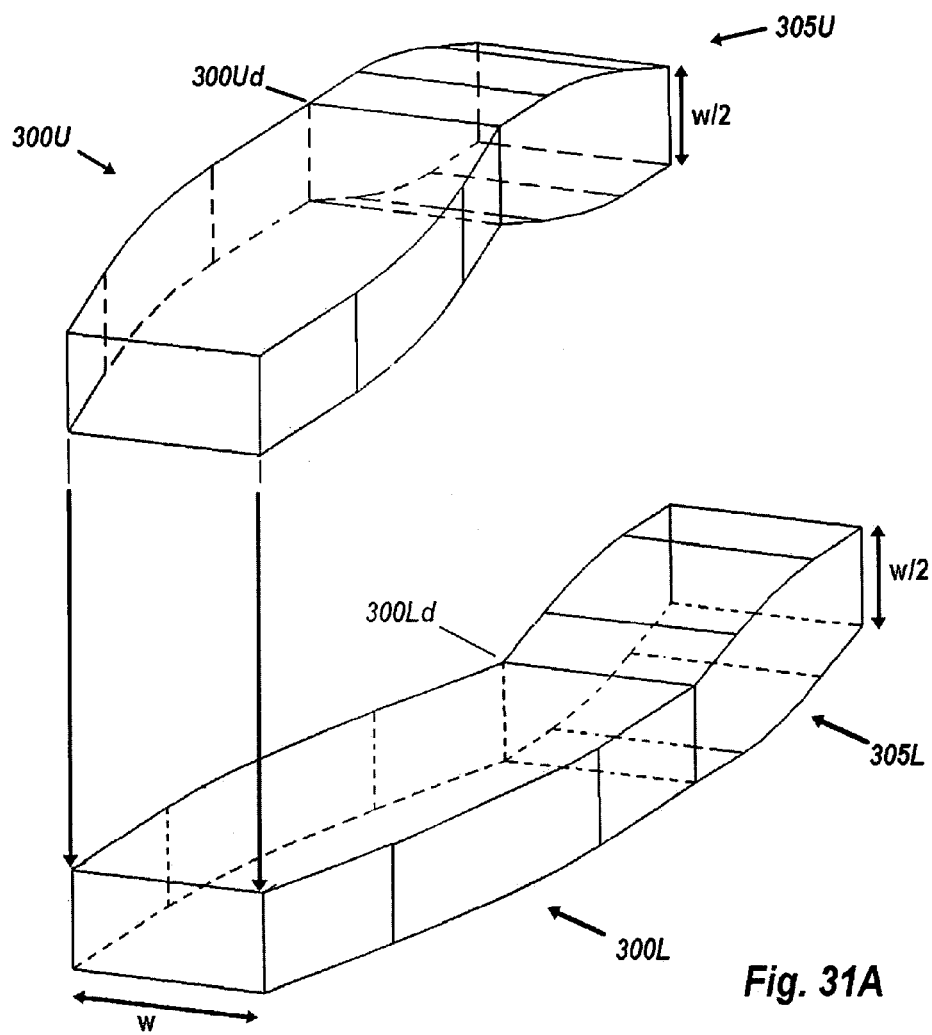
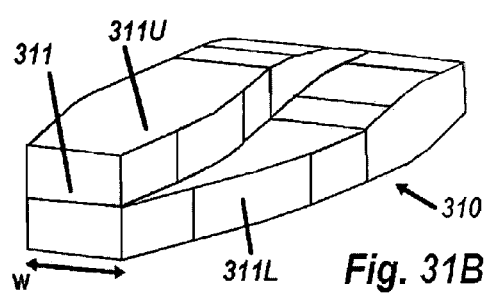 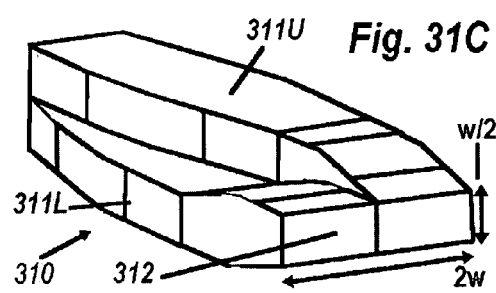
Fig. 31A
Fig. 31B
Fig. 31C

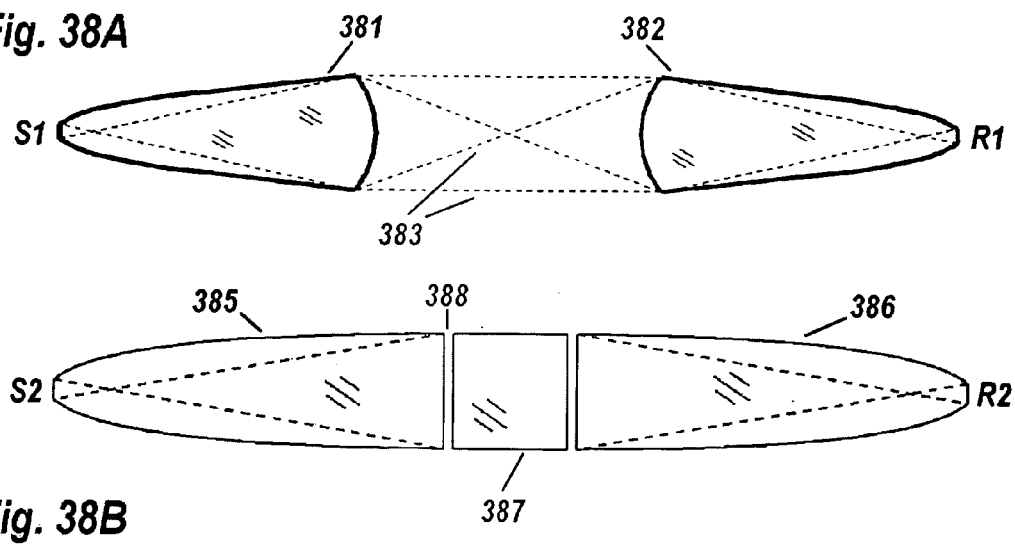
Fig. 38A
Fig. 38B
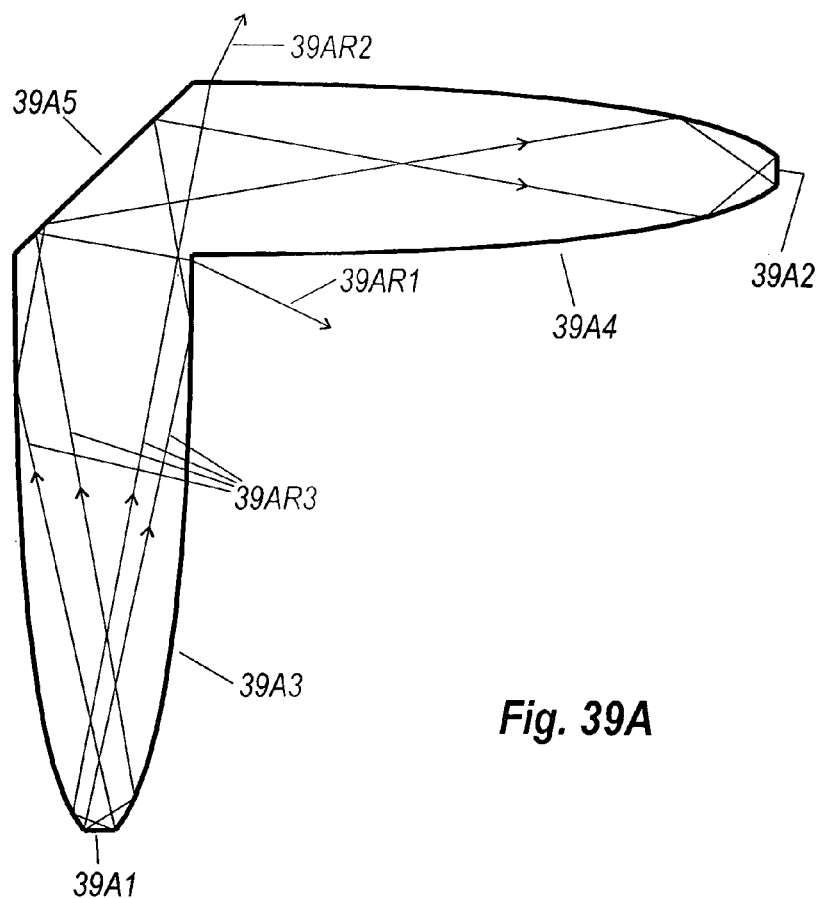
Fig. 39A

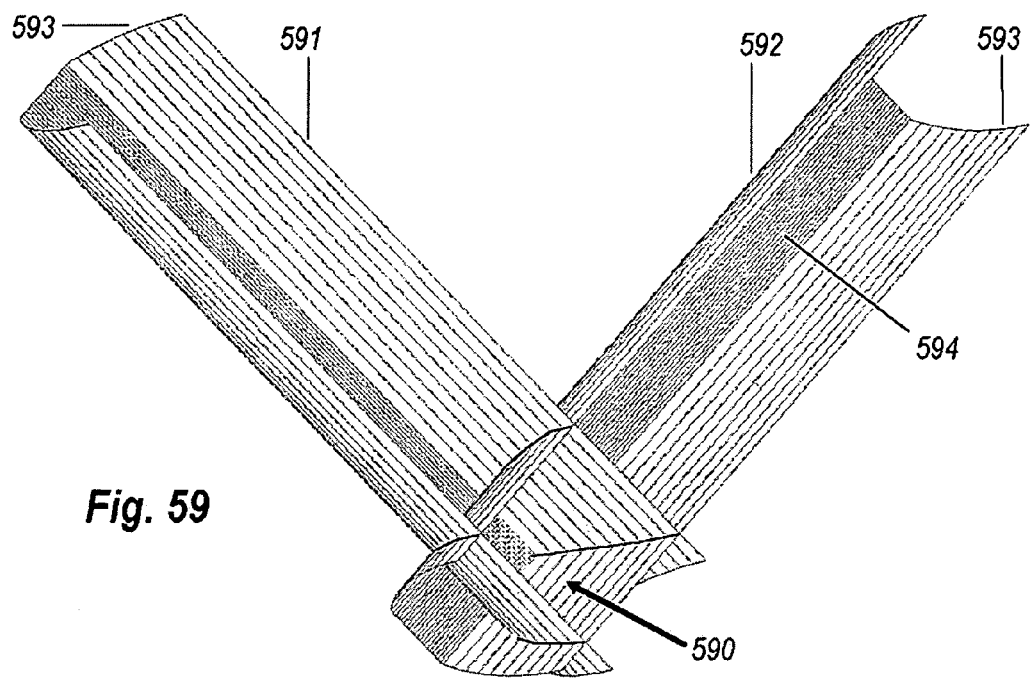
*Fig. 59*
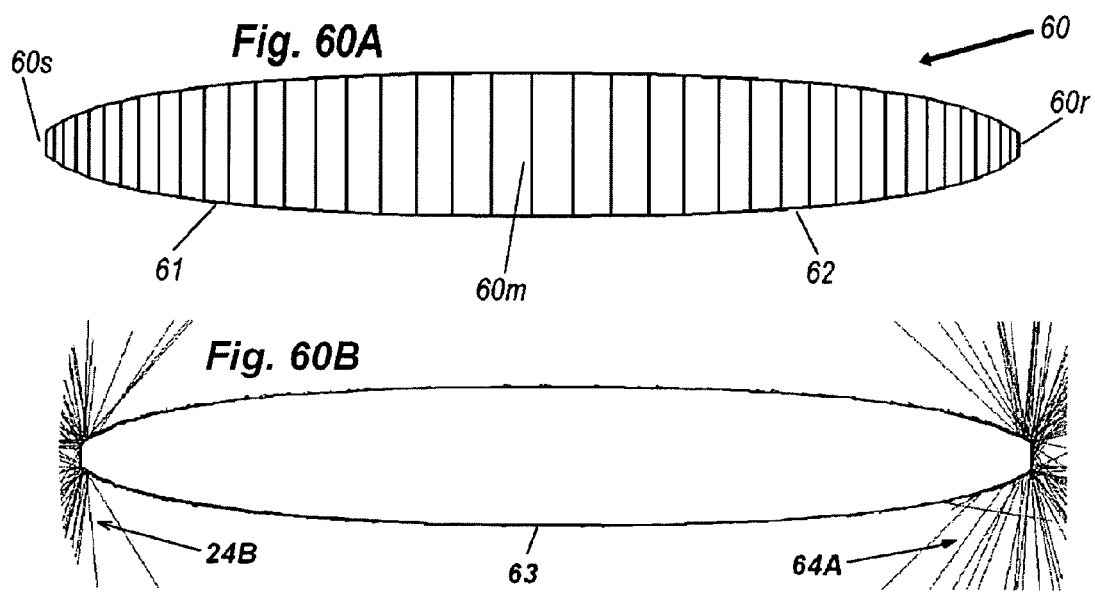
*Fig. 60A*
*Fig. 60B*

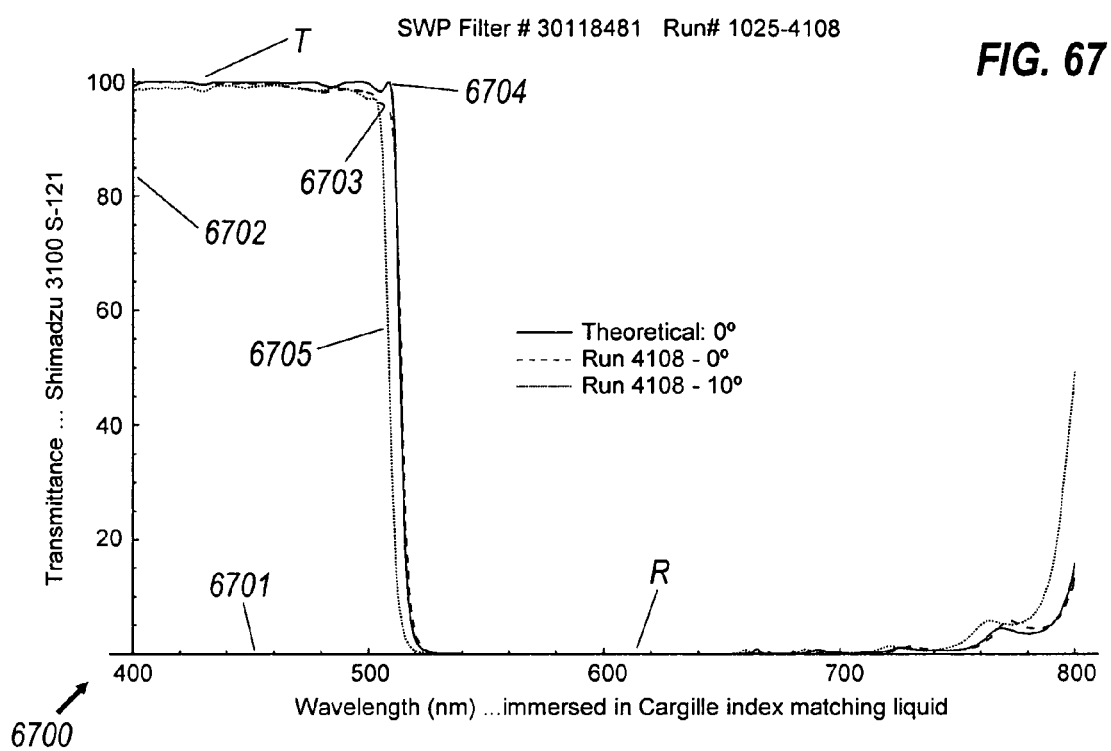

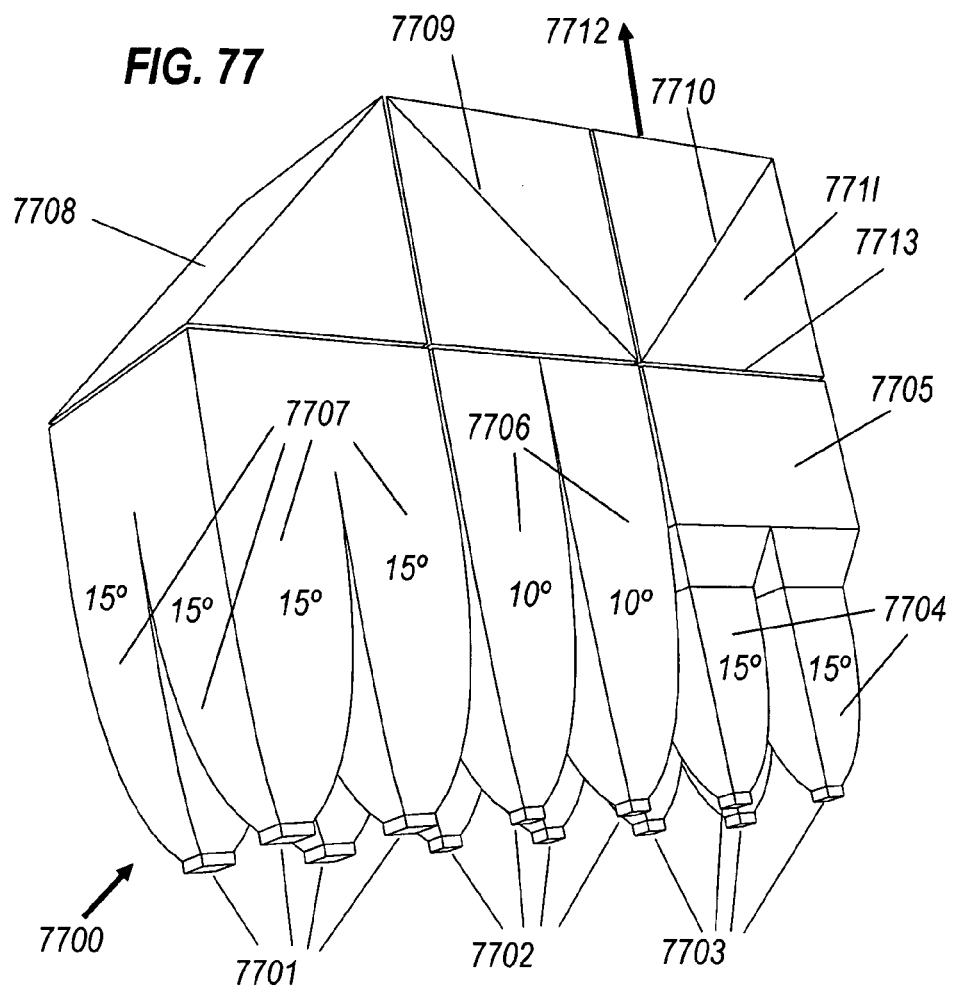
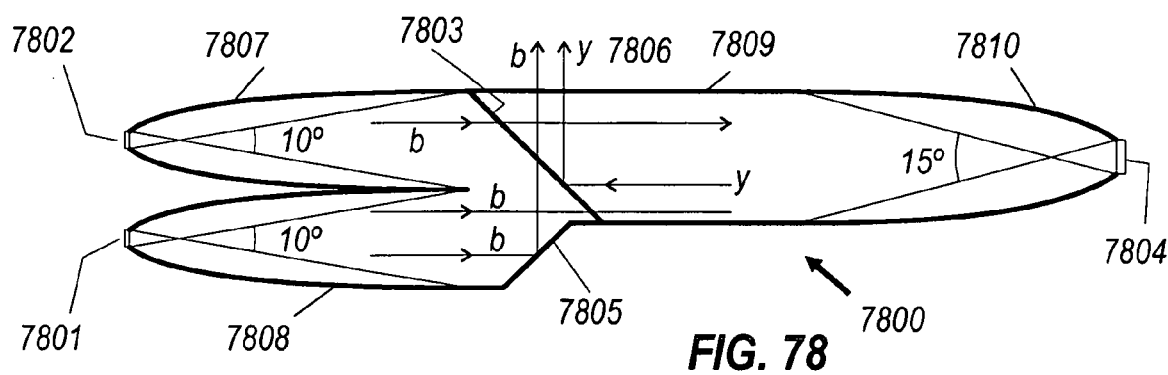

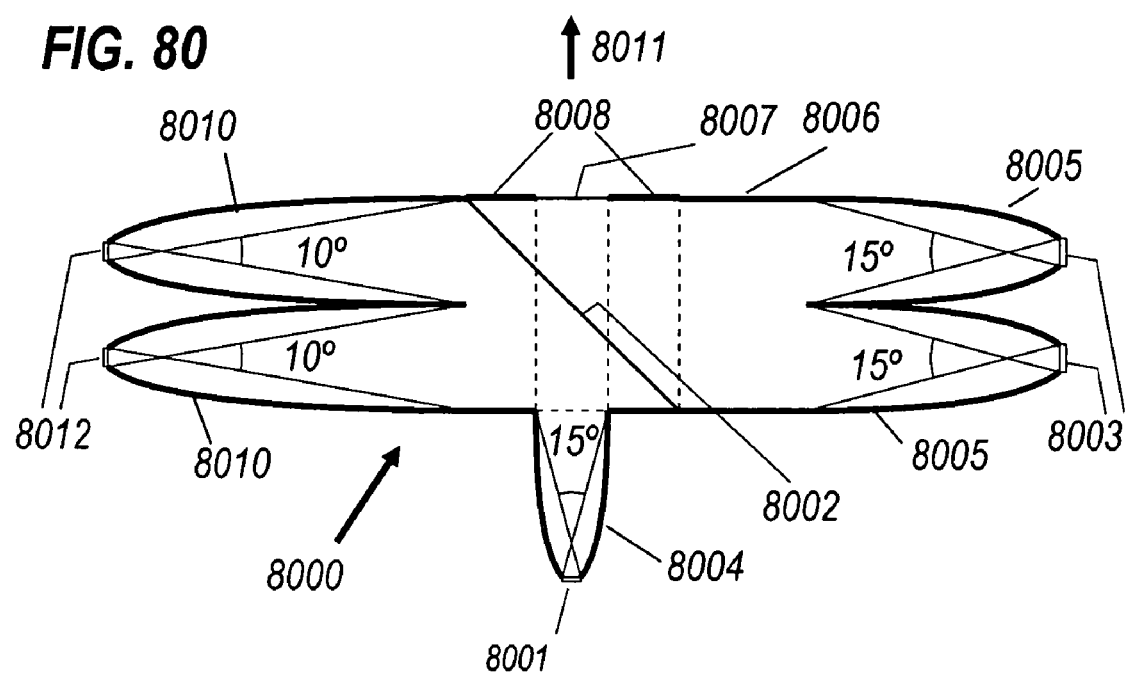

OPTICAL MANIFOLD FOR LIGHT-EMITTING DIODES

CROSS REFERENCE TO RELATED APPLICATIONS

This application is a continuation-in-part of U.S. patent application Ser. No. 11/115,055 for "OPTICAL MANIFOLD FOR LIGHT-EMITTING DIODES" of Chaves et al. filed Apr. 25, 2005, now U.S. Pat. No. 7,286,296, the disclosure of which is incorporated herein by reference in its entirety.

Application Ser. No. 11/115,055 claims the benefit of U.S. Provisional Patent Application No. 60/658,713, filed Mar. 3, 2005, entitled OPTICAL MANIFOLDS FOR LIGHT-EMITTING DIODES, which is incorporated by reference herein in its entirety.

Application Ser. No. 11/115,055 claims the benefit of U.S. Provisional Patent Application No. 60/614,565, filed Sep. 29, 2004, entitled OPTICAL MANIFOLS FOR LIGHT-EMITTING DIODES, which is incorporated by reference herein in its entirety.

Application Ser. No. 11/115,055 claims the benefit of U.S. Provisional Patent Application No. 60/612,558, filed Sep. 22, 2004, entitled OPTICAL MANIFOLDS FOR LIGHT-EMITTING DIODES, which is incorporated by reference herein in its entirety.

Application Ser. No. 11/115,055 claims the benefit of U.S. Provisional Patent Application No. 60/564,847, filed Apr. 23, 2004, entitled OPTICAL MANIFOLDS FOR LIGHT-EMITTING DIODES, which is incorporated by reference herein in its entirety.

STATEMENT REGARDING FEDERALLY FUNDED RESEARCH AND DEVELOPMENT

This invention was supported in part by the National Energy Technology Laboratory Award No. DE-FC26-05NT42341. The Government may have certain rights in this invention.

BACKGROUND OF THE INVENTION

1. Field of the Invention

The present invention relates generally to light-emitting diodes (LEDs), and more particularly to light collection/distribution systems that utilize one or more LEDs.

2. Description of Related Art

Light emitting diodes (LEDs) are a widely available, inexpensive, and efficient light source. For low light uses such as camping headlamps, one or two LEDs provide adequate light. However, to utilize LEDs for applications that require more light, such as automobile headlamps, it is necessary to combine the outputs of a plurality of LEDs. The LED prior art is less than satisfactory regarding the combination of the luminous outputs of a plurality of emitter-chips. Physical chip-adjacency can indeed produce a larger light source, but heat-removal limitations reduce the total luminance. Also, there is little continuity of illuminance between the adjacent emitters, leaving dark zones between the individual emitters. LEDs are available from a wide variety of suppliers, and in commercially available LEDs the emitters themselves have pronounced variations in luminance. For example, some suppliers (e.g., the OSRAM Corporation of San Jose, Calif. and the Cree Corporation of Santa Barbara, Calif.) manufacture high-power LEDs with wires and bonding pads that block light from the top of the emitting chip. In contrast, high-power LEDs from the Lumileds Corporation of San Jose, Calif. exemplify flip-chips, which have no wires or bonds that would otherwise block light emission in front. Even these, however, show great luminance variations across the emitter. The Luxeon I and Luxeon III LEDs by Lumileds, for example, can vary in luminance by a factor of ten from center to edge, with random patterns in between that differ from one chip to the next. Such undesirable patterning, whether on flip-chips or front-wired chips, can cause detrimental artifacts in the beams of collimating or condensing lenses. Although diffusers can be placed over such lenses, diffusers lose 15% of the light and give the beam a fuzzy edge. A more efficient method of source homogenizing, one that preserves sharp edges, would be a significant advance in illumination optics. Although thin-film LEDs have greatly improved uniformity over conventional on-substrate LEDs, there are fundamental reasons why they will always have nonuniform illuminance, because of inherently nonuniform current distribution downward through the active, light-generating layer. Using larger soldered electrodes causes more useless surface recombination at their juncture with the LED, so that electrodes must be kept small. In contrast, the optical transformer described herein places a premium on a corner location for the current-feed, amplifying the nonuniformity. Because the untreated sawed edges of the LED chip will cause surface recombination, current cannot be allowed to reach them, so that the LED cannot be illuminated all the way to its edge. It would be an advantage to provide an optical transformer that alleviates luminance inhomogeneities inherent to LEDs.

Beyond making a single source uniform, a better optical method is needed for combining the outputs of spatially separate LED chips, which are easier to cool than when closely packed. Such an optical source-combination device should optimally produce a uniform luminance with sharp edges. Besides easier thermal management, optical source-combination is needed that makes unnoticeable the individual variations or even failures of any of the LEDs.

The LED prior art is also less than satisfactory regarding the geometry of phosphor utilization in LEDs, such as for LEDs that generate white light. A phosphor coating of a quarter-millimeter (250 microns) or more directly onto a one-mm blue chip will necessarily increase source area, sometimes by a factor of four, and thus reduce luminance. The application of phosphor to such small chips necessarily results in color-temperature variations across each chip and between them as well. Also, much of the phosphor output backscatters; that is, it shines wastefully back into the chip, which is relatively absorptive. Finally, the phosphor must withstand the chip's high operating temperature, and differential thermal expansion poses adhesion problems, greatly reducing output if the phosphor should work loose. Although a thinner phosphor layer would have less problem with stress, as well as more luminance, only one manufacturer, Lumileds Corporation, for example, has the advanced phosphor deposition technology for the conformal 25-micron coating of their white LEDs, ten times thinner than the rest. (Laboratory samples from other companies have been exhibited but the processes have not been proven to be commercially viable at this time.) Even these devices vary in color-temperature, across their faces as well as from chip to chip.

It would be an advantage if the phosphor could be situated away from the LED; particularly, it would be an advantage if the phosphor layer in a LED device was positioned remotely enough to be unaffected by the temperature variations of the LED itself. Such a phosphor target could then be as small as the combined area of the separate LED chips, to maximize luminance. Conventional arrays of white LEDs suffer from variations in color temperature. In order to overcome this problem manufacturers employ expensive binning procedures. However, with the current state-of-the-art LEDs, there is still considerable variation in the color temperature, even using tight bins. Further, since an array of close-packed LEDs in practice has a spacing that is typically one or more chip widths between chips, simple application of phosphor over the entire array would result in a diluted, highly uneven luminance.

Achieving higher white luminance from an LED, with uniformity and color-consistency, is critical for LED market penetration into general lighting uses, where the lower power consumption and longer life of LEDs can greatly contribute to energy conservation. Larger and more efficient phosphor coatings can be utilized if they can be separate from their blue-light sources. Such an advance could particularly benefit automotive headlamps, where current white LEDs are marginal at best in luminance. In fact, color temperature variations across a beam could lead to excess blue light, which is ophthalmologically hazardous.

In some applications it is advantageous to produce a number of smaller size sources from a single larger source. This is useful for example when an optical design is difficult to mold because the optical component would be too thick and/or too large. If such a large single source is separated into a number of smaller size sources of the same total area, the same lens design can be used for each such source, just scaled down to a moldable size. It would also be desirable that these smaller sources are more uniform than the larger parent source, or that they have a prescribed luminance output.

In other applications it would be useful to change the shape of a single source or multiple sources to another shape, such as from a square to a rectangle of a substantially equal area or vice versa. This is useful for such applications as LED headlamps where it is desirable to generate rectangular sources with aspect ratios (length to width) of between two to one to six to one. Such a method must, of course, preserve source luminance as much as possible.

Finally, it is desirable to have a highly efficient means of producing white LED light sources without the use of phosphors, by combining two or more LEDs of a different wavelength into a single homogeneous source. Traditionally, the approach has been to use three different colored LEDs to make white light, commonly a red, a green, and a blue LED. However, the traditional optical approaches do not produce a rectangular or square uniform light source using such RGB light sources. It would be beneficial to have means of producing a light source combining more than three LED wavelengths. Additionally, it would be useful to have a means of producing such light sources where the chromaticity of the light source is adjustable.

SUMMARY OF THE INVENTION

Embodiments of optical manifolds are described herein that provide the ability to efficiently combine a plurality of LED outputs into a single output that is substantially homogeneous, in a small, cost-effective package that may be made of a dielectric material. Optical manifolds are described that can be used to combine multiple LEDs of the same color to provide a high flux and high intensity output beam, or can be used to generate a multi-wavelength beam. For example, a red, green, and blue LED can be combined to make a "white" output. Embodiments are also disclosed that use a single LED or multiple LEDs and a remote phosphor coating arranged so that backscattered photoluminescence is recycled to the output. The optical manifolds use principles of nonimaging optics, and are designed to substantially alleviate luminance variations on the emitting surfaces of LEDs, and provide a substantially uniform light source. In addition, these optical manifolds can be used to produce a variety of non-square shaped light sources using square-shaped LEDs, including rectangular and asymmetric high flux light sources. These high-flux sources are useful for many applications such as for solid state lighting automobile headlamps. For example, for this application it is desirable to have a uniform rectangular LED-based light source with length to width ratio of 4 to 1. This is achievable with the optical manifold described herein. Solid-state lighting in general, and light-emitting diodes in particular, will find new applications through the benefits of the optical transformer described herein. To provide, for example a white LED, an optical system is disclosed for delivering the light of one or more blue chips to a spatially separate phosphor. Such a phosphor target could then be as small as the combined area of the separate chips, to maximize luminance. The phosphor layer is positioned remotely enough to be unaffected by the temperature variations of the LED itself.

The optical transformer described herein relates generally to utilizing the principles of non-imaging optics to fulfill the above-discussed illumination-engineering needs, via the origination of a new type of optical manifold. The edge-ray principle of non-imaging optics sets forth the surfaces of minimal increase of source etendue, a central quantity of non-imaging optics. Etendue is the product of source area $A_S$ and the projected solid angle of the source's output, multiplied by the square of the refractive index n of the optical medium surrounding the source:

$$E = n^2 A_s \sin^2 \theta$$

where θ is the off-normal angle of the solid conical angle which is equivalent to the source's radiation pattern. A diffuse Lambertian emission into 2π steradians is represented by θ=90°. This diffuse output is characteristic of the emission from an LED chip itself.

An ideal optical system conserves etendue, so that the enlarged output area of an ideal collimator leads to its usefully high intensity within a narrow beam angle, while the small size of the focal spot of a solar concentrator leads to the usefully multiplied flux from its wide beam angle.

The optical transformer described herein offers a new kind of optical manifold that provides etendue-limited illumination for collimated backlights, etendue-limited combination of plurality of light sources, and etendue-limited phosphor utilization. The useful fulfillment of these important tasks by the optical transformer described herein marks a new stage of LED evolution. For example, other photoluminescent materials besides phosphors, such as the photoluminescent semiconductor AlInGaP, can be used with the optical transformer described herein more easily than they can be used directly on LEDs.

Some embodiments disclosed herein utilize total internal reflection only, and thus do not need metallic reflector coatings to be applied to their surfaces. Further embodiments comprise injection-molded sub-sections that are assembled into a complete manifold for producing a large "virtual chip" from the emission of several LED chips of smaller size. The virtual chip has better uniformity of luminance and color than the actual chips, and can be configured with usefully restricted angular output. Also, controlled non-uniformity can be engineered along with such angular restrictions, enabling an intensity prescription to be met by placing the focal plane of a projection lens on the manifold output.

The reversibility of light paths dictates that the embodiments disclosed herein could equally well be used to disperse a large source by transforming it into several smaller ones, as with a single LED illuminating numerous instruments on an automotive dashboard. With the optical transformer described herein it would be easy to have a backup LED that also fed the optical manifold for the dashboard.

BRIEF DESCRIPTION OF THE DRAWINGS

For a more complete understanding of this invention, reference is now made to the following detailed description of the embodiments as illustrated in the accompanying drawing, wherein:

FIG. 5 is a cross-section of a reflective optical manifold reflector for two LEDs, each one having a CPC that feeds into a single, larger rectangular CPC, which provides the output;

FIG. 7A is a side view of an etendue-limited flux-transfer from a domed LED into an image in air;

FIG. 7B is a side view of an alternative etendue-limited flux-transfer from a domed LED into an image in air;

FIG. 7C is a side view of an alternative etendue-limited flux-transfer from a domed LED into an image in air;

FIG. 7D is a side view of a dual collimating lens with dichroic filter, also including a phosphor-coated surface;

FIG. 7E is a side view of another dual collimating lens with dichroic filter, also including a phosphor-coated surface;

FIG. 15B is a cross-section of a full-width source shifter;

FIG. 15C shows how the geometry of a light shifter can be changed to allow for different lateral shifts of light.

FIG. 19 is a perspective view of a square 1:2 optical manifold with the profile similar to FIG. 17;

FIG. 20A is a cross-section of a 3:1 optical manifold with different input colors;

FIG. 20B is another embodiment of the 3:1 optical manifold of FIG. 20A, with more spacing between the LEDs;

FIG. 23 is a cross-section of an alternative embodiment of a 4:1 optical manifold, but with angular compressors for immersed inputs;

FIG. 24 is a cross-section of an optical manifold arranged in an approximately circular arc;

FIG. 25 is a cross-section of an optical manifold on an arc of decreasing radius;

FIG. 31A is an exploded, perspective view of another embodiment of an optical manifold that defines a monolithic etendue-squeezer;

FIG. 31B is a perspective view of the resulting monolithic etendue-squeezer shown in exploded view in FIG. 31A;

FIG. 31C is another perspective view of the monolithic etendue-squeezer shown in FIGS. 31A and 31B;

FIG. 38A is a cross-sectional view of a dielectric CPC illuminating another CPC;

FIG. 38B is a cross-sectional view of an alternate configuration of FIG. 38A;

FIG. 39A is a cross-sectional view of an alternative optical manifold that includes dielectric CPCs, illustrating the drawbacks of joining two CPCs at 90°;

FIG. 59 shows the construction of a crossed CPC.

FIG. 60A is a side view of a crossed-CPC remote phosphor system.

FIG. 60B shows rays escaping from same.

FIG. 61 is a direction-space diagram showing how corner rays are beyond the acceptance circle.

FIG. 62A is a diagram of energy flow mathematics.

FIG. 62B shows the wavelength composition of same.

FIG. 62C is the remote-phosphor performance curve.

FIG. 63A shows a 4:1 remote phosphor system with a round CPC.

FIG. 63B is another view of same.

FIG. 64A is a cross-section of a white-masked remote phosphor with increased luminance.

FIG. 64B is a perspective view of same.

FIG. 65A is a remote phosphor with separate blue and yellow outputs.

Figure 65A:
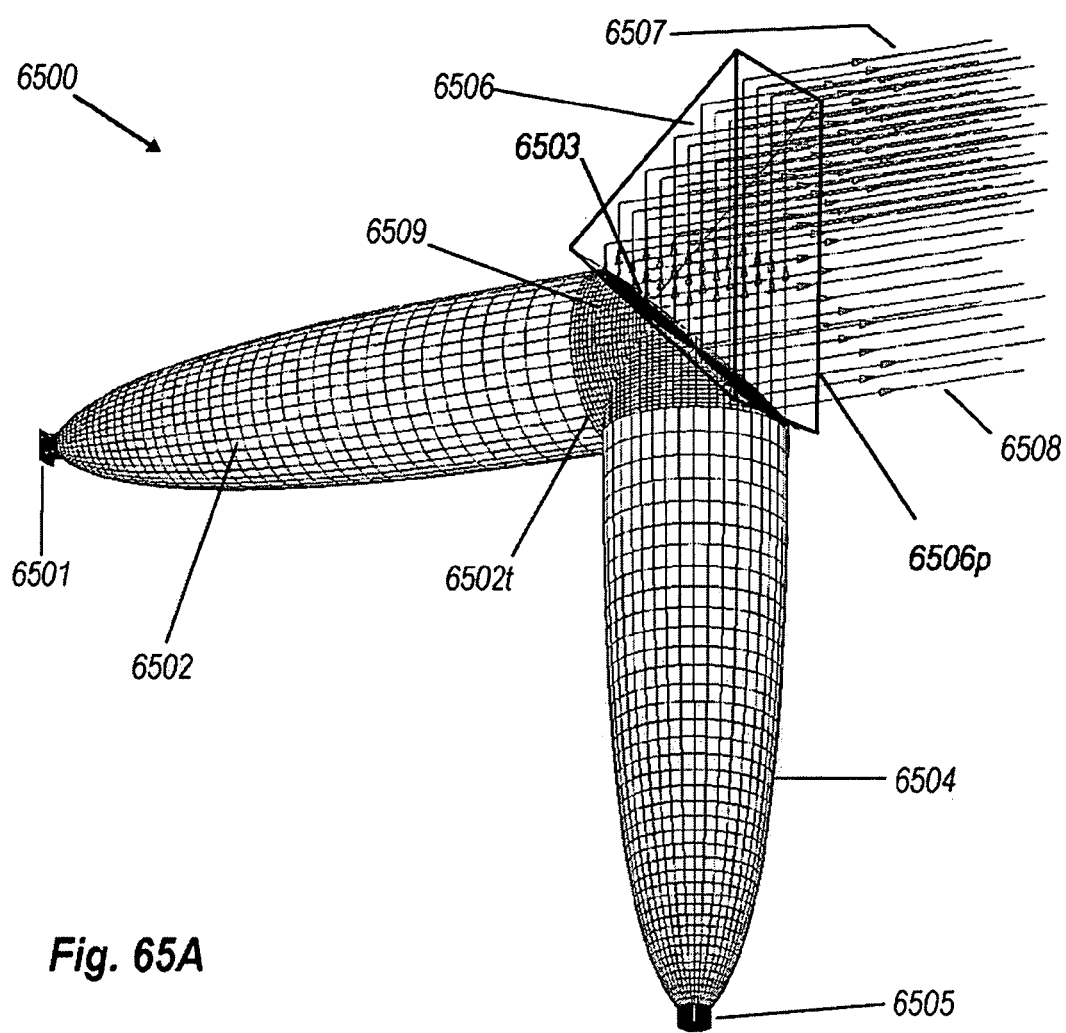
Figure 65B:
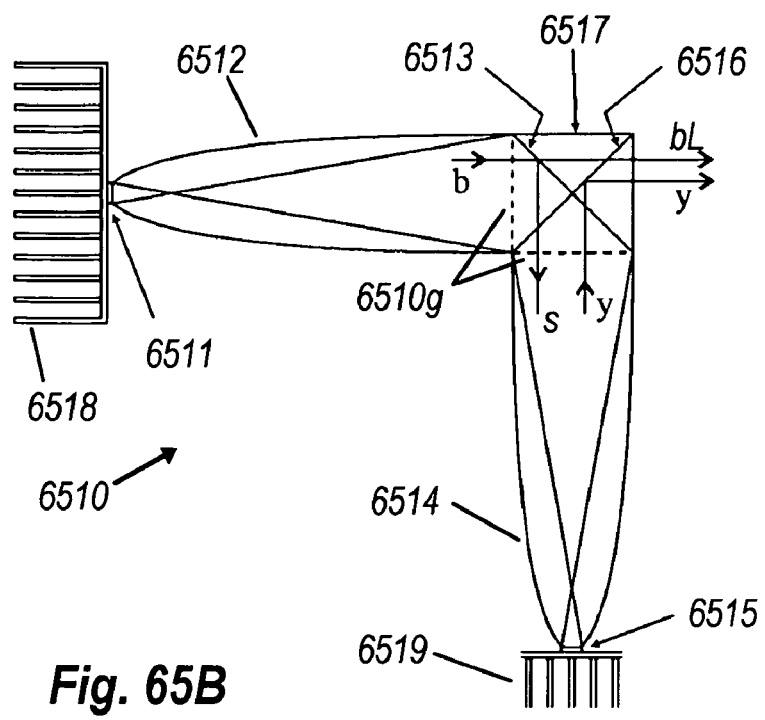

FIG. 65B is a variant of same with a white output.

Figure 65C:
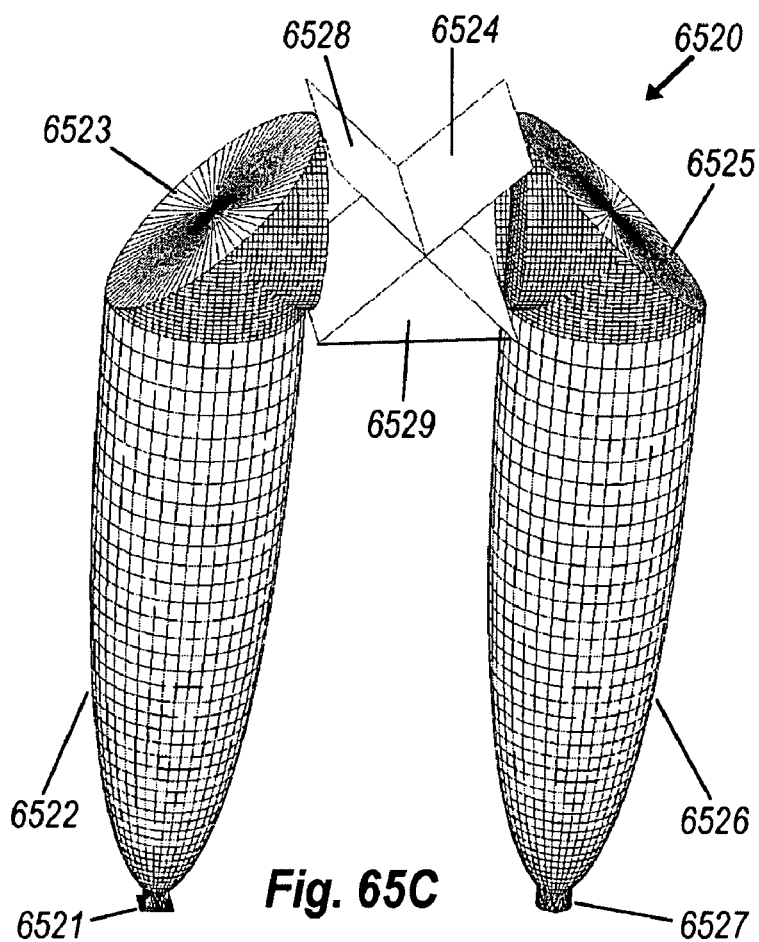

FIG. 65C is a variant of same with coplanar LED and phosphor.

Figure 65D:
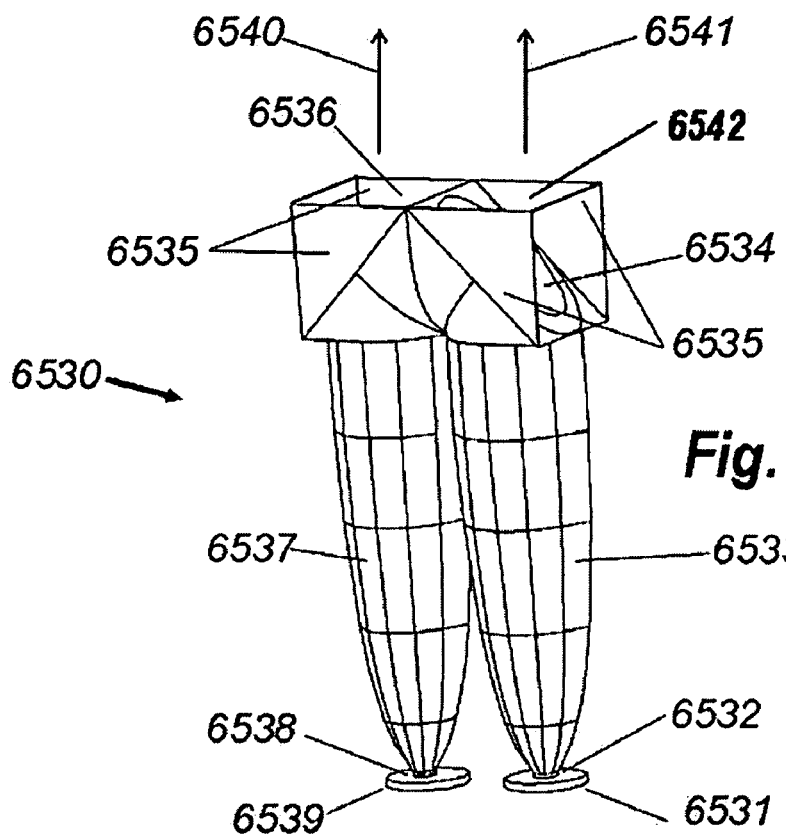

FIG. 65D is a variant of same with coplanar LED and phosphor with separate blue and yellow outputs.

Figure 65E:
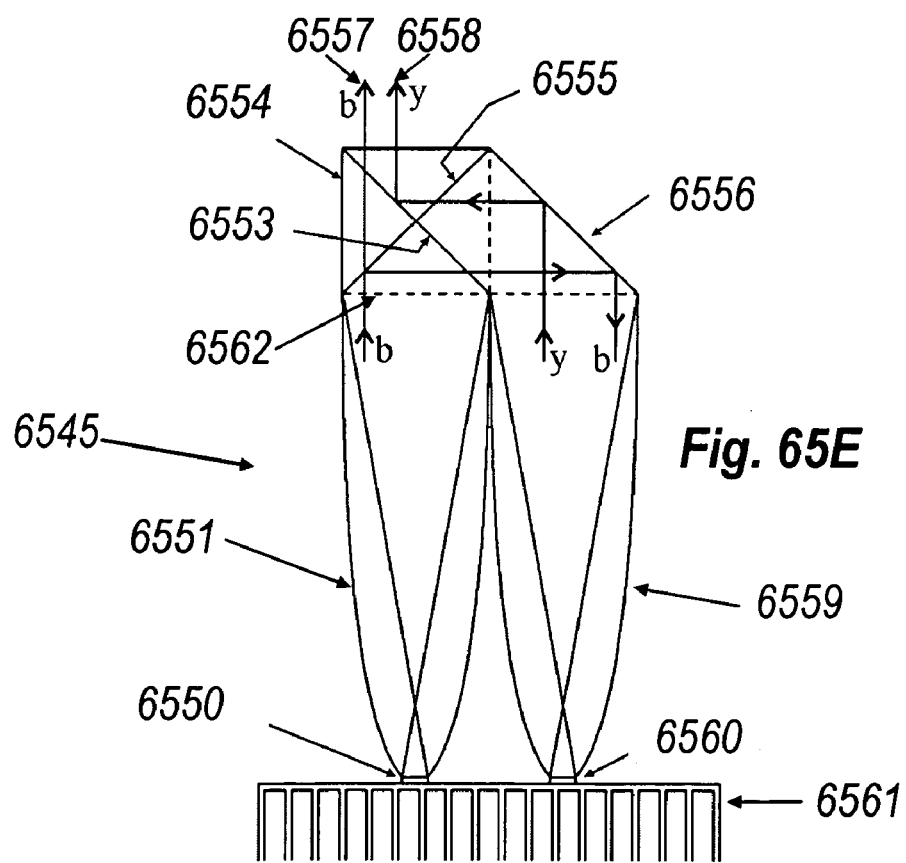

FIG. 65E is a variant of same with coplanar LED and phosphor patch with white output.

Figure 66A:
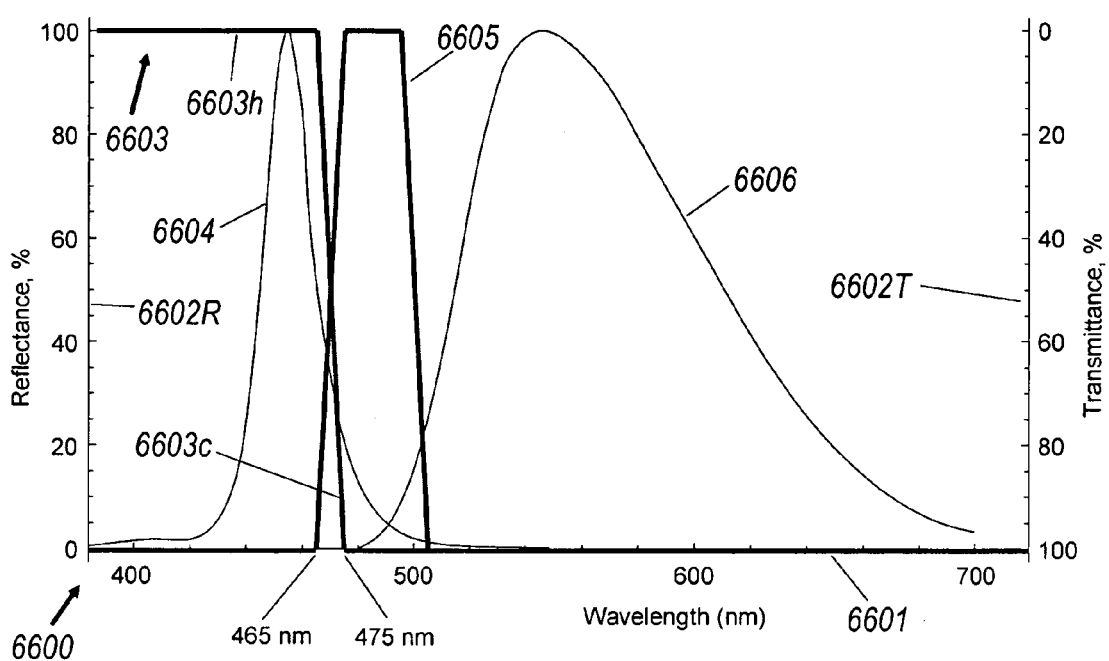

FIG. 66A shows the spectral filter characteristics of FIGS. 65A, B, & D.

Figure 66B:
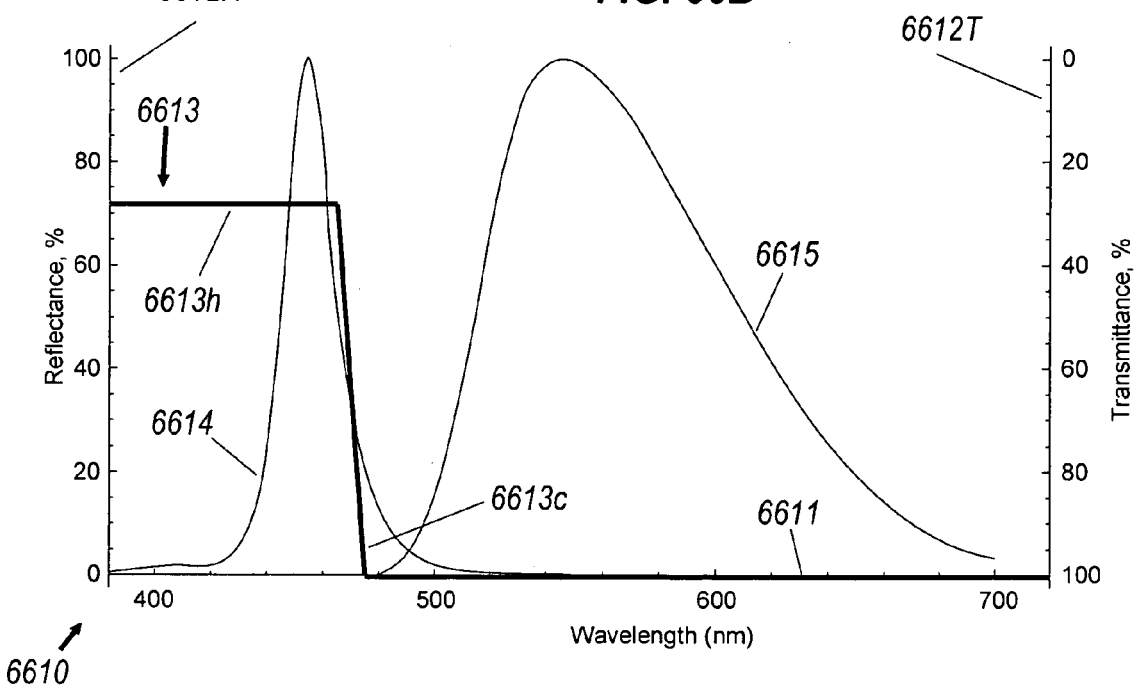

FIG. 66B shows alternative spectral filter characteristics for same.

Figure 66C:
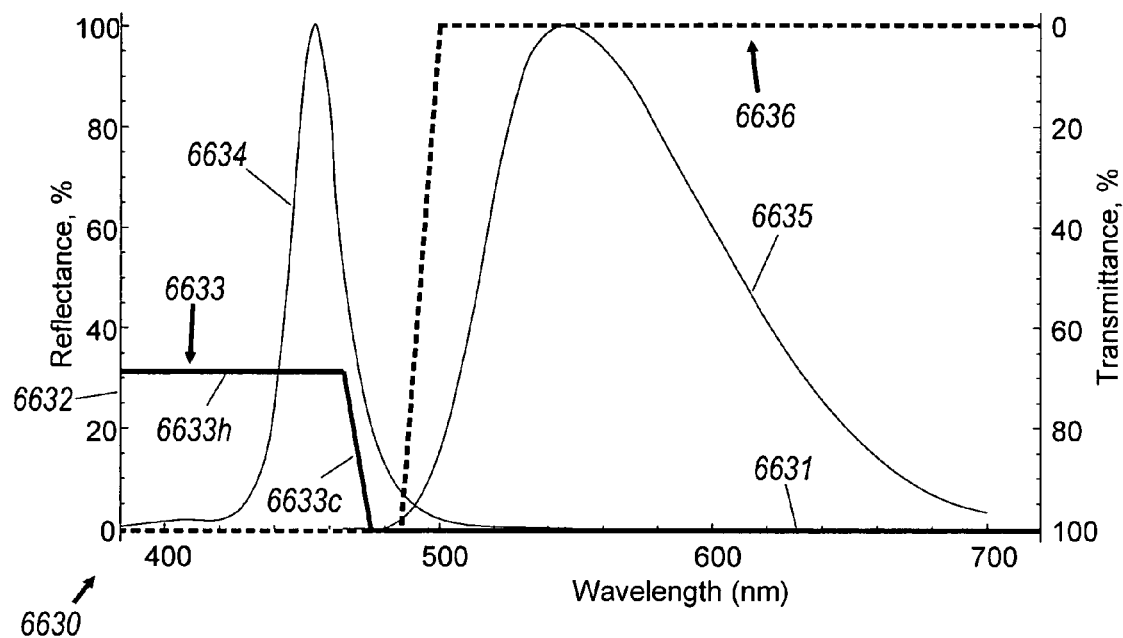

FIG. 66C shows the spectral filter characteristics for FIG. 65C.

Figure 66D:
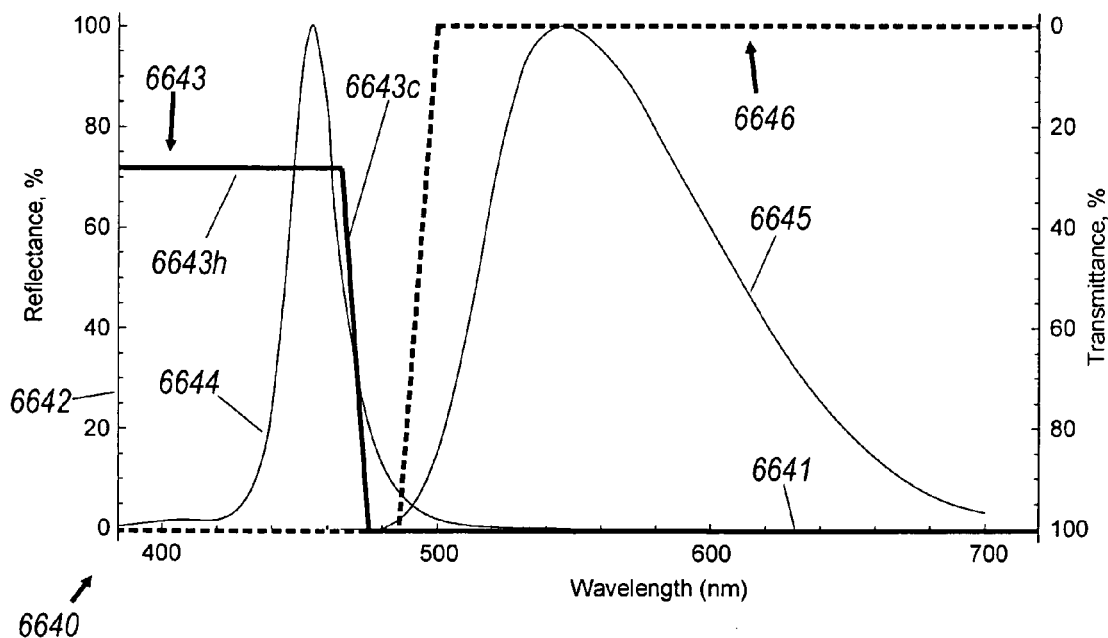

FIG. 66D shows the spectral filter characteristics for FIG. 65E

FIG. 67 is a graph of the spectral transmittance of an actual filter.

Figure 68A:
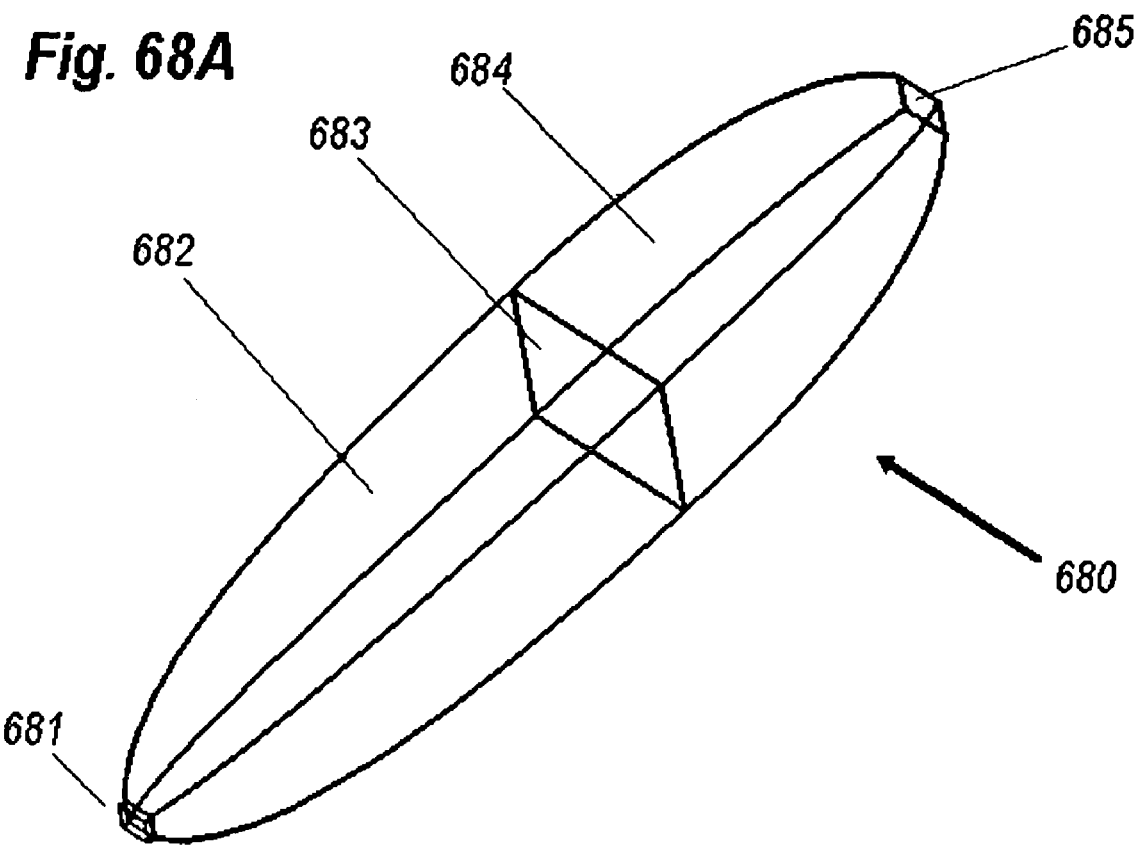
Figure 68:
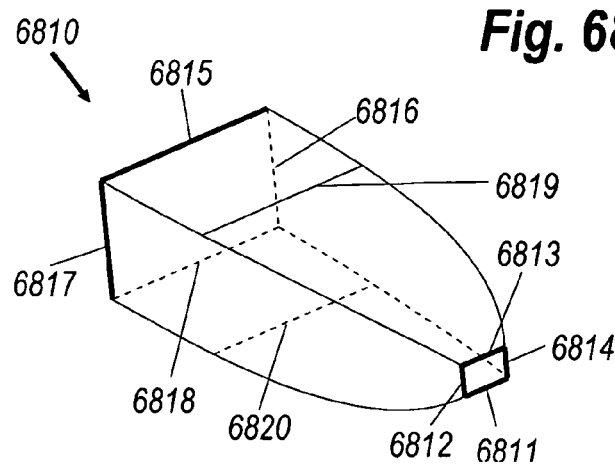

FIG. 68A is a view of a 10° square CPC feeding a 15° square CPC.

FIG. 68B is a view of a rectangular cross CPC

Figure 69A:
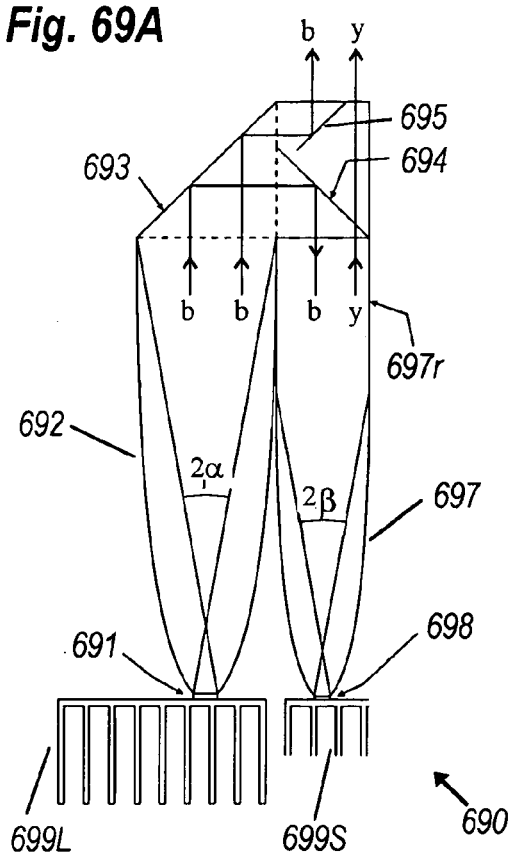

FIG. 69A shows a remote phosphor with cooled coplanar LED and phosphor patch, with coincident but mismatched blue and yellow outputs.

Figure 69B:
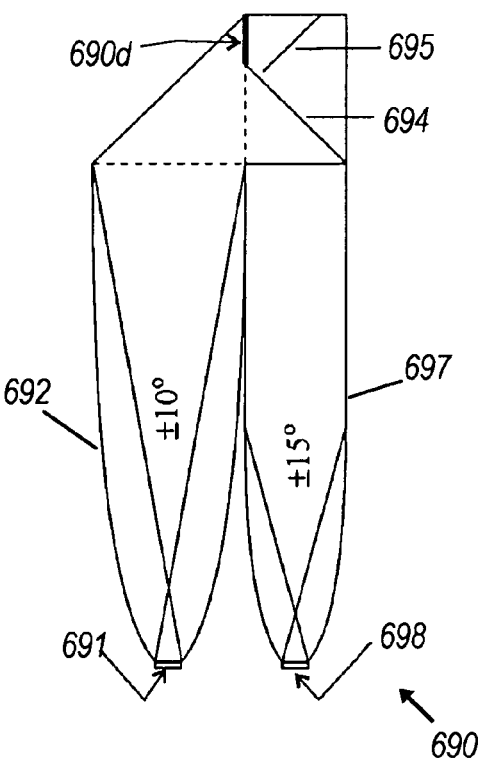

FIG. 69B shows same with compensating diffuser.

Figure 69C:
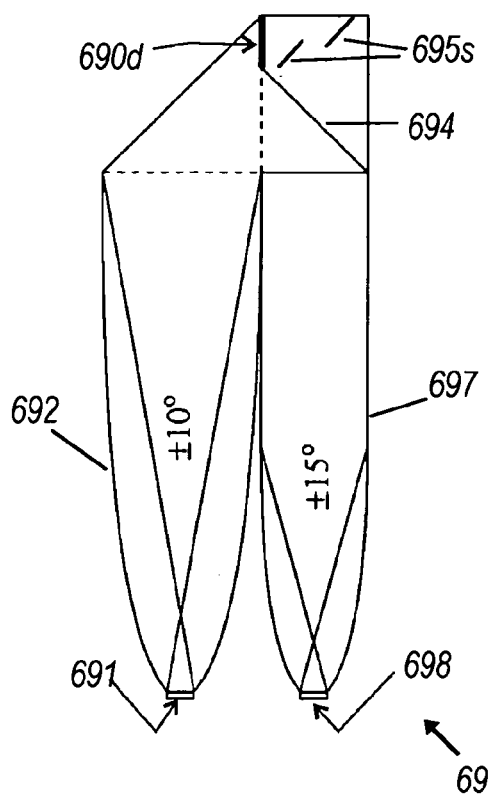

FIG. 69C shows same with smaller output mirrors.

Figure 70:
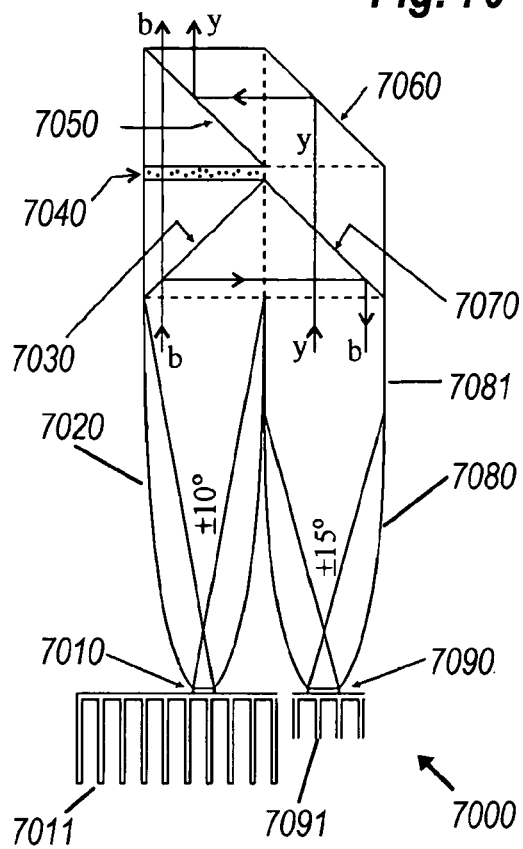

FIG. 70 shows a non-recycling remote phosphor system with spatially and angularly coincident blue and yellow outputs.

Figure 71:
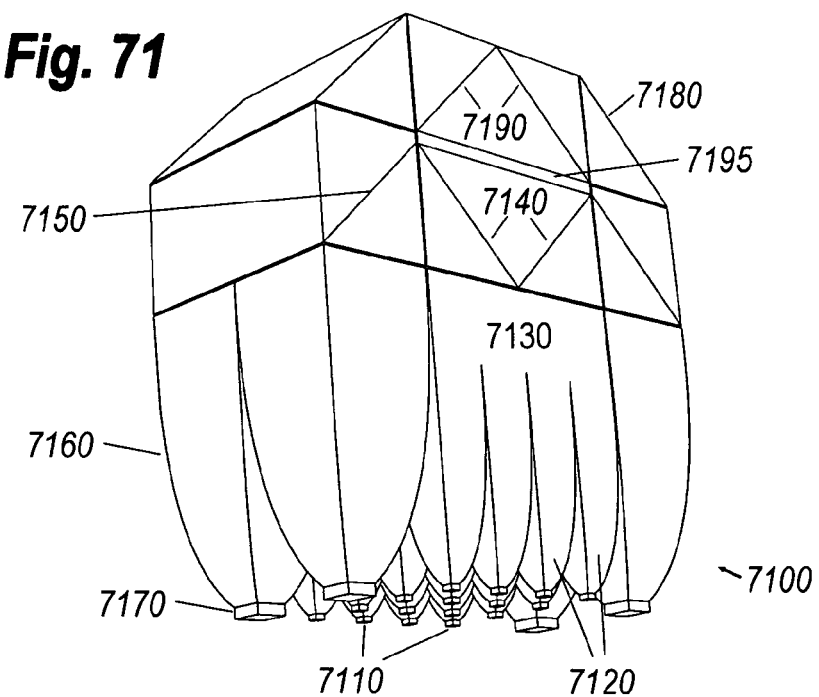

FIG. 71 is a perspective view of a remote phosphor with 16 blue LEDs and 4 phosphors, all coplanar, generating a spatially and angularly uniform collective white output beam.

Figure 72A:
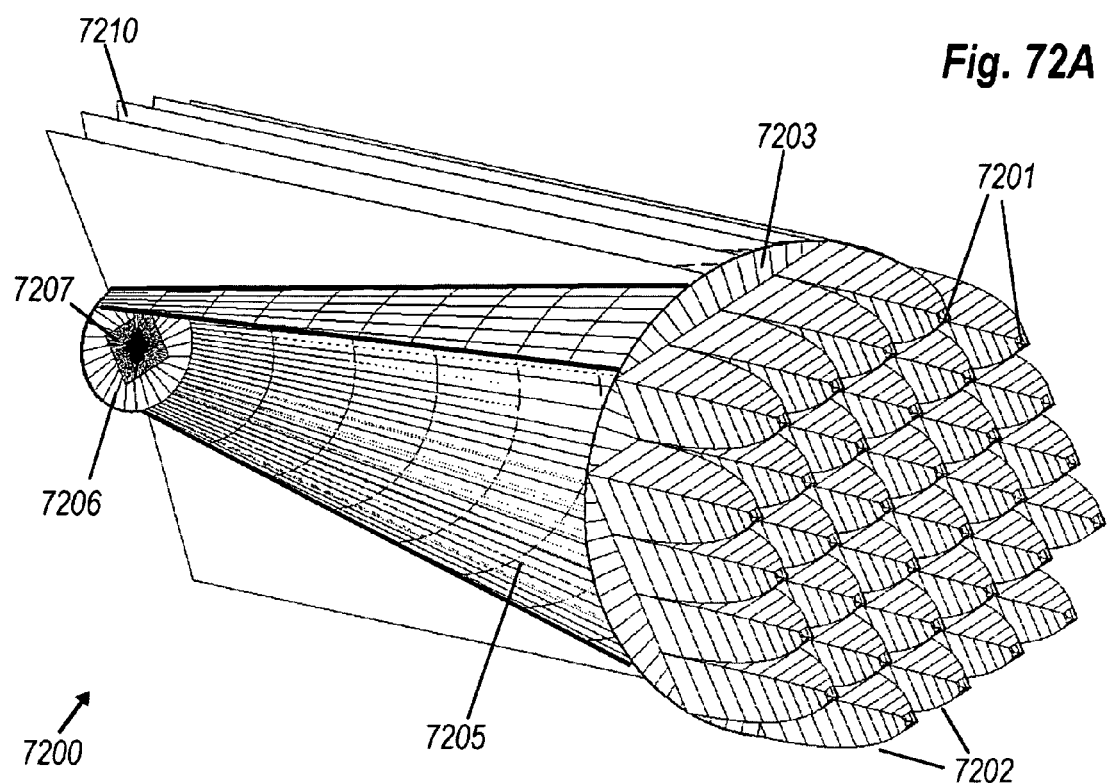
Figure 72B:
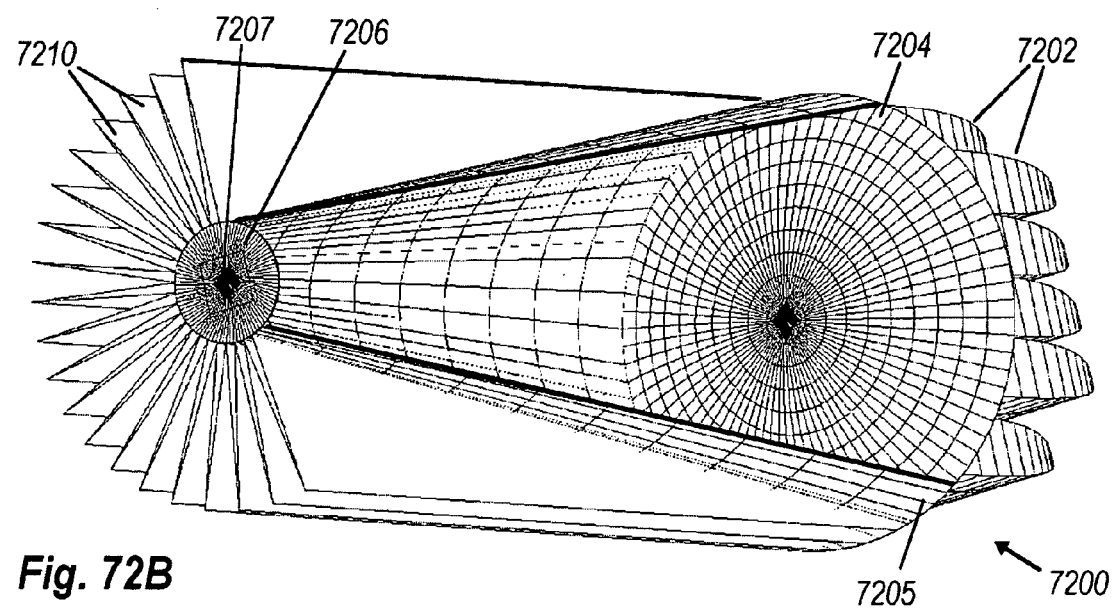

FIG. 72A and FIG. 72B are perspective views of remote phosphor with cone and lens rather than large dielectric CPC.

Figure 73A:
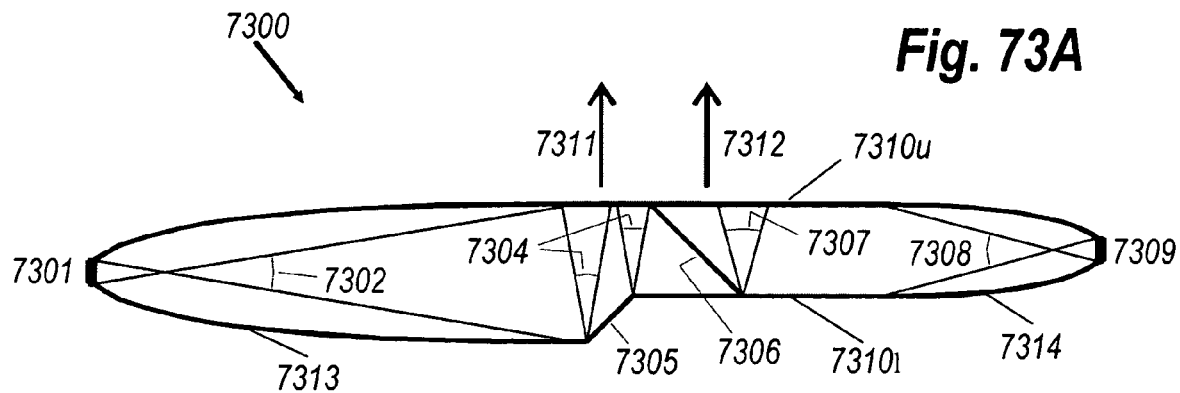

FIG. 73A is cross-section view of a side-emitting remote phosphor system where the LED and phosphor patch lie on approximately the same axis.

Figure 73B:
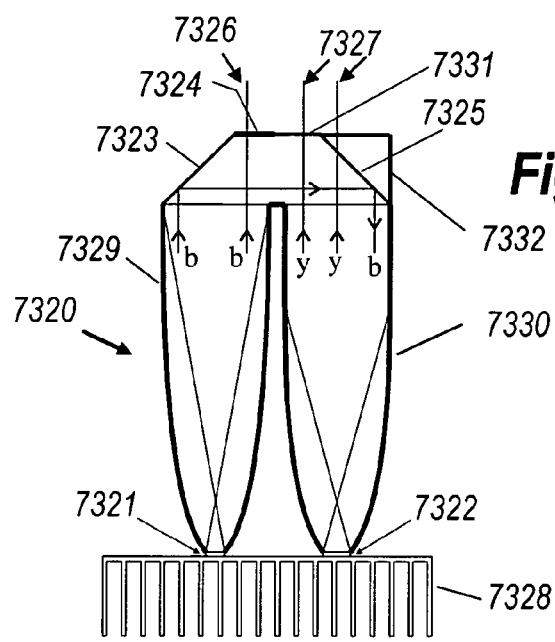

FIG. 73B is a cross-section view of a remote phosphor system with spatially separated contiguous short and long wave output ports.

Figure 73C:
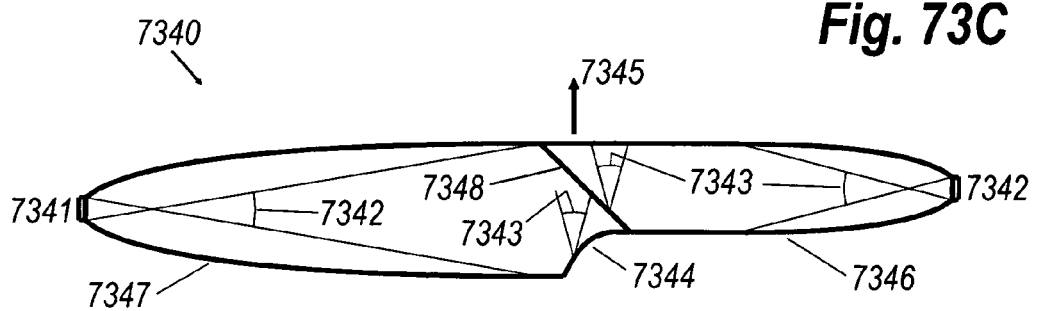

FIG. 73C is an alternative embodiment of the side-emitting remote phosphor system of FIG. 73A.

Figure 74:
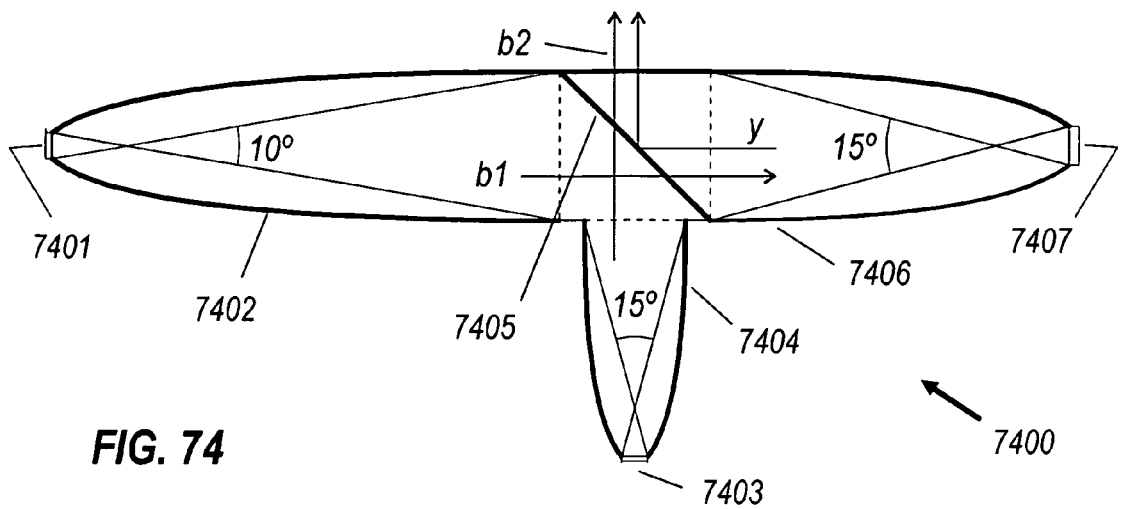

FIG. 74 shows a T-shaped remote phosphor system with controllable color temperature of its white output.

Figure 75:
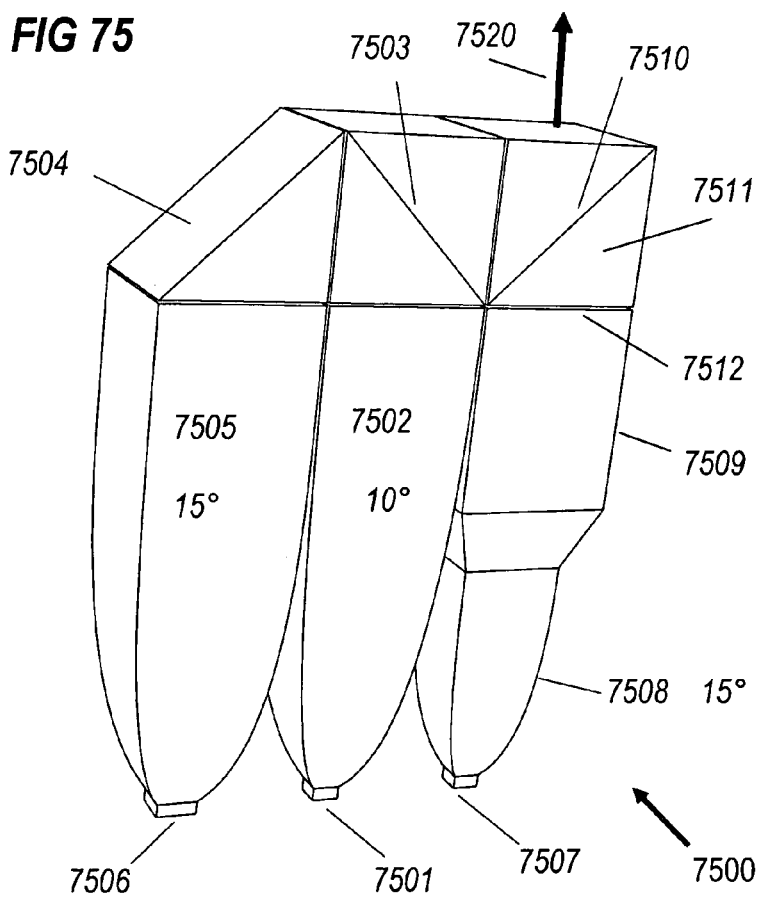

FIG. 75 shows a similar system, but with LEDs and phosphor patch in the same plane.

Figure 76:
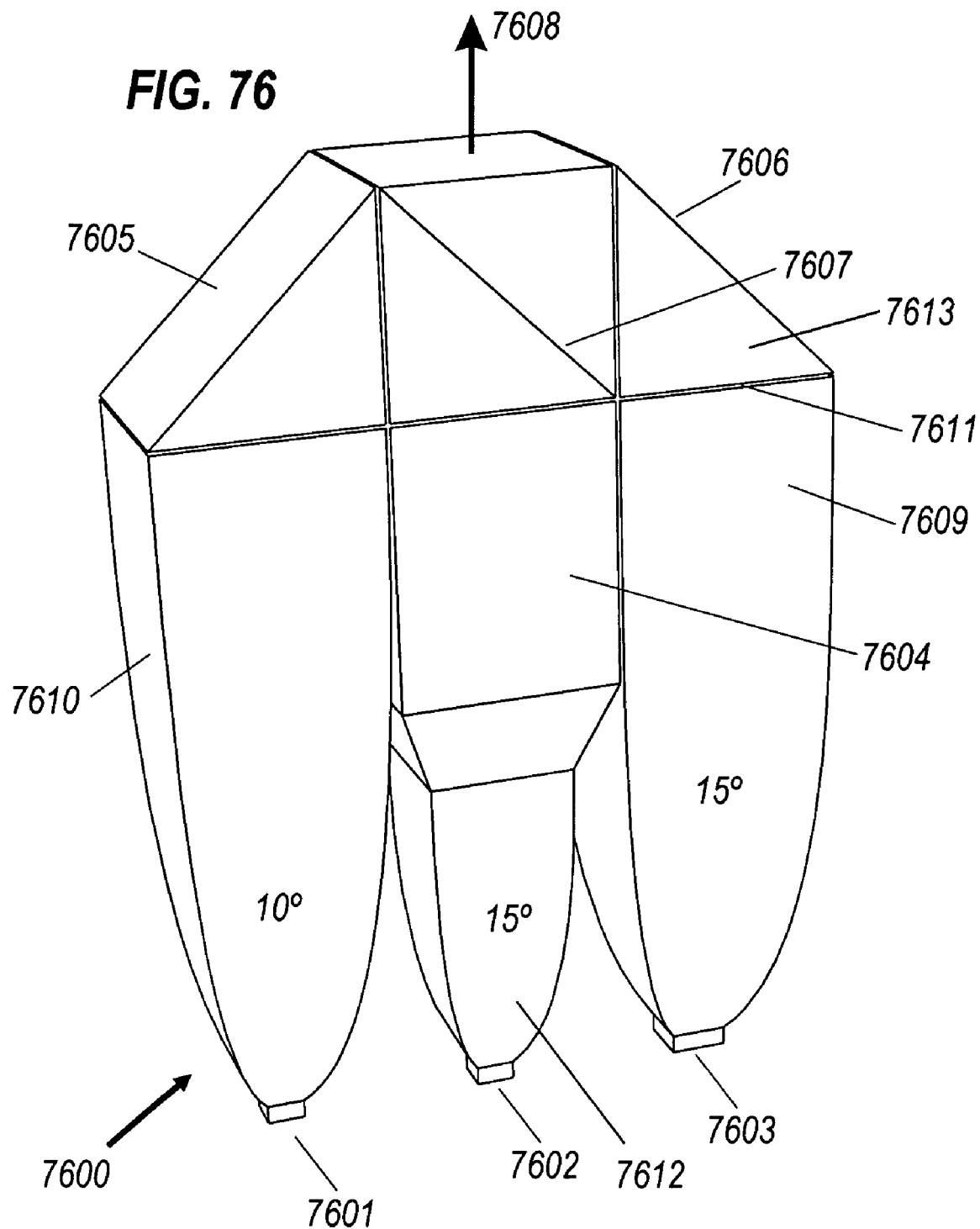

FIG. 76 shows an alternative embodiment of FIG. 75 where the two LEDs and the phosphor patch are in the same plane.

FIG. 77 is a perspective view of a remote phosphor system using the principles taught in FIG. 75 and having eight blue LEDs and four phosphor patches.

FIG. 78 is a cross-section view of a remote phosphor system having an adjustable color temperature that uses two blue LEDs.

Figure 79:
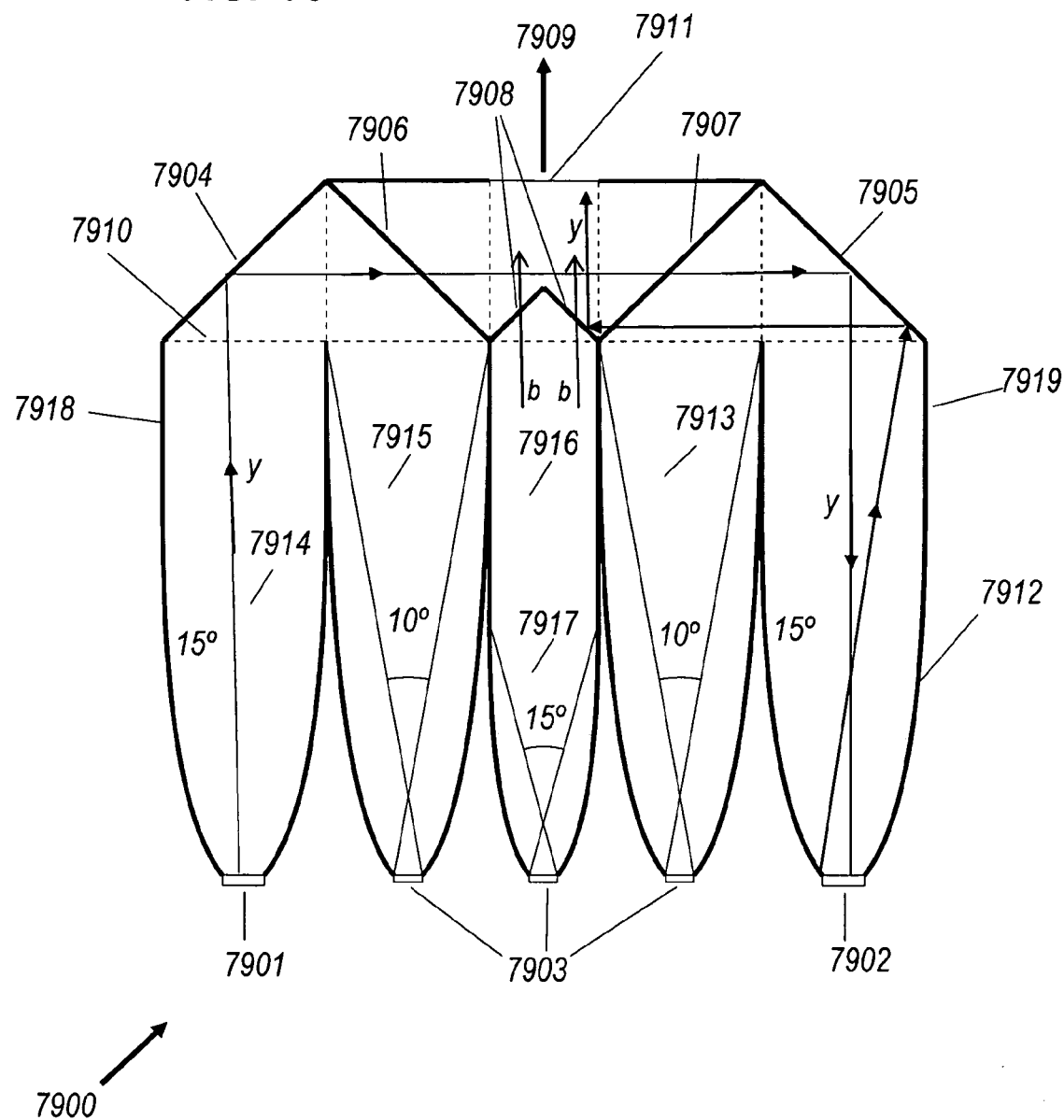

FIG. 79 is a cross-section view of a remote phosphor system with adjustable color temperature that uses partial recirculation of the yellow light.

FIG. 80 is a cross-section view of a variant of the same.

Corresponding reference characters indicate corresponding components throughout the several views of the drawings.

DETAILED DESCRIPTION

This invention is described in the following description with reference to the Figures, in which like numbers represent the same or similar elements.

Glossary of Terms and Acronyms

The following terms and acronyms are used throughout the detailed description:

| | |
|---|---|
| angle rotator | a device that delivers luminance from one plane to another lying at a tilt to the first |
| CEC | compound elliptical concentrator |
| CPC | compound parabolic concentrator |
| cross-CPC | a three-dimensional (3-D) configuration having a 2-D CPC profile in two orthogonal directions |
| dichroic filter | a filter that has two distinct transmission peaks |
| dome of LED | an approximately spherical LED cover made of transparent dielectric materials |
| edge-ray principle | the foundational principle of non-imaging optics, whereby a defining set of rays from the edge of an aperture are guaranteed to be delivered to the edge of another aperture, but the first aperture is not imaged onto the second |
| etendue | the optical manifestation of entropy, defined as the product of source area $A_s$ and the projected solid angle of the source's output, multiplied by the square of the refractive index n of the optical medium surrounding the source |
| ITO | indium tin oxide |
| LED | light emitting diode, a direct converter of low-voltage direct current to light in a narrow spectral band |
| luminaire | a light source and functionally associated light-control apparatus, such as a reflector or a shade |
| luminance shifter | a device that delivers luminance to a different transverse coordinate |
| NA | numerical aperture |
| phosphor | a photoluminescent material that emits light in response to external excitation, often continuing after the excitation ceases |
| phosphor patch | a component having a given size and shape that contains phosphor. It can comprise phosphor or phosphor dispersed in an encapsulant, such as a silicone fluid. The phosphor patch can also be made as a composite material where a phosphor layer (with or without an encapsulant) is deposited on a suitable transparent substrate, such as a sheet or film in a volume production process. |
| PMMA | polymethyl-methacrylate, the polymeric constituent of transparent acrylic plastic |
| RIIR lens | a lens system that has refractive (R) and internally-reflective (I) surfaces in the order specified |
| SMS | a method of optical design that generates a two-surface optical device that transforms two specified input wavefronts into two specified output wavefronts, such as disclosed in U.S. Patent Application 2004-0246606 and in U.S. Patents 6,639,733, 6,867,929, and 6,896,381 |
| thin film LED | an LED that comprises very thin layers and emits nearly 100% of its radiation from its top face |
| TIR | total internal reflection |
| wavefront | a constant-phase surface in a propagating electromagnetic field |

Overview

For purposes of explanation, an "optical manifold" resembles the exhaust manifold of engines. In an optical manifold, channels are provided that either combine multiple light outputs into a single output, or distribute a single output over space. This term can designate a device for fiber optic fan-in and fan-out, such as in U.S. Pat. Nos. 6,850,684, 6,847,774, 6,832,032, 6,655,848, 6,556,754, and 6,549,710 by Simmons et al. This multi-input, multi-output function is an informational task that is distinct from the efficient distribution of illumination. In fiber-optics parlance, such distribution is sometimes called 'fan-in' and 'fan-out', denoting the joining of several optical paths into one.

The distinction between 'fan-in' and 'fan-out' is important when reversibility is considered. That is, some such fiber-optic devices cannot be functionally interchanged, because some light on the reverse paths may spread out and be internally lost. However, it is an advantage to have a system that reversibly conveys light, so that its embodiments are operable in both directions. Thus the embodiments of the optical manifold described herein operate in both light-distribution, from a high-power source to many points of application, as well as light combining, of many sources into one large synthetic source with the same luminance as its input sources.

The term "optical manifold" was used in U.S. Pat. No. 4,362,361 by Campbell, et al., but therein this term denotes a partially reflective coating that repeatedly allows a small part of a laser beam to escape reflection as it tunnels inside a slab, so that multiple beams are made from one. This usage differs from what has become the conventional usage, in that "optical manifold" now denotes branching many-to-one light paths.

U.S. Pat. No. 6,186,650 discloses an "optical manifold" of branching waveguides, with numerous embodiments illustrated. It is believed that an actual ray tracing of these structures, however, would show considerable leakage, as shown by FIG. 19A and FIG. 19B in that patent. Moreover, it is believed that this prior art does not conserve etendue, giving outputs that are much weaker than the input. This is because the squared-off endings of the ports will cause much of the guided light therein to be reflected backwards.

Etendue, like entropy, is a measure of optical disorder, basically being the product of spatial extent and angular extent. Increasing the etendue of light can be considered as the optical equivalent of turning work into waste-heat, where the optical work would be the luminance of light-emission, and the waste-heat would be the useless dispersion of this light. An "etendue-limited" optical device is one that delivers light with nearly the original luminance, once inevitable reflections and scatterings are accounted for. The optical transformer described herein is etendue-limited, in that the input area-angle product is preserved for light passing through it. Some embodiments of the optical transformer described herein receive light from a plurality of sources to create a large, highly uniform synthetic source that may prove highly useful in the art of illumination. Other embodiments form distributed lighting systems, as in vehicle dashboards, that preserve both luminosity and etendue, enabling fewer LED sources to be necessary to accomplish the illumination task.

One example of an etendue-limited optical element is the compound parabolic concentrator (CPC), disclosed by Winston in U.S. Pat. No. 4,002,499. Another is the compound elliptic concentrator (CEC), disclosed by Winston in U.S. Pat. No. 3,957,031. Both of these can be utilized as a building block of the optical transformer described herein. A recent case is the corner-turning element disclosed by Fein in U.S. Pat. No. 6,819,687, which is etendue-limited only for angles well under the critical angle (NA<1). Designed for use with the angular limitations of fiber-optic illumination, this device has significant limitations that are surpassed by a similar-looking but geometrically different angle-turning component of the optical transformer described herein. Fein's device is intended for the NA=0.5 range of fiber-optic illumination, so that light in the NA=1 range, which is that of the optical transformer described herein, would leak out of it. The optical transformer described herein has the NA=1 range because this enables it to convey four times the irradiance of NA=0.5 systems such as Fein's. A further limitation of Fein's device is the NA=1 that its design permits, because its primary application is right-angle turns in biomedical settings, for which two 45°-turners are utilized at NA=0.5. In contrast, the angle-rotating components of embodiments of the optical transformer described herein have very little leakage at any arbitrary turning angle of the NA=1 light it conveys, so that the 90° angle rotators illustrated herein could as easily be extended to comprise a 360° device suitable for a helical configuration, should such a novel requirement arise. This flexibility enables optical transformer embodiments described herein to address the entire span of applications of both light combining and light distribution, with maximal flux, something yet to be accomplished by the prior art. This flexibility is further exemplified by embodiments of the optical manifold disclosed herein comprising two opposing angle-rotators acting as luminance shifters, another useful component of systems with arbitrary branching patterns of distributed illumination.

Another improvement provided herein regards manufacturability of optical transformers. In the prior art, such as exemplified in Fein, all the surfaces must be optically active on such optical angle-turning devices. This makes it difficult to have points of injection for a part without introducing lossy surface defects on the optically active surfaces. Optical transformers are described herein that overcome this problem by providing inactive surfaces along the length of the device that can be used for points of injection. The inactive surfaces can be used as a means of holding the devices, and they can be freely modified into a wide range of shapes, without affecting the shape of the active surfaces of the device. The inactive surfaces are deliberately created by the pattern of ray distribution within the angle-rotator, providing an envelope of non-interaction with the light field, within which non-lossy attachments may be made.

Description

A better understanding of the features and advantages of the optical transformer described herein will be obtained by reference to the following detailed description and accompanying drawings, which set forth illustrative embodiments in which the principles of the invention are utilized.

An optical manifold is described herein that receives light from a plurality of solid-state sources and combines them into a single virtual-source output having little more etendue than the sum of the inputs. When the sources have different dominant wavelengths, the output light has the chromaticity of their calorimetric mixture. Due to the reversibility of light, the same shape of manifold could be used to disperse the light from a single large solid-state source among multiple virtual sources.

Two solid-state light sources in particular are contemplated for the optical transformer described herein: thin LEDs and dome-packaged high-power LEDs. Their packaging geometry dictates differing configurations of injection means for the optical transformer described herein. The prior art encompasses several types of injector means, including CPCs and immersion lenses, as well as conventional domed packaging.

Figure 1A:
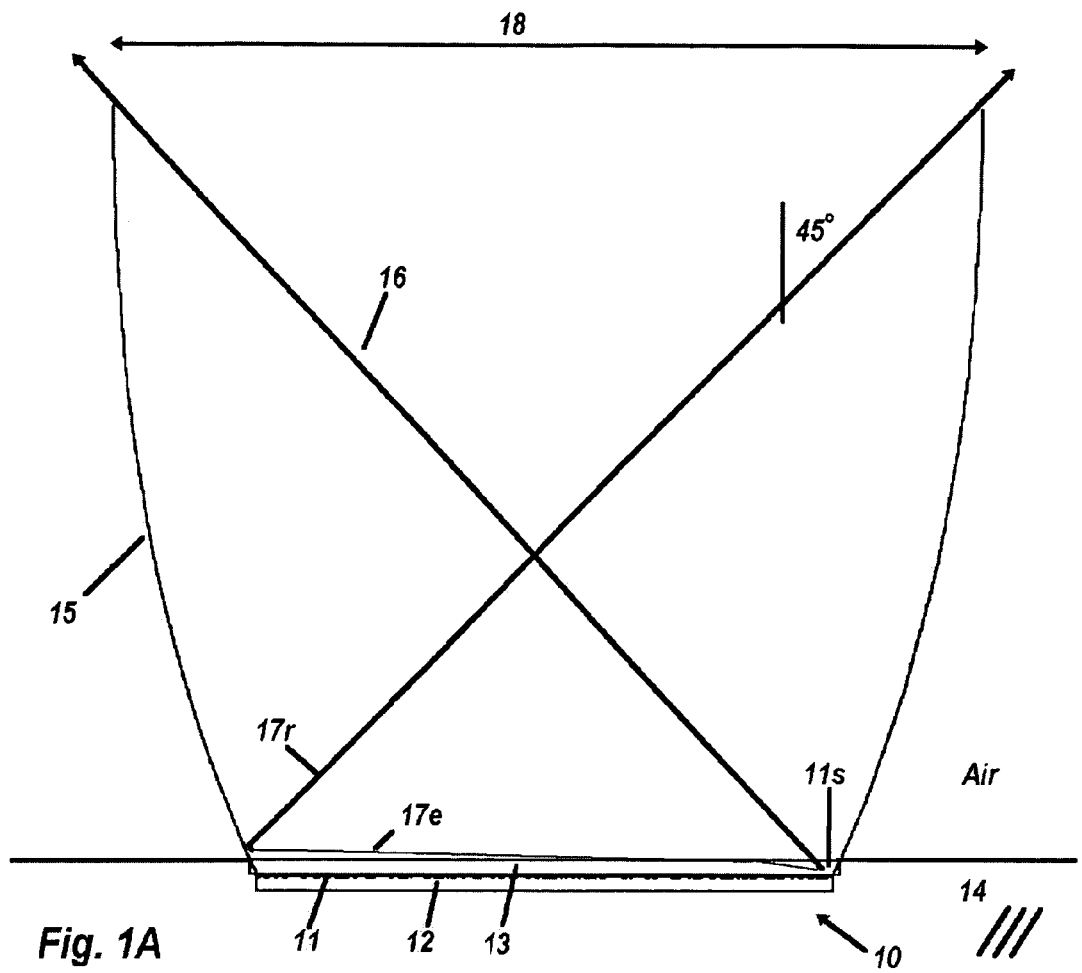
FIG. 1A is a cross-sectional view of a thin-film LED with an adjacent compound parabolic concentrator (CPC) reflector.

FIG. 1A is a cross-sectional view of an optical manifold including a thin-film LED 10 comprising a light-emitting layer 11, reflective means 12, and a window 13. The LED 10 is embedded in a protective transparent epoxy or gel 14. An example of such a gel is Nyogel OC431A by Nye Optical Products of Fairhaven, Mass., with refractive index 1.46 and thixotropic viscosity keeping it in place. An external CPC reflector 15 is accurately situated on the surface of epoxy 14 so that it just straddles window 13 over LED 10, which is typically about a millimeter across. One advantage of the optical manifold described herein is that it allows more efficient cooling of larger (or multiple) LEDs. The difficulty of cooling larger or multiple chips is one of the motivations for the optical transformer described herein. (Electricity and heat sinks are not shown.)

Thin-film LEDs, such as the LED 10 shown in FIG. 1A, emit nearly 100% of their output flux from the top surface of the device. Such devices have been produced in the laboratory and have been shown to the public by, for example OSRAM Semiconductors of Regensburg, Germany, which has begun producing them commercially in red and yellow with green and blue by the middle of the year 2005. A variety of thin emitter technologies are currently proposed by OSRAM Corporation of San Jose, Calif., including Indium Gallium Aluminum Phosphide (InGaAIP) and Indium Gallium Nitride (InGaN). All the emitting architectures shown by OSRAM Semiconductors to date use a wire bond on their top surface. The current thickness of the emitting layer in these devices is on the order of 0.1 microns and the overall chip depth is two to five microns. Therefore the side emissions from these devices are quite small, so they are ideally suitable for use in many of the embodiments of this invention.

FIG. 1A further shows source-point 11s emitting edge-ray 16, which just clears the upper edge of CPC 15. Also shown is edge ray 17e emitted horizontally, thereby intercepting the base of reflector 15, from which it is reflected into ray 17r, which in turn just clears the upper edge of CPC 15. The 45° design angle is shown. It applies to both direct ray 16 and reflected ray 17r. Double-arrow 18 denotes the width of the virtual source generated by CPC 15. Its width is 1/sin 45° times the width of emitting layer 11, thus preserving etendue.

Although FIG. 1A shows CPC 15 as a hollow metal reflector, it could as well be filled with a dielectric such as cast epoxy. If the 45° design angle would be slightly reduced to the critical angle (40°), the CPC would become slightly taller, and extreme rays 16 and 17r would be refracted to horizontal, for a planar air-interface across the top of CPC 15. Such a filled CPC would couple the LED into air with transverse magnification equal to the refractive index of the transparent filling material. (The area is increased by the factor of $n^2$.) For greater magnifications, a narrower design angle is needed. When that angle is reduced to 10°, reflector 15 can be dispensed with, since total internal reflection suffices, as shown in FIG. 2.

U.S. Pat. No. 3,739,217 by Bergh and Saul teaches that the extraction of light from within a high-index-of-refraction body can be increased by roughening either a front emitting surface or a back surface of the high-index layer, where this roughened back surface interfaces with a reflective layer. However, the Bergh et al. Patent does not specify the reflector-material nor does it indicate whether the reflector should be in direct contact with all surfaces of the high-index body. The Bergh et al. Patent appears to indicate in its FIGS. 2 and 3 that there is an air gap between the illuminated body and the back reflector.

Figure 1B:
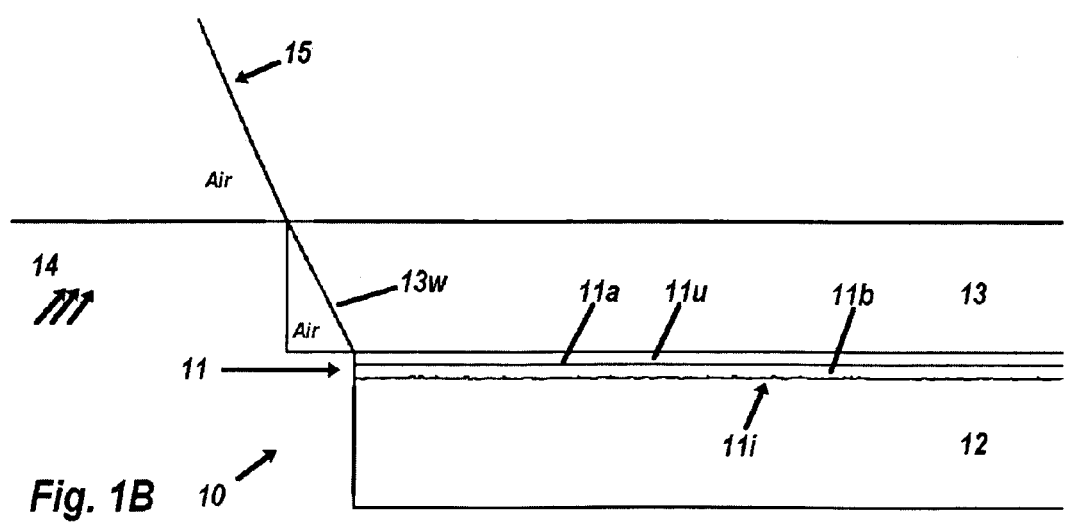
FIG. 1B is a magnified cross-sectional view of part of FIG. 1A, showing the LED with a diffuse reflector in contact with the active epitaxy layer.

FIG. 1B is a magnified view of the LED 10 of FIG. 1A, showing emitting layer 11 comprising thin (approximately 0.1 microns) active layer 11a situated in the middle, InGaN layer 11u above it, and layer 11b below it. Window 13 can be seen to have slanted edge 13w to prevent light-escape. FIG. 1B further shows an approach to enhancing the luminous extraction efficiency of a top-emitting LED (or of a predominantly top-emitting LED) wherein electrically conductive reflective layer 12 also acts to power epitaxy layer 11, with which it is in direct contact. Roughened interface 11i is the contact surface. This roughening can be achieved on the epitaxy layer 11 by chemical etching or other well-known methods. Once the epitaxy layer is roughened, the reflective layer 12 can be deposited thereupon by vacuum, sputtering, or other deposition methods.

The material properties of reflector layer 12 must be precisely specified to match with the properties of the epitaxy layer. For example, where an electrically conductive reflective layer is needed, a metallic material is best, and its index must have the proper complex value to achieve a high diffuse reflectance. For a blue LED using an epitaxy layer of GaInN or GaN for example, the visible-wavelength index of refraction of both GaInN and GaN is about 2.54. Calculating the reflectance of such a metal layer involves using the complex index of refraction in the Fresnel-reflection equations, so that both the real and imaginary components of the index of refraction of a candidate material are critical. The reflectance for rays striking at a zero incidence angle can provide a metric for choosing appropriate materials. A suitable equation for carrying out such an analysis is:

$$R=[(N_{epi}-N_s)^2+k_s^2]/[(N_{epi}+N_s)^2+k_s^2]$$

where R is the reflectance at zero incidence at the interface of the epitaxy and the metal layer, $N_{epi}$ is the index of refraction of the epitaxy, $N_s$ is the real part of the index of refraction of the metal, and $k_s$ is the imaginary part of the index of refraction of the metal.

Assuming that the epitaxy layer has index 2.54, the metal needs the real component to be low and the imaginary component high. Silver has a low real component (0.12) and a very high imaginary component, over wavelengths ranging from 450 nm (k=2.47) to 700 nm (k=4.52). At 550 nm a thick layer of silver has an index of refraction (real) of approximately 0.12 and an imaginary value of 3.34. Plugging these values into the aforementioned equation yields a reflectance of 0.93. By way of comparison a layer of aluminum would have a much lower reflectance in contact with GaInN, as it has a real value of 0.76 and an imaginary value of 5.32 at 550 nm. In this case the reflectance at the interface of the two materials, for zero incidence angle rays, can be calculated by the same equation as 0.80. This is a very significant difference, especially with the extraction efficiency of the device having a non-linear relationship to the reflectance of this layer, because internal rays in the epitaxy undergo many boundary reflections before being either absorbed or extracted from the layer. Thus a small improvement in the reflectance of this bottom interface layer can produce a large improvement in the external quantum efficiency of the LED.

Such a reflective layer may also be made of dielectric materials using multi-layer approaches, particularly the Bragg reflector, common to the industry. However, electrical conductive paths known as vias must be introduced somewhere through this otherwise non-conductive layer, in order to power the semi-conductor. The use of a dielectric layer however may increase the internal resistance of the device and therefore increase the internal heat generated for a given applied voltage. Further, it is known that it is very difficult to design a Bragg reflector which has high reflectance for a wide range of wavelengths and incidence angles. This is especially a problem for LEDs which employ conformal phosphor coatings on the die. Thus silver may be deemed a superior solution over a dielectric reflector as it performs well over a wide range of incidence angles and wavelengths.

U.S. Pat. No. 6,784,462 teaches how to make an "omni-directional" back reflector with very high reflectance for an LED by combining a quarter wavelength layer of Indium Tin Oxide (ITO) in front of a layer of silver. The thin film approach in the '462 patent, however, assumes that the silver and ITO layers are smooth, precluding any roughening of the bottom of the LED proper, known as the 'epitaxial layer' because it is made atop a substrate, by an atomic beam in a vacuum. Because of extensive light trapping within a cube of high-index material, a standard LED geometry, achieving maximum extraction efficiency makes it imperative to have a roughened surface at the interface where the reflector is in contact with the epitaxial layer. This is needed to achieve high diffuse reflectance, which causes trapped light to be randomly redirected for another chance at escape. Further, ITO has a much lower electrical conductance than silver, which may be a disadvantage for some designs.

Getting trapped light scattered out before it is absorbed makes it desirable to have either a bottom diffuse reflector or a top scattering layer incorporated with layer 11u of FIG. 1A. A combination where both approaches are employed can also be utilized. However, one can introduce too much scattering in the device when both a top and bottom scattering layer are used and thus reduce the device extraction efficiency. It can be shown that without top scattering introduced into layer 11u, that a perfect reflector such as described in U.S. Pat. No. 6,784,462 will not perform as well as the diffuse silver reflector described herein. Further, in many instances it is desirable to have a smooth interface at the top of layer 11u and one cannot introduce a scattering or diffusing layer on its interface or below its top emitting surface. In these instances the rear diffuse reflector proves most beneficial and has been stated herein, will outperform even a 100% perfect specular reflector.

Furthermore, silver will lose its reflectivity if not properly protected from contact with air or corrosive materials (it is highly reactive with sulfur), so it must be sealed by suitable protective layer. Typically, if the silver is sandwiched between the epitaxial layer and a suitable substrate such as Germanium, then no noticeable degradation of this material takes place as it is hermetically sealed. If edge protection is required there are many suitable materials known to those skilled in this field of semi-conductor design.

Regarding the matter of a roughened back-reflector made of silver, computer simulations thereof, using well-known Monte-Carlo ray-tracing techniques, show that the optical transformer described herein will greatly benefit from having this feature in the LEDs that illuminate its embodiments, particularly those disclosed below that recycle the emission of a phosphor.

This roughened-silver reflector can of course greatly benefit thin-film LEDs whether or not used in conjunction with the optical transformer described herein. Referring again to FIG. 1B, another such LED optical improvement is the reduction of the absorptance of lower epitaxy-layer 11b, where the majority of luminosity losses occur within epitaxy layer 11. As an epitaxy, this layer is typically deposited on a sapphire crystal. In the production of thin-film LEDs the epitaxy wafer is removed from the sapphire. (A summary of the processes needed to remove the InGaN wafer from the sapphire substrate was described by Dr. K. Streubel of OSRAM-Opto in a presentation titled "Thinfilm Technology for Light Emitting Diodes" at Intertech LEDs 2004 conference in San Diego, Calif., USA, Oct. 20-22 2004, which is incorporated herein by reference in its entirety.)

The absorption of the lower layer is not essential to its function, and seems to be confined to the superficial atomic crystal-planes, several tens of nanometers out of the layer's total thickness of 5,000 nm. According to the research of S. Schad and B. Neubert of the University of Ulm in Germany, described in their paper "Absorption in InGaN-on-Saphire Based Light-Emitting Diodes", Annual Report 2003, Opto-electronics Department, University of Ulm, which is incorporated herein by reference in its entirety, the first thin layer of an InGaN-type LED grown on a sapphire substrate, approximately 65 nm, is responsible for most of the absorptance of the InGaN LED in the blue wavelength. They theorize that the remaining semi-conductor material grown on the substrate is highly transparent. These planes were so near the sapphire that their crystal structure and absorptance greatly increased. In some embodiments, neither layer 11a nor 11u has this thin absorptive layer. Precise removal of this strained sub-layer is possible with magnetorheological polishing, greatly reducing the absorptance and thereby enhancing the LED's external quantum efficiency.

A separate possibility for enhancing that efficiency is to cause the front layer 11u of FIG. 1B to have bulk-scattering characteristics, rather than the complete transparency typical of such a layer. A study using a ray-tracing model showed that the introduction of a scattering coefficient of 100/mm into layer 11u gives an approximately 40% increase in efficiency for a SMD-type LED, where layer 11u does not have any appreciable scattering and does not have a phosphor layer in contact with it. Similar improvements are seen for a dome type monochrome LED. If the scattering coefficient is increased to 200/mm, a very slight improvement is seen. Whereas beyond this level there is reached a point where the performance degrades from the maximum. The use of a means of scattering in the front layer typically does not have a beneficial effect on performance when it is used in conjunction with the roughened back-reflector approach already discussed. There is a very slight improvement to the extraction efficiency if a roughened-back reflector is used in combination with layer 11u having a 10/mm scattering coefficient. Beyond this level of front scattering the performance falls below either single approach.

The optical manifolds disclosed herein that recapture back-scattered light can be enhanced significantly when the extraction efficiency of the LED is high. Particularly, it is believed that the remote phosphor embodiments described herein will outperform the prior art in terms of external quantum efficiency, particularly conformal-phosphor LEDs. The performance of the novel optical systems disclosed herein can be improved dramatically when they are used in conjunction with top-emitting or substantially top-emitting LEDs, particularly those which employ a highly reflective back layer with modest scattering.

Figure 2A:
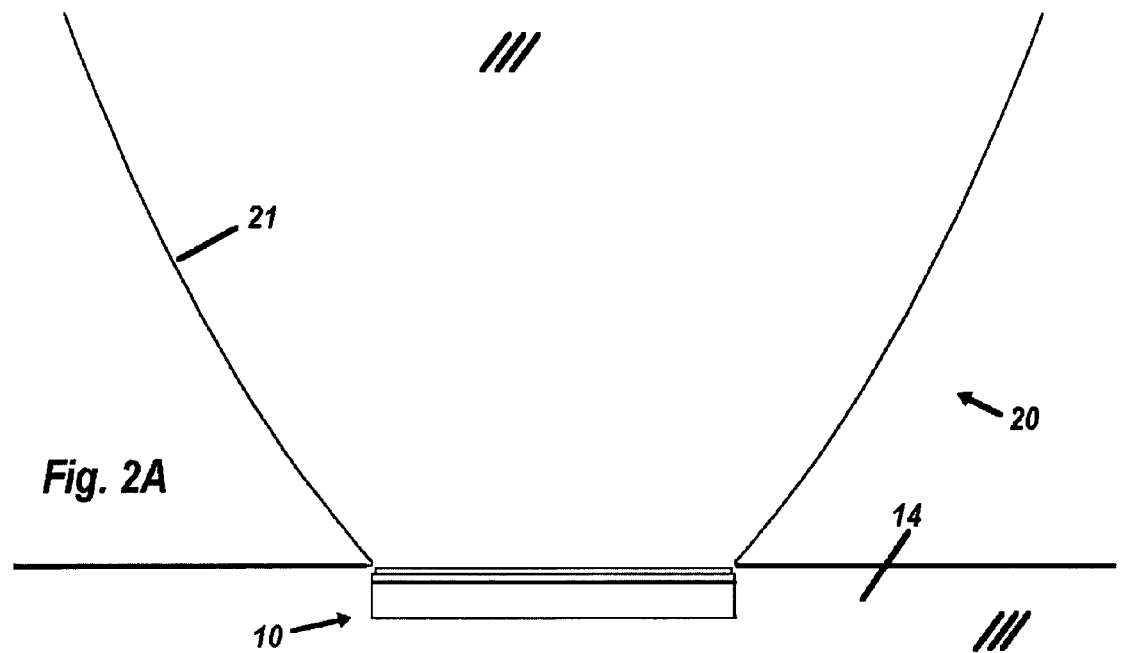
FIG. 2A is a cross-sectional view of a thin-film LED immersed in optical contact with a 10° dielectric-filled CPC, showing a bottom part of the CPC.

FIG. 2A is a cross-section of the bottom of a dielectric-filled CPC. As in FIG. 1A, the thin-film LED 10 is immersed in transparent dielectric 14. Optically continuous with transparent dielectric 14 is dielectric-filled CPC 20, formed by a CPC surface 21, which operates solely by total internal reflection, and thus not needing a reflective coating. In actual practice, the CPC 20 would be separately manufactured and optically bonded to transparent dielectric 14, just above thin-film LED 10.

Figure 2B:
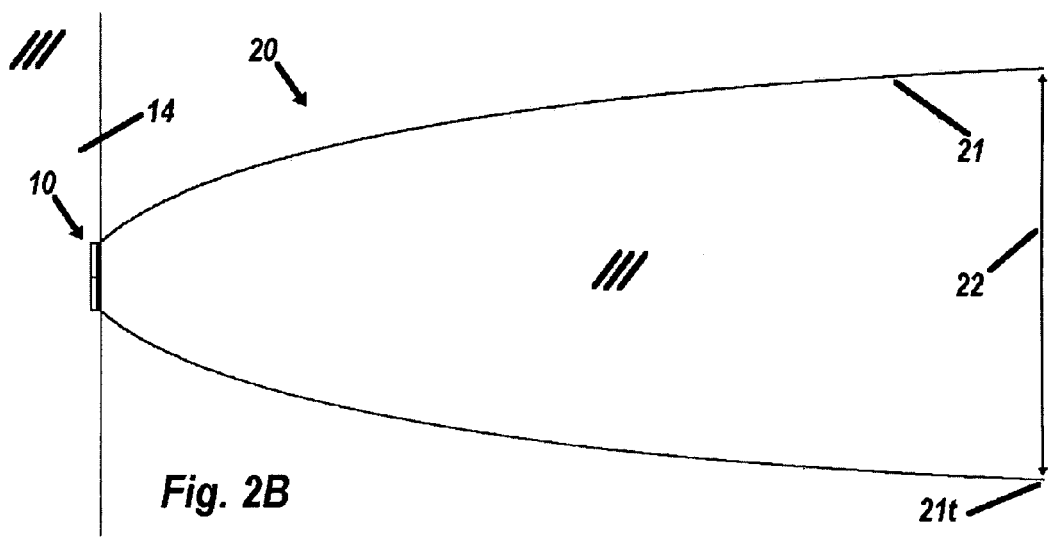
FIG. 2B is a cross-section of the dielectric-filled CPC of FIG. 2A, showing the entire 10° dielectric CPC.

FIG. 2B is a cross-section of the dielectric-filled CPC of FIG. 2A, showing the entirety of the CPC 20, with parabolic profile 21 shaped for a 10° output angle, the widest possible for a CPC using only total internal reflection. Top edge 21t of profile 21 is the outer edge of virtual source 22. The dielectric medium within CPC 20 may continue rightward in alternative embodiments (not shown in FIG. 2) as exemplified by CPC 54 connecting with larger CPC 53 in FIG. 5.

Figure 2C:
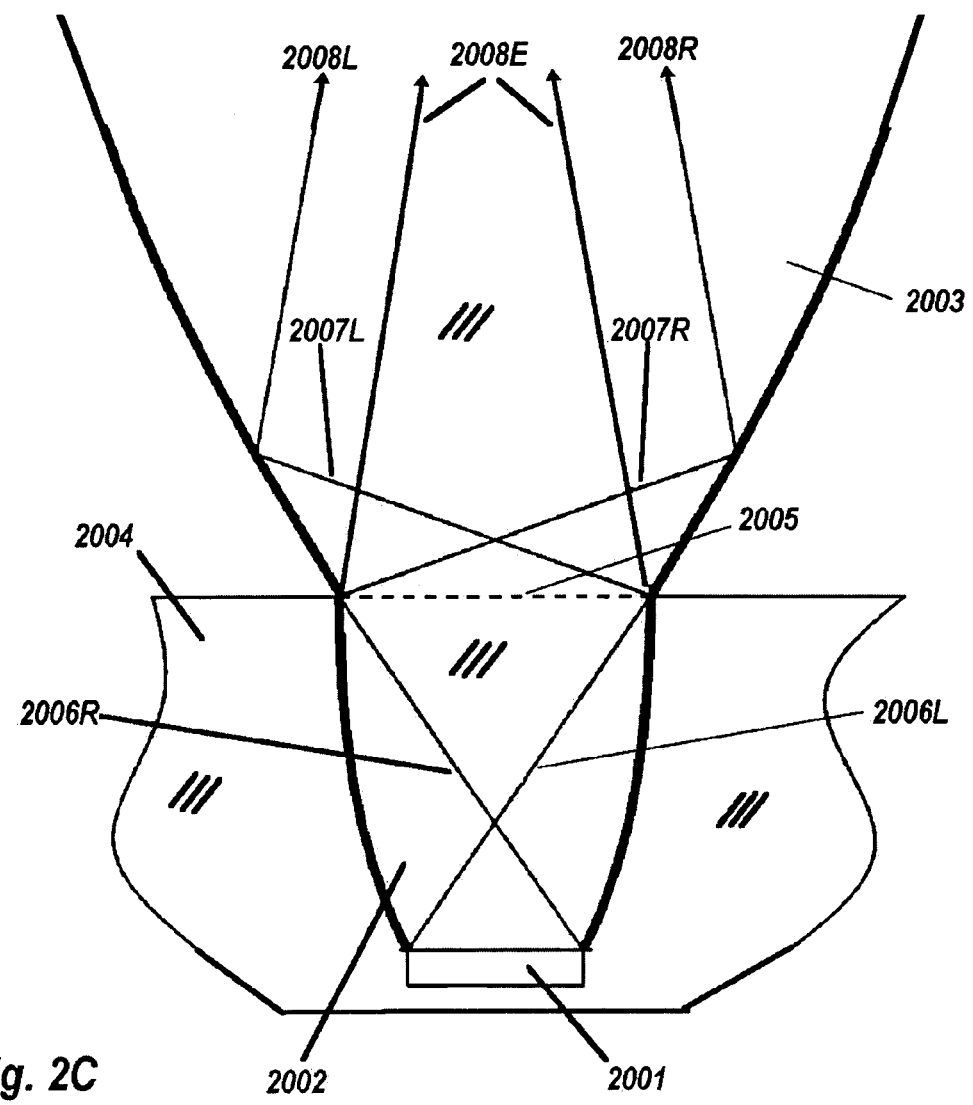
FIG. 2C is a cross-section of an optical manifold that incorporates the cross-section shown in FIGS. 2A and 2B, including a high-index CPC for high-efficiency light extraction and a low-index CPC for collimation.

In some embodiments, the CPC 20 could have a refractive index higher than that of the epoxy material comprising transparent dielectric 14 of FIG. 1B. Jewelry-grade cubic zirconia, for example, has a refractive index of 2.2, similar to diamond. Even if currently it may be more expensive than polymer plastic optics, such a high-index transparent material may in the future be economically available. It would be advantageous for forming a CPC that is optically bonded to a thin-film LED to form an embodiment of the optical transformer described herein. While the high index (~2.5) of titanium-dioxide films matches that of the LED material, the film's high absorptance makes it unsuitable in forming a CPC. Sol-gel materials are being developed for casting or in boule form, with refractive index available at unprecedented high values of 2.4-3, sufficient to index-match with the LED material. Further, these high index materials can be designed and manufactured to have an extremely low absorptance coefficient in the visible wavelengths, similar to a material such as the highest optical grade PMMA. This would eliminate the light trapping and high Fresnel reflectance that bedevil current LEDs. FIG. 2C is a cross-sectional view of an alternative optical manifold that utilizes a variation of this approach, replacing the CPC 20 with two CPCs. A first CPC 2002 is in contact with an LED 2001, and is made of a sol-gel material matched to the index of the semi-conductor and second, upper CPC 2003 is made of a lower refractive index material, such as PMMA. The first CPC 2002 is designed to partially collimate and fully flash the second CPC 2003, which performs further collimation. This arrangement shown in FIG. 2C greatly increases overall extraction of flux from the die. Because of this, the LED 2001 would have a specular reflecting layer on its bottom side, unlike the diffusely reflecting mirror in FIG. 1B. Surrounding silicone material 2004, with a low refractive index of 1.4, is the initial mold for the casting of CPC 2002, thereafter providing structural support for small CPC 2002, alleviating stress upon its bond with the top surface LED 2001. CPC 2001 is designed for this index ratio of 2.5:1.4, operating entirely by total internal reflection. Its exit face is planar interface 2005 with larger CPC 2003. Edge rays 2006R and 2006L are shown being reflected by the top edge of CPC 2001 and then refracted by interface 2005 into 70° edge rays 2007R and 2007L. They are internally reflected by CPC 2003 into final collimated rays 2008R and 2008L, respectively. Adjacent to them are edge rays 2008E, originating from rays 2006R and 2006L being directly refracted through interface 2005 and then totally internally reflecting off the wall of CPC 2003.

Figure 2D:
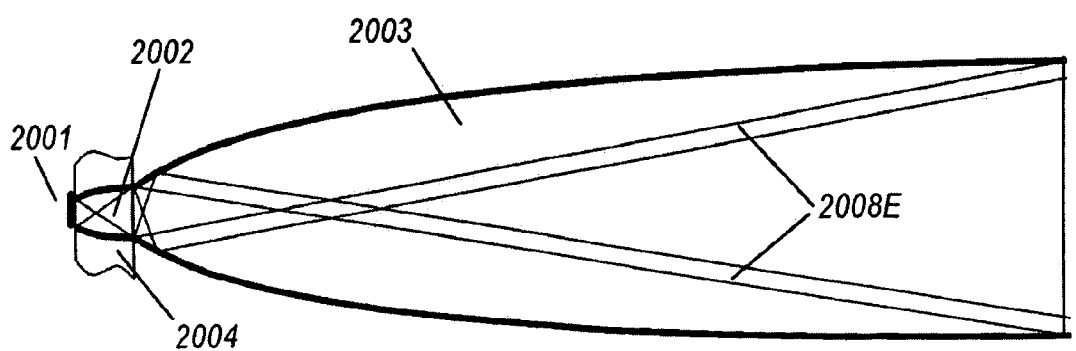
FIG. 2D is a cross-sectional view that shows the entire CPC shown partially in FIG. 2C.

FIG. 2D is a cross-sectional view that shows the entire CPC 2003 shown partially in FIG. 2C, including the ultimate position of edge rays 2008E.

An alternative embodiment of the device of FIGS. 2C and 2D is to include a thin high matching index layer at the interface between LED 2001 and CPC 2002. In this instance the matching index phosphor layer is deposited onto the LED via a method such as electrophoretic deposition (the migration of charged colloidal particles or molecules through a solution under the influence of an applied electric field usually provided by immersed electrodes, also called cataphoresis). One method is one which provides high contact area between the phosphor and the top surface of the LED. The index of refraction of LED, 2001, the small CPC 2002, and the phosphor should be closely matched, preferably within minus 0.1. So for an InGaN LED, which has an index of refraction on the top inactive surface of 2.5, the phosphor and the material of the small CPC should have an index of refraction between 2.4 and 2.5. Embodiments based on this device do not use or need a short-pass filter, such as the short-pass filter 105 described below with reference to FIG. 10B, to trap back-scattered light from the LED. When the refraction indices are matched, light will be recycled between the phosphor and the LED back mirror.

Figure 3A:
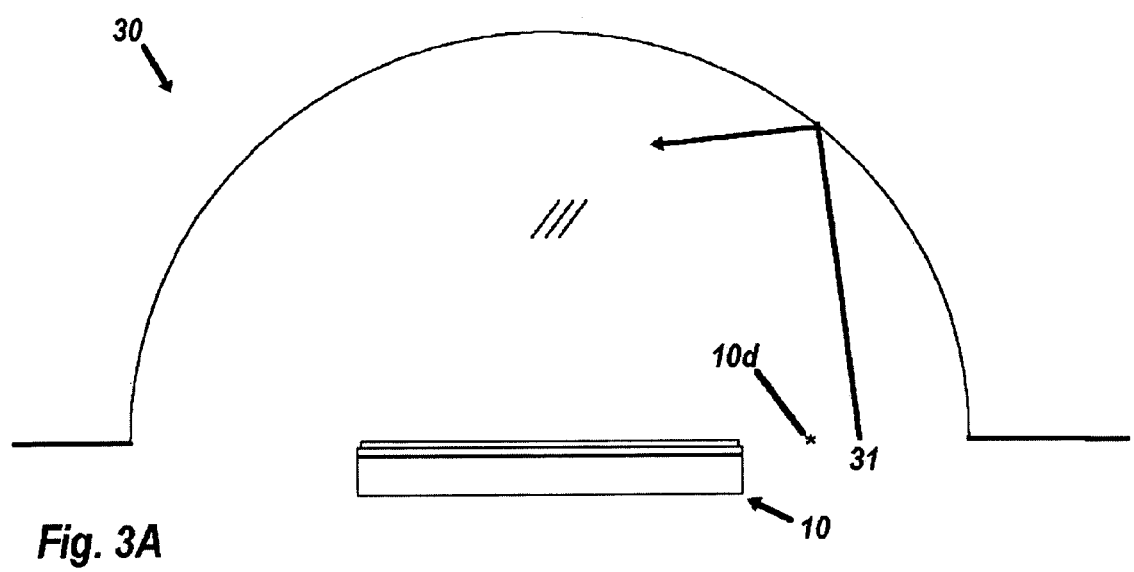
FIG. 3A is a cross-section of a thin-film LED immersed in a small hemisphere.

FIG. 3A is a cross-sectional view of a thin LED 10 embedded in dome 30, a typical configuration in commercial packages. Dome 30 is shown with the smallest possible size, for the refractive index of epoxy (n=1.54), consistent with all rays emitted from LED 10 escaping total internal reflection. LED 10 is square, and is seen in cross-section. Point 10*d* marks the radius of the corner of LED 10. Beyond it some rays will not exit the dome. A hypothetical exemplary ray 31 is internally reflected because its origin is too close to the surface of hemisphere 30.

Figure 3B:
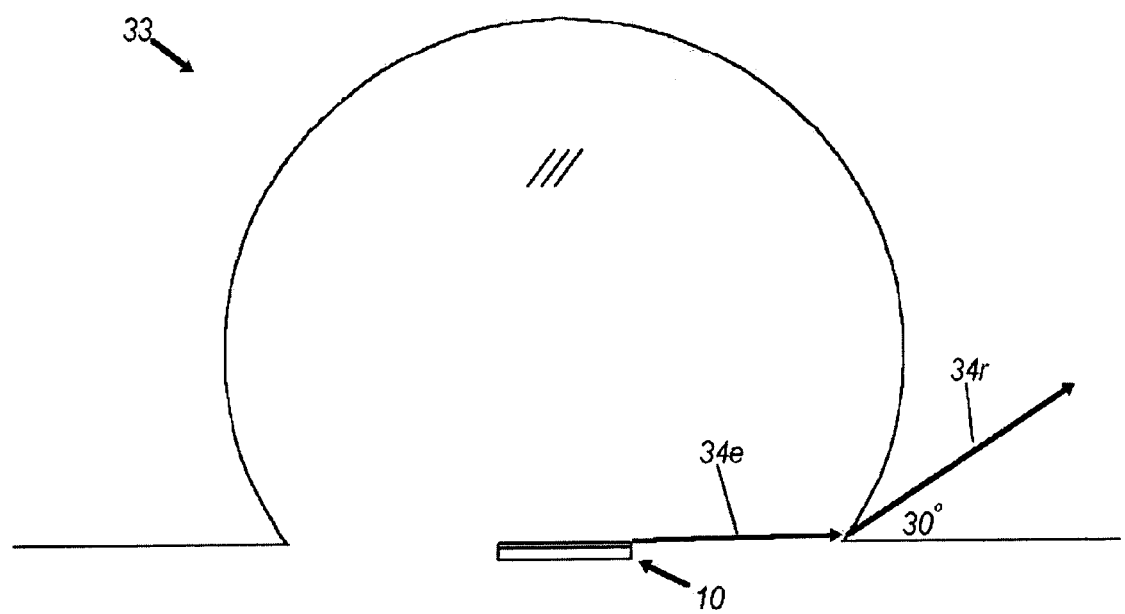
FIG. 3B is a cross-section of a thin-film LED immersed in a ball lens.

FIG. 3B is a cross-sectional view of an LED 10 immersed in a ball lens 33. Near-horizontal edge ray 34*e* is refracted to external ray 34*r*, representing a 30° deflection. This angular reduction is useful for fast optical systems to gather into a beam. In practice, ball 33 would be glued to transparent substrate 14. Due to its aberrations, such a lens will increase etendue somewhat. It is larger than the hemisphere of FIG. 3A, but its size is similarly determined, as that which just allows all rays emitted by the corner of LED 10 to escape unreflected.

Figure 3C:
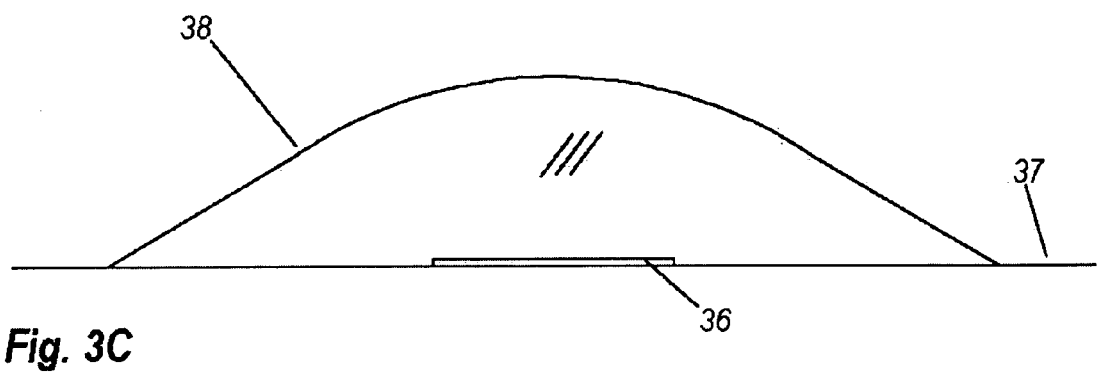
FIG. 3C is a cross-section of a thin-film LED immersed in a glob configuration typical of chip-on-board LEDs.

FIG. 3C is a cross-sectional view of a thin LED 36 on the circuit board 37, immersed in an epoxy glob 38, its untailored shape solely a result of the characteristics of epoxies highly convenient for mass production. It disadvantageously traps some light. This shape, however, is highly consistent in mass production, so that other elements of the optical transformer described herein could be shaped to bond with it.

Figure 4A:
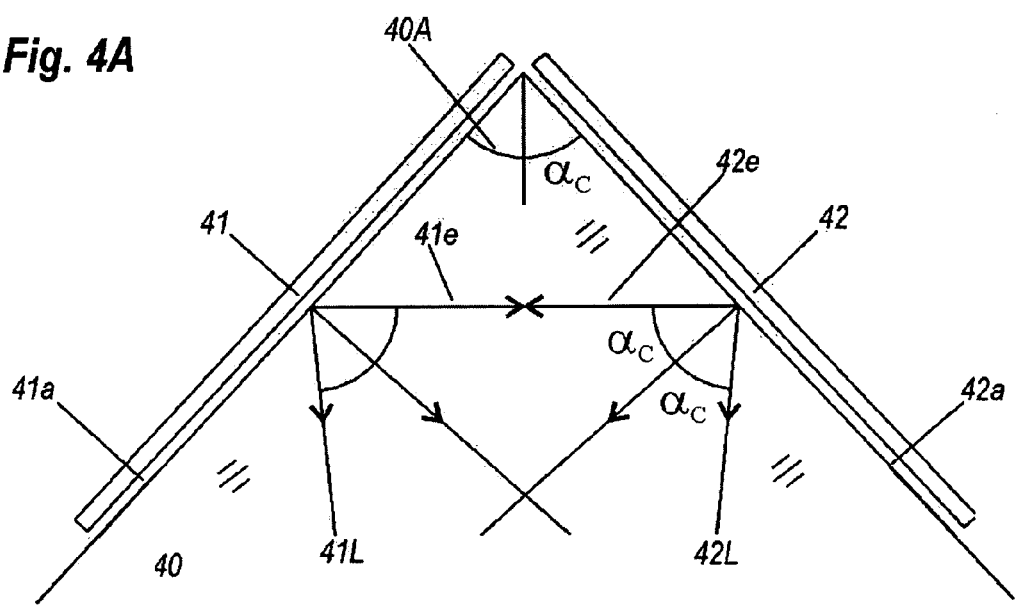
FIG. 4A is a cross-sectional view of two thin-film LEDs and a prism coupler.

FIG. 4A is a cross-sectional view of a prism coupler 40 that has an interior angle adapted to the critical angle $\alpha_C$ of the prism material. Thin LED 41 sends Lambertian emission across airgap 41*a*, wherein it is confined between upper edge ray 41*e* and lower edge ray 41L. Thin LED 42 emits across airgap 42*a* and enters prism 40, wherein its Lambertian emission becomes confined to half-angle $\alpha_C$, between upper edge ray 42*e* and lower edge ray 42L. The purpose of interior angle 40A being $2\alpha_C$ becomes apparent when ray 41*e* is seen to internally reflect off air gap 42, to join ray 42L. Thus the internally reflected light fills the angle space outside the edge rays of the incoming light.

Figure 4B:
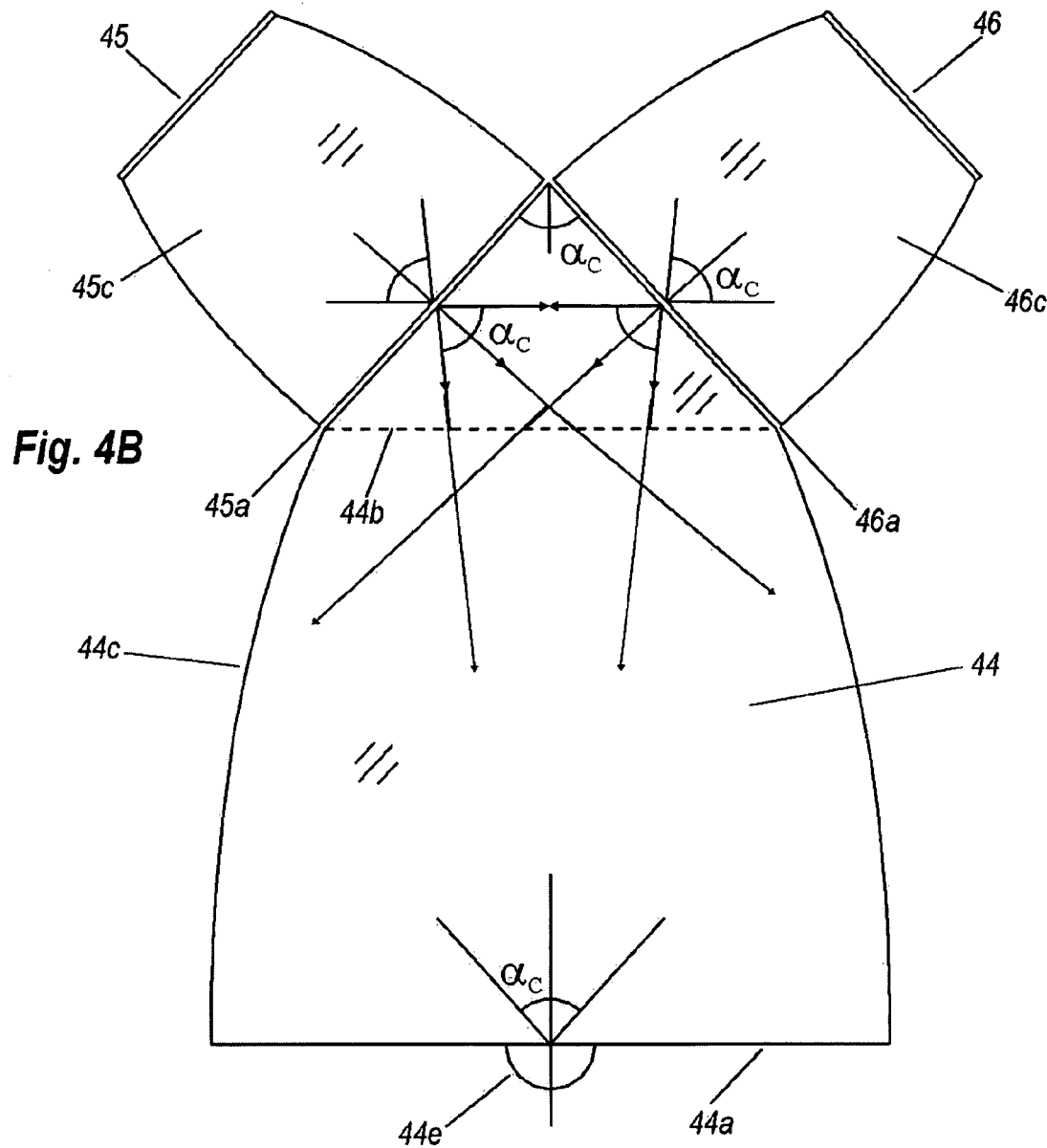
FIG. 4B is a cross-sectional view of an optical manifold 44 that utilizes the prism coupler shown in FIG. 4A, including two thin-film LEDs immersed in smaller CPCs, each with a prism coupler, and a large CPC.

FIG. 4B is a cross-sectional view of an optical manifold 44 that utilizes the prism coupler shown in FIG. 4A. The optical manifold 44 comprises a dielectric CPC 44*c* and a conjoined prism block 44*b*. The thin LED 45 is immersed in a dielectric CPC 45*c*, which is wider at airgap 45*a*, across which it shines Lambertian light into manifold 44, wherein refraction confines it to critical angle $\alpha_C$. A similar approach is used with LED 46, CPC 46*c*, and airgap 46*a*. The prism coupler then receives two inputs of radiation spanning an angle $2\alpha_C$, through 45*a* and 46*a*, and transforms them into a fully Lambertian pattern at 44*b* (about ±90° full angle). A CPC 44*c* expands from its width at block 44*b* to its exit face 44*a*. This enables all the light to exit as Lambertian emission 44*e*, forming a "virtual chip". An exit surface at 44*b* would trap light beyond critical angle $\alpha_C$, hence the use of CPC 44*c*.

FIG. 5 is a cross-section of a reflective optical manifold for two LEDs, 51 and 52, as inputs, respectively having small CPCs 54 and 55 that feed into a single, larger rectangular CPC, 53, for the output. This is a simple way of combining the output of two light-emitting diodes. Reflective optical manifold 50 receives the light output of first LED chip 51 and second LED chip 52. The manifold 50 comprises an upper compound parabolic concentrator (upper CPC) 53 and lower compound parabolic concentrators (lower CPC) 54 and 55, which receive the light of chips 51 and 52, respectively. Dividing line 50*d* delineates the input plane of CPC 53 as well as the output planes of CPCs 54 and 55. Output opening 56 emits the combined output of the two LEDs into about ±90°.

The operation of CPC 54 is shown by edge ray 57, which is the reflection by surface normal 58 of nearly horizontal rays from chip 51. After reflection at line 50*d*, the edge ray 57 proceeds to the edge of output opening 58, represented by a dotted exit-line, whereupon it is reflected back to horizontal, unfortunately somewhat obscuring said dotted line.

Further embodiments of the optical transformer described herein are possible by using the clustering principle of FIG. 5, which is built on the reflector of FIG. 1A. A series of drawings in FIGS. 6A to 6I depict further embodiments of clustering.

Figure 6A:
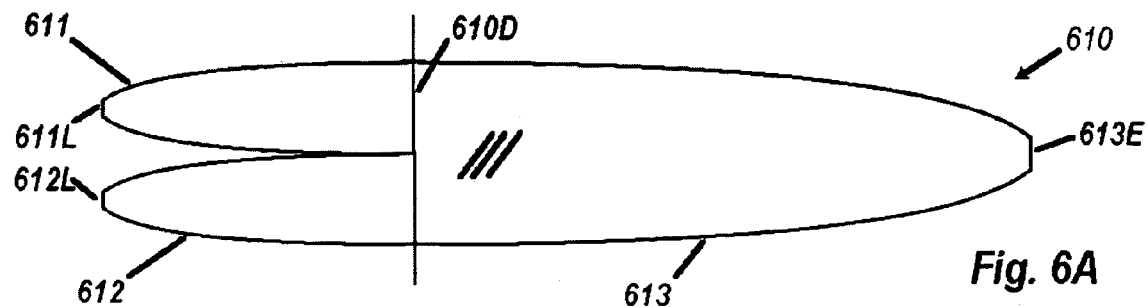
FIG. 6A is a cross-section of a 2:1 dielectric optical coupler.

FIG. 6A is a cross-section of optical manifold 610, based on dielectric CPCs such as that in FIG. 2. Manifold 610 comprises input CPCs 611 and 612 and output CPC 613. LEDs are mounted at entry ports 611L and 612L, and their combined output is formed at exit port 613E. Dividing line 610D is the boundary between input and output CPCs. The reversibility of light shows that there could be a large LED shining into port 613E, causing light to be emitted at ports 611L and 612L.

Figure 6B:
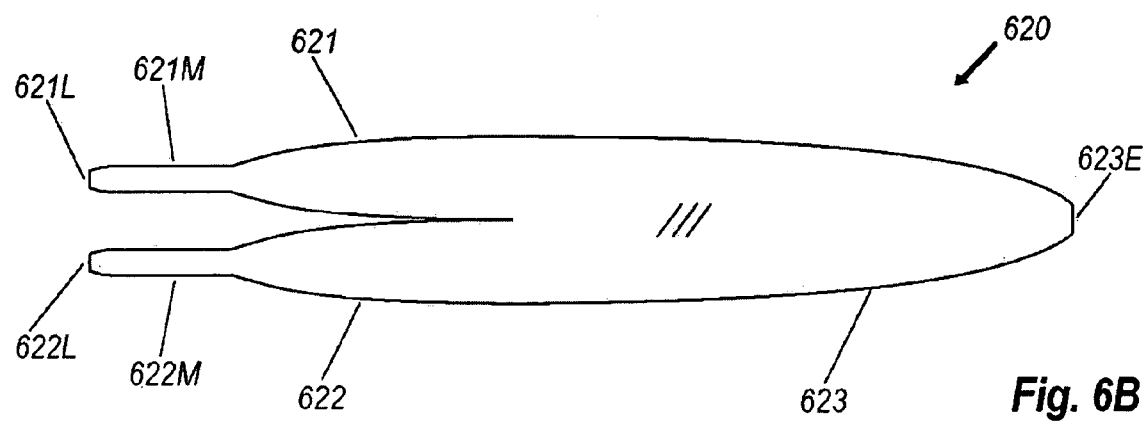
FIG. 6B is a cross-section of a dielectric coupler similar to FIG. 6A, also including mixing rods.

FIG. 6B is a cross-section of optical manifold 620, comprising input dielectric CPCs 621 and 622 and larger output CPC 623. Input CPC 621 also comprises mixing rod 621M, just inward from source 621L, having the minimum width possible for guided light. This helps erase non-uniformities in source 621L, to ensure uniform luminance for exit port 623E.

Figure 6C:
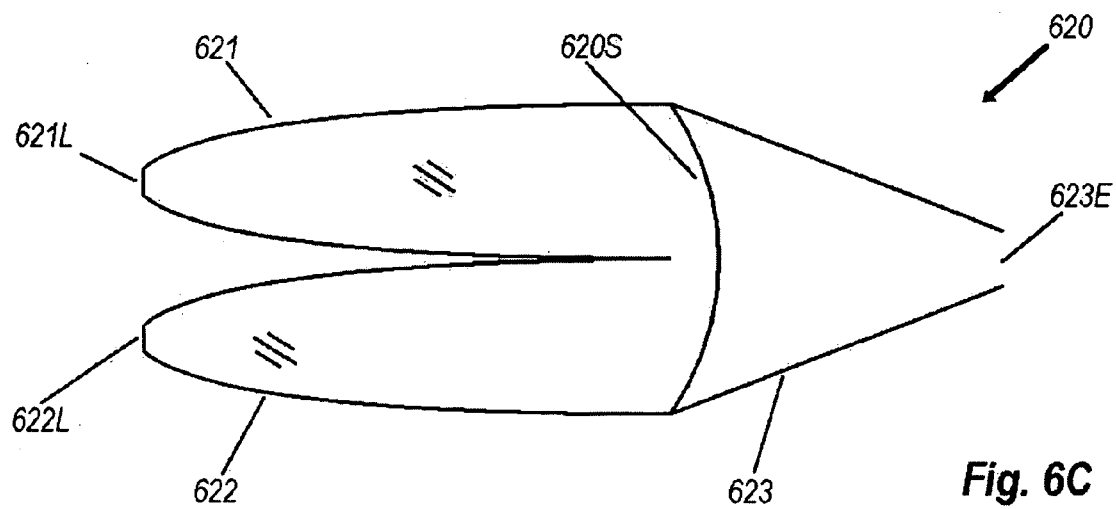
FIG. 6C is a cross-section of a hybrid optical manifold with CPC inputs and a cone with angularly restricted output in air.

FIG. 6C is a cross-section of one embodiment of the optical manifold 620, comprising dielectric-CPC input manifolds 621 and 622, and tailored mirror 623, acting in conjunction with a lens surface 620S to produce etendue-limited output in air at exit 623E.

Figure 6D:
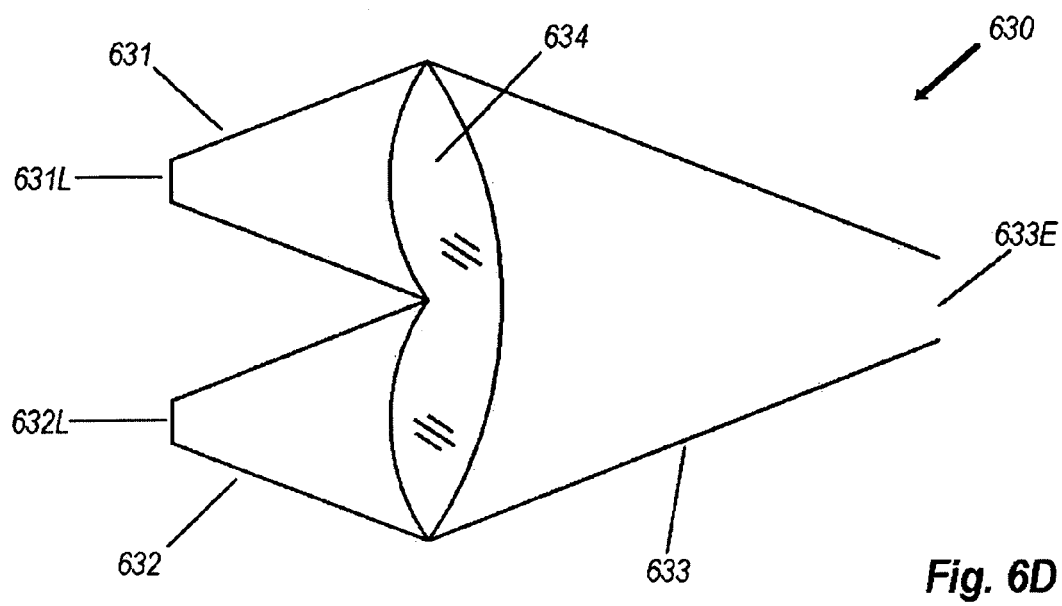
FIG. 6D is a cross-section of an optical manifold comprising cones or tailored mirrors and a multiplex lens.

FIG. 6D is a cross-section of another embodiment of the optical manifold 630, comprising reflective input cones 631 and 632, an output cone 633, and a lens 634. The light from LEDs 631L and 632L are combined at output port 633E.

Figure 6E:
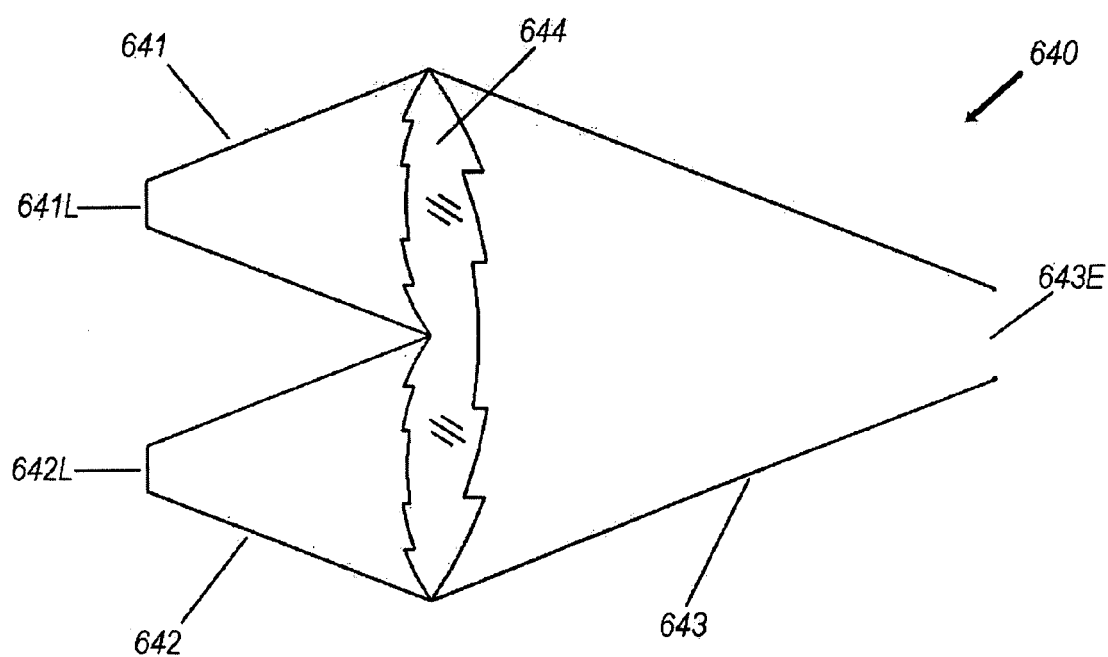
FIG. 6E is a cross-section of a configuration similar to FIG. 6E, but utilizing a multiplex Fresnel lens.

FIG. 6E is a cross-section of still another embodiment of the optical manifold 640, comprising reflective input mirrors 641 and 642, an output mirror 643, and a Fresnel lens 644. The light from LEDs 641L and 642L are combined at an output port 643E. The thickness of the Fresnel lens 644 is exaggerated for clarity and in actual practice could be even thinner.

Figure 6F:
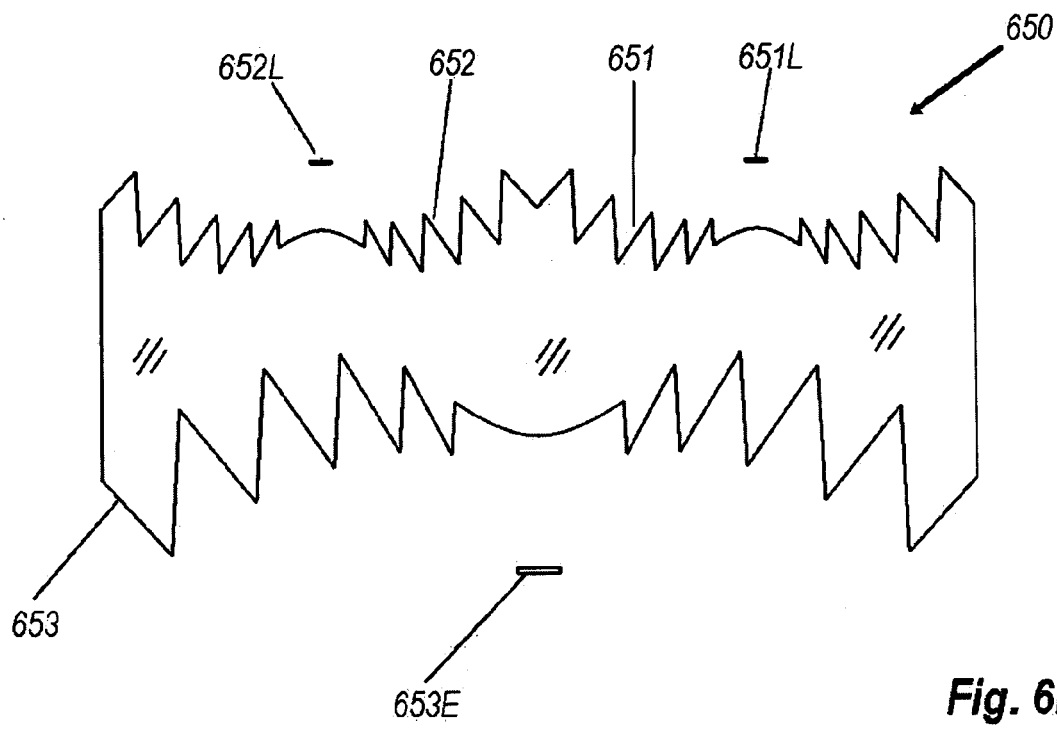
FIG. 6F is a cross-section of an optical coupler comprising a multiplex TIR lens.

FIG. 6F is a cross-section of still another embodiment of the optical manifold 650 comprising input TIR lenses 651 and 652 and an output TIR lens 653. Input LEDs 651L and 652L have their outputs combined at focal zone 653E. The cross-sections of FIG. 6A-6E can be realized in either rectangular or circular symmetry. TIR lenses, however, are inherently circularly symmetric, requiring some trimming for them to tessellate into arrays.

Figure 6G:
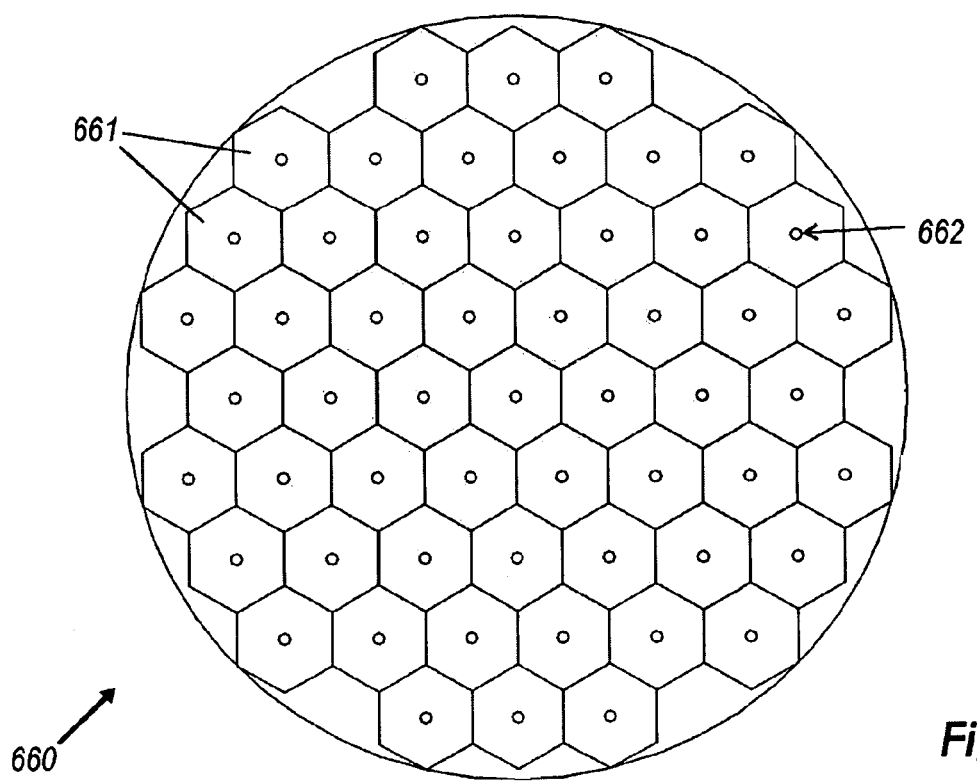
FIG. 6G is a face-on view of a hexagonally tiled optical manifold utilizing a plurality (e.g., 55) of circularly symmetric lenses, which can be implemented with any of the lenses shown in FIGS. 6A-6F, for example.

FIG. 6G is a plan view of a multiplex lens 660, comprising 55 hexagonally trimmed circularly symmetric input means, as exemplified by FIGS. 6A-6F. Each lens 661 focuses on an LED 662.

Figure 6H:
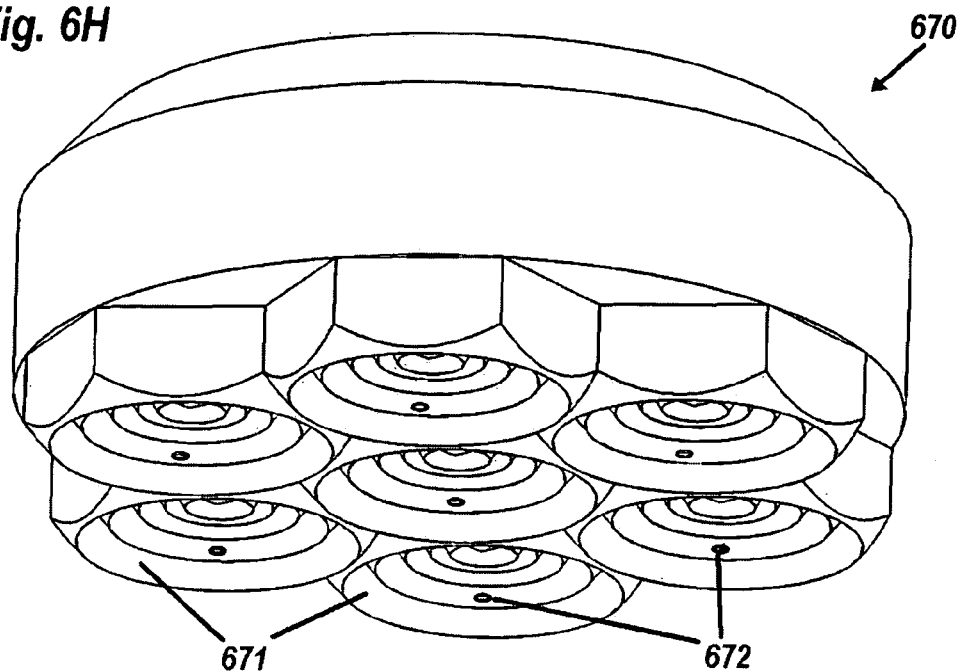
FIG. 6H is a perspective view of the input side of a multiplex TIR lens.

FIG. 6H is a perspective view from the input side of optical manifold 670, comprising 7 circular TIR lenses 671, each centered on LED 672 and receiving its light.

Figure 6I:
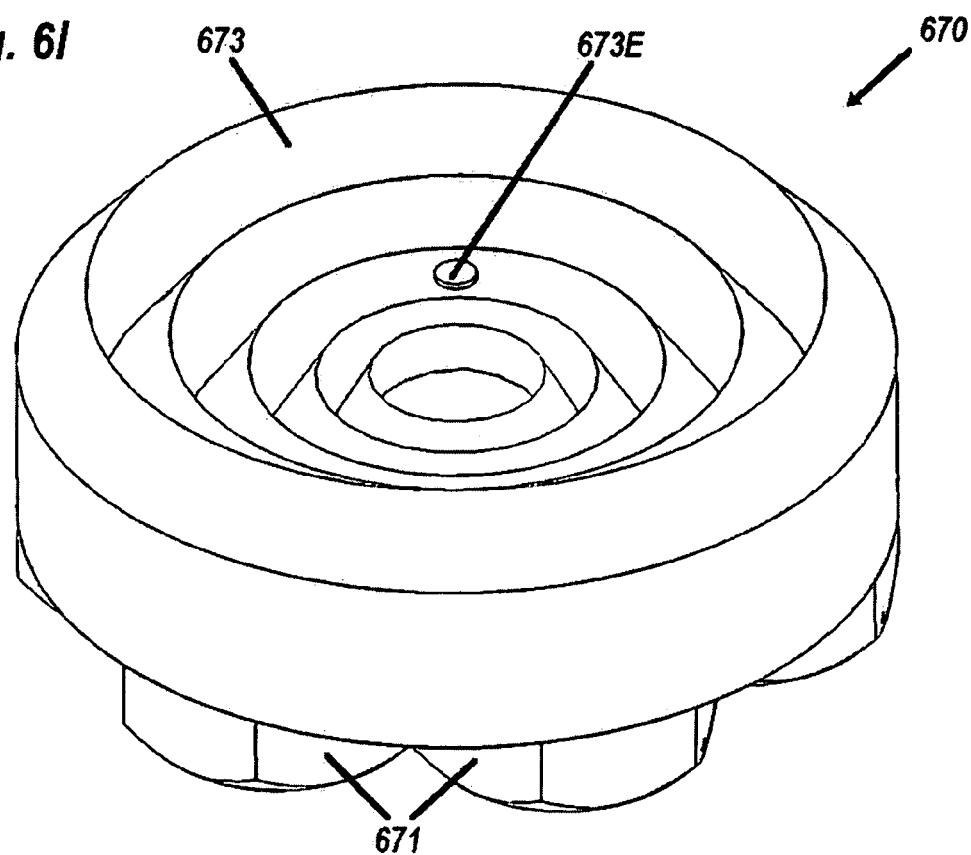
FIG. 6I is a perspective view of the output side of the multiplex TIR lens of FIG. 6H.

FIG. 6I is a perspective view of the optical manifold 670 of FIG. 6H from the other side, showing output TIR lens 673 and exit zone 673E.

Many other combinations of the aforementioned components can be formulated once the principles of this invention are understood. For example, the large output dielectric CPC 610 in FIG. 6A can be replaced by the large trimmed TIR lens 653 of FIG. 6F. In this instance the output image is formed in air. This later configuration has an advantage in that the overall optical system is shorter in length and in some instances the TIR Lens may be easier and less expensive to mold than a long CPC or cross-CPC.

In all the above configurations the parts can either be molded as separate pieces and bonded together or be molded as one piece.

So far the embodiments of optical manifolds shown have utilized thin, generally flat LEDs as input sources, and many depend upon placing a flat input of the optical manifold close to the flat emitting chip. Among the embodiments shown in FIGS. 4 through 6, a domed LED such as depicted in FIG. 3A, could be used as input only by the TIR lens of FIGS. 6F through 6I. For some other manifold configurations, it is necessary to extract the luminance from the dome and image it in air, where of course it will appear to be n times bigger in dimension, in the case of chip immersion in refractive index n.

FIG. 7A is a side view of an etendue-limited flux-transfer from a domed LED into an image in air. FIG. 7A shows a high-power LED package 700, comprising a base 701, an emitting chip 702, and a transparent dome 703. A solid-dielectric dual lens 710 comprises a lower lens 711 and an identical upper lens 712, oppositely oriented and joined along line 710D, both lenses being circularly symmetric about axis 710A. The lower lens 711 comprises a central hyperbolic lens 711h and a surrounding generalized-Cartesian-oval reflector 711t, which collimates light coming through central cylinder 711c. Hyperbolic lens 711h acts as an inlet, being focused on the center of LED chip 702. Upper lens 712 comprises central hyperbolic lens 712h and surrounding totally internally reflecting surface 712t. Light converges with ±90° on chip image 710E, from which another optical manifold could receive input light. Exemplary chief ray 715 has polar angle $\beta$ from chip 702 and equal polar angle $\beta'$ at image 710E. When such a lens is precisely made and positioned, the etendue of image 710E does not increase much over that of the source, and source-luminance inhomogeneities are washed out, in that points on the image receive light from many points on the source. This non-imaging action is done by the mirror-inversion action of profiles 711t and 712t, which act like Dove prisms to rotationally smear the light that they totally internally reflect.

FIG. 7B is a side view of an alternative etendue-limited flux-transfer from a domed LED into an image in air. FIG. 7B shows a cross-section of a 2-facet dual TIR lens 720, mounted on an LED package 700. A lower TIR lens 721 surrounds the dome 703 and collimates the light of chip 702, sending it across dividing plane 720d into the upper TIR lens 722, which in turn focuses it onto exit image 720E. The lens 720 is circularly symmetric about axis 720A of the LED package 700. An exemplary chief ray 725 subtends equal angles $\beta$ and $\beta'$ with axis 720A. The optical accuracy of the manufacturing of this preferred embodiment must be high for image 720E to have little more etendue than chip 702. There will be an increase in area of image 720E from that of chip 202, which is proportional to the square of the index of refraction of the material of dome 703 in which LED 702 is embedded.

FIG. 7C is a side view of SMS-designed RIIR lens 730, rotationally symmetric about a central axis 730a, with an equatorial plane 730d dividing it into a lower lens 731 and an upper lens 732. The central lens 731c collects upward going light from LED chip 702 and collimates it into the central lens 732c, which in turn focuses it onto exit image 730e. Surrounding the central lens 731c is a bell-shaped surface 731e, shaped to distribute light from the chip 702 over the totally internally reflecting surface 732r, which collimates it onto the lower totally internally reflecting surface 731r, thereupon converging upon bell-shaped surface 732e, which focuses it upon exit image 730e. Exemplary chief ray 725 exits the center of chip 702 at polar angle $\beta$ to be refracted [R] at the entry surface 731e, internally reflected [I] at upper surface 732r, internally reflected [I] at lower surface 731r, and finally refracted [R] through the exit surface 732e, hence lens 730 is an RIIR lens. The continuity of the surfaces of lens 730 means that square LED chip 702 will have a square image at 730E, with very little etendue increase. This is because all RIIR light paths, such as 725 and 726, have equivalent optical path lengths, assuring accurate definition of the boundary of image 730e, even though it is in air and thus n times bigger dimensionally than chip 702 (using the refractive index surrounding the chip.) Because lens 730 is non-imaging, luminance inhomogeneities of chip 702 are smeared out. This lens is also more compact than those of FIGS. 7A and 7B, and thus the embodiment shown in FIG. 7C may be more preferable for some purposes than those of FIGS. 7A and 7B.

Additional embodiments are shown in FIGS. 7D and 7E, but with a feature to be discussed below with reference to FIG. 11, namely a blue-pass dichroic filter for recycling phosphor emission, located congruent with equatorial planes 710D, 720d, and 730d, respectively in FIGS. 7A, 7B, and 7C. FIG. 7D is a cross-sectional view through dual-lens system 740. The LED package 700 comprises the base 701, the blue-emitting chip 702 (also shown in plan view at right), and the gel-filled dome 703. Optically coupled to dome 703 is a lens 741 of refractive index about 1.5. Optically coupled to it in turn is a silicone lens 742, of a refractive index 1.34. In the equatorial plane of lens-system 740 is a blue-pass dichroic filter 743, the recycling purpose of which is discussed below in FIG. 11. Atop it is a silicone lens 744, with form substantially identical to that of lower silicone lens 742. An uppermost lens 745 is identical in form to lower lens 741, except for the addition of dome 745d, within which is immersed a remote phosphor 746 (also shown in plane view at right). Silicone lenses 742 and 744 can be seen acting in concert to direct ray 747 by total internal reflection within lenses 741 and 745, respectively. Ray 748 is emitted at angle $\beta$ from centerline 749, and strikes phosphor 746 at equal angle $\beta'$.

FIG. 7E is a side view through a dual-lens system 750, similar in function to that of FIG. 7D, with a similar LED. The gel-filled dome 703 is optically bonded to lower lens 751, comprising internally reflecting an outer profile 751t, an inner collimating lens 751c, and an optically inactive cylindrical wall 751w. Blue-pass dichroic filter 753 is in the equatorial plane of system 750. An inverted upper lens 755 is identical in form to lower lens 751, but with the addition of dome 755d, in which phosphor 756 is immersed. Phosphor 756 is also shown to the right in plan view, as is the blue-emitting chip 702. The ray 758 is emitted at angle $\beta$ with respect to a central symmetry axis 759, and strikes phosphor 756 with equal incidence angle $\beta'$.

Figure 7F:
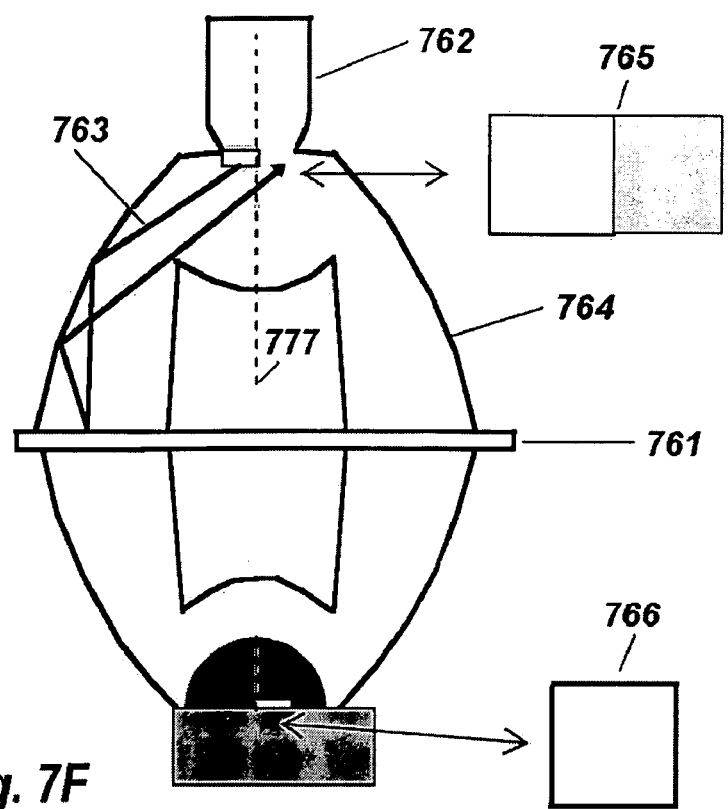
FIG. 7F is a side view of another dual collimating lens with dichroic filter, including an off-axis LED and an off-axis phosphor system.

FIG. 7F is a side view through a dual-lens system 760, which is similar to the dual lens shown in FIG. 7E. In this embodiment an LED 766 is displaced off to the side of a device axis 777 so that one edge of the LED 766 is on axis 777. The phosphor layer 765 is located at the imaged focal position of lens 760 but on the opposite side of device axis 777 from that of LED 766. The dual lens 764 sharply images LED 766 onto the phosphor layer 765, whereupon some rays are directed into solid dielectric optic 762, and others are backscattered to filter 761. The filter 761 redirects and images all backscattered rays onto imaged focal position at the same height as phosphor layer 765, but on the opposite side of the axis of the device. These rays are directed into solid dielectric optic 762, whereupon they are directed from the device in a pattern. The final optic 762 will mix the bluish white and the yellow colors coming out of 765 into a uniform white color. Ray 763 illustrates the key principle associated with this embodiment. The dual lens 764 is designed through application of the SMS design methods. This device theoretically has a lower potential luminance than the embodiment in FIG. 7E as the virtual area of the source is larger. However, it has an advantage over the approach employed in FIG. 7E in that there is only a single re-cycling of the back-scattered rays before it can exit the device.

Figure 7G:
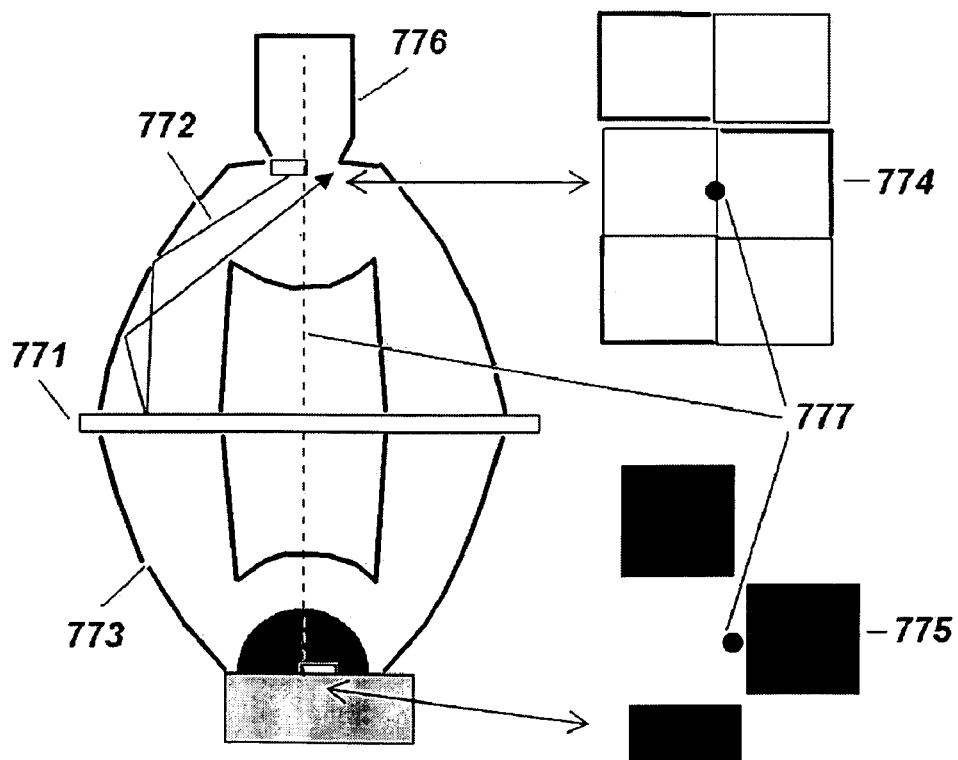
FIG. 7G is a side view of another dual collimating lens with dichroic filter, including an off-axis LED triad array and an off-axis phosphor triad array system.

FIG. 7G is a similar optical system to the one described in FIG. 7F. In this embodiment the single LED and single phosphor target is replaced with a triad of LEDs 775 and a triad phosphor target 774. The principle and operation of the device is similar to the device shown in FIG. 7F. The dual lens 773 sharply images LEDs 775 onto the phosphor targets 774, whereupon some rays are directed into solid dielectric optic 776, and other rays 772 are backscattered to filter 771. The filter 771 redirects and images backscattered rays onto spaces opposite the phosphor targets 774.

Figure 7H:
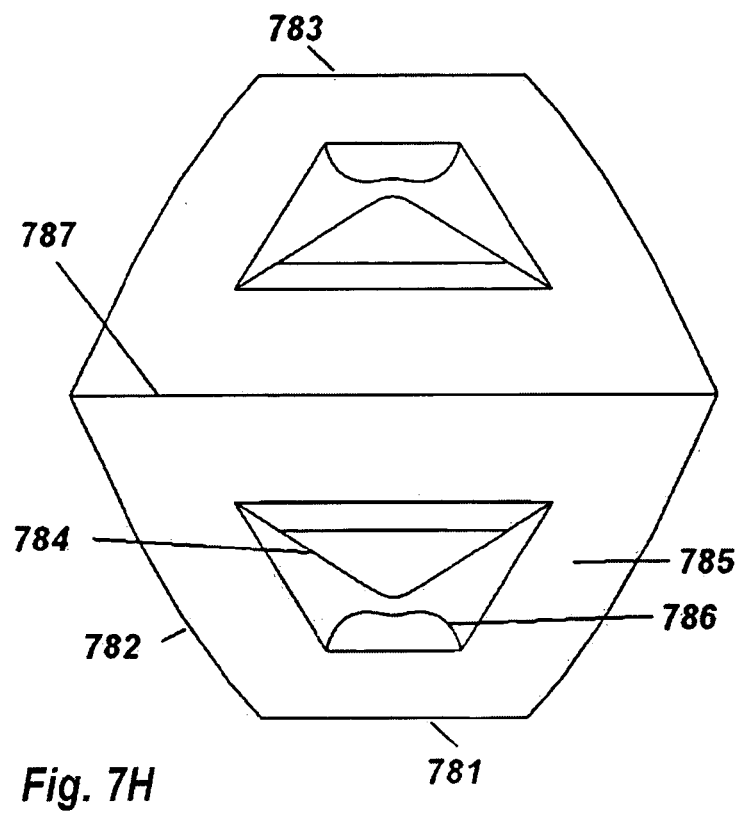
FIG. 7H is a side view of another dual collimating lens for use with an off-axis LED and phosphor system.

FIG. 7H shows an embodiment that uses the same principle of single recirculation as the embodiments shown in FIGS. 7F and 7G but with a slightly different optical architecture. In this approach, a filter 787 is embedded on its entire face by the bottom and top halves of an optic 782. Each half of the optic 782 has an outer solid dielectric TIR element 785, and an inner pair of refractive lenses 786 and 784 with an air gap between them. These optical features together provide controlled offset imaging of the LED die onto the phosphor for either a single LED/phosphor pair or an array of die and phosphor. Interface 783 can have a secondary dielectric optic attached to it such as 762 of FIG. 7F, to extract the direct and recycled rays.

Figure 7I:
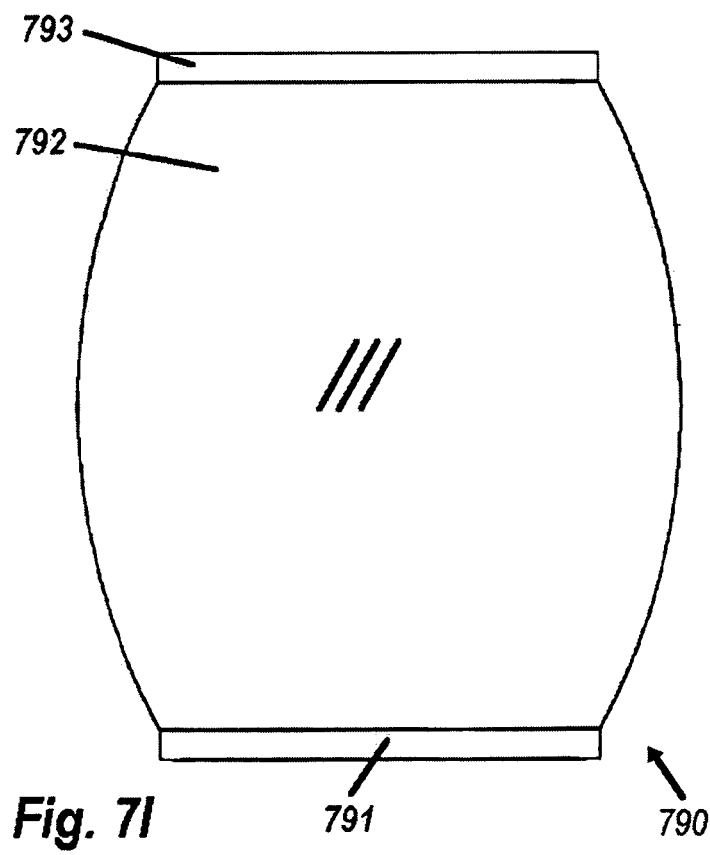
FIG. 7I is a cross-sectional view of a cross-CEC with a remote phosphor.

FIG. 7I is a cross-section of a remote phosphor system 790, comprising LED chip 791, a high-index compound elliptical concentrator (CEC) 792, and a high-index phosphor layer 793. For a square or rectangular LED, one embodiment is a cross-CEC. The latest high-index (2.4-2.8) phosphor is zinc-selenide-sulfide, available from the Phosphor-Tech Corporation as an electrophoretic deposition capable of high packing density, with index controlled by the selenium-sulfur ratio. A further high-index CPC could function atop layer 793 similarly to CPC 2002 of FIG. 2C. This embodiment includes a specular reflector at the rear of LED 791, preferably of silver or the hybrid silver/ITO omni-directional reflector described in U.S. Pat. No. 6,784,462 which is incorporated herein by reference in its entirety. This will reflect the phosphor's rearward emission with good efficiency, helping to nearly double its front-side luminance.

FIGS. 1A through 2D concern the gathering of light for the optical transformer described herein. They show two-dimensional profiles acting on rays running in the plane of the Figures. In some practical embodiments a 3-dimensional system is formed by extruding such a profile orthogonally to its plane. The thickness of this extrusion distance is typically equal or slightly larger than the width of the square chip. This will result in losses in the extrusion direction of rays not in the plane of the profile being extruded. Instead, a two-way cross-CPC can be used, with the same profile used in orthogonal directions. Examples of this are shown in FIGS. 8A, 8B, 9A, 10A and 10B. Critical to high system efficiency is the use of a transparent material with suitably low absorptance, because of the multi-pass nature of the passage of light within these embodiments. For example, polycarbonate, a routinely employed injection-molded plastic, has so much absorption that these embodiments will have serious losses, whereas acrylic does not.

Figure 8A:
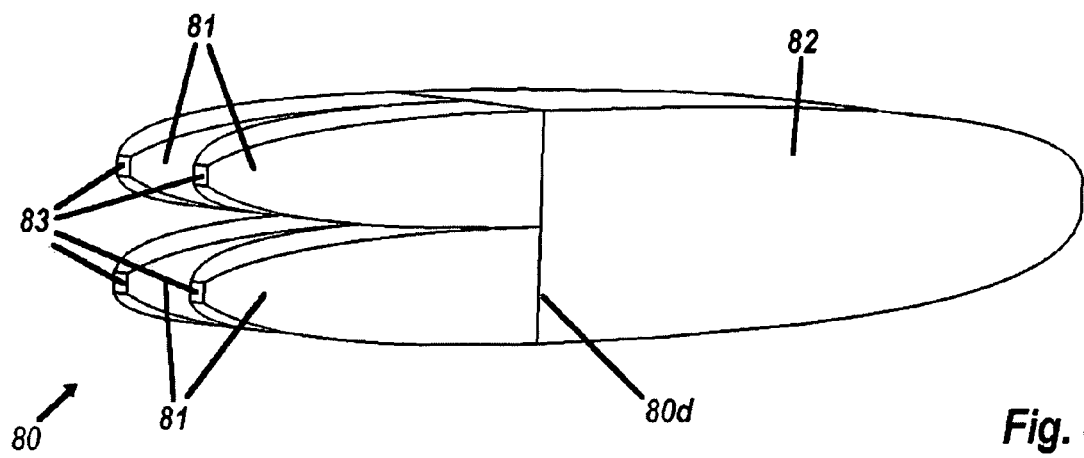
FIG. 8A is a side view of an optical manifold comprising a plurality of square CPCs arranged in a 2×2:1 configuration.

FIG. 8A is a perspective view of optical manifold 80, a dielectric-filled 2×2:1 multi-CPC embodiment. It comprises four input cross-CPCs 81 and output cross-CPC 82, all square in cross-section, as seen with dividing line 80*d*. The cross-section of each of these four cross-CPCs 81 is similar to that of FIG. 2B, so that immersed LEDs 83 will have all their light sent across plane 80*d* into cross-CPC 82.

Figure 8B:
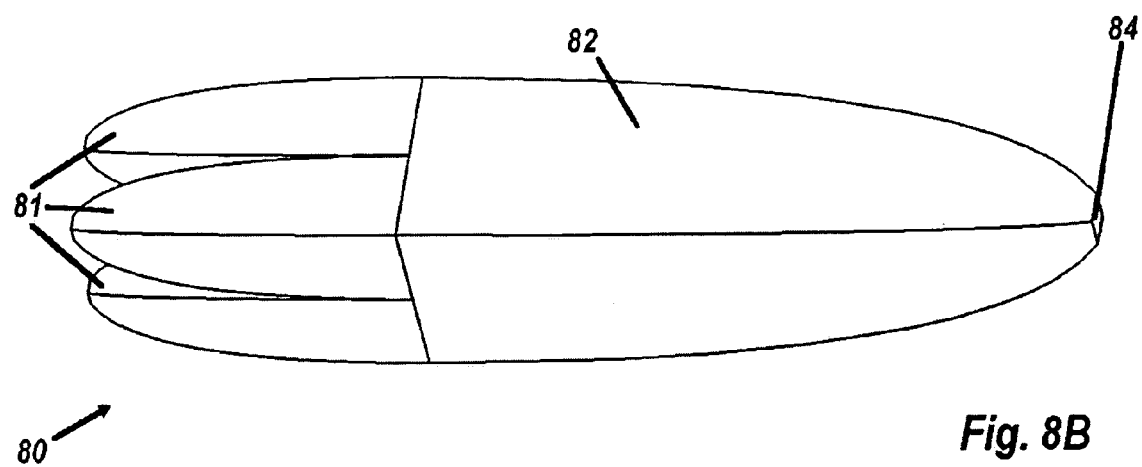
FIG. 8B is an end view of an optical manifold comprising square CPCs in a 2×2:1 configuration.

FIG. 8B is another perspective view of optical manifold 80, also showing exit surface 84, which must connect to another device of similar refractive index, else some of the concentrated light will be returned by internal reflection. It is possible to join manifold 80 with some of the embodiments to be shown below.

Figure 9A:
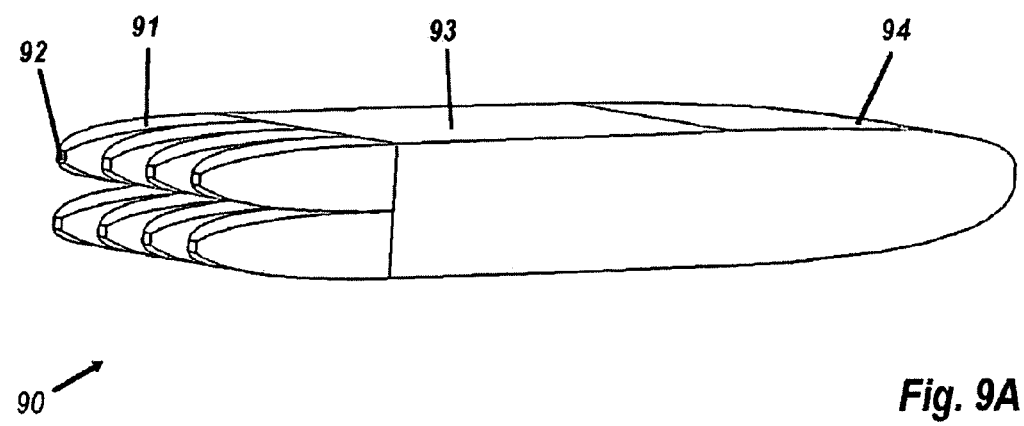
FIG. 9A is a side view of a 2×4:1 optical manifold for eight LEDs and a 2:1 rectangular output, also comprising a mixing rod.

FIG. 9A is perspective view of a 2×4:1 optical manifold 90, comprising a plurality of input cross-CPCs 91 that receive light from a corresponding plurality of immersed LEDs 92, a rectangular mixing section 93 that receives the light from the plurality of cross-CPCs 91, and a rectangular output cross-CPC 94 that receives light from the rectangular mixing section.

Figure 9B:
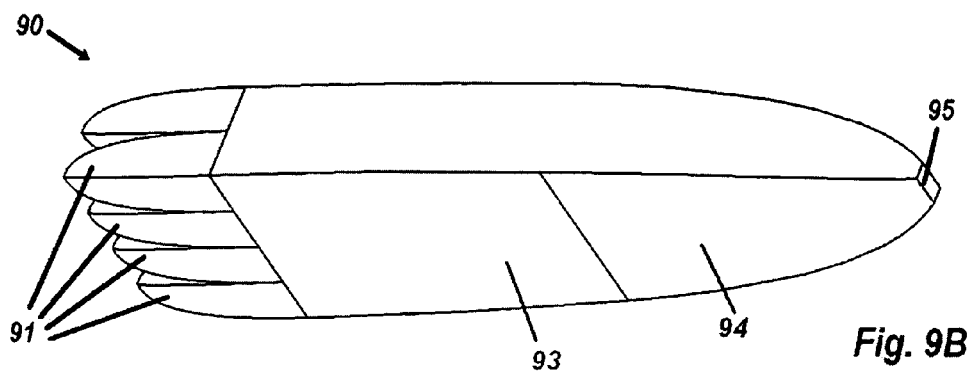
FIG. 9B is another side view of a 2×4:1 optical manifold for eight LEDs and a 2:1 rectangular output, also comprising a mixing rod.

FIG. 9B is another perspective view of the manifold 90 shown in FIG. 9A, also including an approximately rectangular output surface 95 from the output cross-CPC 94. The geometry of the mixing section 93 is detailed in FIG. 68B.

Regarding these and other multi-port embodiments of the optical transformer described herein, the high-index CPC arrangement of FIG. 2C could be implemented with a silicone layer 2004 expanded to comprise multiple indentations to form multiple molds for high-index CPCs to go over plurality of LEDs. The sol-gel process of high-index casting can thus accommodate many different embodiments of the optical transformer described herein.

Figure 10A:
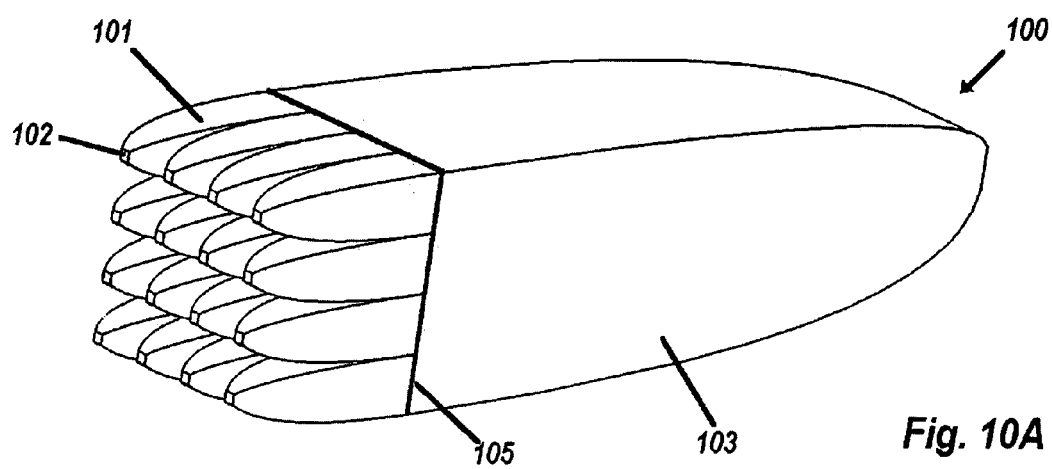
FIG. 10A is a perspective view from the input side of a 4×4 optical manifold that feeds the output of sixteen blue LEDs through a blue-pass filter.

FIG. 10A is a perspective view of a 4×4:1 optical manifold 100, comprising a plurality of (in this embodiment sixteen) square dielectric input cross-CPCs 101, a corresponding plurality of immersed LEDs 102 connected respectively to the cross-CPCs, and an approximately square output dielectric cross-CPC 103 coupled to collectively receive the light output from each of the cross-CPCs. Also shown is an immersed square filter 105, installed for the case of blue LEDs 102. In some embodiments, square filter 105 would be a blue-pass reflector applied across the input face of output CPC 103, then optically joined to the array of input cross-CPCs 101. Such a blue-pass reflector can be constructed in several ways well known to those skilled in this art, such as deposition of thin film multi-layer dielectric or other materials onto a suitable substrate, and through single or multi-layer reflection or transmission holographic coatings. In a 1981 publication (Miles, Webb, and Griffith, "Hemispheric-field-of-view, nonimaging narrow-band spectral filter", *Optics Letters*, Vol. 6 #12 pp. 616-618 (December 1981) two hollow reflective CPCs are used face-to-face to collimate light into a narrow-band spectral filter and then condense the filtered light. Embodiments of the optical transformer described herein, in contrast, utilize a dielectric CPC instead of a hollow CPC. Another difference is using a short-pass filter or band-pass filter by which short wavelengths are transmitted and long wavelengths are reflected (rather than a narrow-band filter). For many applications, a band-pass filter with a lower cutoff below the working range of frequencies may be treated as equivalent to a short-pass filter. The embodiment of FIG. 10A has a plurality of input CPCs rather than a single CPC. As shown in FIG. 10C, the condenser CPC, 103, has a phosphor target, 106. Condenser CPC 103 combines and homogenizes the input from sixteen LEDs onto a single exit surface on which phosphor target 106 resides. A novelty of the embodiment of FIG. 10A, also not disclosed in Miles et al., is the function of filter 105, to reflect the back emission of phosphor 105, as shown in FIG. 10D. This is the recycling principle of certain embodiments of optical transformer described herein, which is believed to be a novelty.

Figure 10B:
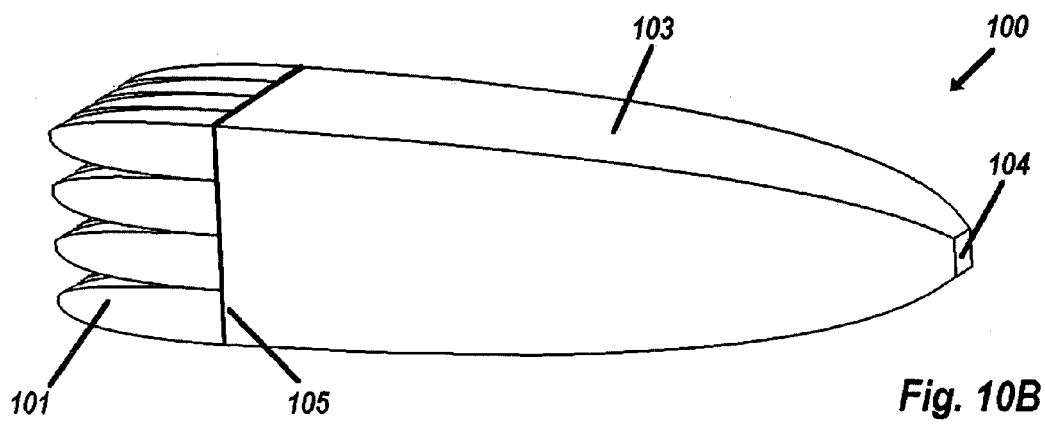
FIG. 10B is a perspective view of the manifold of FIG. 10A from the output side, where the blue-passed light is condensed onto a patch of highly uniform phosphor.
Figure 10C:
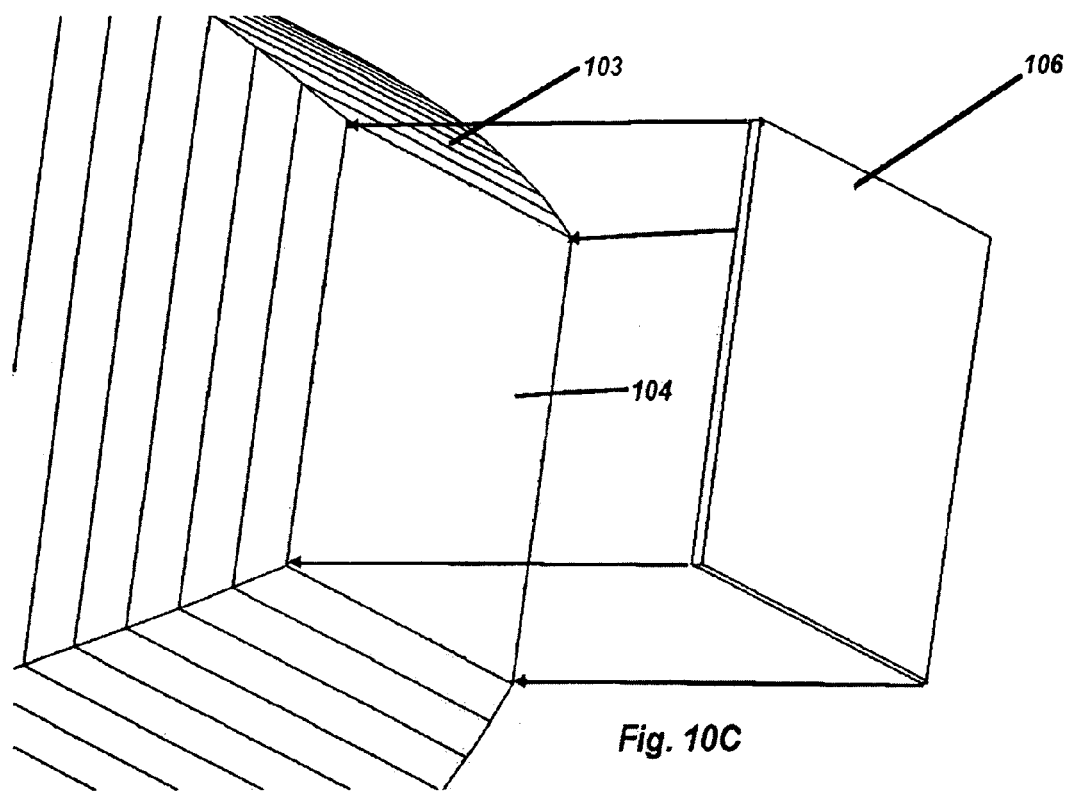
FIG. 10C is a close-up exploded perspective view of the phosphor, a monolithic ceramic, optically bonded to the CPC.
Figure 10D:
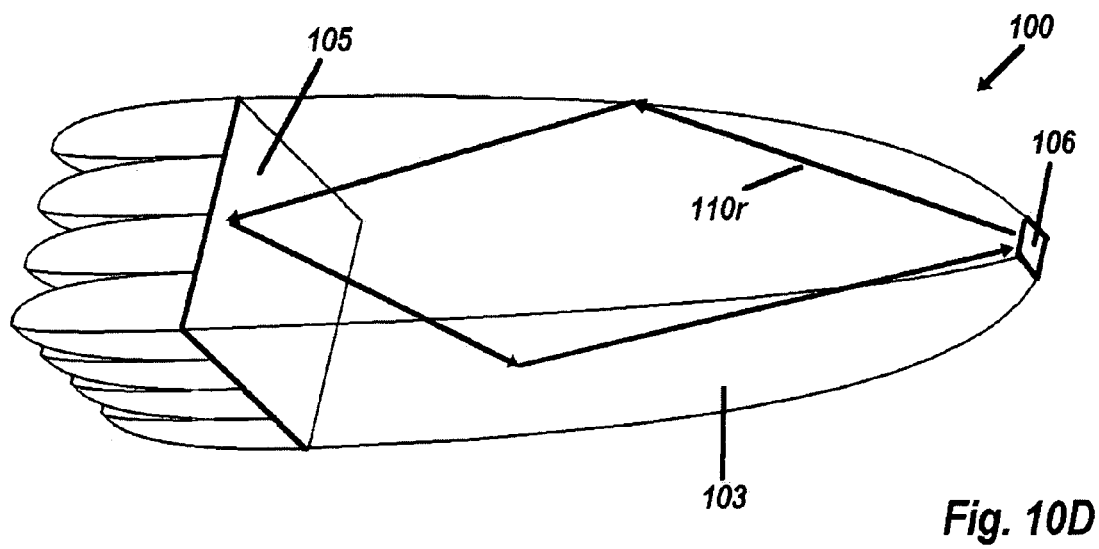
FIG. 10D is a ray trace in a perspective view of the optical manifold of FIG. 10A, showing how the phosphor's light output is returned by the filter, greatly increasing phosphor efficiency and luminance.

FIG. 10B is another perspective view of the optical manifold 100 shown in FIG. 10A, and in addition comprising an approximately rectangular exit face 104.

FIG. 10C is a close-up view of exit CPC 103 at exit face 104, showing thin phosphor layer 106 exploded away from its actual position installed on 104. The phosphor layer receives the entirety of the immersed Lambertian optical output of cross-CPC 103. The advantageously uniform summation of light from blue LEDs 102 suffers no uniformity lost due to fluctuations or malfunction of any one LED. Advantageously, no wavelength binning of individual LEDs is required, so that quality control suffices that keeps constant the average center wavelength of any of the plurality of LEDs.

The optical manifold shown in FIGS. 10A, 10B and 10C makes possible further advantages that flow from the phosphor configuration shown in FIG. 10C and that are not obtained with phosphor layers conventionally applied to individual blue chips. In a conventional white LED, the blue chip receives a drop of a slurry of powdered phosphor in a semi-fluid binder. The drop dries (or is UV-cured) after being deposited on the blue chip during manufacturing. The disadvantages of the conventional approach are numerous. First, the deposition of a thin, controlled-thickness conformal layer of phosphor is extremely difficult to achieve onto the surface of a 1-mm high-powered LED emitter, which is believed to be a consequence of the materials used in the manufacture of the LED, the small size of its deposition surface and the fact that many of the techniques available for depositing a constant thickness layer on the emitting surface could possibly damage the LED. Secondly, the phosphor layer is subject to high heat conditions because it is proximate to the LED, which can lead to accelerated thermal degradation of the coating or to physical damage to the phosphor/LED interface by forces arising from mismatched thermal expansion. The phosphor spectral emission curve, discussed in connection with FIGS. 11A, 11B and 11C below, shifts to longer wavelengths as temperature increases, resulting in an undesirable temperature dependence of LED color. There are other problems with this technology that are known to those who are skilled in the art, including the above-discussed difficulties in control of color temperature.

Instead, FIG. 10C shows how the optical transformer described herein directly utilizes the phosphor after it is baked into a ceramic, as a large thin sheet of uniform thickness, such as 25-60 microns. A conveniently large piece could then be laser-scored or otherwise cleaved into pieces the size of layer 106, for example, in the range of 4-6 millimeter on a side. Larger pieces of phosphor of the same thickness could of course be used in larger optical manifolds for greater white-light luminosity. This method offers high uniformity in both luminance and color temperature, due to the much greater control of phosphor thickness and the lack of thermal cycling.

FIG. 10D is ray tracing within the optical manifold 100 of FIGS. 10A, 10B, and 10C, illustrating the function of blue-pass filter layer 105, which is installed across the input face of output cross-CPC 103. Blue light from LEDs 102 passes through blue-pass filter layer 105 and reaches phosphor layer 106. Phosphor layer 106 emits an exemplary yellowish Lambertian-distributed ray 110r. The reversibility of optics means that cross-CPC 103 will compress the full angular range of the Lambertian emission, with representative ray 110r, of the interior side of phosphor layer 106. When this yellowish emission reflects off of blue-pass filter 105, its narrow angle causes it to be returned to phosphor 106. That is, large CPC 103 reduces the off-axis angles of all rays to under 10°. These returned rays will be scattered within phosphor layer 106 but not absorbed, and will instead have another 50% chance of escaping the exterior side of phosphor layer 106. It is believed that this feature can nearly double the white luminance over that found with phosphors directly coated on blue LEDs. The large CPC 103 can produce superior uniformity due to its non-imaging nature. A further novelty possible with some embodiments of the optical manifold described herein is the precise control of color temperature by the exact and uniform application of phosphor thickness. This combination of uniform blue illumination and a large photoluminescent layer is a novelty.

Figure 10E:
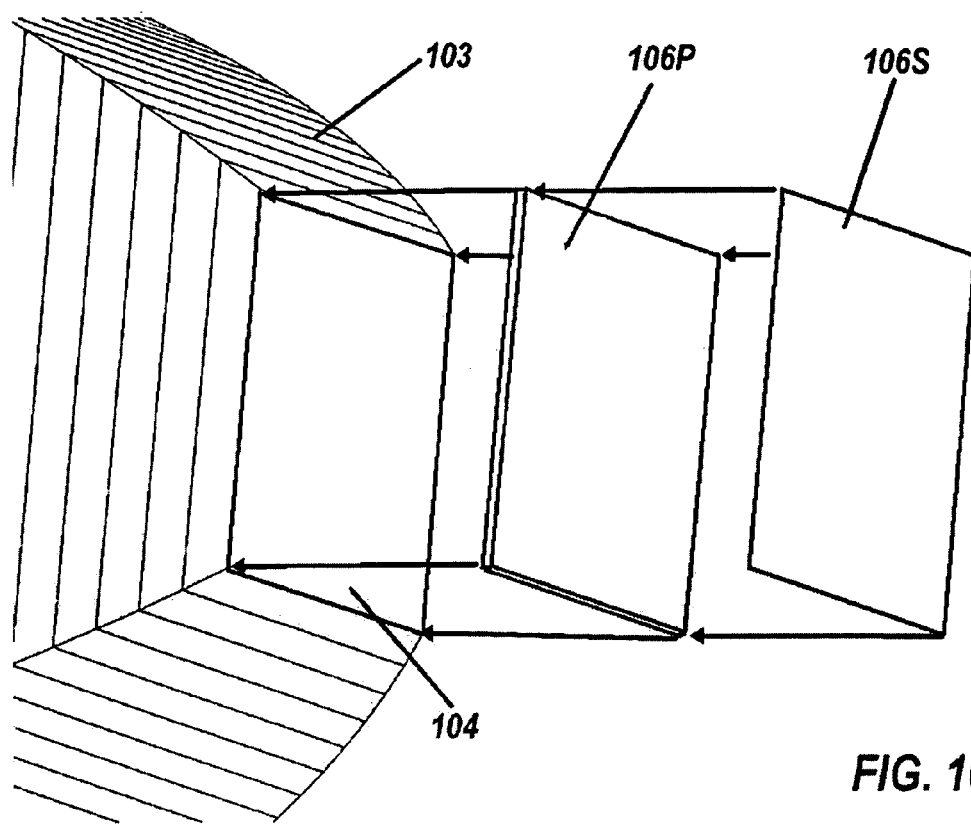
FIG. 10E is an exploded perspective view of a red semiconductor installed atop a green phosphor in the optical manifold of FIG. 10A.

It is believed possible to utilize a photoluminescent semiconductor, such as a slice from a wafer of AlInGaP, to generate red light when illuminated by blue light. Since this material is transparent, it can be overlaid over a green phosphor and used instead of a yellow phosphor. Using a green phosphor can be advantageous when the quantum efficiency of the semiconductor is more than that of the yellow phosphor. FIG. 10E shows an example of such a configuration, showing the large CPC 103 with the exit face 104. A green phosphor 106P bonds thereupon and thinner red semiconductor layer 106S is installed atop it.

Figure 10F:
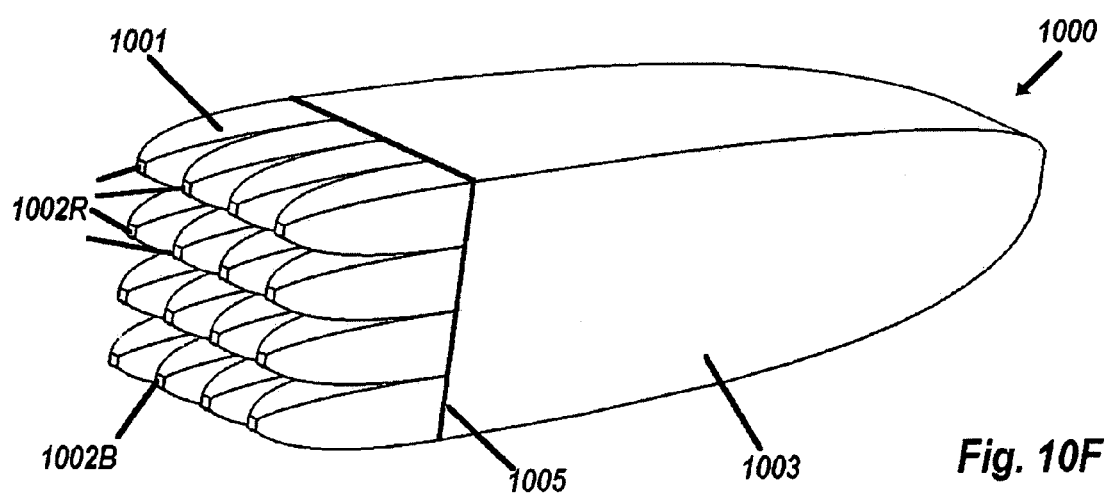
FIG. 10F shows a manifold fed by both red and blue LEDs, also including a phosphor-coated surface.
Figure 10G:
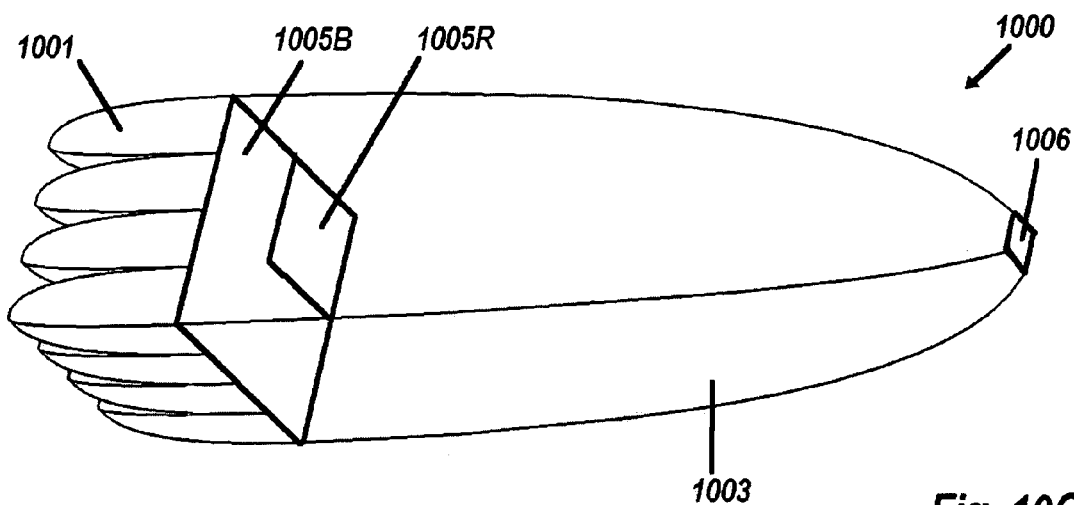
FIG. 10G is another view of the phosphor end of a manifold fed by both red and blue LEDs.

Another way to use a green phosphor is with red LED light sources. FIG. 10F is a perspective view of a manifold 1000 comprising sixteen small CPCs 1001 feeding large a CPC 1003 through a planar filter 1005. In this example, four of the LEDs 1002R are red and the remaining twelve LEDs, 1002B, are blue. FIG. 10G is another view of manifold 1000, showing green phosphor 1006 at the exit plane of large CPC 1003. A filter 1005 is shown comprised of a smaller red-pass filter 1005R and an L-shaped blue-pass filter 1005B. The filter 1005R lies over the four red LEDs 1002R, while filter 1005B lies over the twelve blue LEDs 1002B. This composite filter has recycling action just as shown by ray 110r in FIG. 10D.

Figure 10H:
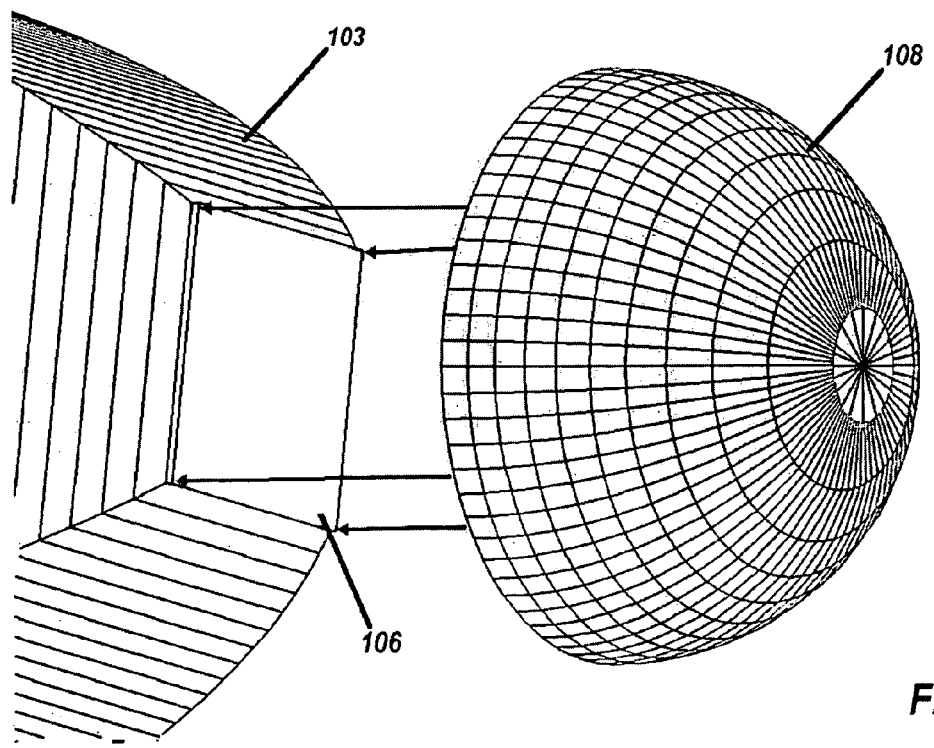
FIG. 10H is a close-up exploded view of a dielectric dome in which the monolithic ceramic is immersed, also including a phosphor-coated surface.

Another issue arises from the refractive index of the phosphor material, thought to be about 1.8 for some currently-used phosphors 106. This would cause light to be trapped in the phosphor due to total internal reflection. FIG. 10H is an exploded view similar to FIG. 10C, but adding an optical system that increases-light extraction from the phosphor. FIG. 10H shows dielectric cross-CPC 103, monolithic ceramic phosphor 106, and dielectric hemisphere 108, which fits over the phosphor.

Figure 10I:
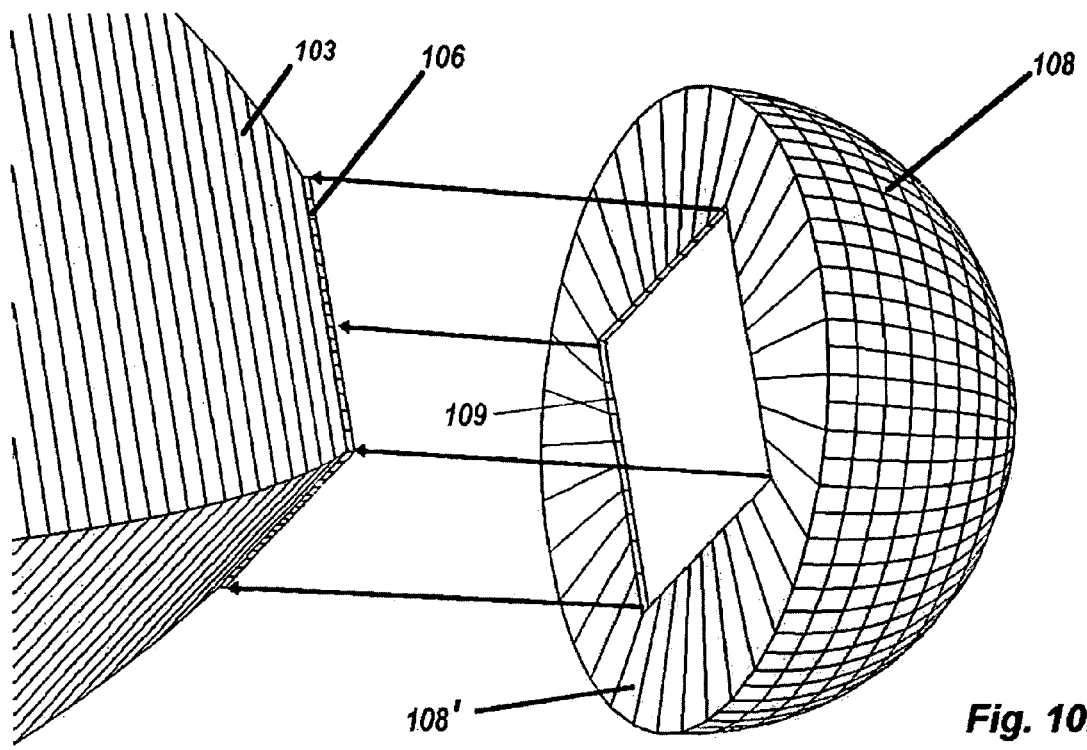
FIG. 10I is a close-up exploded view from another viewing angle showing the dome's indentation to receive the phosphor.

FIG. 10I is another view of this fit, also showing the equatorial surface 108'
of the hemisphere 108, including a square indentation 109 that receives phosphor 106 and is optically bonded thereto. This arrangement increases light extraction by generating a magnified image of the phosphor. It is believed that such a dome will be less useful, however, when phosphor scattering is high. In that case, light trapped by the flat phosphor layer will be re-scattered and recycled via interaction with the filter 105 or 1005, which may be a blue-pass or short-pass bandpass filter, until it is either extracted or absorbed. If the short-pass filter is properly designed it should have a reflectance of 0.99 and have negligible absorptance. Assuming that the material chosen for the recycling section of optic also has a low absorptance (such as PMMA), then the amount of flux lost in the multiple bounces is small, and the light extracted in such a system will be high. This will cause luminance to be substantially higher than in the dome case, albeit at a slight decrease (5-10%) in overall luminosity. A flat protective cover of a suitable material is typically provided to protect the phosphor layer. Suitable materials include epoxy, PMMA, polycarbonate, for example, and other materials with a lower index of refraction than the phosphor.

Figure 11A:
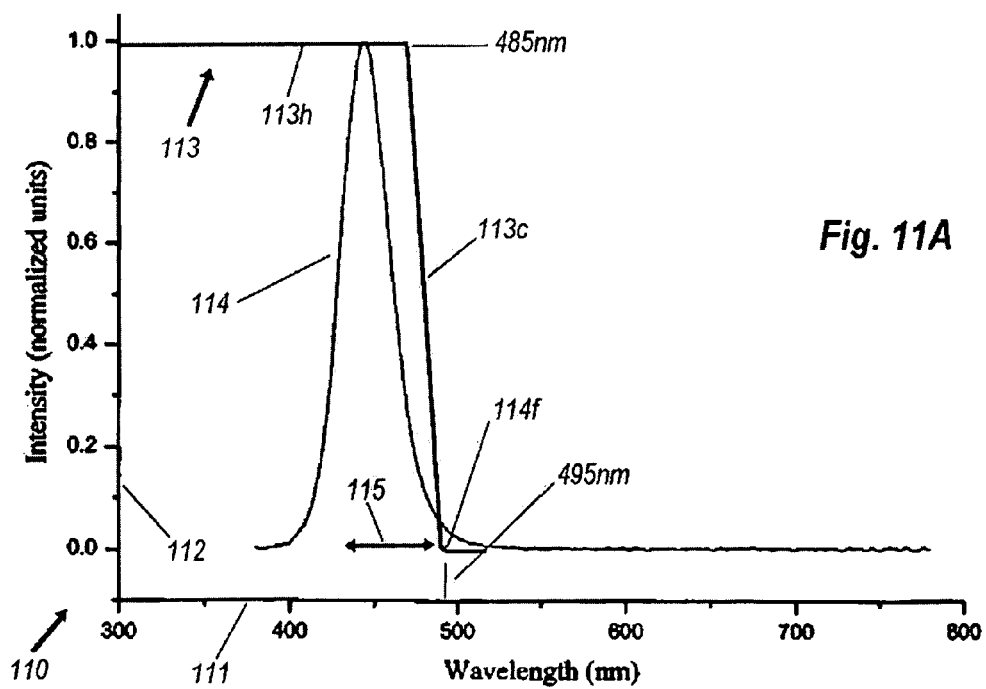
FIG. 11A is a graph of the spectrum of light output from a blue LED, and also including the transmission curve.

FIG. 11A is a graph of the output of the filter 105 in a spectrophotometric plot 110, comprising a horizontal wavelength scale 111 spanning the extremes of the visible spectrum, from 400 to 800 nanometers. A vertical scale 112 plots the relative intensity or transmittance. A plot line 113 shows the spectral transmittance of an example of a short-pass filter serving as blue-pass filter 105 of FIG. 10A. An upper line 113h is at nearly 100%, since filter 105 typically has a refractive index only a slightly lower than that of an injection moldable plastic such as polycarbonate. For example one suitable material for such a filter is a PYREX wafer.

FIG. 11A graphs a transmittance plot 113 that shows an abrupt cliff 113c, between 485 nm on the left and 495 nm on the right. Short-pass filters having abrupt changes in transmittance and reflectance plots are commercially available, over a wide range of center wavelengths, such as from JDS Uniphase Corporation of Santa Rosa, Calif. Suitable short-pass filters have a high transmittance (typically above 90% even in air including Fresnel losses) below a prescribed wavelength, and a high reflectance (above 99%) for wavelengths starting only 5 nm above the transmission cutoff wavelength. In addition, these filters can maintain the high reflectance bandwidth for of up to 150 nm. Finally, these short-pass filters can meet these specifications when sandwiched between dielectric optics or in air, for ray incidence angle 10° or less. The center wavelength itself is certified at normal incidence and is described as varying in accordance with the cosine of the incidence angle within the filter, as theory dictates. Plot line 114 depicts a typical spectrophotometric plot for a blue LED. Only a tiny fraction, 114f, is outside the transmittance curve 113. Such spectral filtering, however, is angle-sensitive, with wavelength shift 115 showing the effect on the entire filter spectrum of 27° off-normal incidence. This shows that plot 114 would be shifted enough to cause all the blue light to be reflected. The input CPCs of FIG. 10A have a 10° exit angle, which causes a shift of only about 495(1−cos 10°)=7 nm, half the width of cliff 113c. This effect only increases reflective losses from about 1% to 2%.

Figure 11B:
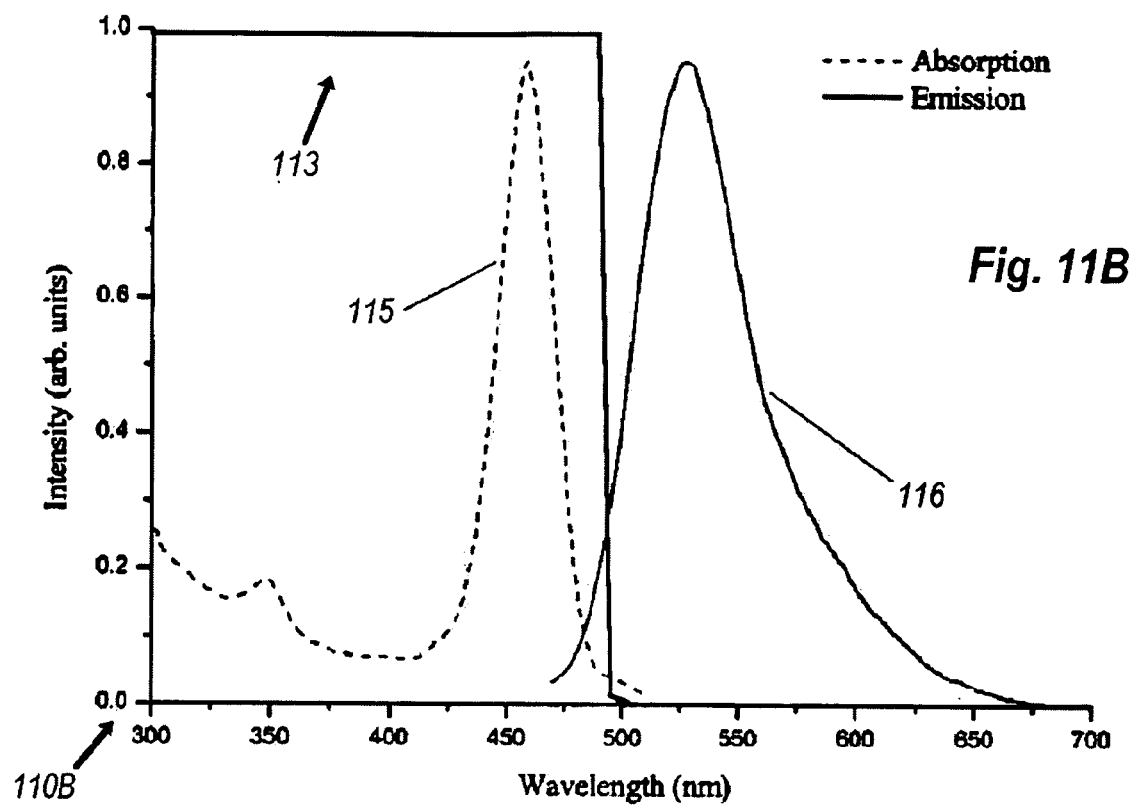
FIG. 11B is a graph of the absorption and emission spectra of a yellow phosphor, and also including a transmission curve of a blue-pass filter.

FIG. 11B is a graph similar to FIG. 11A, but with a different spectral plot 110B, illustrating the significance of filter transmittance plot 113, now juxtaposed with dotted-line phosphor absorption curve 115 and solid-line phosphor emission curve 116. Absorption curve 115 is nearly coincident with blue-LED emission curve 114 of FIG. 11A, and is all on the transmission side of plot 113. Emission curve 116 is nearly all on the reflection side of plot 113, which is what causes the return of white ray 110r of FIG. 10D, ensuring the recycling of inwardly emitted white light from phosphor 106.

Figure 11C:
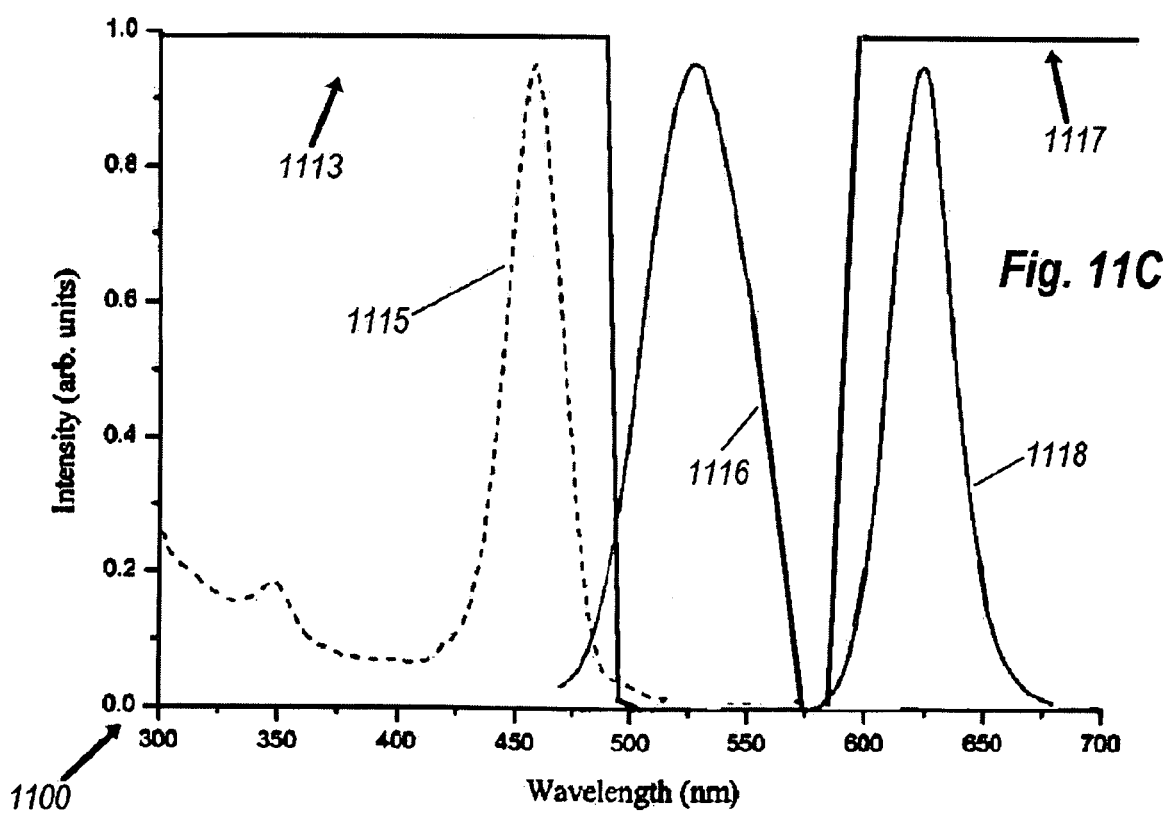
FIG. 11C is a graph of the absorption and emission spectra of a green phosphor, and also including the transmission curve of a red-pass filter.

FIG. 11C shows a similar graph to FIGS. 11A and 11B, but with a different spectral plot 1110, illustrating the spectral action of composite filter 1005 in FIG. 10G. A blue-pass filter 1005B of FIG. 10G has a transmission curve 1113 in FIG. 11C. Dotted curve 1115 is the excitation function of the green phosphor, and solid curve 1116 is its emission function. A red-pass filter 1005R of FIG. 10G has transmission curve 1117 in FIG. 11C. Red LEDs 1002R of FIG. 10F have spectral distribution 1118 of FIG. 11C. Both filters reflect the green phosphor emission wavelengths of curve 1116, enabling the recycling within the large CPC of the phosphor back-emission.

A filter for this application can be produced using a PYREX wafer as a substrate and depositing on one side of this substrate many thin layers of materials using the well-known vapor deposition process. A suitable PYREX wafer is readily available from Corning, Corning N.Y., with a thickness of approximately 0.3 mm with a dimensional tolerance of ±0.05 mm. This material has an average index of refraction in the visible range of 1.47. The deposition processes, design procedures and the materials needed to make such a device are well established from prior art. For example, using forty-five alternating thin layers of silicon dioxide and tantalum pentoxide on the aforementioned PYREX wafer, a filter can be designed to achieve a minimum transmittance of above 85% for wavelengths 400 to 495 nm, while having a reflectance above 98% for wavelengths in the range of about 515 nm to 700 nm. Such a device can be made into large wafer and then the required shapes can be cut into smaller pieces to match the size of filter 105. This approach can appreciably lower the cost of the filter. Other even more efficient designs are readily available from industry sources such as the devices available from JDS Uniphase of Santa Rosa, Calif., using a variety of well-established processes, materials and design procedures.

Figure 12:
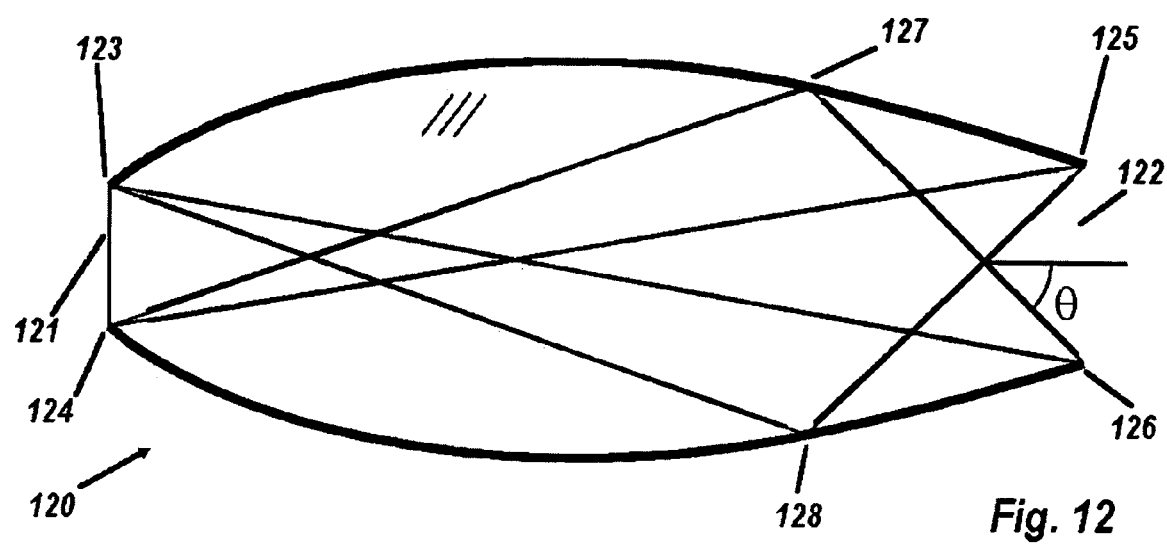
FIG. 12 is a cross-section of an angular compressor.

It is desirable that the Lambertian distribution of an immersed LED be compressed to the critical angle, but expanding area in an etendue-conserving fashion. FIG. 12 shows distribution-transforming element 120, with a wide-angle (±90°) port 121 marked by end-points 123 and 124, and spatially wider narrower-angle port 122, marked by end-points 125 and 126. Point 127 is a point on the surface of element 120 between end points 123 and 125 from which a ray at the critical angle θ of the transparent medium composing element 120 will just exit from element 120 at end-point 126 on the opposite side. Point 128 is directly opposite point 127. From end-point 123 to point 127, the profile of element 120 is an ellipse with foci at opposite points 124 and 126. Between end-point 125 and point 127 is a parabola with focus at point 124 and axis parallel to the ray running from point 127 to point 126. The opposite side, from end-point 124 to point 128 and from point 128 to end-point 126, is correspondingly shaped. To the left of points 127 and 128 is a CEC (compound elliptical concentrator), while to their right is a CPC. The narrower-angle output of distribution-transforming element 120 serves as suitable input for further embodiments. The advantage of this device relative to a simple CPC with exit angle 20 is that TIR is more easily achieved at the bottom edges 123 and 124.

Equally important for building blocks of the optical manifolds of the optical transformer described herein are etendue-conserving ways to transport luminance at a high NA, which is typically around 1, while mixing it to achieve high uniformity and a constant color. The NA can be calculated using either of the following equations:

$$NA = n \sin(\pi/2 - \theta_C) = n\sqrt{(1 - 1/n^2)},$$

where $\theta_C$ is the critical angle of the material and n is the index of refraction of the material. This equation is useful for determining the NA of a system where the input ray bundle is already inside a dielectric media. In this instance the value n in the equation is greater than 1.0.

Prior art relating to transport of illumination is shown in U.S. Pat. No. 6,819,687 by Fein, particularly his FIG. 1F. This corner-turning configuration is only possible with conventional reflectors, since TIR will fail for arbitrary rays coming in. For all-TIR operation Fein has a device in his FIG. 3B for a 45° turn. An optic with a similar geometry is redrawn here, in FIG. 13A, to promote discernment of the distinction from it, and advantages over it, of the angle-rotator disclosed herein.

Figure 13A:
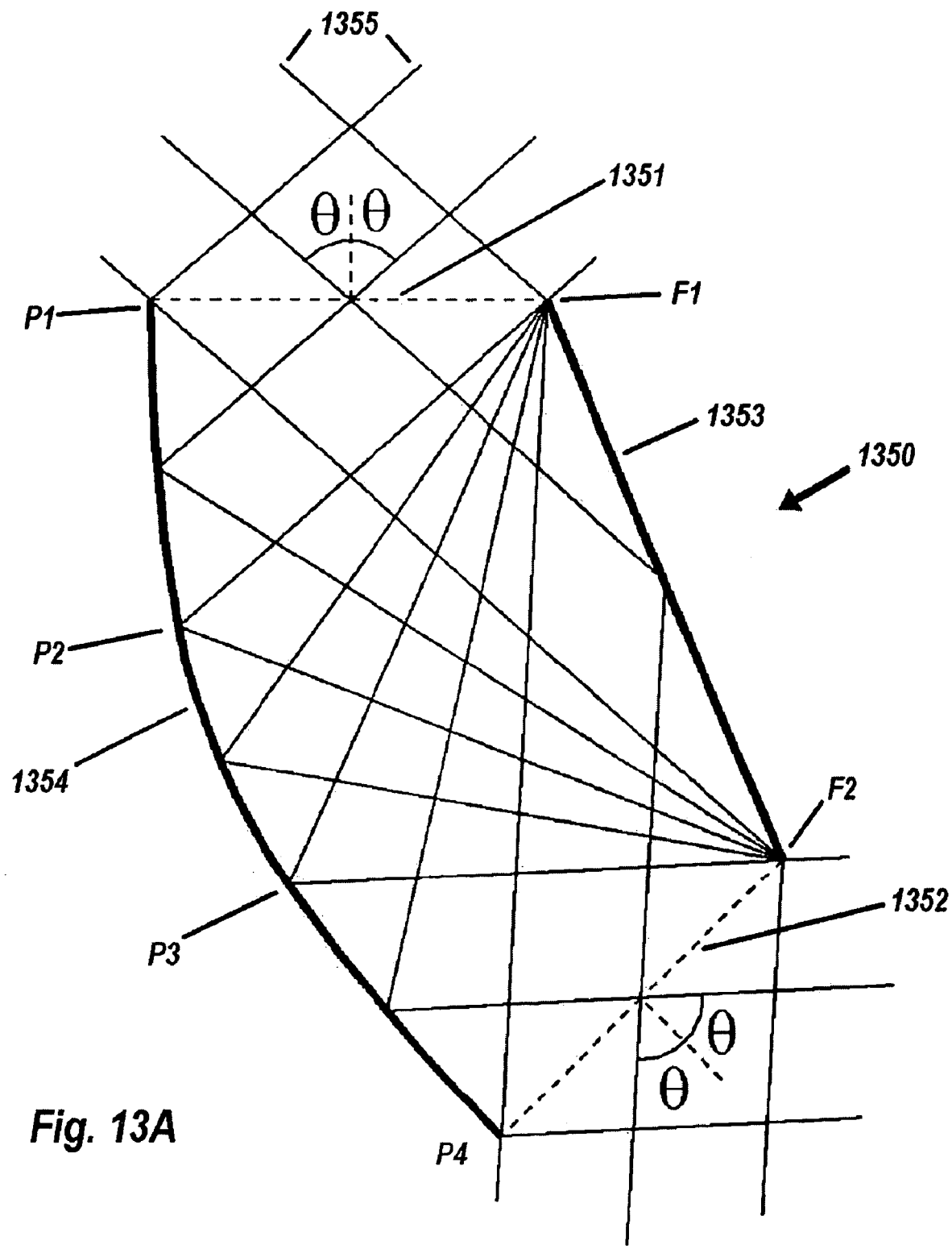
FIG. 13A is view of prior art, including a corner turner.

FIG. 13A shows the construction of Fein's corner-turner 1350, with ports 1351 and 1352 lying at a 45° mutual orientation. It uses a construction angle $\theta$, which is the complement of the critical angle $\theta_c = \sin^{-1}(1/n)$, which for n=1.495 is $\theta = 49°$. This corresponds to the maximum angle of guided light, or approximately NA=1. Inside wall 1353 is a flat mirror for which TIR is operable, running from point F1 on port 1351 to point F2 on port 1352. Outside wall 1354 comprises a parabolic arc running from point P1 on port 1351 to point P2, with focus at point F2 and axis making an angle $\theta$ to the normal to the entrance aperture 1351, in the direction (clockwise direction as seen in FIG. 13A) more nearly perpendicular to the line F2-P1, an elliptical arc running from point P2 to point P3, with foci F1 and F2, and a parabolic arc running from point P3 to point P4 on port 1352 with focus at point F1 and whose axis makes an angle $\theta$ to the normal to the exit aperture 1352. Construction lines 1355 are reflected against outer wall 1354 in the same way as the limiting rays of light at approximately NA=1.

Figure 13B:
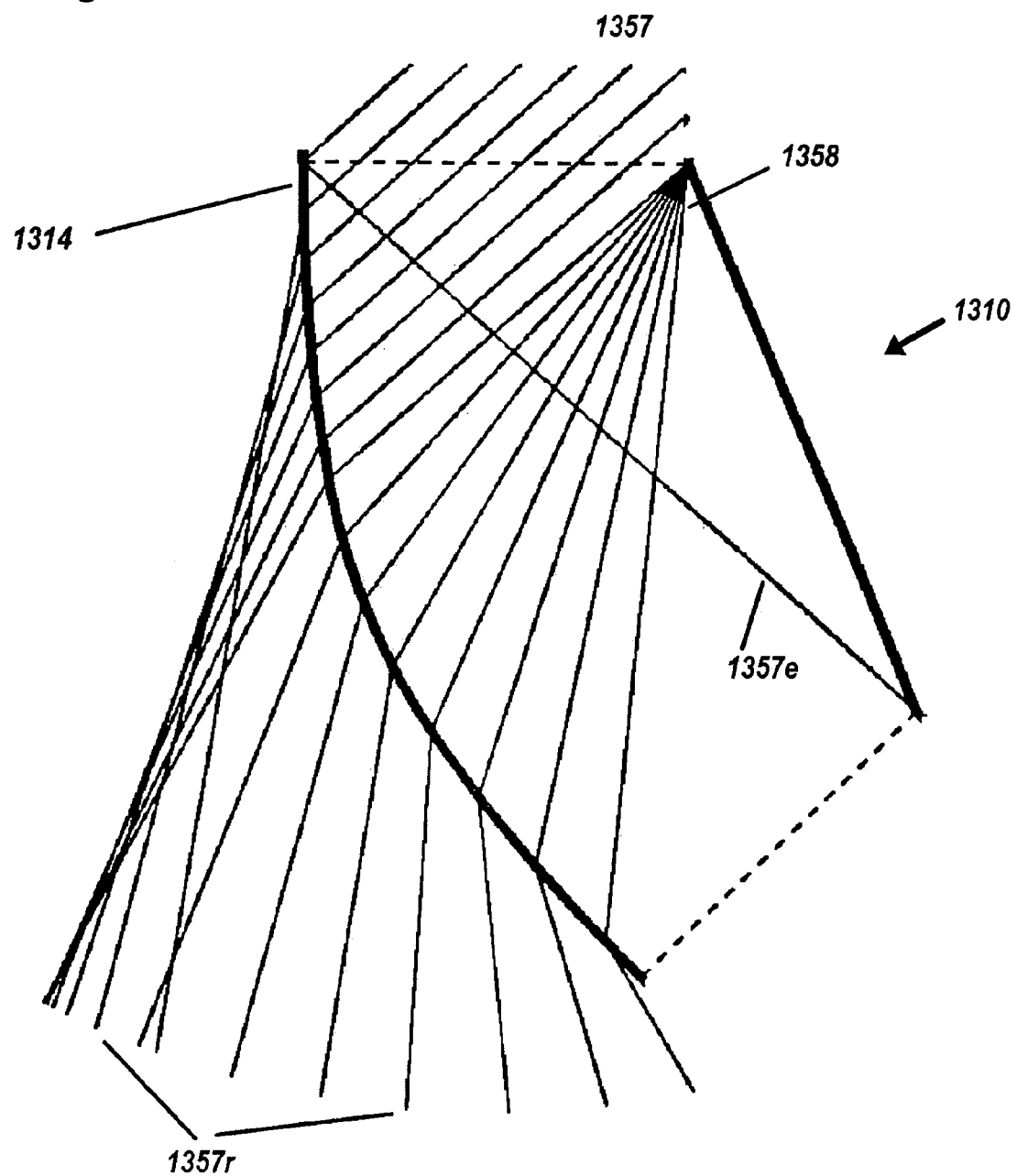
FIG. 13B is a ray trace of the prior art shown in FIG. 13A.

Although these construction lines are for NA approximately equal to one, the device of FIG. 3B of Fein cannot actually transport such radiation via only total internal reflection. This is shown in FIG. 13B, which depicts a ray trace of corner turner 1310. Edge rays 1357 in FIG. 13B make an angle $\theta$ to the normal to entrance aperture, which is the complement of critical angle $\theta_c$ for the material of this device. Only one of them, ray 1357e, is reflected by TIR. All the rest, refractively transmitted rays 1357r, constitute leakage and a partial device-failure. More complete ray traces show that 100% delivery is only obtained when the ray incidence angles are less than or equal to the angle between the line connecting points F1 and P4, and the normal to entrance aperture in FIG. 13A. In the example of FIG. 13A this angle is approximately 3 degrees. Some rays with incidence angles greater than 3 degrees for this device will leak out the side of the optic. If all the light is to be redirected by means of total internal reflection, it should be clear that the devices described in Fein, as illustrated by his FIG. 3B, are only suitable for rotating highly collimated light sources.

Figure 13C:
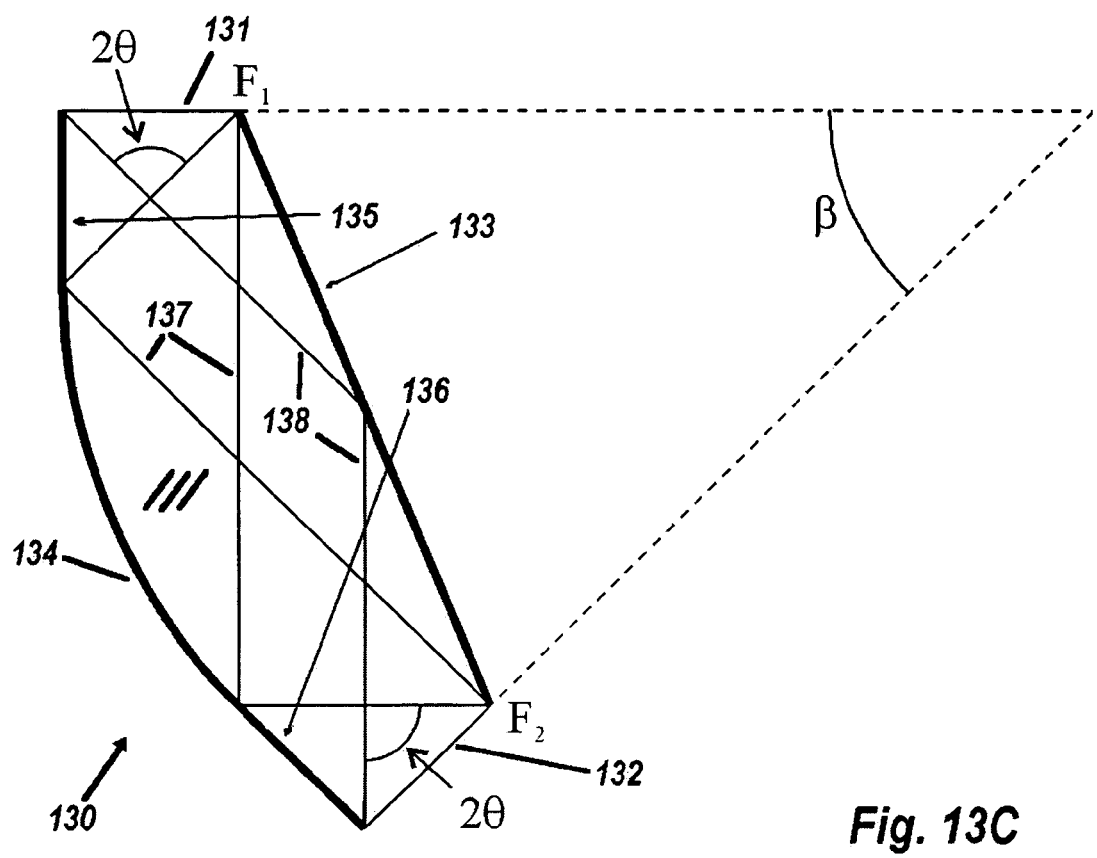
FIG. 13C is a cross-section of an angle-rotator of the optical manifold.

The angle-rotators used in the optical manifold satisfy total internal reflection for all rays up to the highest possible NA. FIG. 13C is a cross-sectional view of an angle-rotator 130, with a first port 131 and a second port 132, which are in complete exchange for light of angular width $2\theta$. This angle is twice the complement of the critical angle for the transparent material of rotator 130. The second port 132 is at angle $\beta$ from the plane of port 131, generally at the convenient value of approximately 45°, enabling two angle rotators to transport luminance around a right-angle bend with substantially no losses, a situation that would cause inescapable losses for the simple round or square cross-sections of the prior art.

In FIG. 13C, a flat sidewall 133 extends between foci $F_1$ and $F_2$ of elliptical segment 134, which is in turn flanked by flat sidewalls 135 and 136. Sidewall 135 is oriented perpendicular to entrance aperture 131, while sidewall 136 is oriented perpendicular to exit aperture 132. Rays 137 run from focus $F_1$ to focus $F_2$ via a single total internal reflection, while ray 138 runs via a single total internal reflection from the opposite side of port 131 from point $F_1$ to the opposite side of port 132 from point $F_2$. This shows how angle rotator 130 transfers all rays within $\pm\theta$ from first port 131 to second port 132, with none escaping. This nonimaging optical configuration tends to smear out any luminance non-uniformities it receives. This smearing is because each point on the second port 132 receives light from the entirety of port 131 as well as from reflections from the walls of angle rotator 130. Since an image is just another type of luminance-nonuniformity, this is why this and other embodiments herein are termed 'non-imaging'.

Figure 13D:
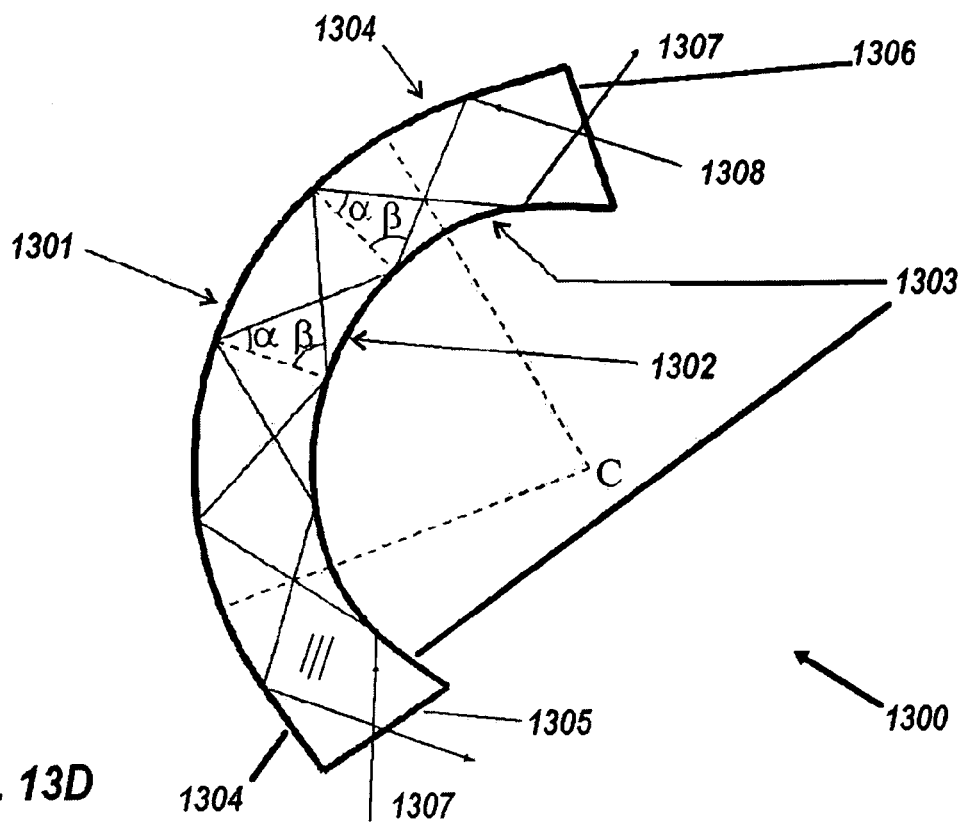
FIG. 13D is an alternative embodiment of an angle-rotator similar to that in FIG. 13C.

FIG. 13D is a cross-sectional view of an angle-rotator 1300 similar to that in FIG. 13C, comprising outer arc 1301 with center of curvature at point C and inner arc 1302 also centered on point C. Tailored curves 1303 terminate both ends of arc 1302, as do tailored curves 1304 for arc 1301. Curves 1303 and 1304 jointly define end ports 1305 and 1306. Their two-way nature is shown by oppositely directed rays 1307 and 1308, totally internally reflecting at outer incidence angle $\alpha$ and inner angle $\beta$, respectively against arcs 1301 and 1302. The end-ports are not shown refracting the rays since they are expected to be joined to other optical manifolds such as disclosed herein.

Figure 13E:
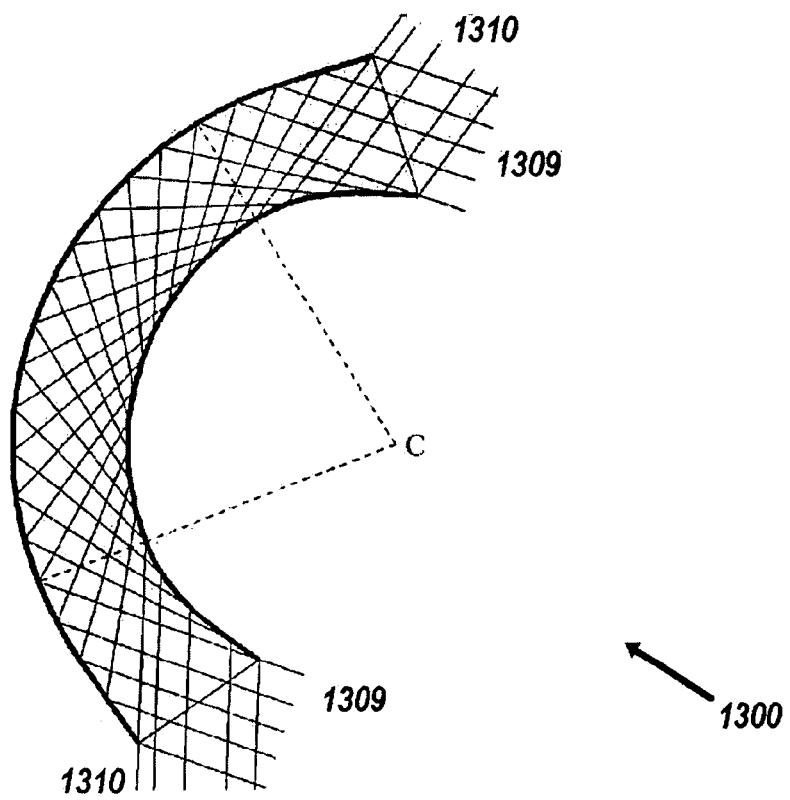
FIG. 13E is a ray tracing of an angle-rotator such as shown in FIG. 13D.

FIG. 13E also shows an angle-rotator 1300, but with complete sets 1309 and 1310 of parallel paths of edge-rays, which define the angular limits within which rotator 1300 will convey all luminosity through large arcs via total internal reflection.

Figure 14:
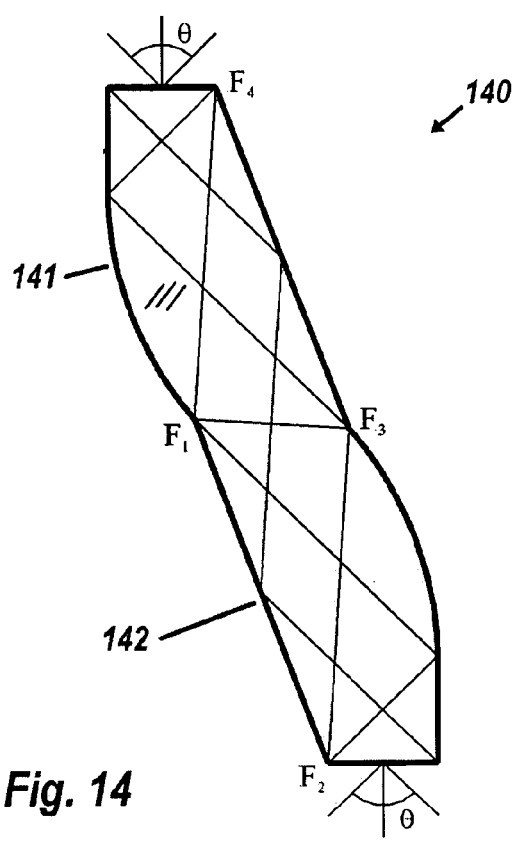
FIG. 14 is a cross-section of a source-shifter comprising two modified angle rotators.

FIG. 14 is a cross-section of an optical shifter 140, comprising first angle rotator 141 and oppositely oriented second angle rotator 142. To fit together, both rotators have been modified by removal of segments analogous to flat segment 135 of FIG. 13C. Thus interface $F_1$-$F_3$ is wider than the input light. The net effect of shifter 140 is, in this example, a lateral shift of 1.5 widths of an input luminance distribution, which of course is confined to the critical angle of the transparent material composing it. The multiple internal reflections within shifter 140 tend to smooth out any luminance non-uniformities entering it.

Figure 15A:
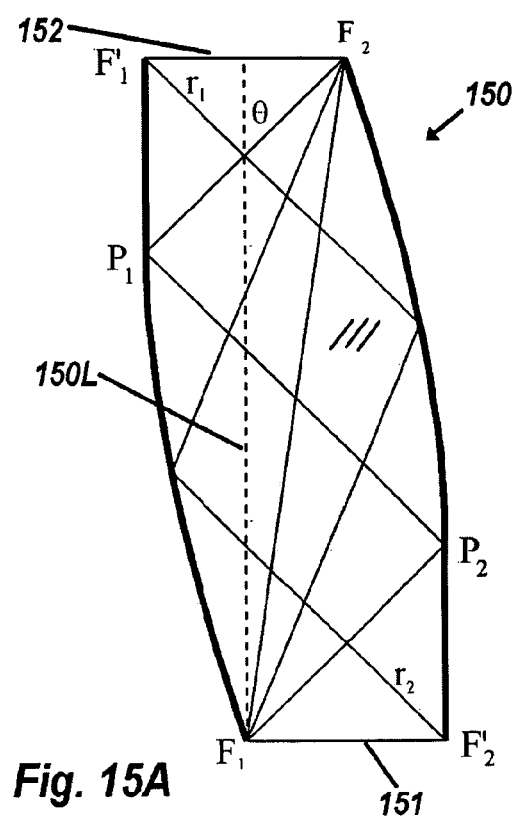
FIG. 15A is a cross-section of a half-width source shifter.

FIG. 15A is a cross-section of optical shifter 150, also for lateral luminance shifting with no angle rotation. First port 151 spans points $F_1'$ and $F_2$. Second port 152 spans points $F_1$ and $F_2'$ and is shifted a half width from port 151, as shown by dotted line 150L. When either port is a boundary with air, light entering it must be within the critical angle $\theta$ of the transparent material of 150. Straight-line segment $F_1'P_1$ is perpendicular to port 152, and straight-line segment $F_2'P_2$ is perpendicular to port 151. Parabola $F_1P_1$ has focus at $F_2$ and axis parallel to ray $r_1$. Parabola $F_2P_2$ has focus at $F_1$ and axis parallel to ray $r_2$, which is parallel to ray $r_1$. As a non-imaging optical device, element 150 tends to smear out, as previously discussed regarding FIG. 13C, non-uniformities of the luminance distributions entering it.

FIG. 15B is a cross-section of optical shifter 155, for lateral luminance shifting by its full width, as shown by axis 155L. A first port 156 spans from point 15BPT1 at one end of axis 155L to point 15BPT2. A second port 157 spans from point 15BPT3 to point 15BPT4 at the other end of axis 155L. As previously, light is confined to the critical angle 15BA1 of the transparent material composing shifter 155. This is shown in FIG. 15B as the acute angle formed between the line defined by the ray from points 15BPT3 to 15BPT7 and the axis 155L. The perimeter of shifter 155 is partly composed of straight lines, from point 15BPT2 to point 15BPT5 and from point 15BPT3 to point 15BPT6, which are perpendicular to the ports 156 and 157. Parabolic segment 158 runs from point 15BPT5 to point 15BPT4, and has its focus at point 15BPT1 and its axis parallel to the ray defined by points 15BPT7 and 15BPT3. Parabolic segment 159 runs from point 15BPT6 to point 15BPT1, and has its focus at point 15BPT4 and its axis also parallel to the ray defined by points 15BPT7 and 15BPT3.

FIG. 15C is a cross-section of the same optical shifter 155 shown in FIG. 15B. By moving the right hand side (segments 15BPT1-15BPT2-15BPT4) of the device relative to the left hand side (segments 15BPT1-15BPT3-15BPT4) in such a way that point 15BPT1 is always on the left parabola 159 and first port 156 is moved to the position 15BPT1*-15BPT2*, the lateral shifting of the light can be changed to any value while maintaining its angular aperture.

FIGS. 15A and 15B show two variations along a continuum of possible values of lateral shift of luminance. Greater shifts merely require a longer shifter than 155 of FIG. 15B.

Figure 16:
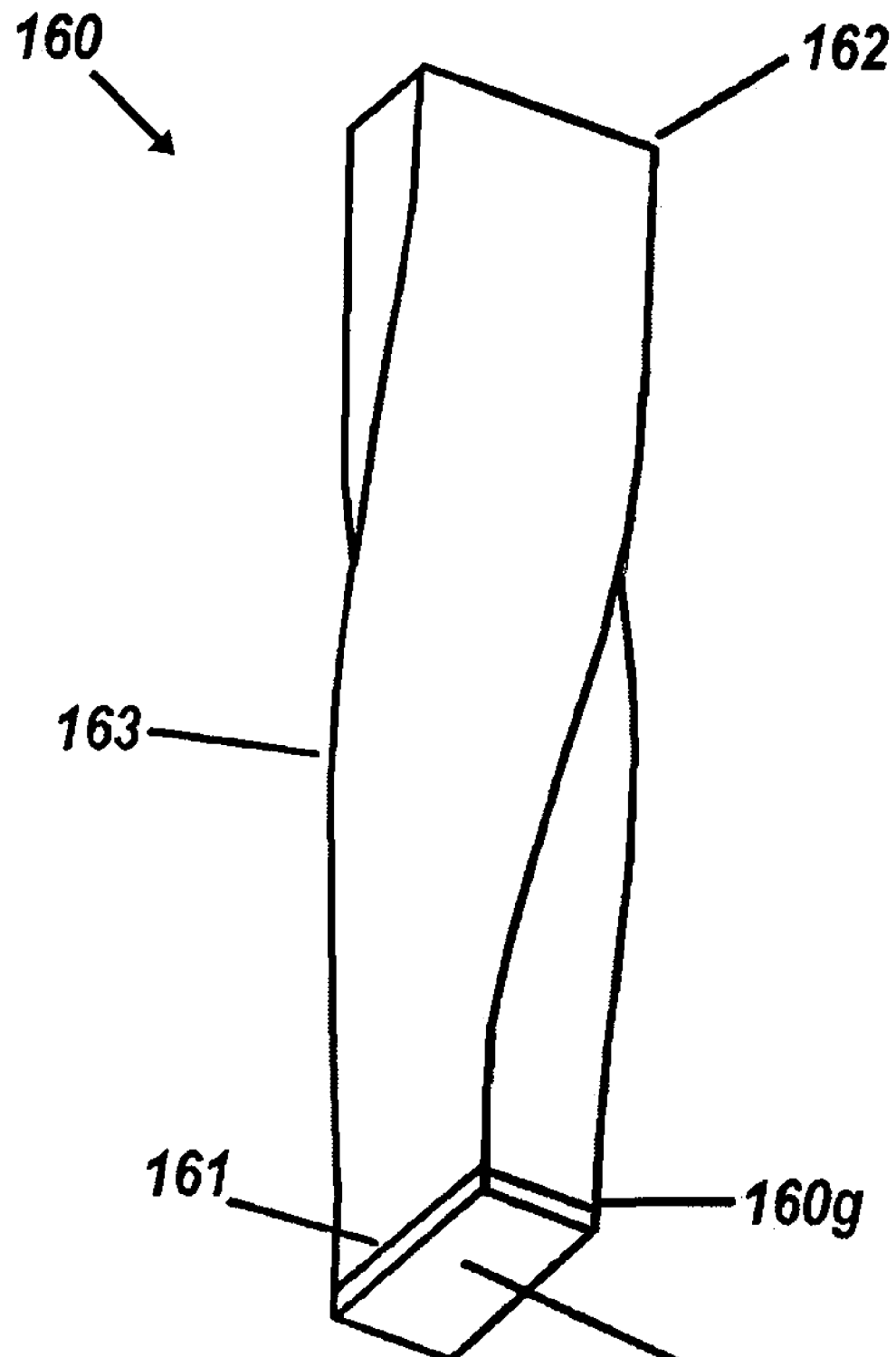
FIG. 16 is a cross-section of a source twister.

FIG. 16 is a perspective view of an optical twister 160 that has a first rectangular port 161 and a second port 162 oriented perpendicularly to it. A spiral curve 163 is one of four forming the corners of 160. Also shown is Lambertian LED 165 positioned across air gap 160g, so that light inside device 160 is confined to the critical angle of its material, with little loss being conveyed from face 161 to 162.

Figure 17:
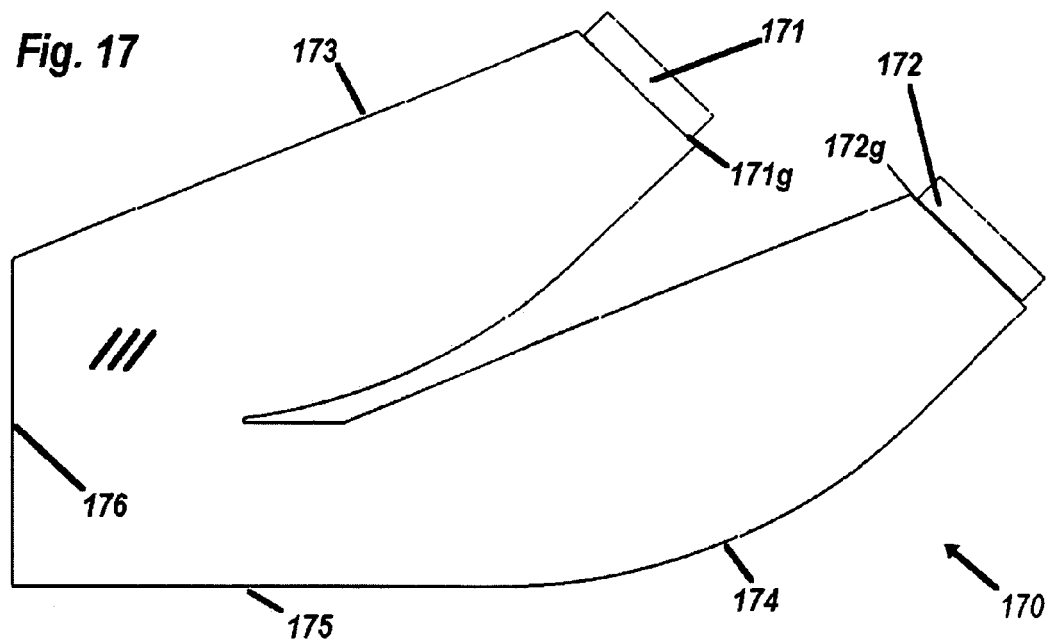
FIG. 17 is a cross-section of a 2:1 optical manifold.

FIG. 17 is a cross-sectional view of an optical manifold 170 that incorporates angle rotators. Particularly, FIG. 17 shows how angle rotators can be combined to make an optical manifold 170. LEDs 171 and 172 shine their light across respective air gaps 171g and 172g, into respective angle rotators 173 and 174, the latter positioned in accordance with the length of straight section 175. The entire width of exit port 176 receives light from both LEDs.

Figure 18:
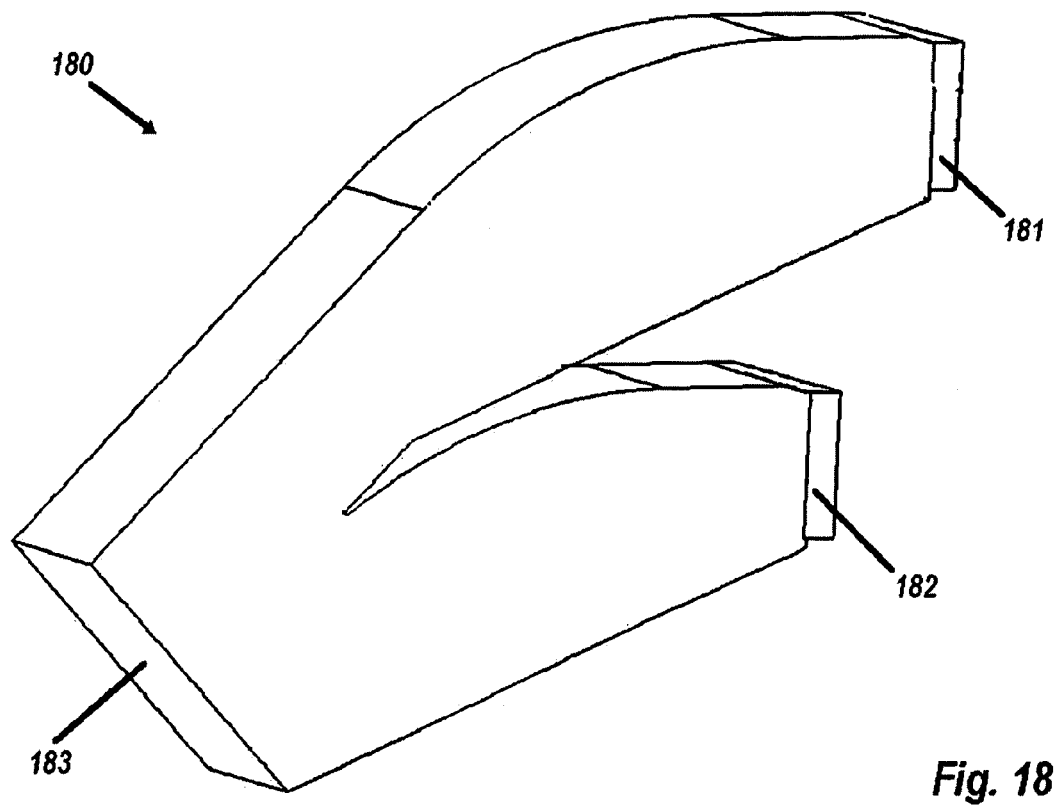
FIG. 18 is a perspective view of a rectangular 2:1 optical manifold with the profile similar to FIG. 17.

FIG. 18 is a perspective view of an embodiment of the optical manifold 170 incorporated into a three-dimensional design. Lambertian LEDs 181 and 182 shine into manifold 180 and their combined light issues from an exit port 183. The light from each LED is spread over substantially the entire width of 183. In FIG. 18 a two-dimensional profile is extruded into a three-dimensional solid using an orthogonal path direction. Alternatively, the extrusion can be tapered slightly with a one or two degree draft angle to facilitate removal of parts from an injection mold. In this approach the starting or ending profile will be smaller than the other, which is believed to result in only a small reduction in performance of the device.

FIG. 19 is a perspective view of an optical manifold 190 that has a square input port 191. Sequential angle rotators 192 and 193 feed rectangular output port 194. Straight rectangular section 195 feeds sequential angle rotators 196 and 197, thence rectangular output port 198. The length of section 195 is adapted to put ports 198 in the same plane as port 194.

FIG. 20A is a schematic view of an optical manifold 200, comprising a lateral shifter 201 receiving light from a red LED R, a mixing rod 202 receiving light from a green LED G, and a lateral shifter 203 receiving light from a blue LED B. A duct 204 receives their mixed light. Within manifold 200 all light is confined within a critical angle θ, because as previously the LEDs shine across a small air gap, such as 201g shown.

FIG. 20B is a schematic view of an optical manifold 205, similar to manifold 200 (FIG. 20A) in having an input duct, 206, fed by three branches, 207-209. Manifold 205, however, is larger in order to reach more separated sources. Input branches 207 and 208 are each similar to the shifter shown in FIG. 14. Upper branch 207 is shown as comprised of upward-curving first angle-rotator 207a and downward-curving subsequent angle-rotator 207b, with imaginary line 207d joining them. Upper branch 207 is for red LED R and lower branch 208 is for blue LED B, while a longer mixing rod, 209, is for green LED G.

Figure 21:
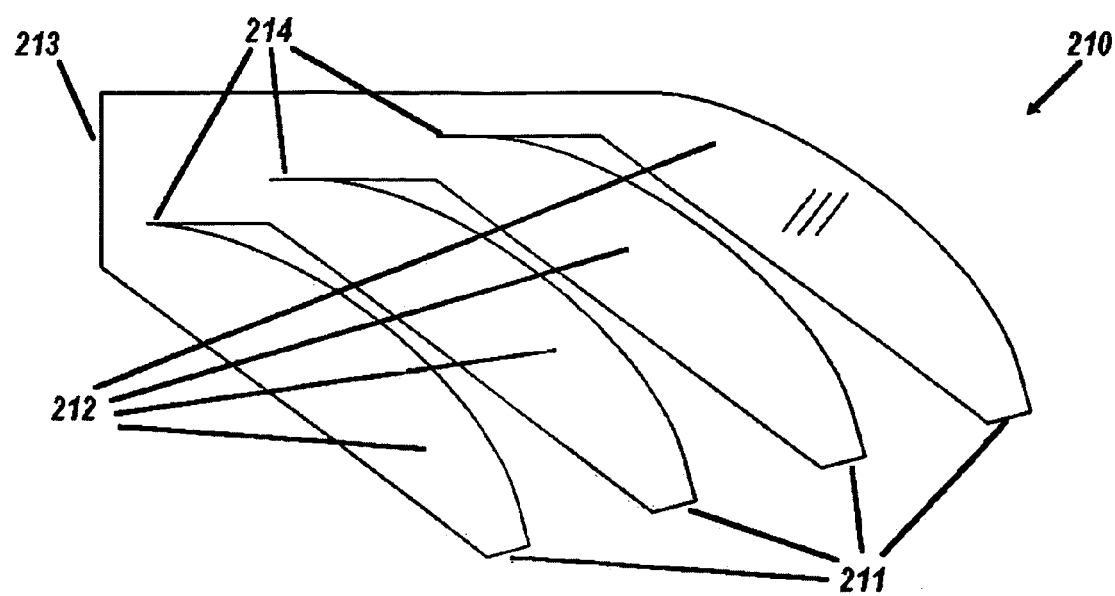
FIG. 21 is a cross-section of a 4:1 optical manifold with coplanar inputs having one angle-rotator each.

FIG. 21 is a cross-section of a 4:1 optical manifold 210, with coplanar input ports 211, angle rotators 212, and output port 213, receiving the light from the input ports. Slit-like cracks 214 where angle rotators 212 merge into a combiner of optical manifold 210, however, would in actual practice be slightly filleted, defined as the replacement of the tip of such a long crack with a wider rounded tip, perhaps a few thousandths of an inch wide.

Ray traces have shown that such practical departures from ideal form cause small losses of only a few percent, and only small deviations from uniformity across the exit face. Such design modifications are too small to be easily visible at the drawing scale of these Figures, and their performance costs are mirror. In part this is due to the great integrative power of the optical transformer described herein, whereby large spatial variations of input light result in very small departures from output uniformity. For example, dark bonding pads on LEDs lead to only 5% departures from uniformity, far less than the unofficial 50% limit of commercial displays.

Figure 22:
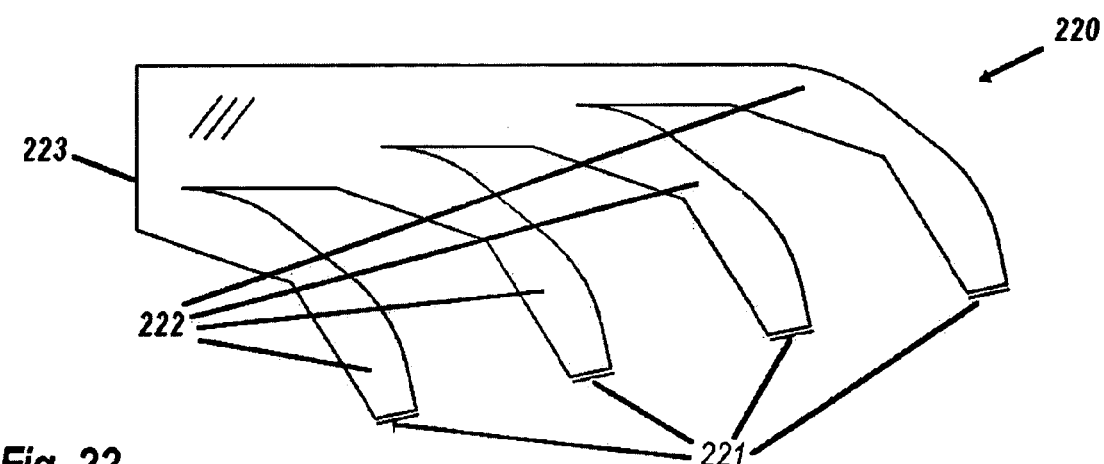
FIG. 22 is a cross-section of another 4:1 optical manifold, with coplanar inputs having two angle-rotators each.

FIG. 22 depicts a 4:1 optical manifold 220, with coplanar LEDs 221, dual angle-rotators 222, and an exit port 223. In FIG. 22, the coplanar LEDs 221 are spaced farther apart than those of FIG. 21.

The LEDs of FIGS. 21 and 22 inject their Lambertian light across air gaps, so that within the manifold the light is confined to the critical angle. FIG. 23 shows a 4:1 optical manifold 230, with coplanar LEDs 231 immersed in angle transformers 232, identical to that of FIG. 12. The light from them proceeds down angle rotators 233 to exit port 234. According to the principles taught herein, the distance between the input ports can be adjusted to any desired distance, while allowing the ports to reside on a common plane. This capability is particularly useful when designing a particular manifold combiner for a plurality of LEDs that reside on a common circuit board, as the distance between the LEDs required for good thermal management can be easily accommodated.

FIG. 24 depicts arcuate 4:1 optical manifold 240, with input ports 241, angle rotators 242, and exit port 243. Outer walls 244, 245, and 246 and inner wall 247 are circular arcs concentric on point C. Radius R must be sufficiently large to prevent leakage out these arcuate walls. As is possible in virtually all the embodiments of this invention, the sharp creases of this device can be modified by either chamfering or filleting the creases, or a combination of both, without having any appreciable effect on the transfer efficiency or output uniformity.

FIG. 25 is a schematic view of an arcuate 4:1 optical manifold 250, comprising four input ports 251, each with small angle rotator 252, and a common output port 253. A small angle rotator 254, a medium size angle-rotator 255, and a large angle-rotator 256 enable the manifold 250 to have a radius of curvature varying from a small radius 257 through medium radius 258 to a large radius of curvature 259. These radii, and the inter-branch spacings, are controlled by the rotation angles and relative sizes of the various angle rotators comprising the particular manifold.

Figure 26A:
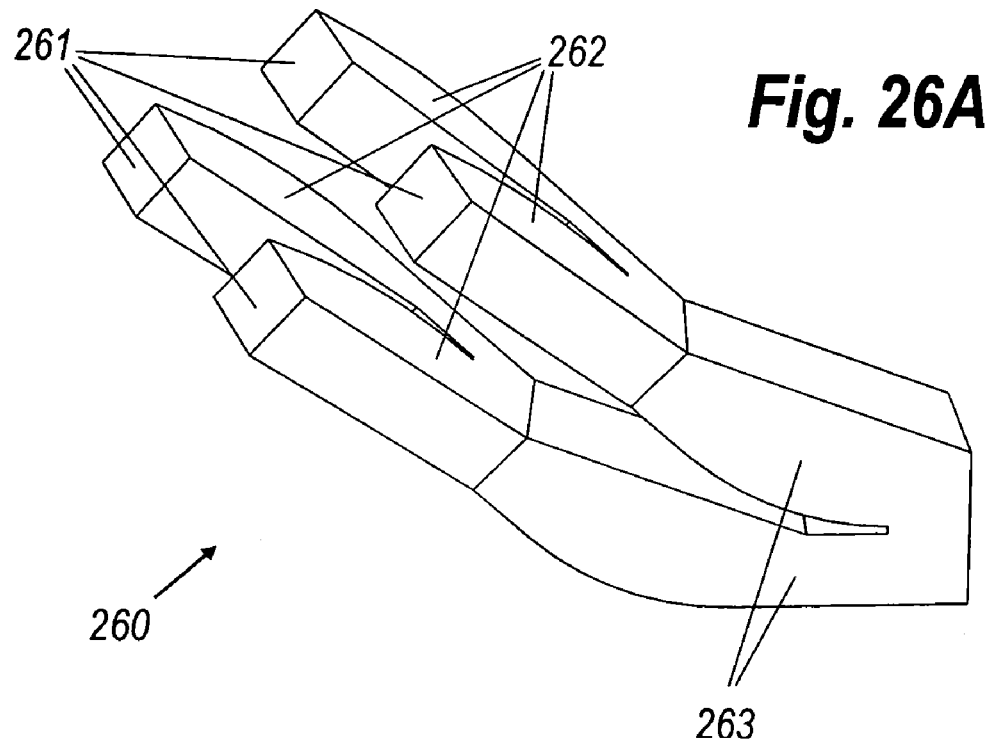
FIG. 26A is a perspective view of a 2×2:1 optical manifold with intermediate angle-rotators.

FIG. 26A is a perspective view of a 2×2:1 optical manifold 260 with non-coplanar square input ports 261, each with small angle rotator 262. Each pair of rotators 262 feeds a rectangular distribution to large angle-rotators 263. In FIG. 26A, each of the four ports 261 has been placed in arbitrarily different planes, but could as easily be in the same plane.

Figure 26B:
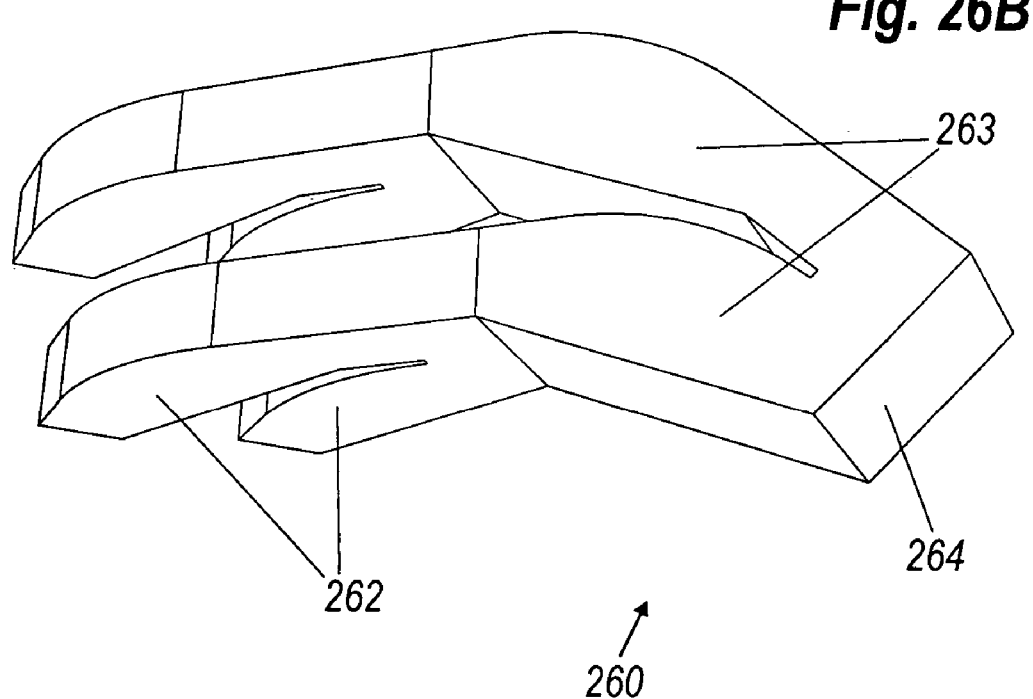
FIG. 26B is a perspective view of the 2×2:1 optical manifold with intermediate angle-rotators shown in FIG. 26A.

FIG. 26B is a perspective view of the 2×2:1 optical manifold 260 of FIG. 26A, also showing a square exit port 264 fed by the rectangular angle-rotators 263, which in turn are fed by the angle-rotators 262 acting in the plane orthogonal to that of the rotators 263.

Figure 26C:
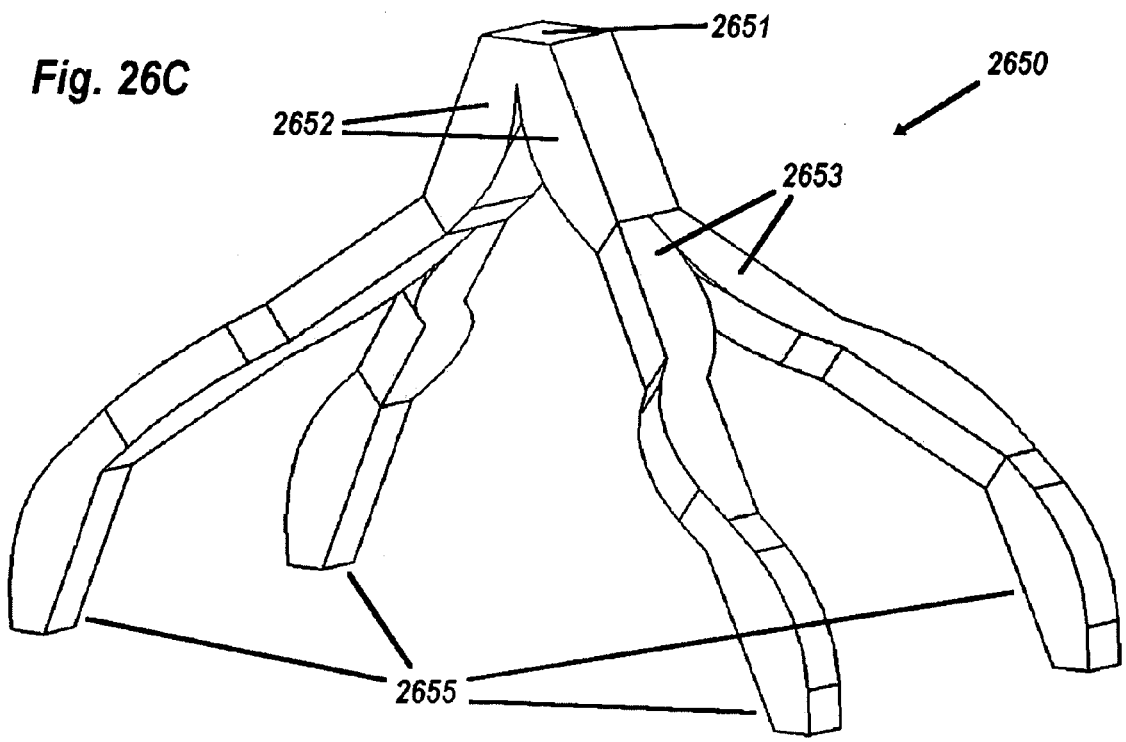
FIG. 26C is a view of a more openly branched 2×2:1 manifold.

FIG. 26C is a perspective view of a 4:1 manifold 2650, including an output port 2651 fed by two angle rotators 2652, each fed by a pair of angle rotators 2653 in the orthogonal plane. Each of these four rotators leads through two more rotators to form one of four legs 2655.

Figure 26D:
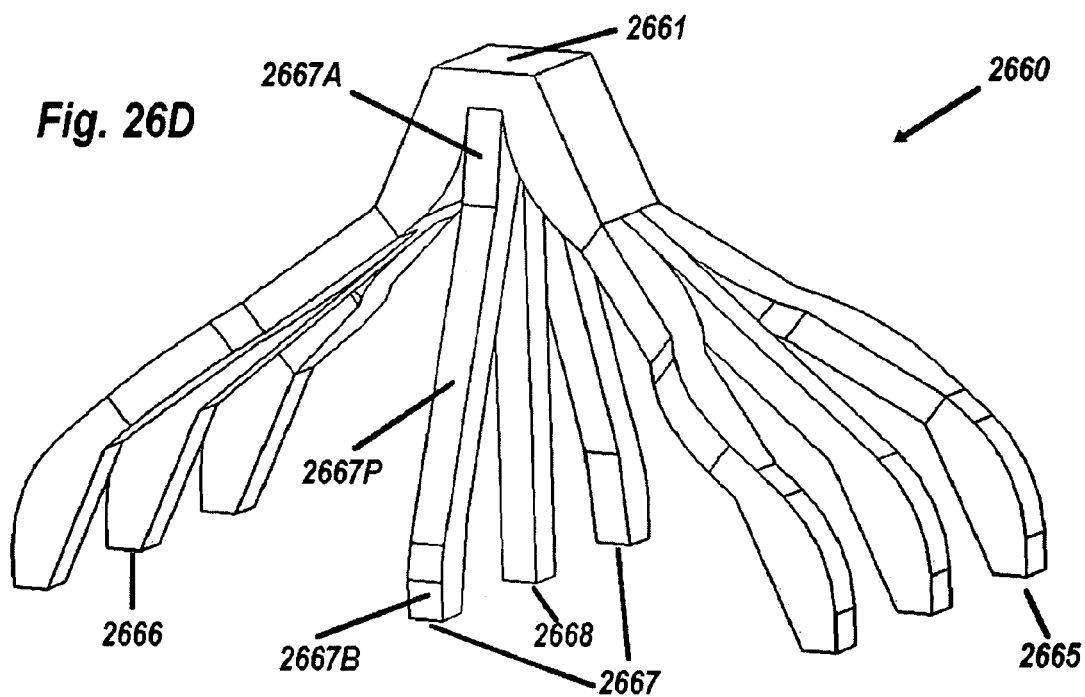
FIG. 26D is a view of a 3×3:1 manifold.

FIG. 26D is a perspective view of a 9:1 manifold 2660 with the same corner legs 2665 as 2655 of FIG. 26C, but having a larger output port 2661. Between the corner legs 2665 are central legs 2666 and side legs 2667, which comprise an upper angle rotator 2667A and a lower angle rotator 2667B, connected by light pipe 2667P. A central light pipe 2668 is at the very middle of this 3×3 array of optical ducts.

Figure 27A:
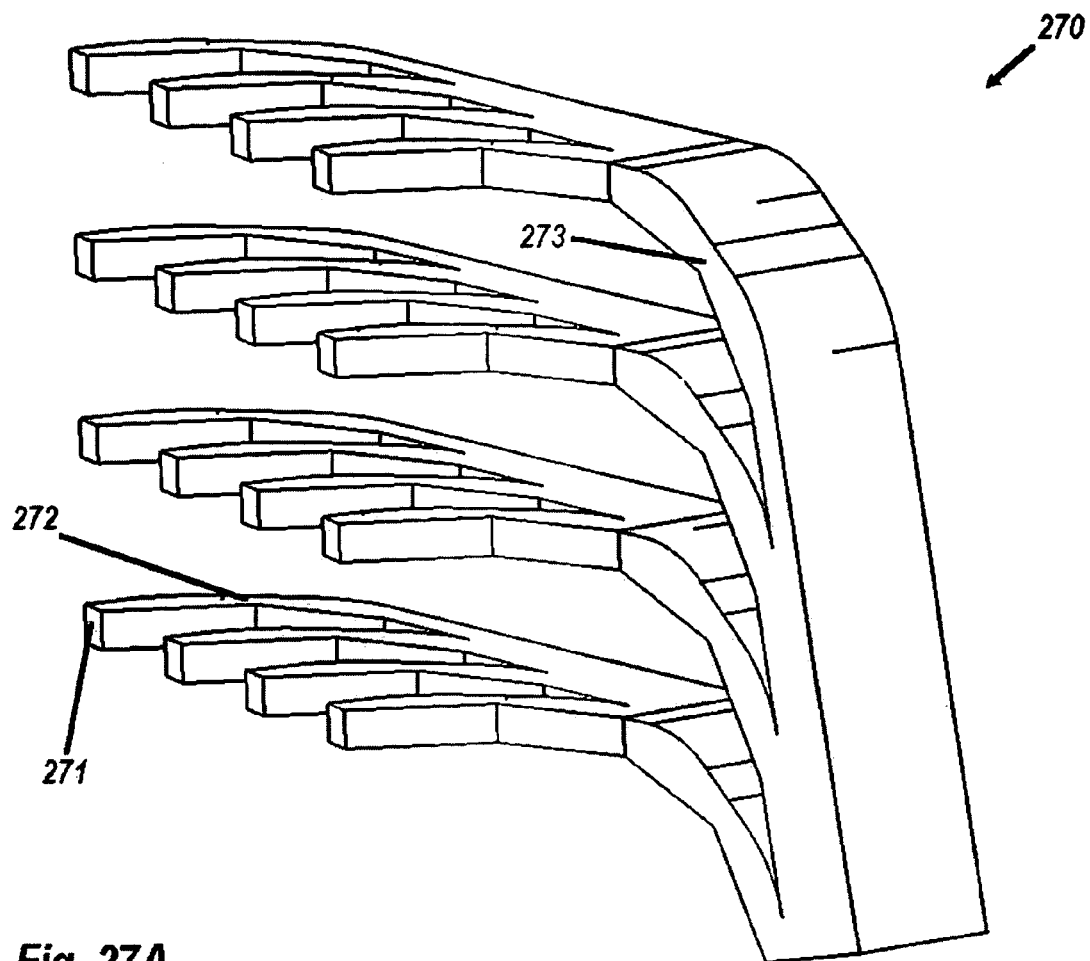
FIG. 27A is a perspective view of a 4×4:1 branched optical manifold.

FIG. 27A is a perspective view of a more elaborate 4×4:1 optical manifold 270 that has sixteen coplanar input ports 271, each with a dual angle rotator 272. Each column of four dual angle-rotators feeds a large dual angle-rotator 273.

Figure 27B:
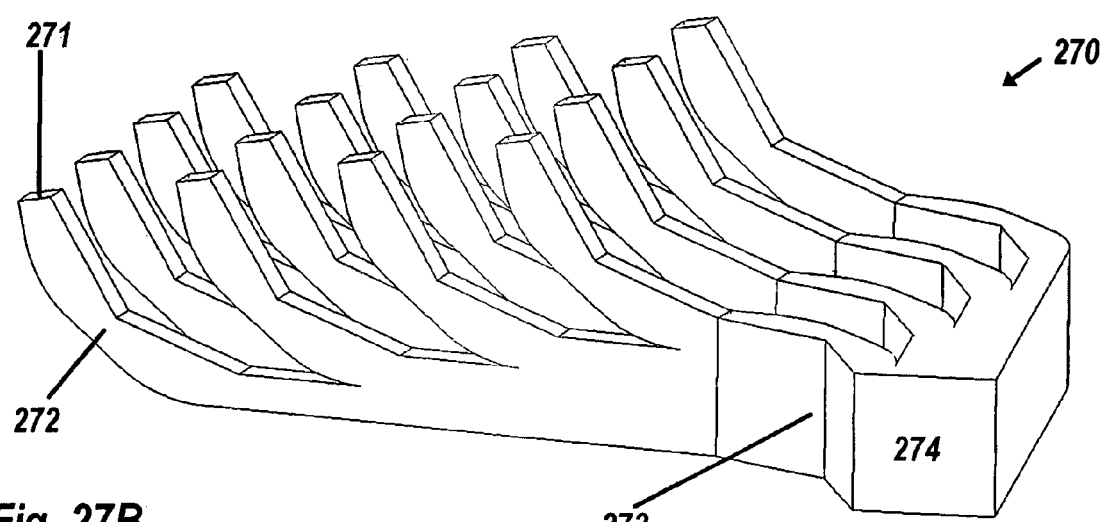
FIG. 27B is another perspective view of the 4×4:1 branched optical manifold shown in FIG. 27A, viewed from another angle.

FIG. 27B is a perspective view of the 4×4:1 optical manifold 270 of FIG. 27A from another view, showing a square output port 274.

Figure 28A:
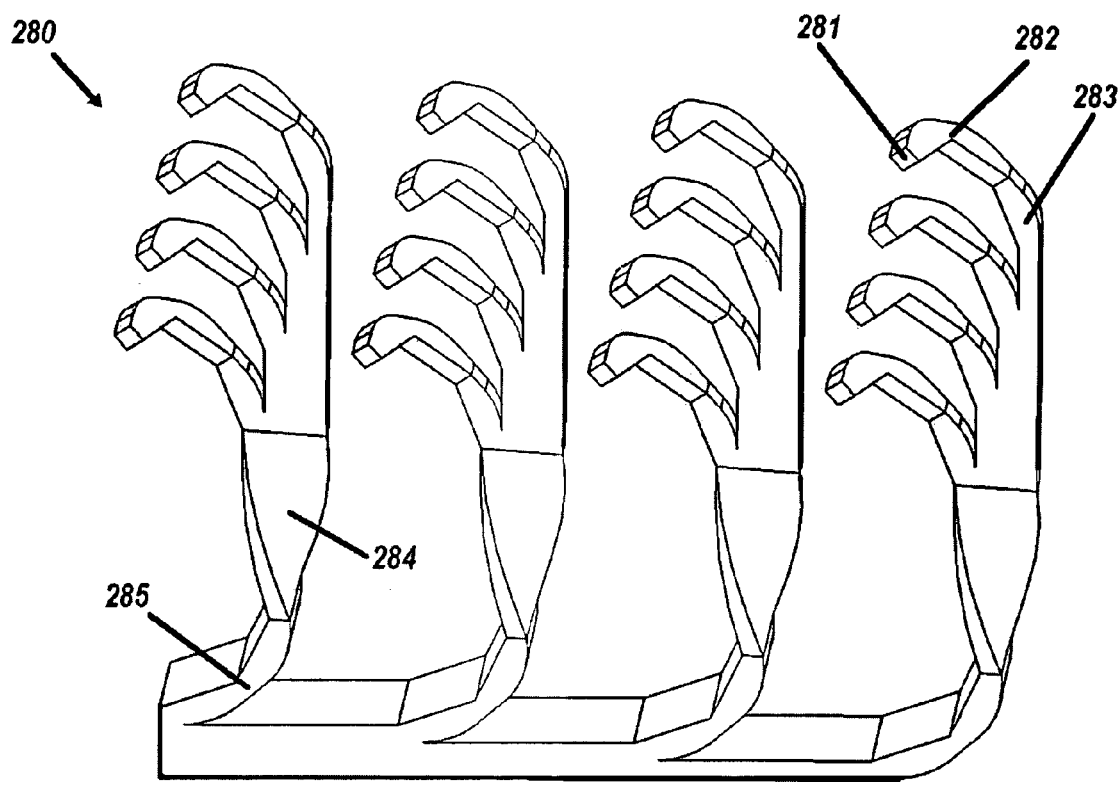
FIG. 28A is a perspective view of a 4×4:1 twisted-branch optical manifold.

FIG. 28A is a perspective view of a 4×4:1 optical manifold 280, comprising sixteen coplanar input ports 281, each having a dual angle-rotator 282 feeding second angle rotator 283, which is in a plane turned at 90° to the plane of dual angle-rotator 282. Columns of four of these dual angle rotators feed into four twisters 284, followed by large angle rotators 285.

Figure 28B:
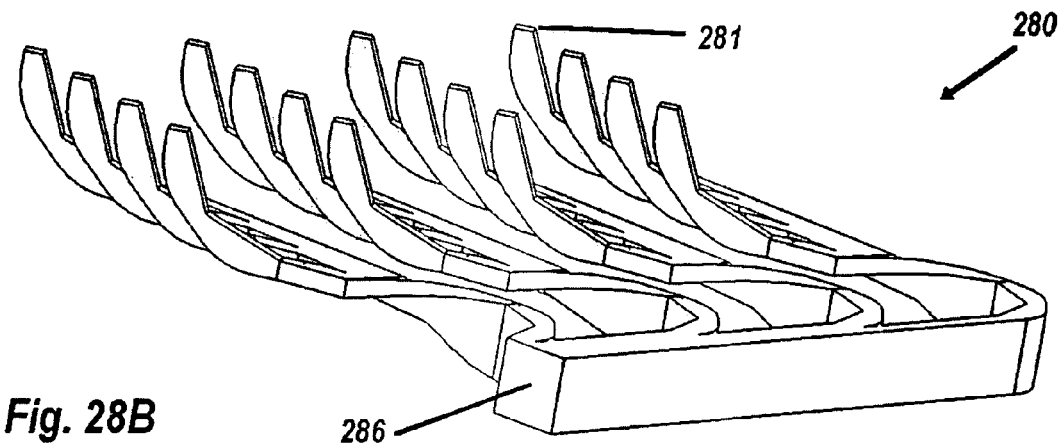
FIG. 28B is another perspective view of the 4×4:1 twisted-branch optical manifold shown in FIG. 28B, viewed from another angle.

FIG. 28B is a perspective view of a manifold 280 as in FIG. 28A viewed from another angle, showing a square exit port 286.

Figure 29:
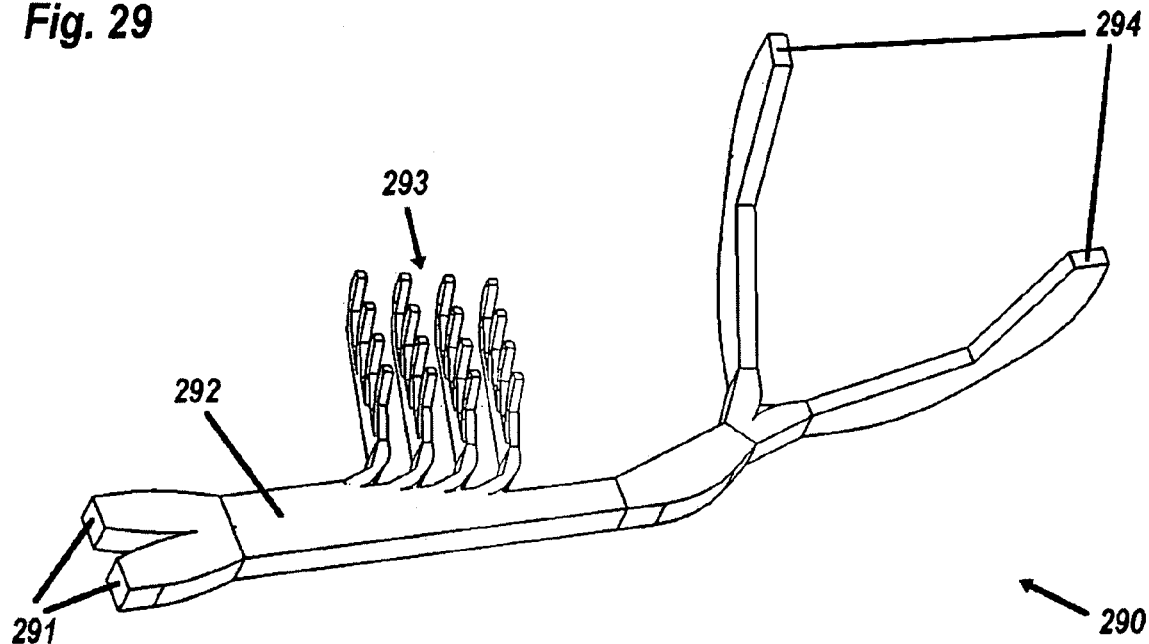
FIG. 29 is a perspective view of an alternative embodiment of an arbitrarily branched optical manifold.

To illustrate the versatility of the optical manifolds described herein, FIG. 29 is a perspective view of an optical manifold 290, similar to what might be utilized to illuminate the instruments of an automotive dashboard. For reliability, dual input LEDS 291 feed into the manifold 290, with the possibility of one operating as primary illuminator and the second as backup or daytime illuminator. Alternatively, the two LEDs could have different colors to signal different overall conditions. The input light splits in mixing rod 292, about half going to a 4×4 output array 293, and the other half proceeding to split and feed rectangular output ports 294.

Another advantage of various of the optical manifolds described herein is their ability to alter not only the limiting angle of light entering the manifold, but also the spatial shape of the luminance entering it, particularly from square to rectangular. The luminance shifters of FIGS. 15A and 15B can be adapted for this purpose, enabling elongated luminance distributions to be produced.

Figure 30:
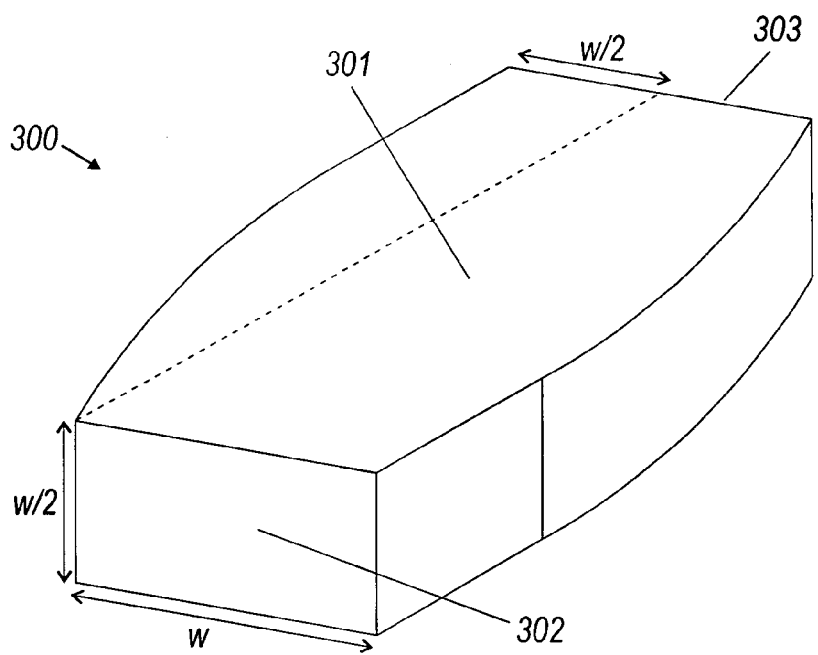
FIG. 30 is a perspective view of a luminance shifter.

FIG. 30 is a perspective view of a luminance shifter 300, formed from profile 301 of width w (at port 302), by an orthogonal sweep by w/2, so that first port 302 is a 2:1 rectangle. Second port 303 is shifted by w/2 as shown in FIG. 15A.

FIG. 31A is an exploded, perspective view of another embodiment. Upper half-width shifter 300U is contiguous across line 300Ud with orthogonal shifter 305U, with downward shift of w/4. Nearly identical but inverted lower shifter 300L is contiguous with shifter 305L, to provide a side shift of w/2 and an upward shift w/4.

FIG. 31B is a perspective view of the monolithic etendue-squeezer 310 shown in exploded view in FIG. 31A. In FIG. 31B, a square input face 311 is split into a top duct 311U and a lower duct 311L, also diverging to form a 4:1 rectangular output face (not shown). As previously, this device operates on light within the critical angle of its transparent material.

FIG. 31C is another perspective view of the etendue-squeezer 310 shown in FIG. 31B, showing a 4:1 rectangular output face 312, and also showing its width 2 w and height w/2.

Figure 32:
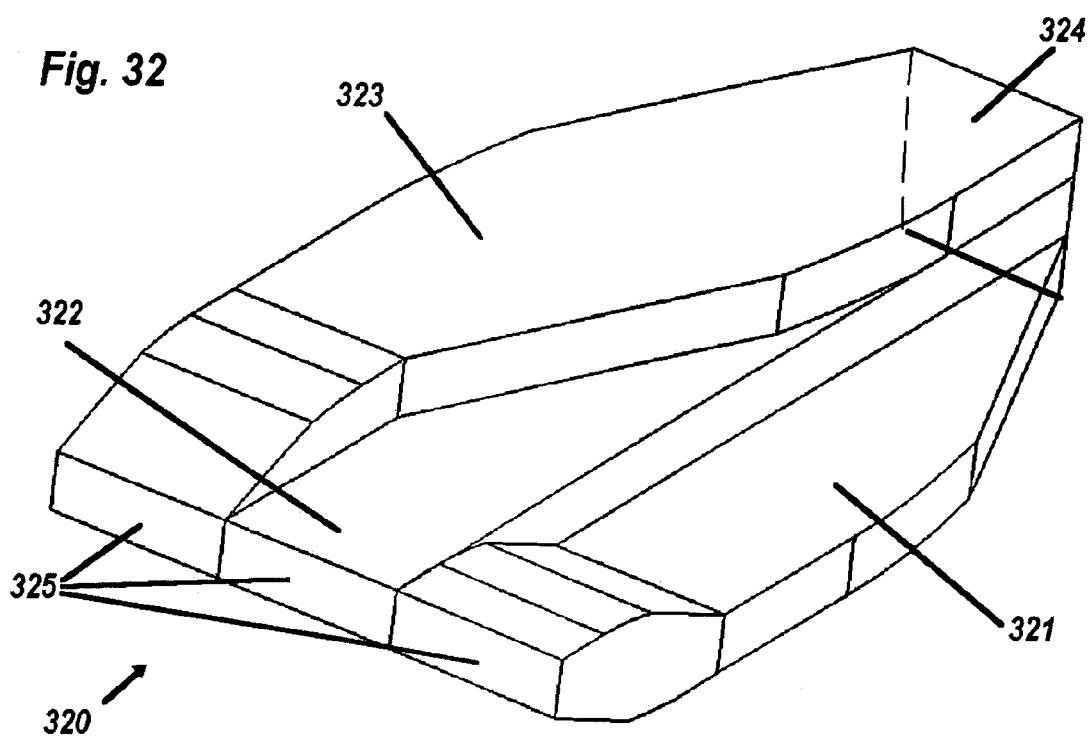
FIG. 32 is a perspective view of a monolithic 9:1 etendue-squeezer.

FIG. 32 is a perspective view of a monolithic 9:1 etendue-squeezer 320, comprising: an upper-to-left light-duct 321, a central rectangular duct 322, and a lower-to-right light-duct 323. These light-ducts divide square-face port 324 into three parts, each having a 3:1 ratio, which are displaced and rejoined as 9:1 elongated rectangular duct 325. The shape of rectangle 325 can be useful both as a fan-out for nine small light-ducts or as a synthetic light source for luminaires, particularly when phosphor-coated.

A practical issue with many embodiments of the optical manifold described herein is where to put attachment points for mounting a manifold in its proper position. When a surface is optically active, placing a mounting fixture thereupon will result in optical losses through diversion of light from its intended destination. Accordingly, it is often desirable to arrange for some optically inactive surfaces to be part of a manifold.

Figure 33A:
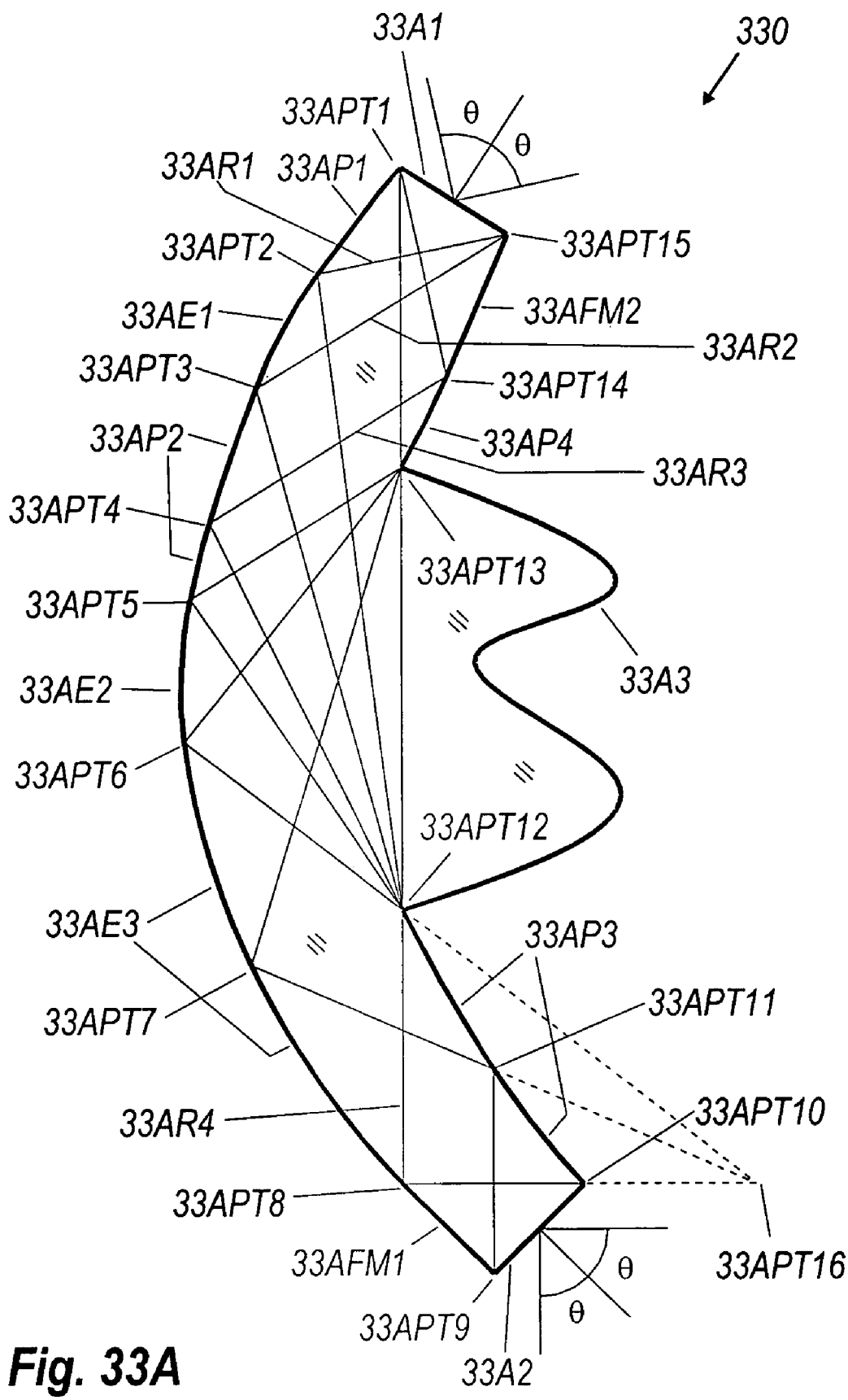
FIG. 33A is a cross-section of a luminance transfer duct with an optically inactive surface.

In FIG. 33A, the nomenclature for each item is such that it starts with the figure number (33A), followed by a code that identifies the type of object (PT for point, P for parabola, E for ellipse, FM for flat mirror, R for light ray) and then a number to identify each item separately. The remaining items do not have any code identifying the type of object and have only the figure number (33A) and a number. FIG. 33A is a cross-sectional view of a light duct 330 having an input port 33A1 and an output port 33A2, with limiting incidence angle θ upon both. Side of duct 330 comprises parabolic arc 33AP1 with focus at point 33APT12 and axis parallel to light ray 33AR1 and extends from point 33APT1 to point 33APT2. Point 33APT2 is on the straight line that goes through point 33APT15 and in the direction defined by the angle θ relative to the normal to the entrance aperture 33A1. The side wall continues with elliptical arc 33AE1 with foci 33APT15 and 33APT12, which extends from point 33APT2 to point 33APT3. Parabolic arc 33AP2 extends from point 33APT3 to point 33APT5 and has focus at point 33APT12 and axis parallel to ray 33AR2. Elliptical arc 33AE2 has foci 33APT13 and 33APT12 and extends from point 33APT5 and 33APT6. Elliptical arc 33AE3 has foci 33APT13 and 33APT16 and extends from point 33APT6 to point 33APT8. Flat mirror 33AFM1 completes the left side of the light guide and extends from point 33APT8 to point 33APT9. Point 33APT8 is obtained by intersecting a straight line perpendicular to the exit port 33A2 passing through point 33APT9 and another straight line passing through point 33APT10 and that makes an angle θ to the normal to the exit port 33A2. Point 33APT16 is on the straight line connecting points 33APT8 and 33APT10. On the right-hand side, the light guide starts with a parabolic arc 33AP3 with focus 33APT16 and axis parallel to ray 33AR4 and extends from point 33APT10 and 33APT12. The profile continues with non-optically active curve 33A3 that may be given any shape, as long as it does not intersect the straight line connecting points 33APT12 and 33APT13. Parabolic arc 33AP4 with focus at point 33APT1 and axis parallel to ray 33AR3 extends from point 33APT13 to point 33APT14. Flat mirror 33AFM2 completes the design and extends from point 33APT14 to point 33APT15.

Figure 33B:
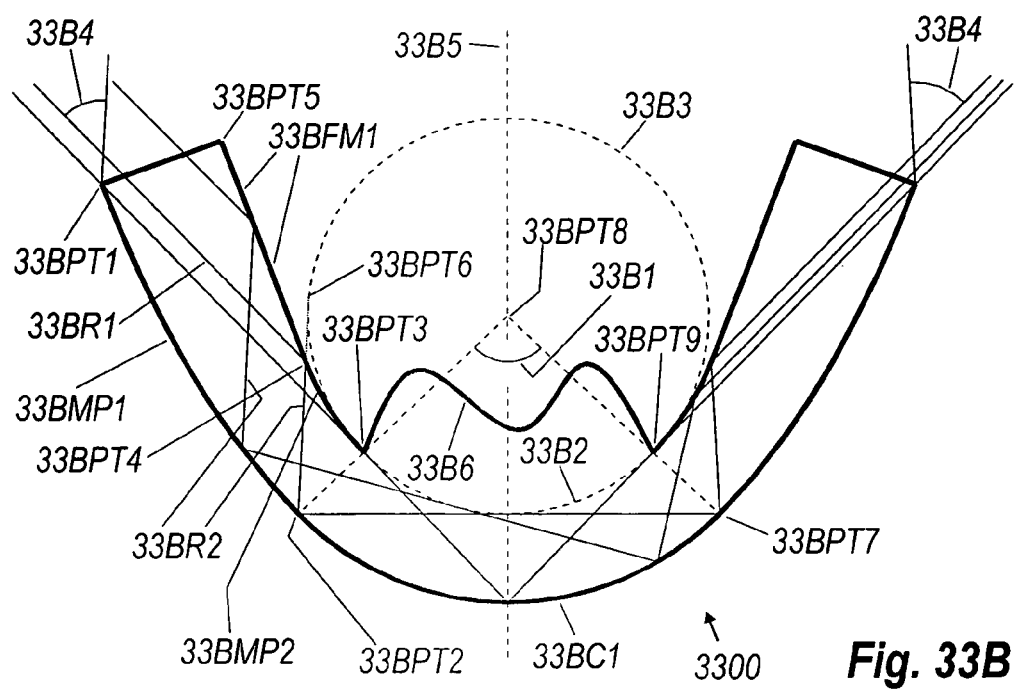
FIG. 33B is a cross-section of an angle-rotating luminance duct similar to the embodiment of FIG. 33A.

FIG. 33B is a cross-sectional view of an angle-rotating luminance duct 3300, resembling that of FIG. 13D, with a full 90° light rotation denoted by angle 33B1. The acceptance and exit angles 33B4 are both the same value. In the nomenclature of this figure MP stands for macrofocal parabola (as defined in the paper "Macrofocal Conics as Reflector Contours", D. Spencer, Journal of the Optical Society of America, Vol. 55, No. 1, pp. 5-11, January 1965) and C for circle. The side wall starts with macrofocal parabola 33BMP1 which extends from point 33BPT1 to point 33BPT2. It reflects rays parallel to rays 33BR2 tangent to the circular caustic 33B2 with center 33BPT8 and radius equal to the distance from point 33BPT8 to 33BPT3. The light guide continues with circular mirror 33BC1 with center 33BPT8 and extending from point 33BPT2 to point 33BPT7. The inner wall is composed of flat mirror 33BFM1 extending from point 33BPT5 to point 33BPT4. This mirror is perpendicular to the exit aperture. Macrofocal parabola 33BMP2 extends from point 33BPT4 to point 33BPT3 and reflects rays parallel to ray 33BR1 as if they were tangent to the circle 33B3, which is an extension of the caustic 33B2. The behavior of this mirror is exemplified by ray 33BR1 which after reflection appears to come from a tangent point 33BPT6 to circle 33B3. The profile is completed by the non-optically active surface 33B6 that may be given any shape, as long as it does not intersect the circular caustic 33B2 with center 33BPT8 and going from point 33BPT3 and 33BPT9. The optic is symmetrical relative to vertical line 33B5. Since mirror 33BC1 is a circular mirror and 33B2 is a circular caustic, both with the same center, the rotation that the optic provides can be easily changed by changing the angle 33B1 (with the corresponding decrease in arc length for 33BC1 and 33B2 and rotation of the side mirrors) while keeping the rest of the geometry unchanged.

Figure 34:
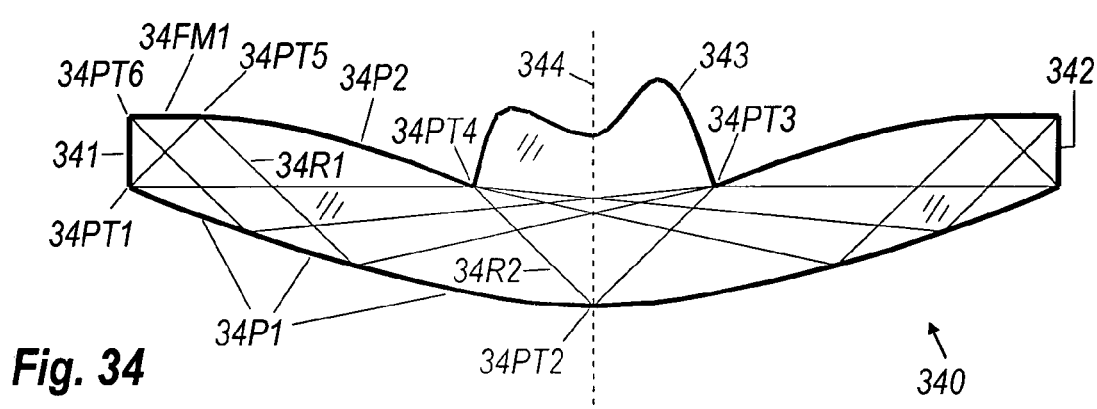
FIG. 34 is a cross-section of an angle-rotating luminance duct that has symmetrically placed ports.

FIG. 34 is a cross-sectional view of a light duct 340, which has symmetrically placed ports 341 and 342. Its lower contour comprises on the left, parabolic mirror 34P1 extending from point 34PT1 and 34PT2 and having focus 34PT3 and its axis parallel to 34R1. The upper contour comprises on the left flat mirror segment 34FM1 perpendicular to port 341 running from point 34PT6 to point 34PT5. It then continues with parabolic mirror 34P2 from point 34PT5 to point 34PT4, which has focus 34PT1 and its axis parallel to ray 34R1. The profile is competed by non-optically active curve 343 that may be given any shape, as long as it does not intersect straight line connecting points 34PT4 and 34PT3. The acceptance angle equals the exit angle and is defined by the angle between ray 34R1 and the line connecting points 34PT1 and 34PT5. The design is symmetrical relative to the vertical line 344.

Figure 35:
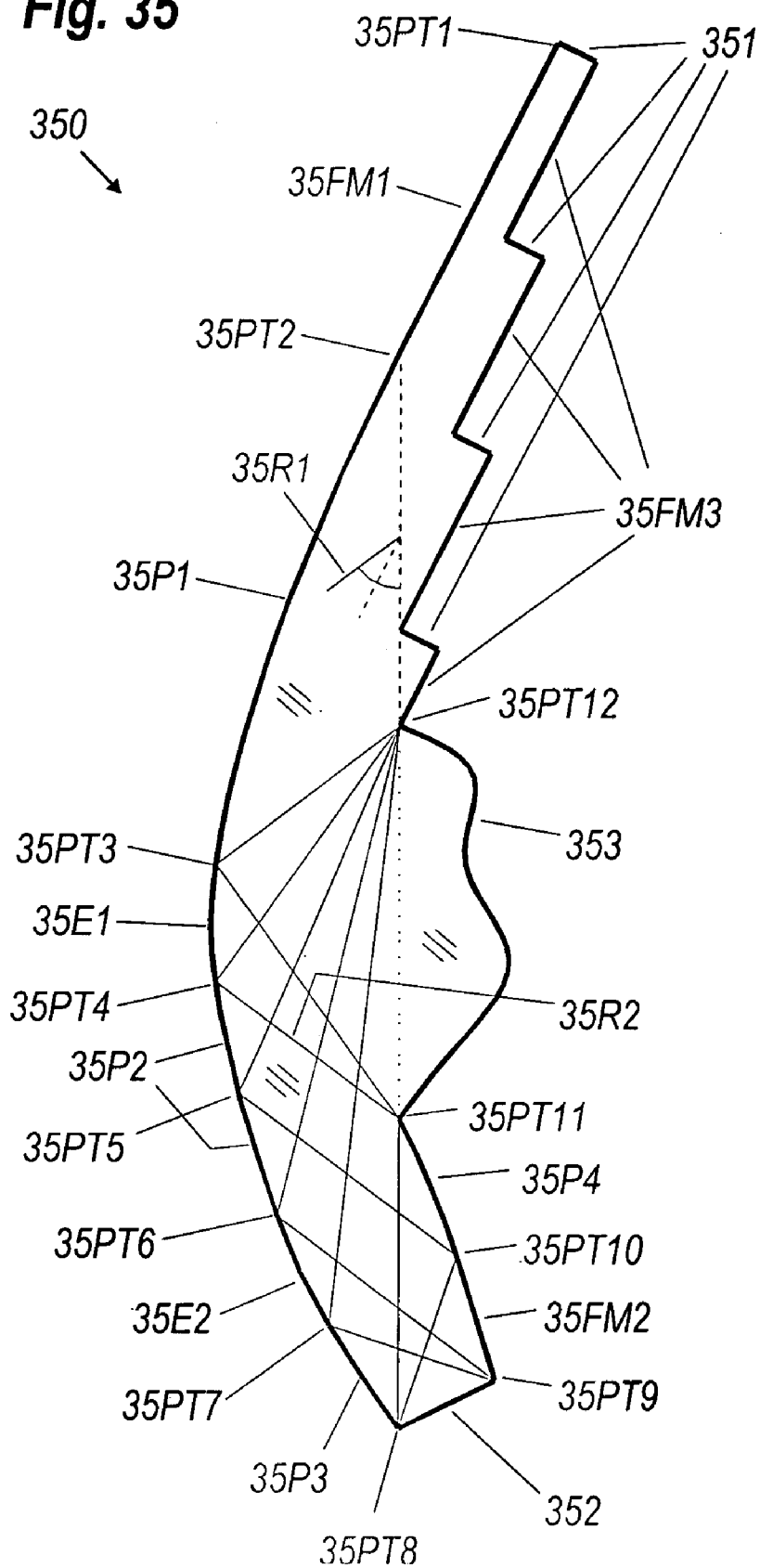
FIG. 35 is a cross-section of a 4:1 duct with an inactive surface.

FIG. 35 is a cross-sectional view of a light duct 350 that has plurality of input ports 351 and an exit port 352. Input ports 351 are perpendicular to flat mirrors 35FM3 and 35FM1. The acceptance angle of the device is defined by the angle between the line from point 35PT2 to point 35PT12 and ray 35R1. Both make the same angle to the flat mirrors 35FM3 and 35FM1. The exit angle is defined by the angle between the line connecting points 35PT8 and 35PT10 and the line that contains points 35PT9 and 35PT7. Flat mirror 35FM1 extends from point 35PT1 to point 35PT2. The light guide profile continues with parabolic arc 35P1 extending from point 35PT2 to point 35PT3 and having its focus at 35PT11 and its axis parallel to ray 35R1. Elliptical arc 35E1 extends from point 35PT3 to point 35PT4 and has foci 35PT12 and 35PT11. Parabolic arc 35P2 extends from point 35PT4 to point 35PT6 and has its focus at 35PT12 and its axis parallel to ray 35R2. Elliptical arc 35E2 extends between points 35PT6 and 35PT7 and has its foci at 35PT12 and 35PT9. Parabola 35P3 extends from point 35PT7 to point 35PT8 and its focus at 35PT12 and its axis parallel to the ray from point 35PT7 to point 35PT9. On the other side, the light guide profile starts with flat mirror 35FM2 extending from point 35PT9 to point 35PT10. Parabolic arc 35P4 extends from point 35PT10 to point 35PT11 and has its focus at point 35PT8 and its axis parallel to ray 35R2. The design is completed by non-optically active surface 353 extending from point 35PT11 to point 35PT12 that may be given any shape, as long as it does not intersect straight line connecting points 35PT11 and 35PT12.

Figure 36:
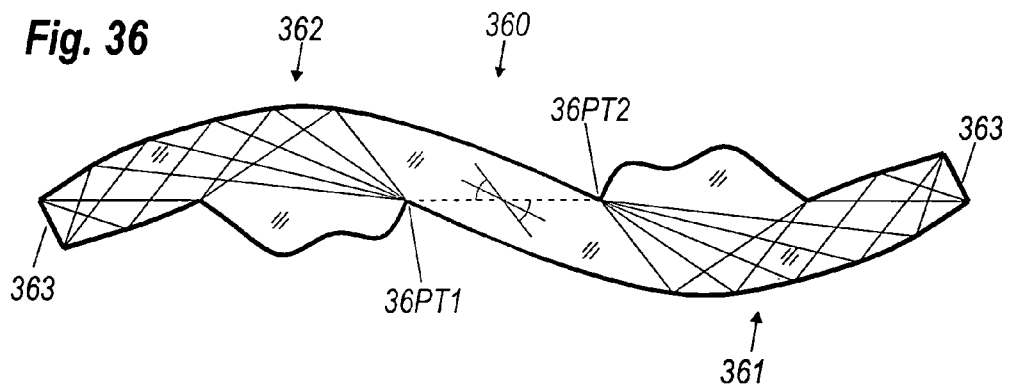
FIG. 36 is a cross-sectional view of a bilaterally symmetrical duct with two inactive surfaces.

FIG. 36 is a cross-sectional view of a luminance duct 360, having a configuration that is bilaterally symmetrical about dotted line from point 36PT1 to point 36PT2, and having ports 363. Both optics 361 and 362 are identical to optic 350 where the flat mirrors 35FM1 and 35FM3 and ports 351 were removed. Line from points 36PT1 to 36PT2 in FIG. 36 is the same as line from points 35PT2 to 35PT12 in FIG. 35.

Figure 37A:
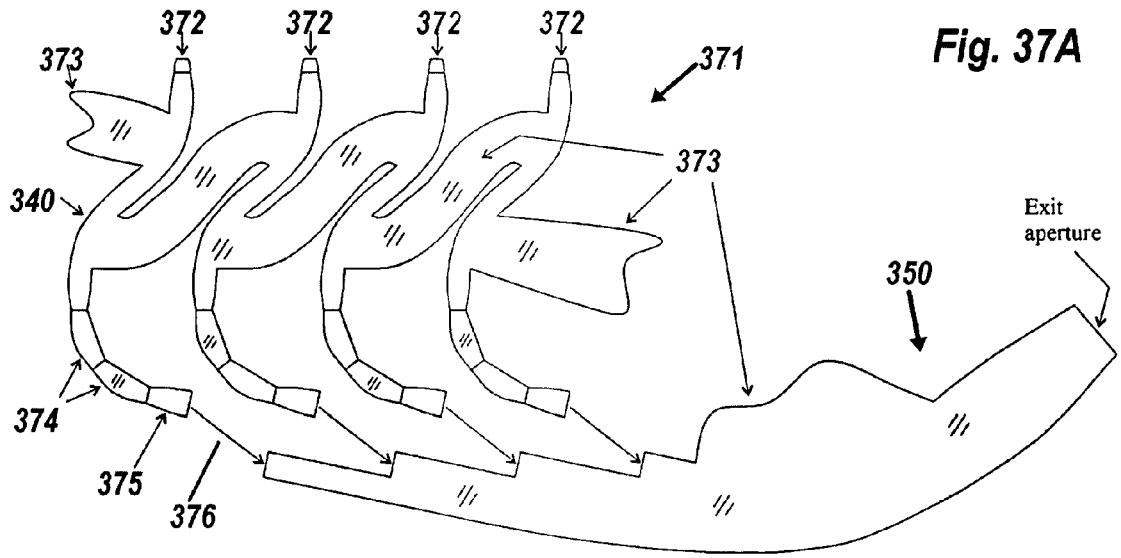
FIG. 37A is a cross-sectional view of a composite system comprising four joined ducts with the configuration of FIG. 35.

FIG. 37A is a cross-sectional view of an extended optical manifold comprising system 350 of FIG. 35, and a four-part manifold 371 fed by four-LEDs 372. The optical manifold 371 comprises the four sections 360 of FIG. 36, as well as angle rotators 374 and angle transformer 375, which are shown joining to duct 350 by arrows 376. Optically inactive surfaces 373 are available for mounting as well as for the location of injection gates and ejector pins in injection molding.

Figure 37B:
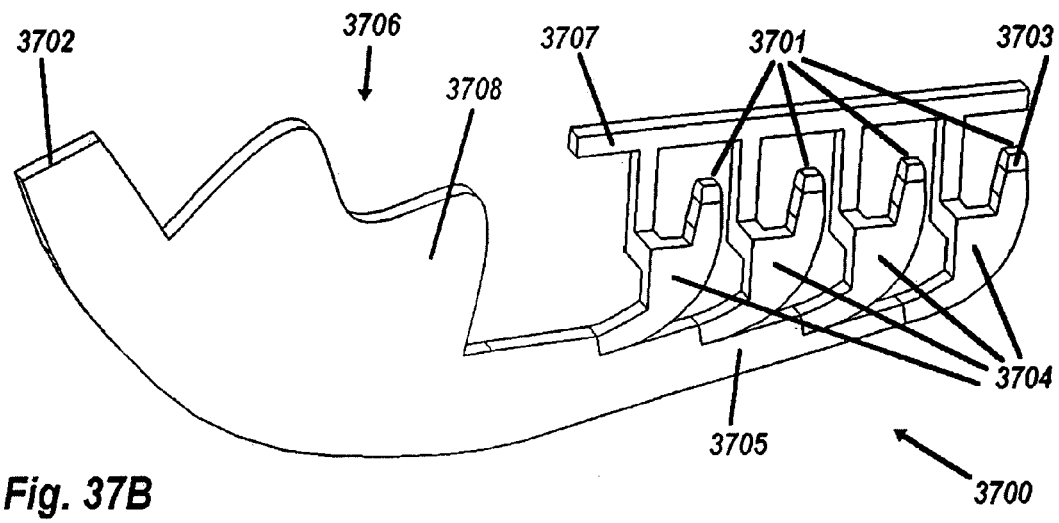
FIG. 37B is a cross-sectional view of another embodiment of an optical manifold in a further composite system.

FIG. 37B is a perspective view of another embodiment of an optical manifold. The optical manifold 3700 in FIG. 37B combines elements of previous Figures. In FIG. 37B, an optical manifold 3700 comprises four input ports 3701 (each with CPC 3703) and a single output 3702 having only their combined etendue, so that all light entering the input ports will be conveyed out the exit port. Each input port 3701 feeds one of the angle-rotators 3704, identical in profile to the embodiment of FIG. 33A. The rotators feed combiner 3705, which is identical to that of FIG. 22, and which in-turn connects with large rotator 3706. A structural beam 3707 connects with the optically inactive flanges of rotators 3704, providing secure mounting in a different plane than that of flange 3708.

Figure 37C:
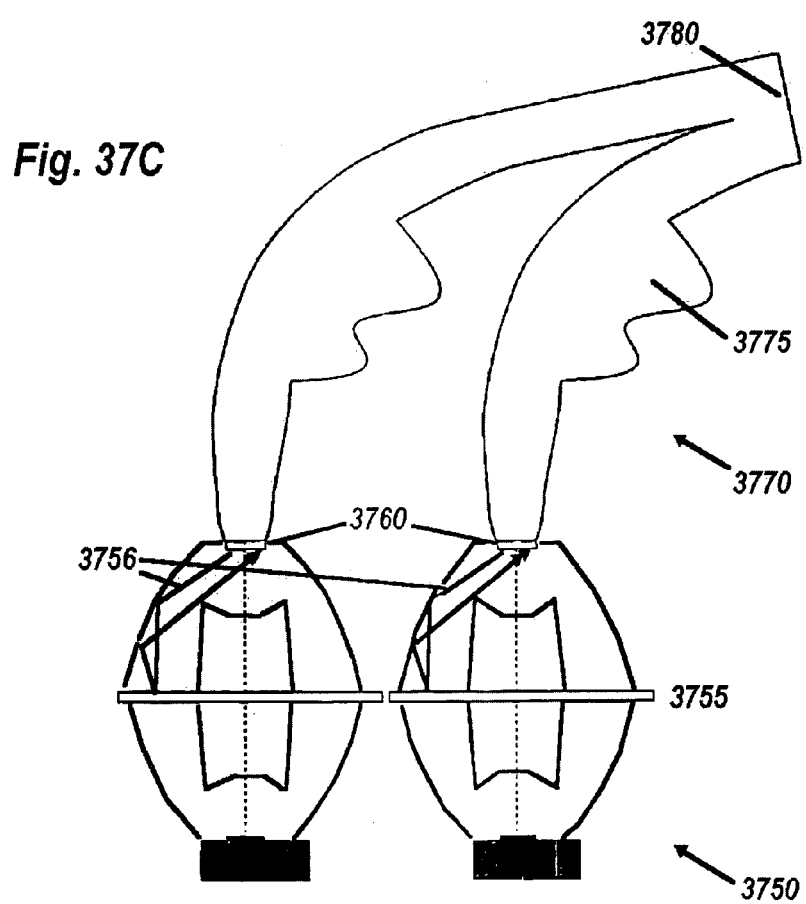
FIG. 37C is a cross-sectional view of another embodiment of an optical manifold in a composite system, also including a phosphor-coated surface.

FIG. 37C is a cross-sectional view of yet a further combination, showing two individual dual-lens LEDs with remote phosphors 3750, identical to that of FIG. 7E, including blue-pass dichroic filters 3755, seen to be recycling rays 3756 of phosphor back emission. Each phosphor feeds angle rotator 3770, their luminosity combined at output port 3780. Brackets 3775 provide sturdy support so that phosphors 3760 receive no structural loads.

FIG. 38A is a cross-sectional view of a dielectric CPC with source S1, emitting edge rays 383 illuminating dielectric CPC 382 with receiver R1. Nonuniformities across S1 will be smoothed out to give a uniform distribution at R1. The curved front faces enable this embodiment to be shorter than flat-faced CPCs.

FIG. 38B is a cross-sectional view of a dielectric CPC in alternative configuration. Because free-space propagation of edge-rays can be intolerant to position errors, FIG. 38B shows an alternate configuration that ensures light delivery. Flat-faced dielectric CPC 385 with source S2 illuminates dielectric block 387, which in turn illuminates CPC 386 with receiver R2. In the optics where this CPC configuration is used, air gap 388 is required for some embodiments. Anti-reflective coatings can be applied to the faces of block 387 proximate to the air-gap to minimize the losses due to Fresnel reflections.

Figure 39B:
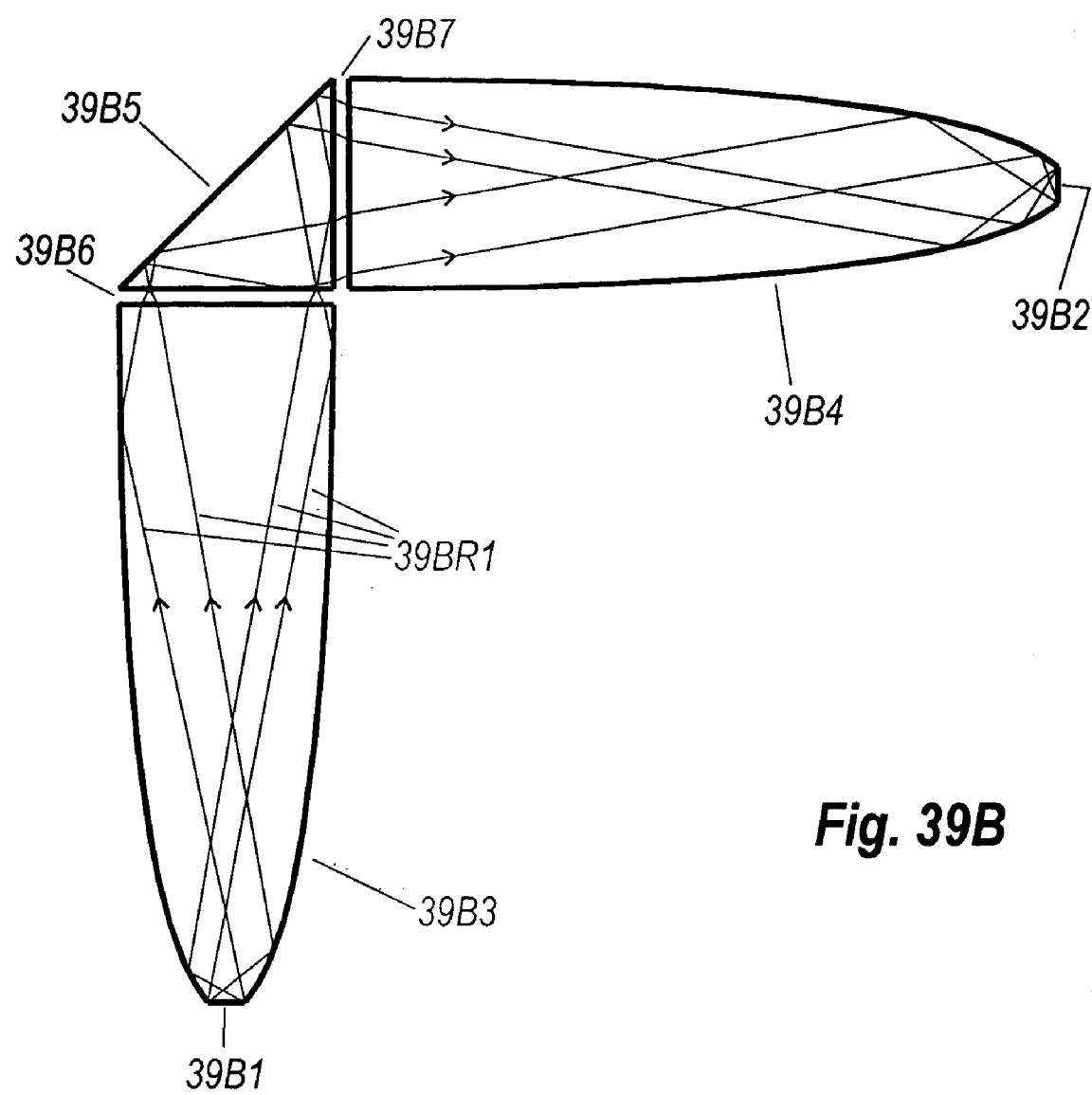
FIG. 39B is a cross-sectional view of an alternative optical manifold that includes two dielectric CPCs as in FIG. 39A, illustrating how an air gap prevents rays from escaping.

FIGS. 39A and 39B are cross-sectional views of an alternative arrangement that includes two CPCs. When a 90° turn is desired, the configuration of FIG. 39A shows how a prism coupler may be useful for transferring flux. CPC 39A3 a collects the light from source 39A1 and collimates it onto diagonal mirror 39A5 which reflects it towards CPC 39A4 which then concentrates it onto receiver 39A2. This geometry, however, is not perfect and some of the rays 39AR3 that leave the source will escape through the side walls of the optic, as for example is the case for rays 39AR1 and 39AR2. The optic of FIG. 39B, is similar but is an improvement of the embodiment of FIG. 39A. In this embodiment CPC 39B3 collects the light from a source 39B1 and collimates through air gap 39B6. Diagonal mirror 39B5 reflects this light through air gap 39B7 and into CPC 39B4, which in turn concentrates the light onto the receiver 39B2. The paths of the light rays inside the optic are exemplified by light rays 39BR1. Air gap 39B7 is in the direction of the flow lines of the radiation coming out of CPC 39B3 and air gap 39B6 is in the direction of the flow lines of the light reflected by mirror 39B5 and also those of CPC 39B4. This arrangement allows a perfect geometrical transfer of light from source 39B1 to receiver 39B2. can be achieved There will be some optical losses due to Fresnel losses at the air gaps and, therefore, anti-reflective coating may be employed to reduce them to a negligible level.

Figure 40:
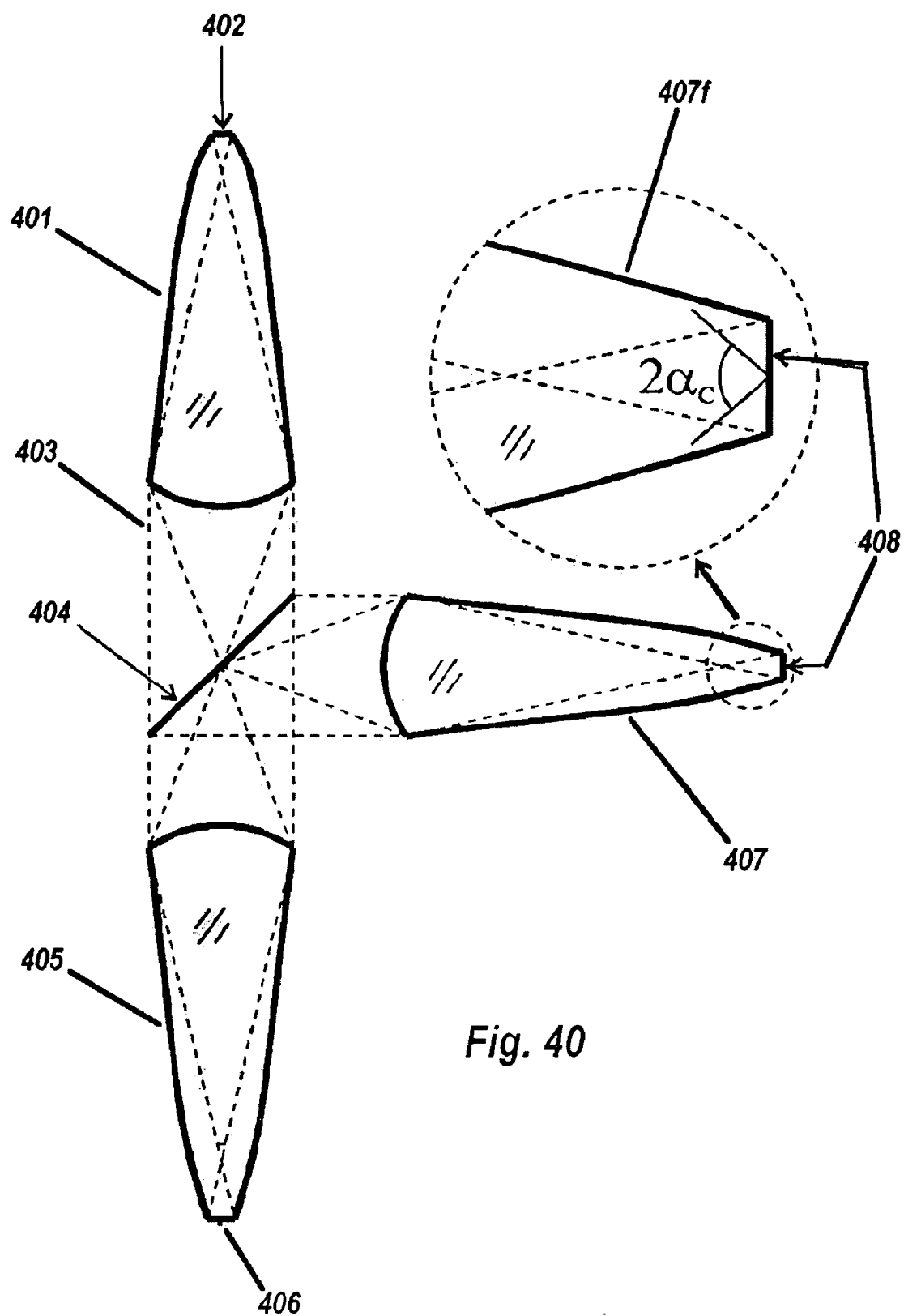
FIG. 40 is a cross-sectional view of an alternate configuration for utilizing phosphor back-emission.

FIG. 40 is a cross-sectional view of an alternative configuration of an optical manifold. The method shown and discussed with reference to FIG. 10D of recycling phosphor back-emission utilizes a blue-pass filter that returns this back-emission to the phosphor. This method utilizes low absorption in the phosphor. The configuration of FIG. 40 can be utilized for a phosphor that does have significant absorption of its own emission wavelengths. Dielectric CPC 401 has blue LED 402 coupled to it, with its directed output shown as edge rays 403. This blue light passes unimpeded through diagonal blue-pass filter 404 and proceeds into dielectric CPC 405 to illuminate phosphor patch 406. Phosphor back emission proceeds to filter 404 and is reflected into third dielectric CPC 407, which has exit face 408. Flat section 407*f* acts to restrict incidence angles to less than the critical angle $\alpha_c$, given by $\alpha_c = \sin^{-}(1/n)$ for refractive index n of the dielectric material comprising CPC 407.

Figure 41:
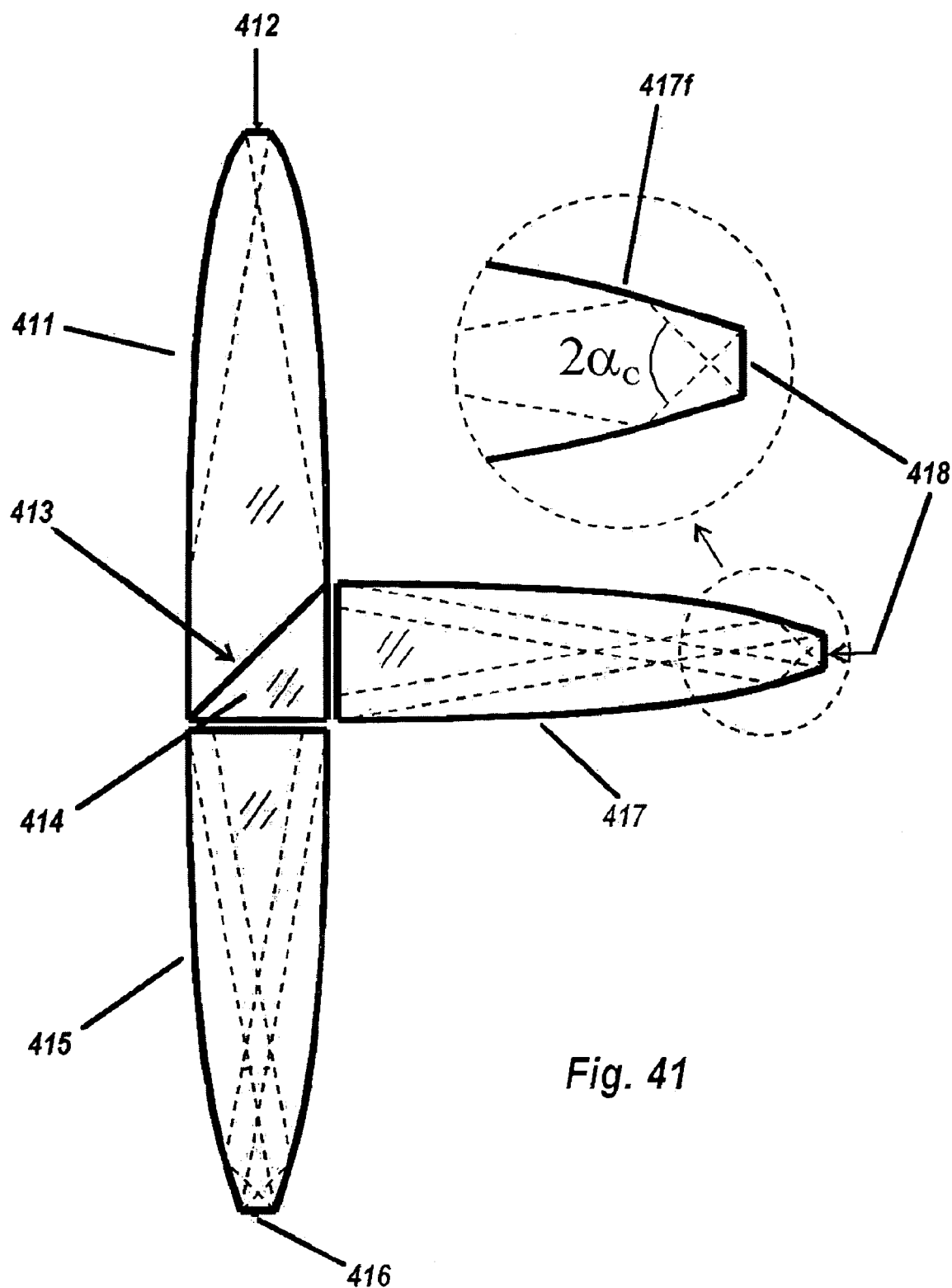
FIG. 41 is a cross-sectional view of another alternate configuration as in FIG. 40, also including a phosphor-coated surface.

FIG. 41 is a cross-sectional view of an alternative configuration of an optical manifold. FIG. 41 shows a similar configuration to FIG. 40, including a dielectric CPC 411 having a blue LED 412 coupled thereto. The CPC 411 has a diagonal exit face 413 with a blue-pass filter coated thereupon. Optically joined to face 413 is a diagonal prism 414. Adjacent to the prism 414 is a dielectric CPC 415, having a phosphor patch 416 on its exit face. Phosphor back-emission proceeds through prism 414, reflects off diagonal exit face 413 into dielectric CPC 417. This reflected back-emission forms a virtual source 418 at the exit face of CPC 417. An expanded view shows how flat section 417*f* acts to restrict incidence angles on face 418 to the critical angle $\alpha_c$.

Figure 42:
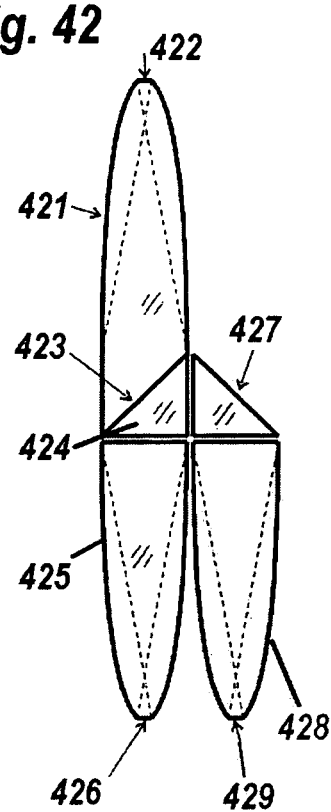
FIG. 42 is a cross-sectional view of another alternate configuration of FIG. 41, also including a phosphor-coated surface.

FIG. 42 is a cross-sectional view of an alternative configuration of an optical manifold. FIG. 42 depicts a similar configuration to FIG. 41. A dielectric CPC 421 is coupled to the blue LED 422 and has a diagonal exit face 423 with a blue-pass mirror coated thereupon and optically joined to prism 424. Dielectric CPC 425 receives the blue light from LED 422 and concentrates it on phosphor 426. The phosphor back-emission is reflected through prism 424 into diagonal prism 427. Third dielectric CPC 428 receives the back emission from prism 427 and concentrates it through the exit face 429.

Figure 43:
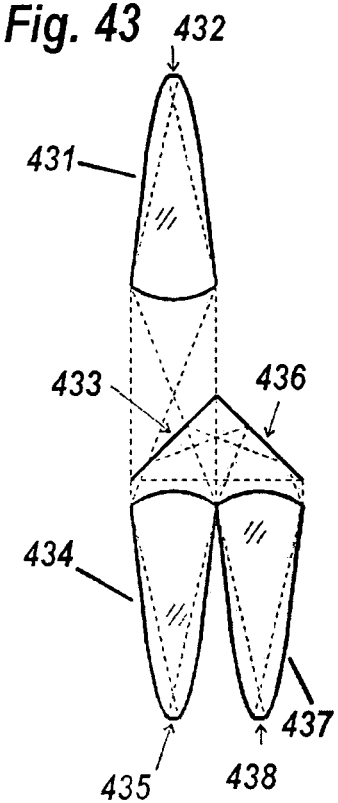
FIG. 43 is a cross-sectional view of a free-space version of FIG. 42, also including a phosphor-coated surface.

FIG. 43 is a cross-sectional view of a free-space version of FIG. 42. Curved-top dielectric CPC 431 is coupled to the blue LED 432 and sends its light through blue-pass filter 433 to the second dielectric CPC 434, having a phosphor patch 435 at its exit face. The phosphor back-emission is reflected by a filter 433 to the mirror 436, thence into the third CPC 437, where it is concentrated through the exit face 438.

Figure 44:
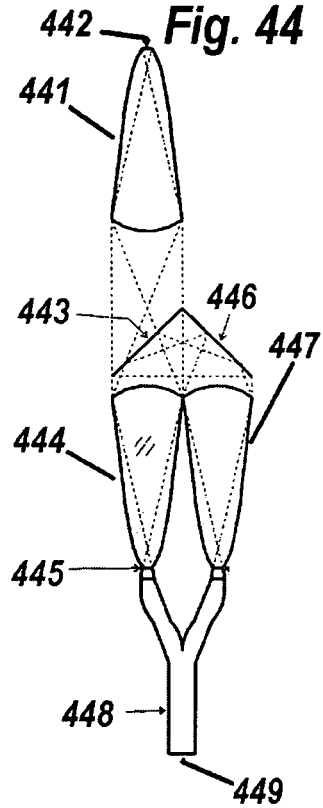
FIG. 44 is a cross-sectional view of an alternate configuration that adds a combiner to FIG. 43, also including a phosphor-coated surface.

FIG. 44 is a cross-sectional view of an alternative configuration of an optical manifold that resembles FIG. 43. FIG. 44 has a CPC 441, a blue LED 442, a blue-pass filter 443, a second CPC 444, a phosphor patch 445, a diagonal mirror 446, and a third CPC 447. A Y-shaped combiner 448 has an output face 449 with twice the area of the phosphor patch 445.

Figure 45:
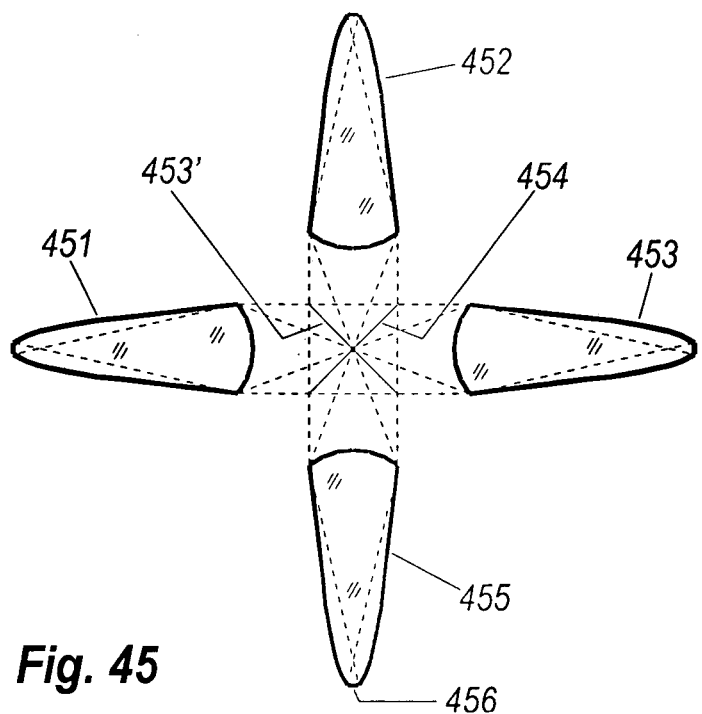
FIG. 45 is a cross-sectional view of an alternate configuration that includes an orthogonal three-color free-space combiner with the refracted output area of one source, not all three, to provide a multiwavelength output.

FIG. 45 is a cross-sectional view of an optical manifold that can be used to combine a plurality of LEDS of different colors to provide a multiwavelength light output. When combining plurality of LEDs of different colors into a white resultant, it is advantageous if the output area is about the same as the input area of any one color, rather than their sum, since this would increase luminance, for example by a factor of about three. (It should be noted that strictly speaking that if the LED is embedded in a solid dielectric that in order for all the light to exit from the output area to the air, the size of the output area must be larger than the input area by a factor equal to the square of the index of refraction of the dielectric material.) FIG. 45 shows one way of accomplishing this. Three curved-face dielectric CPCs are shown, including a red CPC 451, a green CPC 452, and a blue CPC 453. Corresponding LED sources, R, G, and B are in optical contact with their respective CPCs, i.e., with no air gap. A diagonal filter 454 reflects only red light. Second diagonal filter 453' reflects only blue light. All three colors are thereby overlaid and sent into fourth CPC 455, which combines their light into a white resultant at exit face 456. The exit face 456 is actually larger than faces R, G, or B, by a factor at least equal to refractive index n of the dielectric material comprising the four CPCs 451, 452, 453, and 455. (This factor holds only for the 2-dimensional case. In three dimensions the area of the exit face would be larger by a factor of $n^2$.) The fourth CPC 455, however, also differs since it alone also comprises a basal linear section, which acts to restrict incidence angles upon face 456 to a maximum of critical angle $\alpha_c$. The geometry of its tip is similar to the one shown in close-up 407*f* in FIG. 40. Refracted rays exiting face 456 will range up to 90°.

Figure 46:
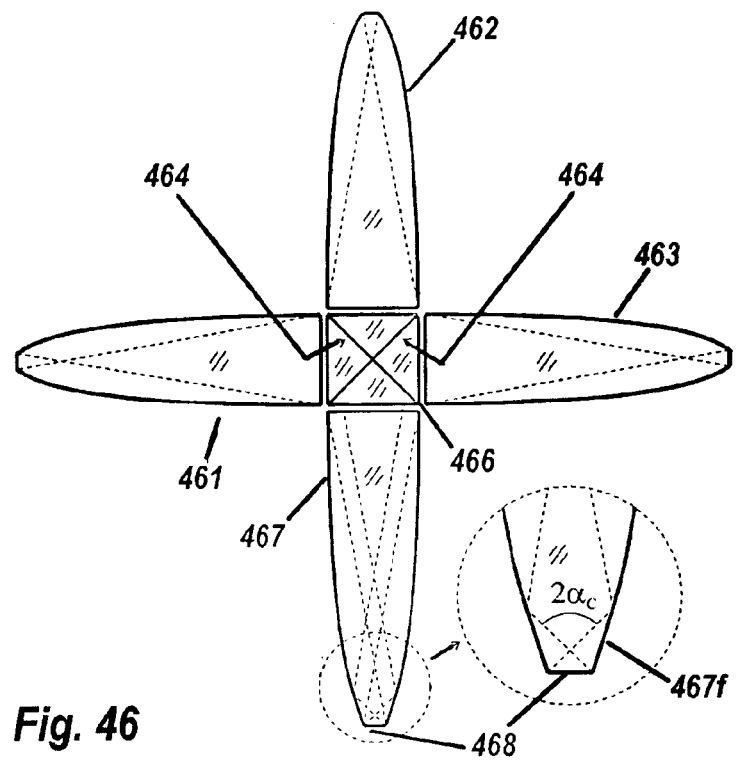
FIG. 46 is a cross-sectional view of an alternate configuration that includes a orthogonal combiner as in FIG. 45 to provide a multiwavelength output, but with a four-prism filter arrangement.

FIG. 46 is a cross-sectional view of an alternative configuration of an optical manifold that can be used to combine a plurality of different color LEDS to provide a multiwavelength light output. FIG. 46 shows a red dielectric CPC 461, a green CPC 462, and a blue CPC 463. A first diagonal filter 464 reflects only red light, and a second diagonal filter 464 reflects only blue light. A prism block 466 is assembled from four smaller prisms having these filter coatings upon them. A fourth dielectric CPC 467 receives three superimposed radiant inputs and combines them into a single white output at exit face 468, whose edge is n times the size of one of edges of the three colored CPCs. A straight section 467*f* restricts incident rays to critical angle $\alpha_c$.

Figure 47:
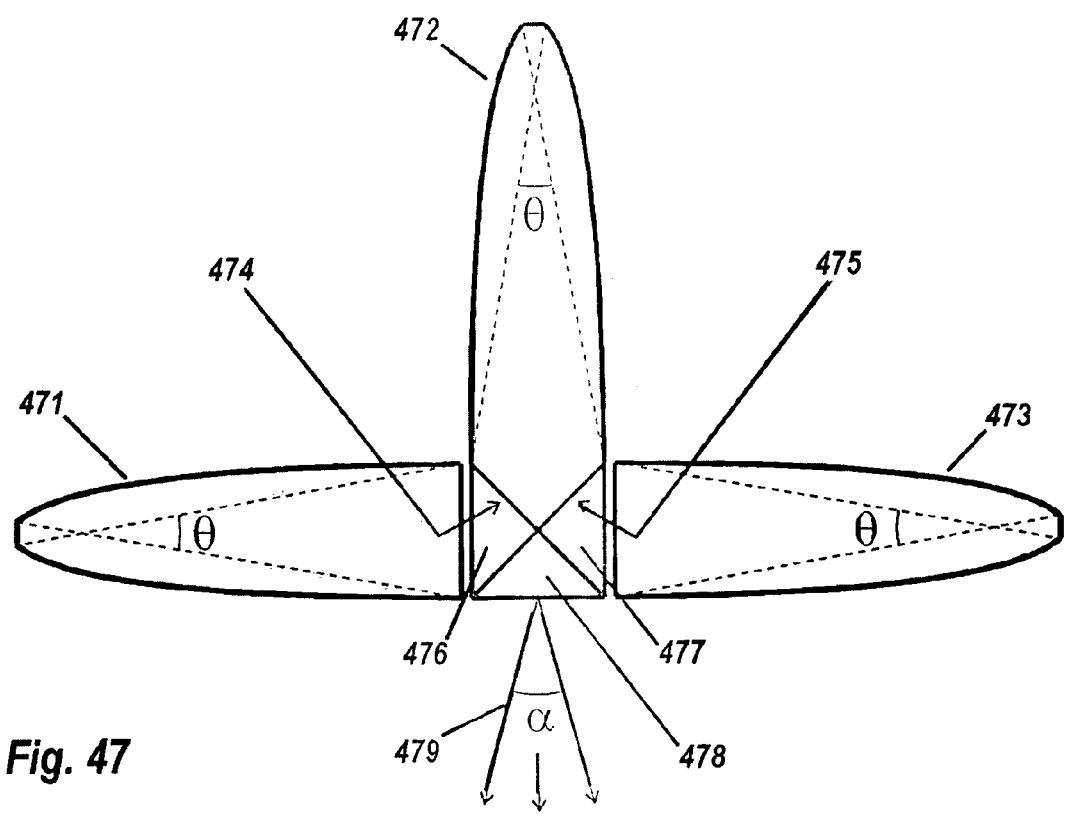
FIG. 47 is a cross-sectional view of an alternate configuration to provide a multiwavelength output that includes an orthogonal prism combiner with angularly narrow-output.

FIG. 47 is a cross-sectional view of an alternative configuration of an optical manifold that resembles FIG. 46. When a white resultant is desired with a narrow angle, the fourth CPC can be dispensed with. Also, an air gap is not strictly necessary between the prism block and the green CPC. FIG. 47 shows the result, with red dielectric CPC 471 and blue dielectric CPC 473 as before, but green CPC 472 has a dual-diagonal exit face. Red reflector 474 and blue reflector 475 are applied to the faces of diagonal sub-prisms 476, 477, and 478. The combined white output 479 has beamwidth α that is the Snellian resultant of internal angle θ of the three CPCs.

Figure 48:
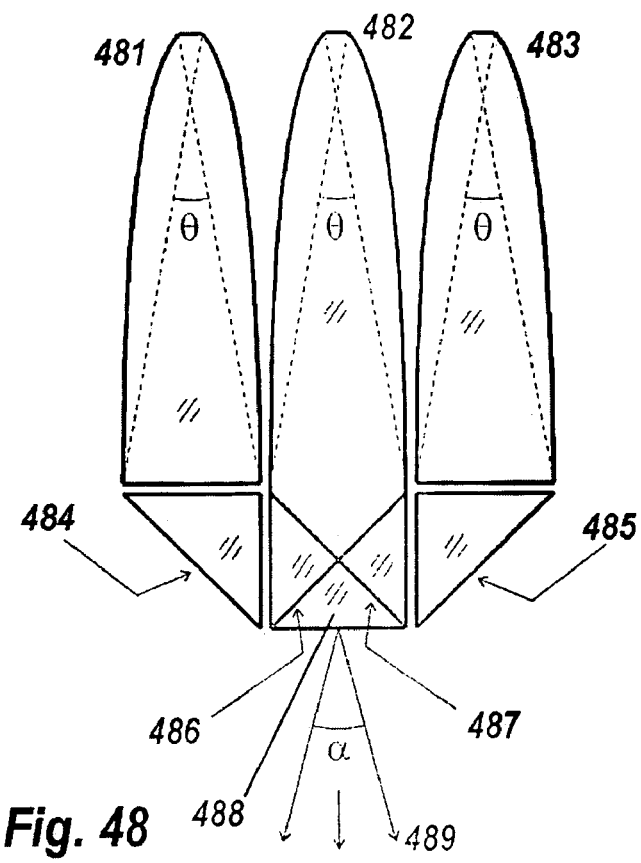
FIG. 48 is a cross-sectional view of an alternate configuration that shows a parallel three-color combiner with angularly narrow output.

FIG. 48 is a cross-sectional view of an alternative configuration of an optical manifold that can be used to combine a plurality of different color LEDs to provide a multiwavelength light output. It would in some cases be more convenient if the LEDs could be in the same plane. Accordingly, FIG. 48 shows a plurality of parallel dielectric CPCs, including a red CPC 481, a green CPC 482, and a blue CPC 483. First and second diagonal mirror-prisms 484 and 485 are also shown. Sub-prisms 486, 487, and 488 are as before, providing a white output 489.

Figure 49:
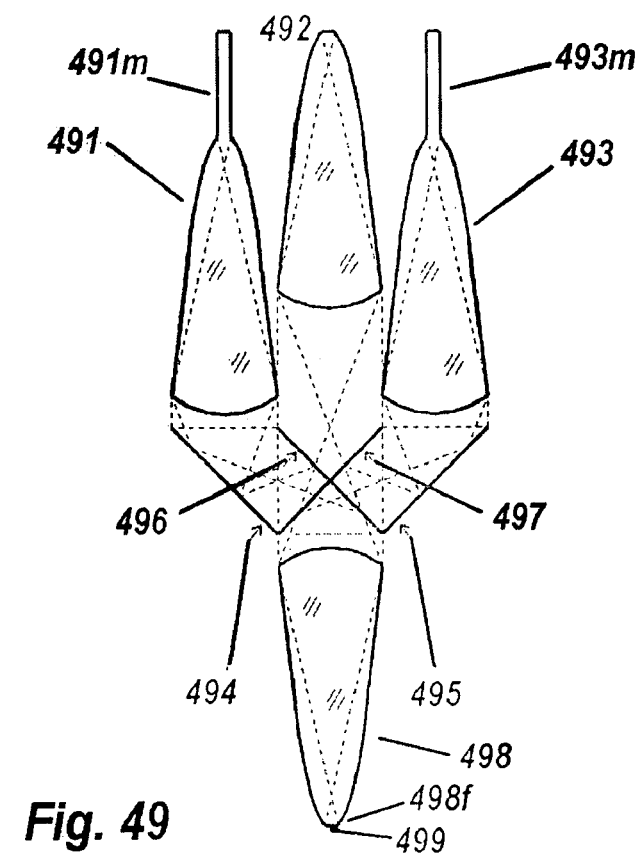
FIG. 49 is a cross-sectional view of an alternate configuration that includes a free-space parallel combiner with output area n times one input.

FIG. 49 is a cross-sectional view of an alternative configuration of an optical manifold that can be used to combine a plurality of different color LEDs to provide a multiwavelength light output. A free-space version of coplanar sources is also possible. FIG. 49 shows a red CPC 491 with mixing rod 491m, green curved-top CPC 492, and blue CPC 493 with configuration identical to CPC 491. Side CPCs 491 and 493 are designed to accept radiation confined to the critical angle defined by the direction of light coming out of the LEDs and refracted into the dielectric material of these CPCs. For the LEDs to be optically coupled to the optics (using glue or a gel), the upper tips of mixing rods 491m and 493m require small CPCs to transform the Lambertian radiation of the LEDs so that it is confined to the critical angle of the mixing rods and the therefore the radiation can be transported down the mixing rods without side losses. In this case, side CPCs 491 and 493 are designed to accept the light confined to the critical angle, but middle CPC 492 is designed to accept the fully Lambertian radiation emitted by the central LED. A diagonal mirror 494 deflects red light onto red reflector 496, while mirror 495 deflects blue light onto blue reflector 497. Fourth CPC 498 combines these beams into a white output at exit face 499, with flat section 498f restricting incidence angles at 499 to critical angle $α_c$.

Figures 50, 51A:
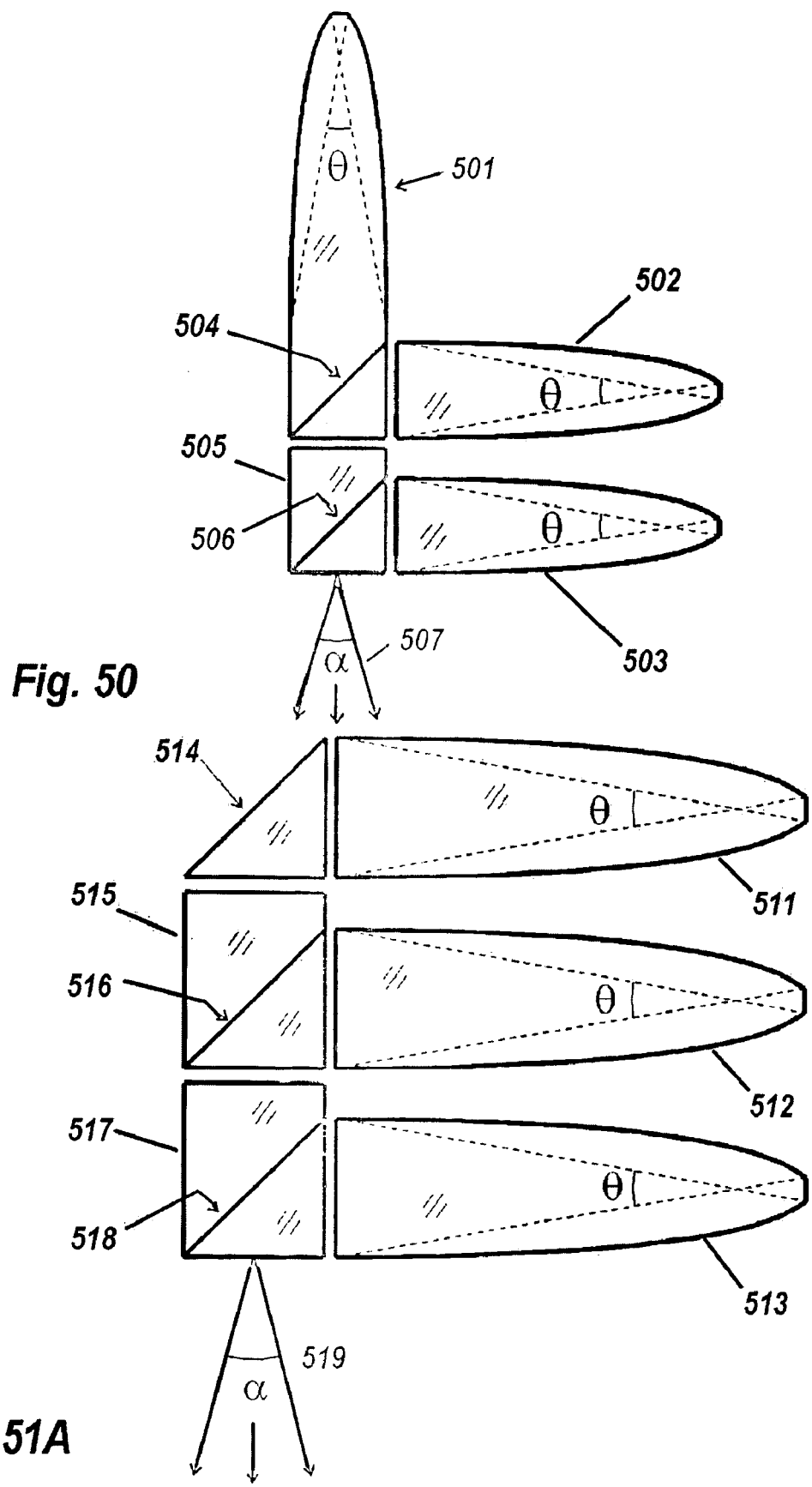
FIG. 50 is a cross-sectional view of an alternate configuration that can be used to combine a plurality of LEDs of different colors to provide a multiwavelength light output, including a prism combiner with two lateral CPCs.
FIG. 51A is a cross-sectional view of an alternate configuration that includes a prism combiner with three lateral CPCs arranged in parallel to combine light and provide a multiwavelength light output.

FIG. 50 is a cross-sectional view of an alternative configuration of an optical manifold that can be used to combine a plurality of different color LEDs to provide a multiwavelength light output. In FIG. 50 an optical manifold has a red CPC 501 with a diagonal exit face, a green CPC 502, and a blue CPC 503. Prism 504 has a red-pass green reflector on its diagonal face. Transition prism 505 receives the combined red and green light, and is optically joined to prism 506, which has a blue reflector on its diagonal and white output 507 exiting it.

FIG. 51A is a cross-sectional view of an alternative configuration of an optical manifold that utilizes coplanar sources. The embodiment of FIG. 51A includes a red dielectric CPC 511, a green dielectric CPC 512, and a blue dielectric CPC 513. A diagonal mirror prism 514 reflects red light downwards through transition prism 515. Optically coupled to prism 515 is diagonal prism 516 with a green reflector coating on its diagonal, which sends green light down through transition prism 517. Optically coupled to prism 517 is diagonal prism 518 with a blue reflector coating on its diagonal. White output 519 exits the bottom of prism 519 with beamwidth α. The distance between the LEDs can be easily changed by independently extending light guides 515 and/or 517.

Figure 51B:
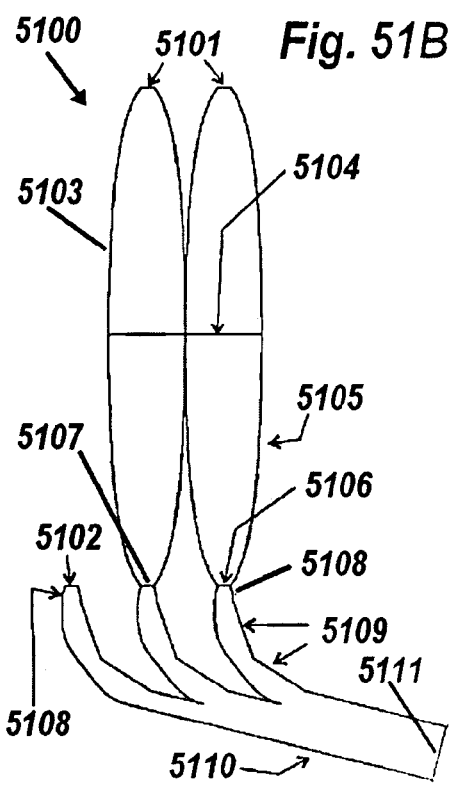
FIG. 51B is a cross-sectional view of a manifold that produces a multiwavelength output using different color LEDs, and a phosphor-coated surface.

Reference is now made to FIG. 51B. In some embodiments it is possible to employ two different phosphors in the blue-excitation embodiments of the optical transformer described herein. A green phosphor with good quantum efficiency could produce about the same luminosity as a green LED of the same radiant output as its blue-excitation LED, but its broader range of wavelengths is better for color rendition. The second phosphor could be a conventional yellow phosphor much like that now used in white LEDs, but doped to reduce the red portion of its emission. This is advantageous in that red wavelengths have a large Stokes loss when generated by photoluminescence. Instead, a red LED can be mixed with the two phosphors to produce an excellent white source. FIG. 51B is a cross-sectional view of a configuration of an optical manifold that generates a multiwavelength light output. Particularly, the optical system in FIG. 51B includes LED manifold 5100 that produces white light, and including two blue LEDs 5101 and a red LED 5102 as luminous inputs. The blue LEDs 5101 feed CPCs 5103, which collimate their light onto blue-pass dichroic filter 5104, which in turn lies atop CPCs 5105. Green phosphor 5106 and yellow phosphor 5107 have their back-emission recycled by filter 5104, and their enhanced forward emission collected by small CPCs 5108, which in turn feed angle-rotator pairs 5109. The second rotator of each angle-rotator pair 5109 feeds output mixing rod 5110 that delivers uniform luminance and uniform white-chrominance at exit port 5111.

Figure 51C:
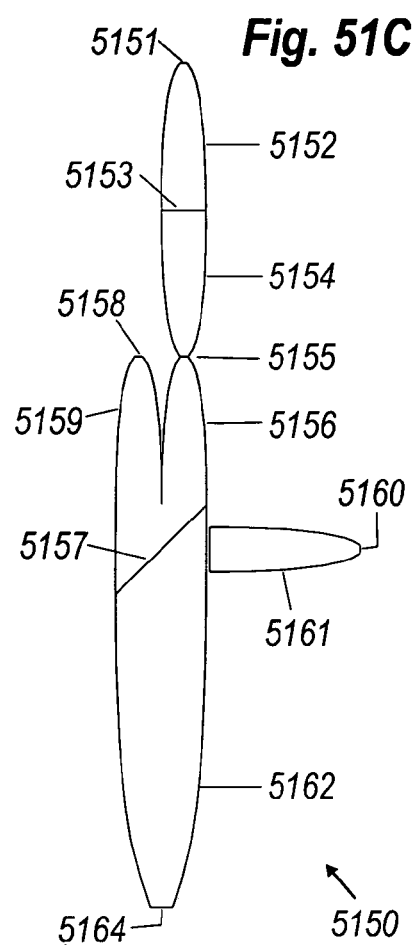
FIG. 51C is a cross-sectional view of an alternate configuration of a manifold that produces a multiwavelength output using different color LEDs, and a phosphor-coated surface.

FIG. 51C is a cross-sectional view of an alternative configuration of an optical manifold that generates a multiwavelength light output. The embodiment of FIG. 51C has a green phosphor only. The optical system in FIG. 51C includes a manifold 5150 that has an input blue LED 5151 feeding a CPC 5152, which contacts a blue-pass filter 5153. A CPC 5154 has a green phosphor 5155 at its small end. A phosphor 5155 feeds a CPC 5156, which collimates the phosphor's light onto diagonal red-reflecting filter 5157. A blue LED 5158 feeds a CPC 5159, which sends collimated blue light through the filter 5157. The red LED 5150 feeds a CPC 5161, which sends collimated light onto filter 5157, which in turn reflects this light 90° along large CPC 5162. A large angle transformer 5162 mixes the light from small CPCs 5156, 5159, and 5161, and narrows their angle for refraction out of exit face 5164.

The ability of the optical transformer described herein to integrate plurality of LED sources enables more than three wavelengths to be used and combined. Because the chromatic aberrations of the human eye tend to disturbingly separate the red and blue images of RGB video, amber and cyan colors can be added to reduce such effects. For example, the stacked configuration of FIG. 51A can be augmented with two more CPCs and filters for the amber and cyan sources.

Figure 52:
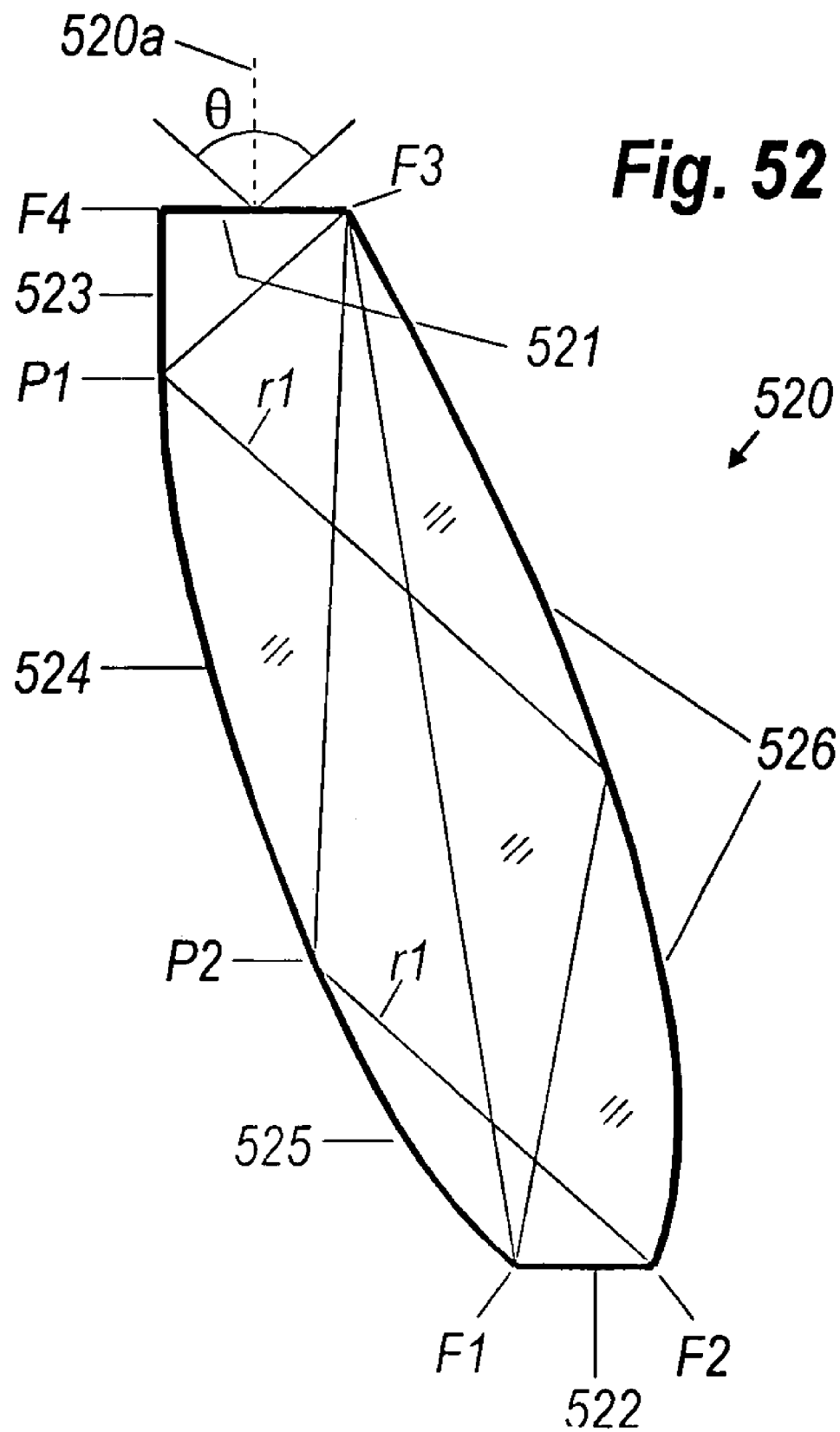
FIG. 52 is a cross-sectional view of an alternate configuration of an optical manifold that includes a double-width luminance shifter.

Reference is now made to FIG. 52, which is a cross-sectional view of an alternative configuration of an optical manifold. Returning to the subject of luminance shifters and continuing the sequence of the half-width lateral shifter 150 in FIG. 15A and full-width shifter 155 in 15B, the embodiment of FIG. 52 includes luminance shifter 520. As shown, light is restricted to angle θ from axis 520a drawn on exit port 521. Input port 522 has a smaller width and is laterally shifted with respect to port 521. The reason for the difference in size between the input and output ports is that input port 522 accepts fully Lambertian light from the LED, while output port 521 emits a light that is confined to angle θ. The left profile comprises flat mirror 523 extending from point F4 to point P1, parabolic arc 524 extending between points P1 and P2, with focus at F3 and axis parallel to lines r1, and elliptical arc 525, extending from point P2 to focus F1, with foci at F2 and F3. The right profile comprises parabolic arc 526 extending from point F2 to point F3 and with a focus at F1 and its axis parallel to lines r1.

Figure 53A:
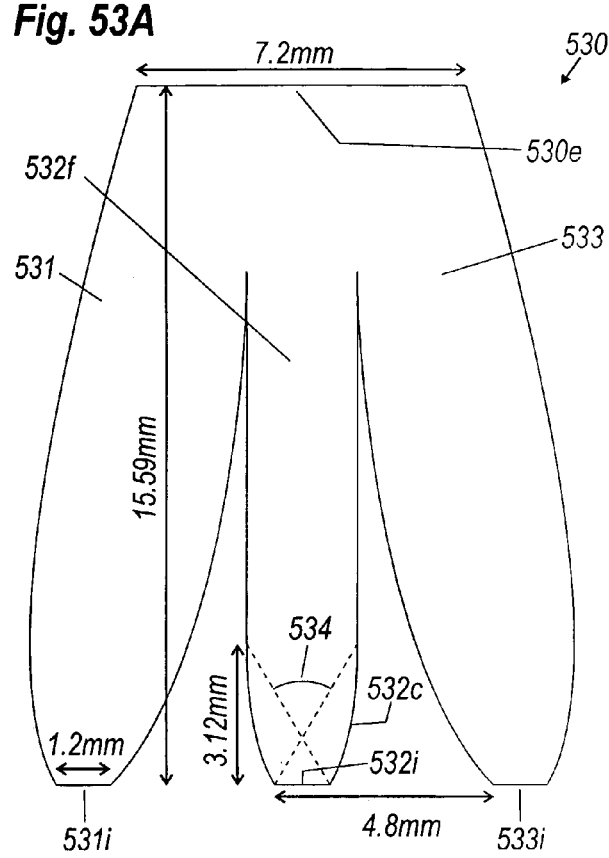
FIG. 53A is a plan view of a triplex optical manifold.

FIG. 53A is a plan view of a triplex optical manifold 530 comprising left luminance shifter 531 of FIG. 52 (imaged to the left), middle luminance duct 532, and right luminance shifter 533 of FIG. 52, all three having respective input ports 531$i$, 532$i$, and 533$i$, each of width of about 1.2 mm in this example. The two shifters mesh with a middle duct 532 along the length of the straight sections of these two shifters (523 of FIG. 52). The middle duct has a CPC profile 532$c$ at its entry port that is about 3.12 mm tall and which collimates the light to angle 534. This angle matches that of the side light shifters, as indicated in FIG. 52 by angle θ. The light exiting CPC 532$c$ is then transported up by light pipe 532$f$. This results in this example, in an optical system with combined exit surface 530$e$ with a width of about 7.2 mm.

Figure 53B:
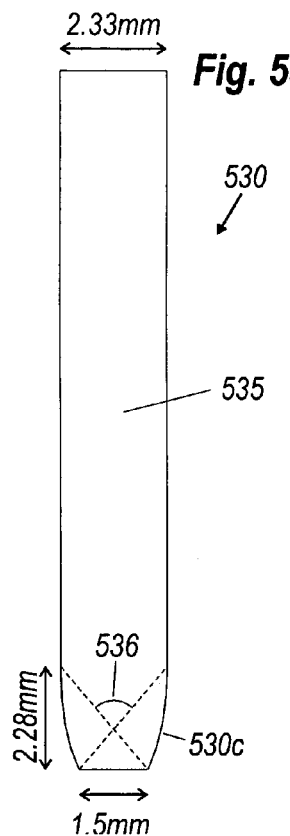
FIG. 53B is a side view of the triplex optical manifold of FIG. 53A.

FIG. 53B is a side view of the triplex optical manifold 530 shown in FIG. 53A, with a width which is about 2.33 mm in this embodiment. All three manifolds in FIG. 53A have a CPC profile 530$c$ in the orthogonal direction to the profile of FIG. 53A. The height of this CPC profile is about 2.28 mm and has an exit angle 536. The entry section of middle duct 532$f$ therefore utilizes a dielectric cross-CPC to adjust the vertical and horizontal exit angles to the desired specifications. The output angles for the three-fold manifold in the vertical and horizontal directions (angles 534 and 536) can be set independently of each other.

Figure 54A:
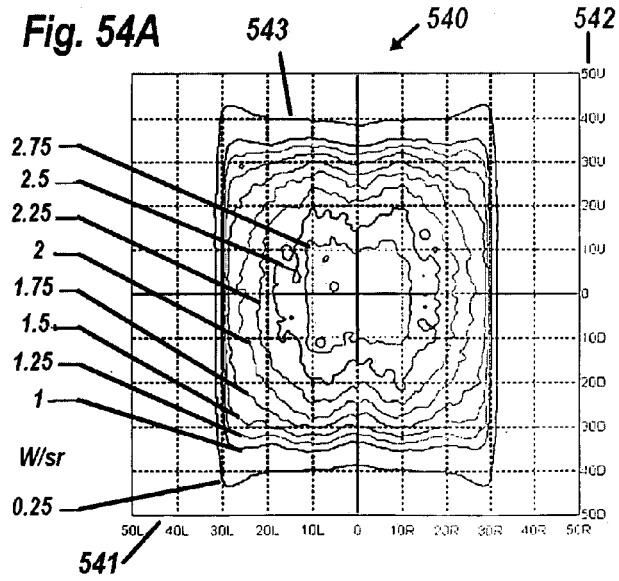
FIG. 54A is a contour graph of the far-field intensity emitted from the manifold of FIGS. 53A and 53B.

FIG. 54A is a graph that shows the contour diagram 540 of the far-field intensity emitted from the manifold of FIGS. 53A and 53B, with a horizontal angular scale 541 running from 50° left (50L) to right (50R) and vertical scale 542 running from 50° up (50U) to down (50D). Contour lines 540$c$ show intensity levels up to a maximum of 3.25 Watts per steradian. The contour line has sharp horizontal boundaries at about ±30°. The vertical boundaries of the contour line are less steep, extending to about ±40°.

Figure 54B:
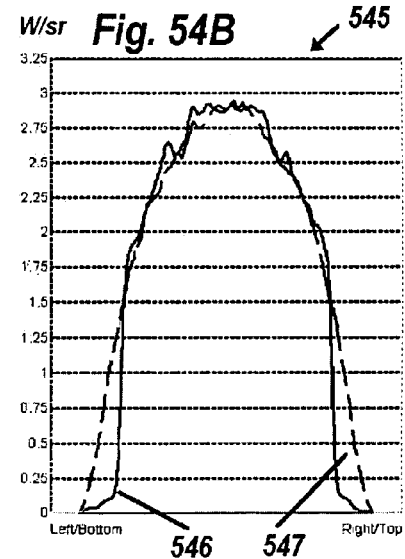
FIG. 54B shows the central horizontal and vertical profiles of the far-field intensity pattern emitted from the manifold of FIGS. 53A and 53B.

FIG. 54B is a graph 545 that shows the horizontal intensity profile as solid line 546 and the vertical intensity profile as dashed line 547 emitted from the manifold of FIGS. 53A and 53B. Both profiles have well-defined borders and steep skirts. Their overall form is quite reproducible despite individual differences in the LEDs feeding the manifold.

Figure 55:
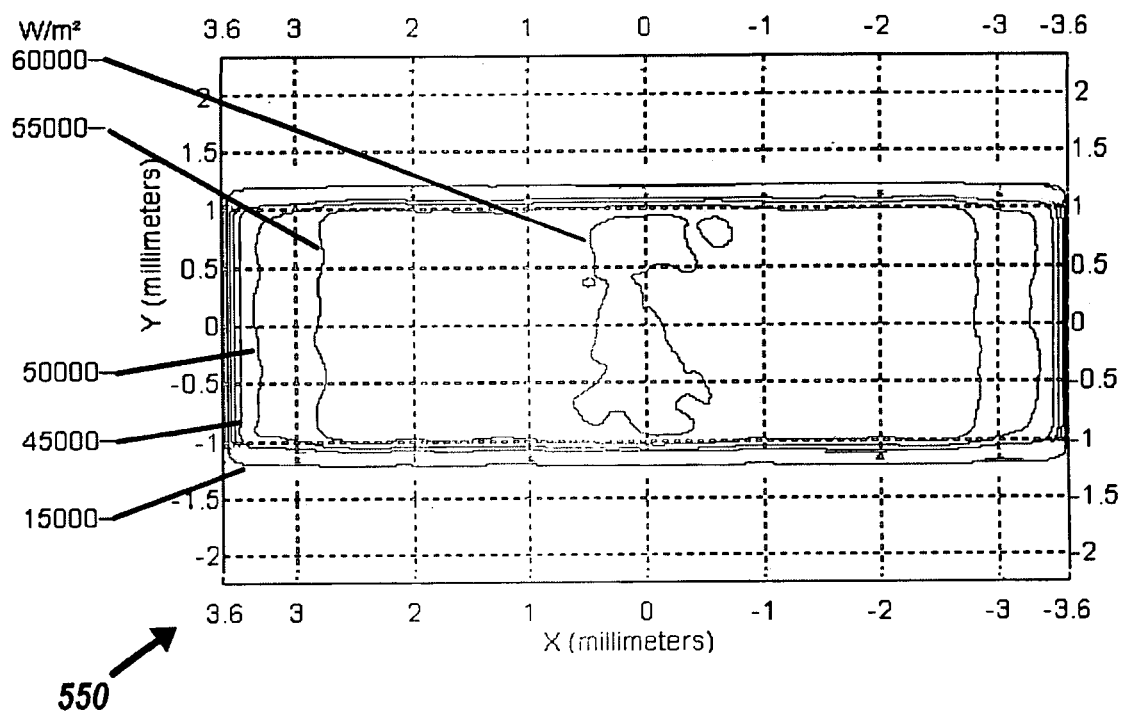
FIG. 55 is a contour graph of the spatial output from the output face of the manifold of FIGS. 53A and 53B.

FIG. 55 is a graphical depiction that shows a spatial luminance map 550, scaled in millimeters, of output face 530$e$ of the manifold of the embodiment shown in FIGS. 53A and 53B. The LEDs 531$i$, 532$i$ and 533$i$ of FIG. 53A were modeled with central dark zones, a strong form of input nonuniformity. Nonetheless, map 550 has outstanding uniformity compared to the LEDs feeding the manifold, with sharp well-defined edges. This distribution is little affected by the usual positional tolerances of the LEDs, or their individual differences in luminance. Its uniformity and definition are also superior to other high-luminance light sources such as incandescent filaments or arcs. Contours are labeled for 15,000 W/m$^2$ at the very edge, to over 60,000 at the center. This high power density comes from a single radiant Watt of input.

Figure 56A:
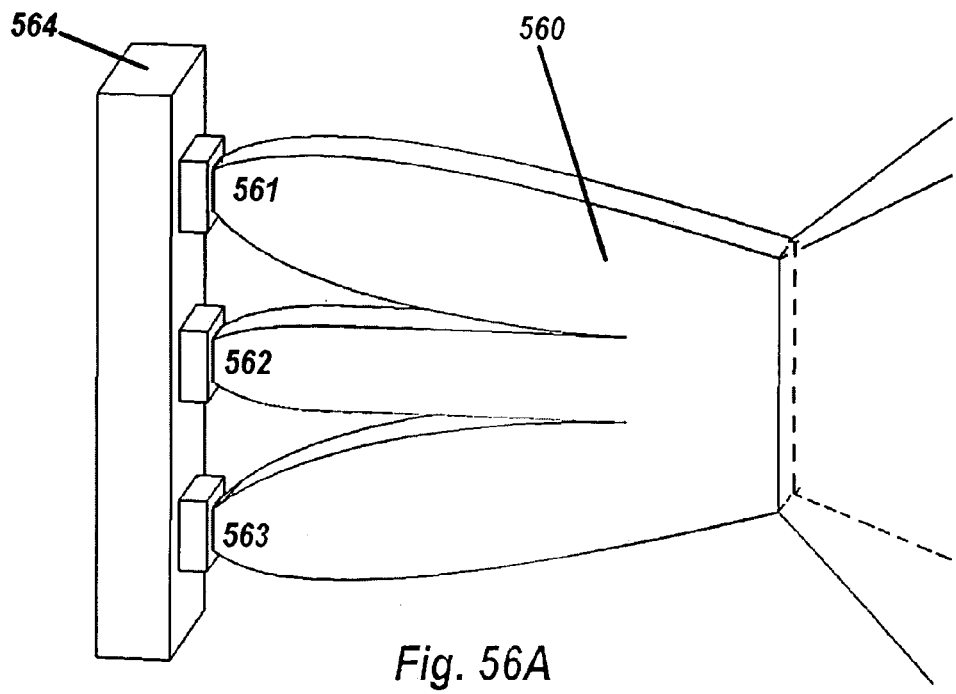
FIG. 56A is a perspective view of another embodiment of a triplex optical manifold, along with three input LEDs, on a circuit board.
Figure 56B:
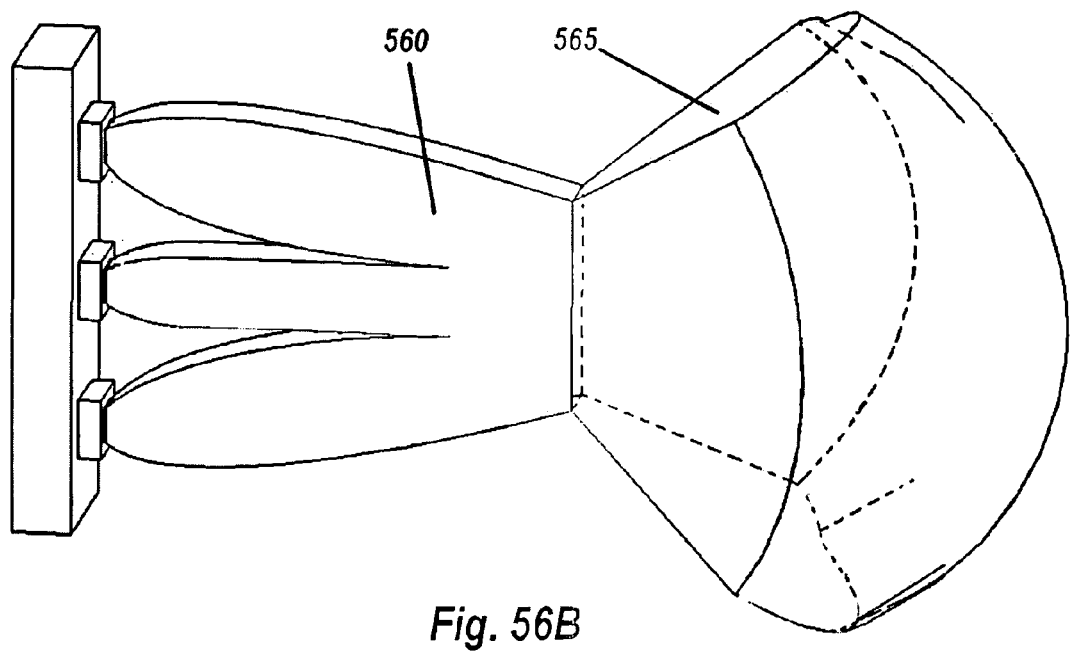
FIG. 56B is a perspective view of the optical-manifold of FIG. 56A, also including a free-form beam-shaping lens.
Figure 56C:
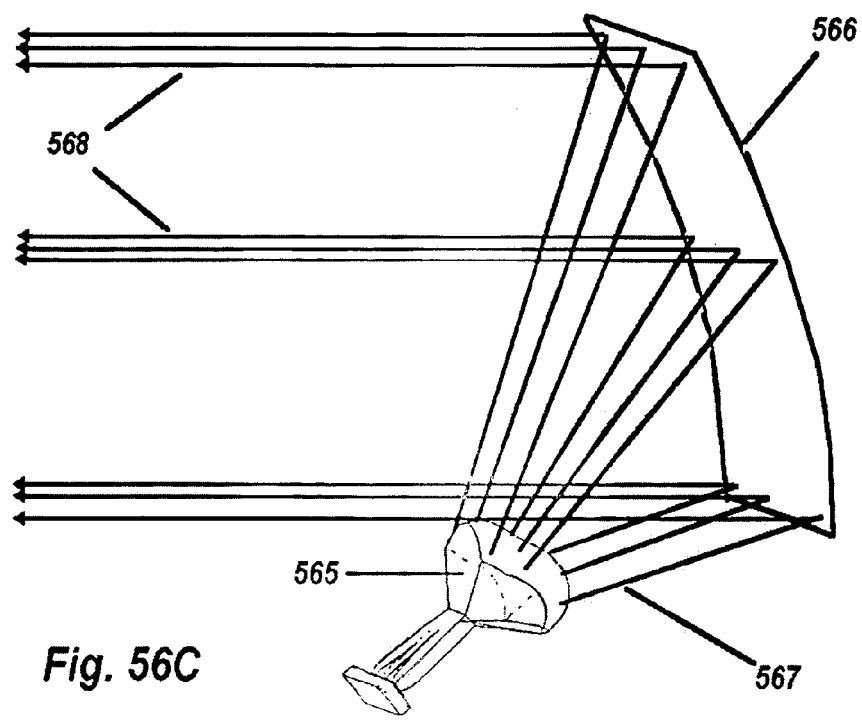
FIG. 56C is a perspective view of the optical-manifold and beam-shaping lens of FIG. 56B, and a ray trace of its output shining on a beam-shaping reflector.

FIGS. 56A, 56B, and 56C illustrate an alternative configuration of a triplex optical manifold. FIG. 56A is a perspective view of a triplex optical manifold 560, along with three input LEDs 561, 562, and 563, all on circuit board 564.

FIG. 56B is a perspective view of a triplex optical manifold 560 as in FIG. 56A, also showing a bulbous free-form lens 565 that shapes the luminous output of manifold 560.

FIG. 56C is a perspective view of the optical manifold 560 as in FIG. 56A, also showing curved rectangular mirror 566, acting to form collimated beam 568 from luminous output 567 of lens 565. Beam 568 fulfills an automotive lighting prescription for a headlamp or other requirements.

Figure 57:
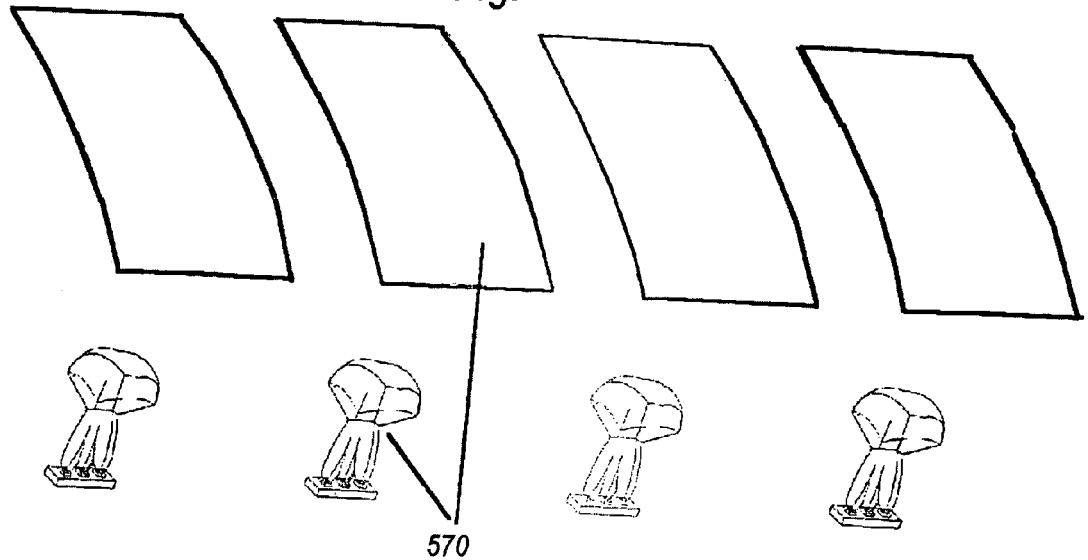
FIG. 57 is a perspective view that includes four such configurations as in FIG. 56C, forming an automotive lamp for example fulfilling a prescription.

FIG. 57 is a perspective view of a bank of four luminaires 570.

Figure 58A:
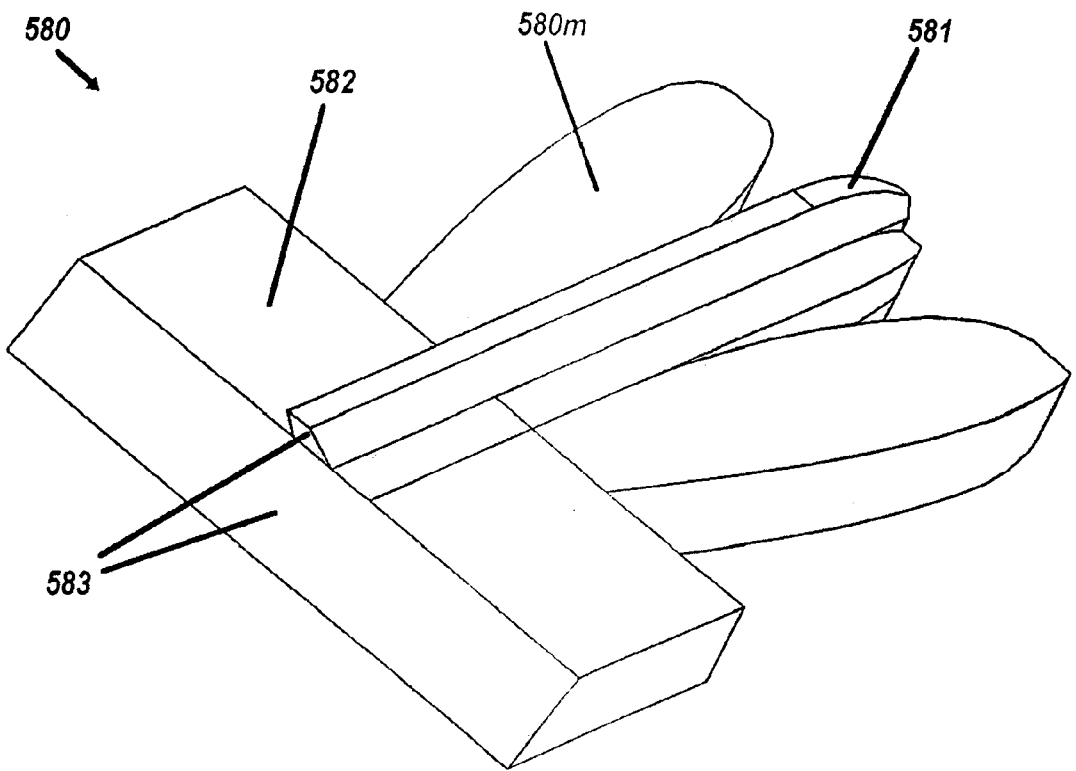
FIG. 58A is a perspective view of an asymmetric manifold for producing an exit aperture in the shape of a beam illuminance pattern approximately matching those of automotive headlamp lighting requirements.
Figure 58B:
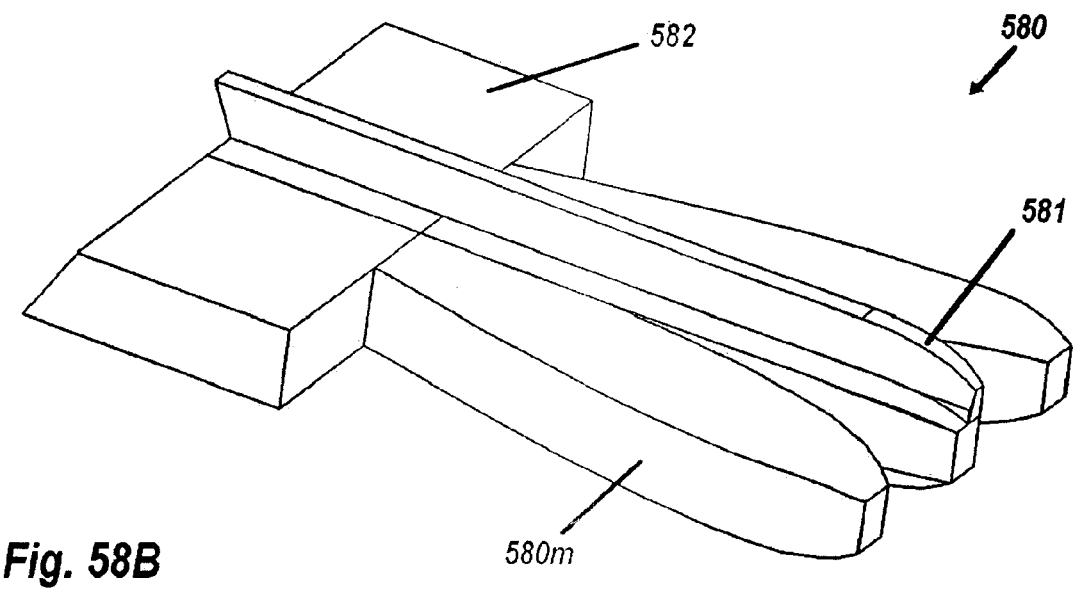
FIG. 58B is another perspective view of the asymmetric manifold of FIG. 58A.

FIGS. 58A and 58B illustrate another approach to producing an asymmetrical beam pattern for such applications as automotive lighting, in particular automotive headlamps. FIG. 58A shows an out-side perspective view of asymmetric manifold 580 with the shape of triplex manifold 530 of FIG. 53A, also comprising secondary duct 581 meshed with primary duct 582. FIG. 58B is another perspective view. Duct 582 has a cross-sectional shape at exit surface 583 whose outer boundary approximately matches the shape of a far field automotive headlamp beam illuminance or intensity pattern. Duct 582 can be tapered in one or more directions along its length to adjust the intensity at various points on exit surface 583. The angular output of 580 in the vertical and horizontal directions can also be adjusted by the design of triplex manifold 580$m$. The output from exit surface 583 can then be further adjusted by secondary optics that employ either imaging or nonimaging principles.

Returning to the configuration FIGS. 10A & 10B, both the small dielectric cross-CPCs 101, and the large dielectric cross-CPC 103 are two-way sweeps of a basic CPC profile, such as those shown in FIGS. 1A, 2B, and 2C. FIG. 59 depicts the geometry of a cross-CPC as the solid intersection 590 of two troughs, namely mutually perpendicular linear-sweep CPCs 591 and 592, of identical planar cross-sections 593. Because each trough has the constant cross-section 593, any light emitted from aperture 594 will be depart trough 592 within its acceptance angle, given that the trough is even longer than shown in FIG. 59. The point to be made is that in spite of the troughs being optically ideal, their intersection 590 is not. In the case of such a shallow cross-section as 593, the departure from perfection is small, but a deeper configuration is another matter.

FIG. 60A shows tandem cross-CPC 60, comprised of left-hand cross-CPC 61 and right-hand cross-CPC 62. They are oriented large-end to large-end, joining on face 60$m$. Light enters at face 60$s$, also known herein as the entry port, and is received at opposite face 60$r$, also known herein as the exit port. Ray tracing simulations show that light entering at 60$s$ is delivered to join-face 60$m$ with nearly 100% geometric efficiency, as expected from common knowledge of CPCs. When such light thereby enters right-hand CPC 62, however, losses become serious. This as a result not previously reported in the literature of non-imaging optics, and motivates several preferred embodiments next discussed herein.

FIG. 60B shows the same tandem cross-CPC 60, but filled with light-rays 63, launched rightward from source 60$s$ of FIG. 60A. Prominently visible are the 10% losses from leakage rays 64A, on the right, and the further 5% losses from leakage rays 64B, on the left. Leakage rays 64A are lost due to TIR failure of rays that have multiply intersected the walls of right-hand cross-CPC 62 of FIG. 60A. Leakage rays 64B were first retroreflected by right-hand cross-CPC 62, thereby entering left-hand cross-CPC 61 and finally becoming ejected as shown. This 15% loss is unacceptable for a lighting system seeking to improve upon conventional phosphor-conversion LEDs.

A related inefficiency of the cross-CPC configuration is in the recycling function shown in FIG. 10D. Actual ray-traces, however, show that the efficiency of this process is only 89%. This does not bode well for overall recycling, therefore, because the process depends upon multiple repetitions of the process shown in FIG. 10D, each sapping the recycled light of 11% of its strength.

Figure 61:
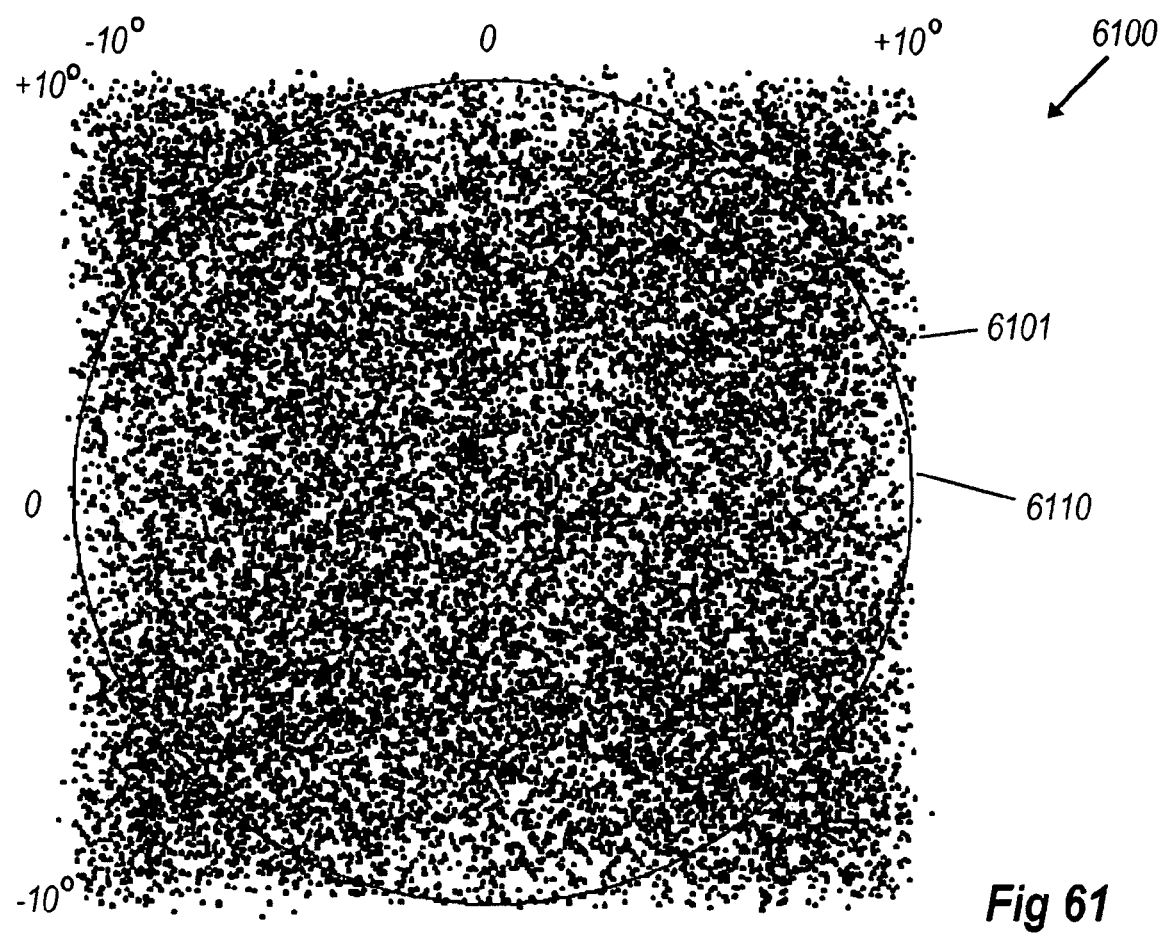

These related inefficiencies are endemic to cross-CPCs. They stem from rays that are within the 2D acceptance angle of either CPC trough (as in FIG. 59), but in 3D are outside it. This can be seen in FIG. 61, showing angle-space graph 6100 for the display of ray-direction spots 6101, representative of light exiting the large end of a cross-CPC. The rays can be seen to be confined in direction to within 10° of either axis. Circle 6110, however, also has radius 10°, but numerous rays can be seen to be outside it, in the corners of graph 6100. These rays are the cause of the inefficiencies discussed, in that many of them become lost. Referring to FIG. 60A in 3D geometry, CPCs 61 and 62 have square cross-section and meet at square flat area 60m. The flow lines of CPC 61 at the corners of square flat area 60m are not perpendicular to 60m. The same happens for the flow lines of CPC 62, which are symmetrical to the ones of CPC 61. These flow lines, therefore, do not match. Also, the cones of edge rays defined at the points of 60m by both CPCs point in different directions and this will cause rejection of some light by CPC 62 that is injected into it by CPC 61. Only the intersection in phase space of the light emitted by the first CPC and accepted by the second will be transmitted.

Figure 62A:
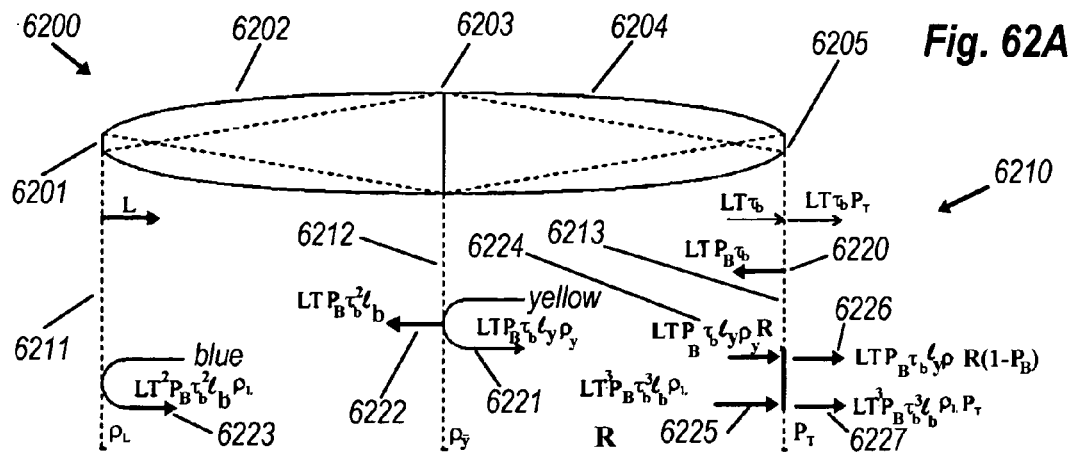

Before disclosing the further improvements of this continuation, the full negative impact of the above-discussed inefficiencies must be mathematically elucidated. FIG. 62A schematically displays remote-phosphor system 6200, comprising blue LED 6201 as light source, first CPC 6202, mid-line dichroic filter 6203, second CPC 6204, and remote phosphor patch 6205. In general, such a phosphor patch is relatively thin, with two surfaces, one receiving light from the CPC, hereinafter called the inside surface, and an opposite side, hereinafter called the outside surface. Also shown is flux diagram 6210, with dotted line 6211 representing LED 6201, dotted line 6212 representing filter 6203, and dotted line 6213 representing phosphor patch 6205. Diagram 6210 utilizes the following mathematical symbols:

L=Luminous flux entering CPC 6202 from blue LED 6201.

T=blue-light transmittance to phosphor patch 6205 from LED 6201 for the optics 6202 and 6204 but not including the losses associated with filter 6203.

R=recirculation factor, the fraction of back-scattered light recycled by CPC 6204 back into phosphor patch 6205. The cross-CPC had an 89% value.

$\rho_L$=integrated reflectance of LED 6201. A value of 70% indicates a higher-quality LED.

$\rho_y$=integrated reflectance of filter 6203 for phosphor emission wavelengths.

$\tau_b$=transmittance of filter 6203 for LED blue wavelengths.

$P_B$=fraction scattered back into second CPC 6204.

$P_T$=fraction of the light striking the phosphor patch 6205 that is further transmitted out the front of phosphor. Besides losses to backscattering, this variable encompasses blue-to-yellow conversion losses and Fresnel reflections (including losses associated if there is cover over phosphor patch 6205). Regarding the cited Prior Art of the inventors' authorship, B. Parkyn, J. Chaves, W. Falicoff, "Remote phosphor with recycling blue-pass mirror", Proc. SPIE Vol. 5942, Nonimaging Optics and Efficient Illumination Systems II, San Diego, Calif., USA, August 2005 and W. Falicoff, J. Chaves, B. Parkyn, "PC-LED luminance enhancement due to phosphor scattering", Proc. SPIE Vol. 5942, Nonimaging Optics and Efficient Illumination Systems II, San Diego, Calif., USA, August 2005, which is imported herein by reference in its entirety, the same symbol used therein, $P_T$, regarded only the backscattering factor and did not include the Phosphor conversion losses.

x=the fraction of total energy remaining after phosphor conversion is accounted for where x=b+yQS$_e$. Where b is the fraction of non-converted blue light remaining and y is the fraction of converted yellow light, Q is the quantum efficiency of the phosphor and S$_e$ is the fractional phosphor Stokes efficiency.

In the aforementioned cited Prior Art of the Inventors, they developed equations using the variable $\rho_F$, which was stated as being the integrated reflectance of filter. As $\rho_F$ is very wavelength dependent, very close to one for yellow light and zero for blue light, it was decided that using the parameter $\rho_y$, more accurately represented the recirculation system for yellow light. This single parameter more accurately handles actual system performance as the amount of recirculated yellow light is much greater than the amount of recirculated blue light. For example, if one assumes a 2:1 balance of yellow:blue, where the yellow is perfectly reflected, $\rho_F$, is only 0.65, whereas, $\rho_y$, would be 1.0 under these conditions.

According to research carried out by a group at Rensellaer Polytechnic, (Narendran et al, "Extracting phosphor photons to improve white LED efficiency", Rapid Research Letters, 2005, www.pss-rapid.com), which is imported herein by reference in its entirety, the reflected blue light from a YAG phosphor layer is fairly constant at approximately 12% for all phosphor thicknesses and densities. In a private communication with one of the Inventors, Prof. Narendran stated that this value in their paper included Fresnel reflections from a substrate (two surfaces) on which the phosphor layer was placed for the tests. He estimated that the blue reflection from a YAG phosphor layer (on its own) suitable for producing white light is between 5 and 7%. If this is the case then the balance of yellow to blue will be closer to 10:1. So a realistic value for the integrated reflectance of filter $\rho_F$ is 90%. However, this is still well below the reflectance values for yellow light in filter 6203, approximately 99%, demonstrated by the Inventors.

In the simplified analysis described herein, it is assumed that the non-reflected yellow light that travels through the filter is lost along with the blue light that is not transmitted through the filter. These assumptions make the prediction model slightly pessimistic, as in the case of the yellow light that is not reflected by the filter, a fraction of it will be recycled due to LED reflectance.

Color balance requires about $\frac{2}{3}^{rd}$ to $\frac{3}{4}^{th}$ of the blue light be absorbed. Good phosphors convert 90-95% of this absorbed light into yellow emission. Due to the lesser photonic energy of that emission, however, the more luminous yellow light only has between 80 to 85% of the radiometric flux it would have if it was merely at the same blue wavelengths the phosphor absorbed. Thus even if all blue and yellow light went out the front and there was no backscattering, the maximum value of $P_T$ would be 0.33+0.67*0.9*0.85=0.84. Typically, $P_B$=50-60% for the yellow phosphor emission, so that $P_T$ is typically well under 0.5.

The small 5-to-10-micron size of typical phosphor powder-suspensions gives a scattering coefficient about 100/mm.

Such scattering strength causes the backscattering fraction $P_B$ to be about 55% and more, as extra phosphor thickness is added for lower color temperatures. Thus if $P_B$ is 55% and the color balance is $\frac{2}{3}^{rd}$ yellow, and the phosphor quantum and Stokes efficiencies are respectively 90% and 80%, then $P_T$ is 26.3%.

Simulations show that the variable $P_T$ decreases as phosphor thickness increases, with values running from 15-80%, though the latter values are for impractically thin phosphors. The lower values occur when a greater preponderance of yellow light is desired, both for greater luminous efficacy as well as for a comfortable reduction in color temperature.

Diagram 6210 of FIG. 62A shows initial flux L entering system 6200, which has transmittance T. This does not include the losses in the filter but only the optic elements. Taking also into account the losses for the blue light as it passes through the filter, the flux that intercepts phosphor patch 6205 is at lower flux level of $LT\tau_b$. This system transmittance T is 89% for the cross-CPC type. (Below a different preferred embodiment will be presented with 99%.) In its passage through the phosphor, some of the blue light is converted to yellow, but with some energy losses, so that a fraction remains, which is the parameter, x. In general, for quantum efficiency $\eta_Q$ (about 90%) and Stokes efficiency (about 80%), converting $\frac{2}{3}$rds of the blue light leads to x=1/3+0.72(2/3)=0.81. Both blue and yellow light-fluxes are multiply scattered, so that the variable $P_T$ measures their combined output flux for this first pass. It is obvious but important to note that the parameter x must also be equal to the sum of $P_T$ and $P_B$. Therefore, the amount of flux which emerges from the source into the air on the first pass is $LT\tau_B P_T$. This term will be added to the other components to determine the total amount of flux from remote phosphor system 6200.

Return arrow $LT\tau_b P_B$ 6220 shows the flux re-entering CPC 6204, flowing leftward to filter 6203. A fraction $I_Y$ of this flux is yellow light and another fraction $I_b$ is blue light, where $I_b=1-I_y$.

The yellow portion of the flux will be reflected, with reflectivity $\rho_y$, being relative to the returning white light. This creates reflected flux-arrow $LTP_B\tau_b I_y\rho_y$ 6221. CPC 6204 has a recirculation factor R that acts thereupon, giving received yellow-return flux-arrow $LT\tau_b P_B\, I_Y\, \rho_y\, R$ 6224. However, this yellow light does not lose energy related to phosphor conversion, when it passes through the phosphor layer. Therefore, the value of $P_T$ for each pass associated with this yellow light needs to be increased by a factor related to the parameters x, and $P_T$. This multiplication adjustment factor for $P_T$ is equal to $\{1+(1-x)/P_T\}$. By multiplying $P_T$ by this factor, $P_T$ is made equal to $1-P_B$. Therefore this first recycling yellow pass, the amount of flux from system is therefore $LT\tau_b P_B I_y\rho_y R(1-P_B)$ as indicated by flux-arrow 6226. In each subsequent pass the amount extracted will be $P_B R\rho_y$ times the value of the previous pass. Therefore, the flux associated with this yellow recycling can be treated as the sum of an infinite series of the form:

$$a\sum_{n=0}^{\infty} r^n = \frac{a}{1-r} \text{ where, } a = LT\tau_b P_B I_Y \rho_y R(1-P_B) \text{ and } r = P_B R\rho_y.$$

If filter 6203 has a transmittance $\tau_b$ for the blue light, then the blue portion of returning flux after traveling through filter 6203 is $LT\tau_b P_B\tau_b I_b$ as shown by flux arrow 6222, which will make it to LED 6201 with its flux reduced by the same transmittance T as in its initial pass. The fraction $\rho_L$ is reflected by LED 5201, and begins its return rightward as flux-arrow $LT^2\tau_b P_B I_B\tau_b\rho_L$ 6223. This blue flux will again be reduced by transmittance T, yielding the returned blue flux-arrow $LT\tau_b P_B I_B\tau_b^2\rho_L T^2$ 6225. In this case to determine the fraction of flux, which travels through the phosphor, one must multiply the value by $P_T$. Therefore, the flux for this pass that transmits through the phosphor is $LT\tau_b P_B I_B\tau_b^2\rho_L T^2 P_T$, as is seen in flux-arrow 6227. In each subsequent pass the amount extracted will be $P_B T^2\rho_L\tau_b^2$ times the value of the previous pass. Therefore, the flux associated with this blue recycling can also be treated as the sum of an infinite series of the form:

$$a\sum_{n=0}^{\infty} r^n = \frac{a}{1-r} \text{ Where, in this case}$$

$$a = LT\tau_b P_B I_B\tau_b^2\rho_L T^2 P_T, \text{ while } r = P_B T^2\rho_L\tau_b^2.$$

The total light output $L_O$ is then the sum of first pass component, the yellow recycling component and the blue recycling component. The expression becomes:

$$L_O = LT\tau_b P_T + \frac{LTP_B R\rho_y\tau_b I_y(1-P_B)}{1-P_B R\rho_y} + \frac{LT^3\rho_L P_B \tau_b^3 I_B P_T}{1-T^2\rho_L\tau_b^2 P_B}$$

Substituting the values for the large cross-CPC (T=85%, R=89%), along with the remaining system values ($P_B$=55%, $P_T$=26.3%, $I_y$=⅔, $\tau_b$=1, $\rho_y$=1, $\rho_L$=0.7, Q=0.90, $S_e$=0.85), the system efficiency $\rho_E$=$L_O$/L is only 53%, not much better than a conventional high performance conformal-phosphor LED, and the inefficiency of the cross-CPC is the chief culprit.

In the interests of modeling thoroughness, this general equation can be easily modified to handle a variety of cases. In the case where there are coupling losses at the interface of the LED and CPC optic and one designates these fractional coupling losses in the forward direction as $F_{coupling}$, and in the backward direction, $B_{coupling}$, this changes the equation to:

$$L_O = LTF_{coupling}\tau_b P_T + \frac{LTF_{coupling}P_B R\rho_y\tau_b I_y(1-P_B)}{1-P_B R\rho_y} + \frac{LT^3 F_{coupling}^2 B_{coupling}\rho_L P_B \tau_b^3 I_B P_T}{1-T^2 F_{coupling} B_{coupling}\rho_L\tau_b^2 P_B}$$

In the particular case in which all the light is yellow ($I_y$=1) and $\rho_y$=1, no light is going back to the LED, so that $I_B$=0 and there are no coupling loses:

$$L_O = LTP_T + \frac{LTP_B R(1-P_B)}{1-P_B R}$$

If the remote-phosphor system is asymmetric in the sense that the optic attached to the LED is different from the one attached to the phosphor, there is a differing transmittance of light $T_{LP}$ from blue-chip to the phosphor than the transmittance $T_{PL}$ from the phosphor to the LED. In this case, the expression for $L_O$ is:

$$L_O = LT_{LP}\tau_b P_T + \frac{LT_{LP}P_B R\rho_y \tau_b l_y(1-P_B)}{1-P_B R\rho_y} + \frac{LT_{LP}^2 T_{PL}\rho_L P_B \tau_b^3 l_B P_T}{1-T_{LP}T_{PL}\rho_L \tau_b^2 P_B}$$

Maximizing $L_O$ could be reckoned in either radiant or photometric units of measurement. In radiant measurements the conversion losses of blue to yellow count only as decrements, but these losses pale before the greatly increased efficacy of yellow light over blue. Further photo-conversion yields further lumens, and lower color temperature. This is done by thickening the phosphor, which is disadvantageous to conventional conformal-phosphor LEDs because it increases backscattering from the phosphor back into the LED. The present invention allows a thicker phosphor to be utilized without these backscattering losses because of the unique yellow-recycling.

Figure 62B:
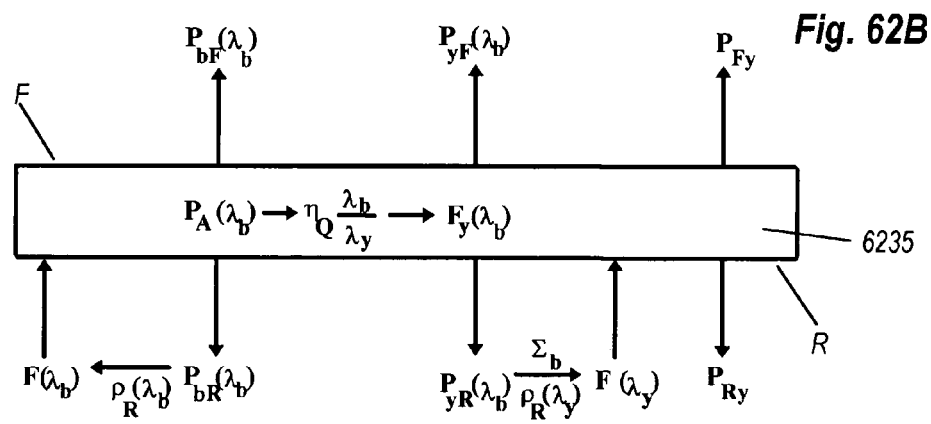

The previous mathematical treatment, based on FIG. 62A, utilized a single probability $P_T$ to indicate the combined yellow and blue output for a given blue input. In further elaboration, FIG. 62B diagrammatically shows phosphor patch 6235, and represents a more spectrally detailed approach to phosphor modeling, amenable to such spreadsheet programs as Lotus 123 or Microsoft Excel, by which each row would represent a single wavelength band (one nanometer, or 1 nm, was sufficiently narrow). For each blue wavelength $\lambda_b$, running generally from 400-500 nanometers, there is an initial flux $F(\lambda_b)$, shown entering the rear surface R of phosphor patch 6205 of FIG. 62A. This represents the spectral-distribution of the blue wavelengths of the LED source, evenly spread spatially over the entire rear surface R with a fully Lambertian angular-distribution. This function corresponds to curve 114 of FIG. 11A.

In FIG. 62B, further entries are as follows:

$P_A(\lambda_b)$ is the probability of blue light, of wavelength $\lambda_b$, being absorbed by the phosphor. This function is also known as the excitation spectrum.

$P_{bF}(\lambda_b)$ is the probability of blue light, of wavelength $\lambda_b$, entering phosphor patch 6235 and making its way to the front surface F and escaping the layer. This light counts towards the above-mentioned quantity $P_T$.

$P_{bR}(\lambda_b)$ is the probability of blue light, of wavelength $\lambda_b$, of escaping out the rear surface R.

$\rho_R(\lambda_b)$ is the efficiency of recycling blue light of wavelength $\lambda_b$. The recycled light joins the original flux $F(\lambda_b)$.

$\eta_Q$ is the quantum efficiency of the phosphor, the fraction of absorbed blue light that gives rise to emission.

$\lambda_b/\lambda_y$ is the ratio of blue to emitted-yellow wavelengths, respectively. This is called the Stokes ratio. Because absorption and emission take place in discrete photonic quantities, the difference between the higher energy $hc/\lambda_b$ of the stimulating blue and the lower energy $hc/\lambda_y$ of the radiated yellow light is lost as heat.

$F_y(\lambda_b)$ is the total flux of yellow light generated by the absorbed blue light of wavelength $\lambda_b$.

$P_{yF}(\lambda_b)$ is the probability of immediate escape out front surface F of the yellow flux generated by blue light of wavelength $\lambda_b$. This probability is wavelength-dependent because the different amounts of absorption of blue light at its different wavelengths causes a different spatial distribution of yellow emission points, and thus differing probabilities of escape. Strongly absorbed wavelengths cause the emission to be near rear surface R, reducing this probability of escape out front surface F.

$P_{yR}(\lambda_b)$ is the probability of immediate escape out rear surface R of the yellow flux generated by blue light of wavelength $\lambda_b$.

$\Sigma_b$ denotes summation over all blue wavelengths to give a total yellow flux out rear surface R.

$\rho_R(\lambda_y)$ is the efficiency of the recycling of yellow light. Because of the wavelength-dependent filter in the remote phosphor, this is higher than the recycling efficiency $\rho_R(\lambda_b)$ for blue light.

$F(\lambda_y)$ is the total flux of all recycled yellow light. Because there is no absorption of yellow light, the following two probabilities are wavelength-independent:

$P_{Fy}$ is the probability of escape out front surface F of yellow light entering rear surface R.

$P_{Ry}$ is the probability of escape out rear surface R of yellow light entering it. The recycling of this light is not shown, since it is already described in FIG. 62A.

These probabilities depend upon the degree of scattering exhibited by the phosphor material, and upon its excitation spectrum. They can be calculated by well-known methods of photon migration in a Monte-Carlo computer routine. The previous color-independent probability $P_T$ is the sum of the blue-light term $P_{bF}(\lambda_b)$ and the yellow-light term $P_{yF}(\lambda_b)$, summed over all blue wavelengths $\lambda_b$.

The well known methods of colorimetry, as expounded in 'Color Science' by Wyszecki & Stiles, Wiley 1982, page 162, which is imported herein by reference in its entirety, show how the blue and yellow output fluxes from the phosphor combine metamerically into a single white color of calculable chromaticity, with a correlated color temperature as discussed on page 224 of same. The chemical composition of the phosphor will determine its luminescence spectrum and the resulting color of any ratio of its flux with the unabsorbed blue light. Such spectrum is described herein as approximately yellow, because of its appearance.

Figure 62C:
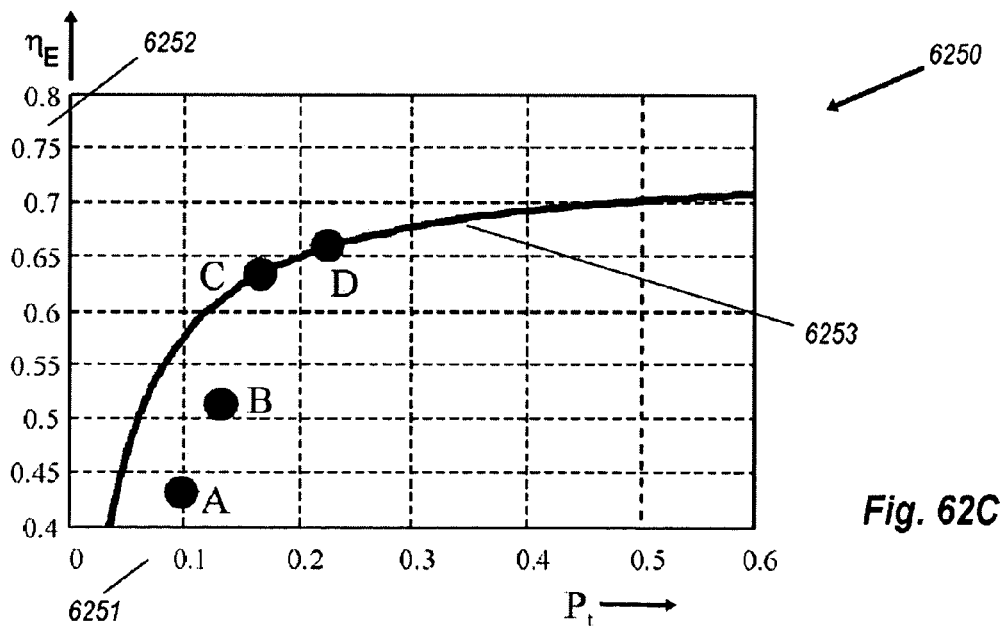

FIG. 62c shows the results of one such computer simulation. Graph 6250 has horizontal axis 6251 enumerated with a values of $P_T$ and vertical axis 6252 enumerated with values of color-independent extraction efficiency $\eta_E = L_O/L$. Curve 6253 gives the values of extraction efficiency for particular values of $P_T$, assuming a phosphor scattering coefficient of 100/mm. Point A is for a conventional white LED with conformal phosphor and a flat window. Point B is for same but with a dome. Point C is for a remote phosphor with a flat window, and point D is for same with a dome. This shows the advantage of the remote-phosphor approach of the present invention.

Figure 63A:
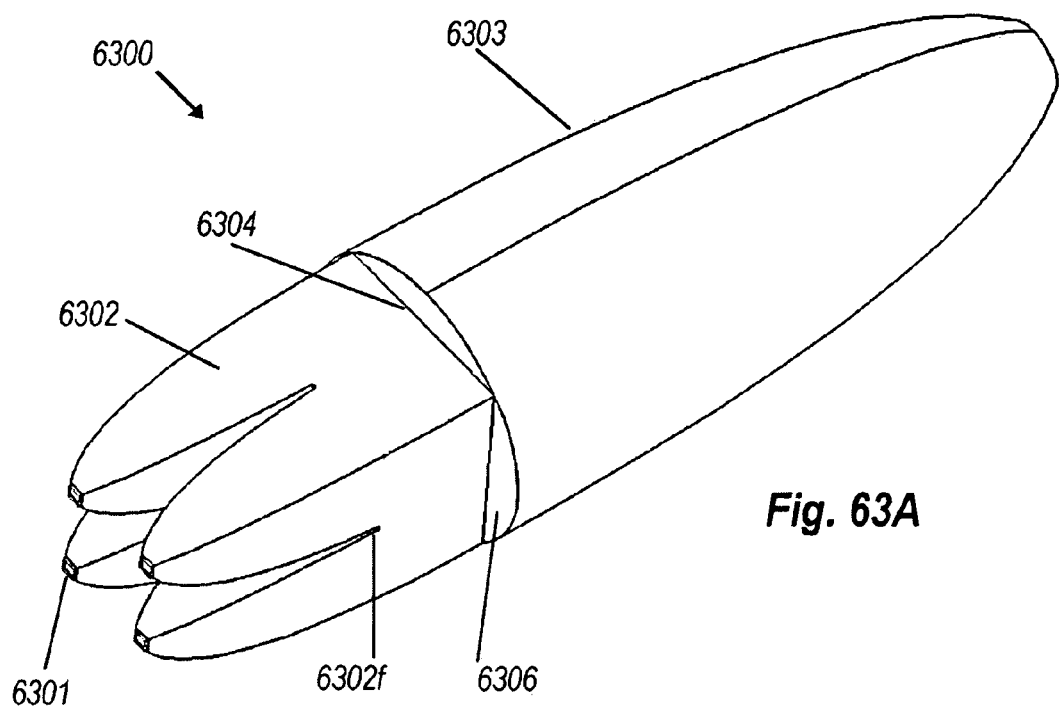
Figure 63B:
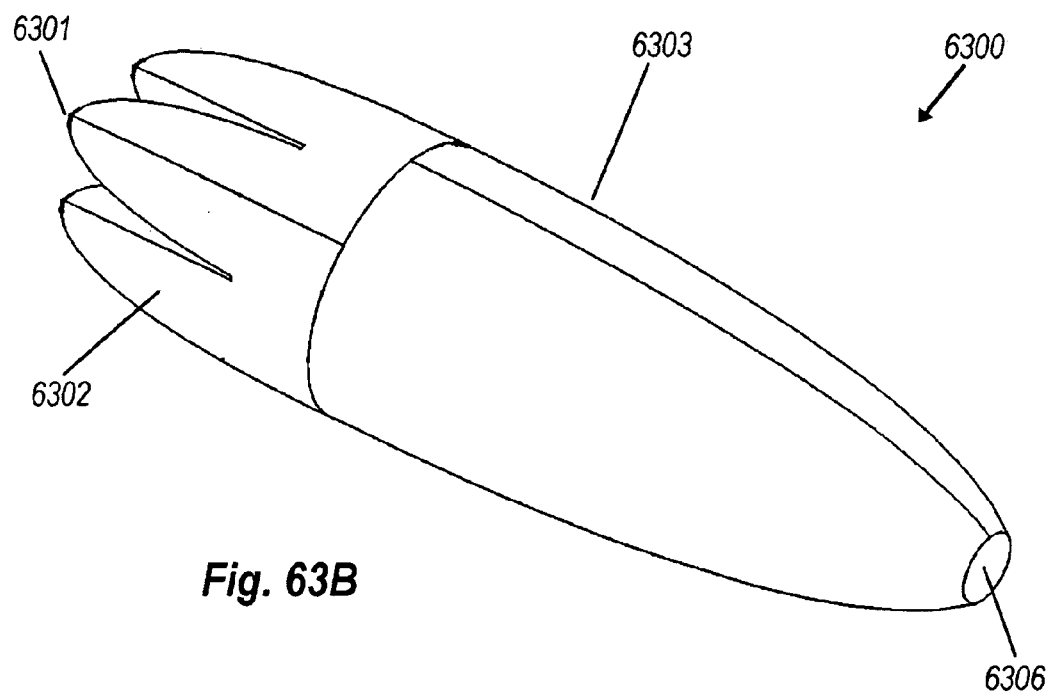

As mentioned in above, the square CPC is deficient regarding the recycling of phosphor back-emission as well as blue-flux delivery to the phosphor. These analyses highlight the great desirability of extremely high optical efficiencies throughout the optical train of the remote-phosphor embodiments of the present invention. Therefore a circularly symmetric CPC or other optic can be utilized for the large element with the remote phosphor to dramatically improve efficiency, as exemplified by the large circularly symmetric optics in the embodiments shown in FIGS. 6D, 6E, 6F, 6G and 6H. FIG. 63A and FIG. 63B show a remote-phosphor system comprising blue LEDs 6301, small rectangular CPCs 6302, and large circularly symmetric CPC 6303. Square 6304 is formed by the top ends of small CPCs 6302 and is where a blue-pass filter (not visible) is placed. Mirror coating 6306 reflects all light, blue or yellow, back to remote phosphor 6305. Because of molding considerations, fillet 6302f forms the common lower surface that connects the outer surfaces of CPCs 6302. Ray tracing simulations by the Inventors show that if two of the four CPCs of 6302 have a small fillet (on the order of 0.25 mm radius) between two common surfaces of adjacent CPCs, that performance of the system is unaffected.

In accordance with considerations discussed in FIG. 61, circularly symmetric CPC 6303 has acceptance angle 15° so that all light from the small CPCs is accepted. Instead of the 10° circle 6110, a 15° circle would include all directions represented by spots 6101. This results in a 99.5% transmission, rather than the 89% of a square CPC system as in FIG. 10A. The remote phosphor patch 6306 is circular, however, and is several times larger than the combined area of LEDs 6301. Thus this more efficient configuration has reduced luminance because of the phosphor-patch area is larger than that of the original four LEDs.

There is another advantage to having the acceptance angle of the large recycling optic be greater than the smaller optics that feed it. It is well known that the transmittance wavelength of such a filter shifts towards the shorter wavelength with increasing incidence angles. That is, the wavelength where the reflectance starts to operate will shift toward a shorter wavelength as well. If the acceptance angle of the recycling optic is larger than that of the CPCs or other optics, the radiation coming back to the filter from the remote phosphor via the recycling optic will strike the filter with a bigger average incidence angle. This is very useful for capturing radiation that is overlapping the blue LED and phosphor emissions. Going from a 10° optic to 15°, one can increase the effective reflectance of the filter in the backwards direction by 5 to 10 nm toward the blue.

In this instance, CPC 6303 with an acceptance angle 15° has a theoretical recirculation factor, R, of 97.5% compared to only 85% for the cross-CPC. In the previous example of the all cross-CPC system, its efficiency (including phosphor conversion losses) was estimated to be 53%. Using the same values as before in the equation but with T=99% and R=97.5%, the estimated efficiency of remote phosphor system 6300 becomes 69%. Taking into account that the phosphor conversion losses are sizable (16%), the theoretical system efficiency of remote phosphor 6300 is 0.69 divided by 0.84 or 82%. Monte-Carlo raytracing modeling of remote phosphor 6300 by the Inventors shows even better efficiency (nearly 90%), using the commercial ray tracing package LightTools, which also took into account wavelength-by-wavelength efficiencies rather than a single lumped figure. This was in spite of the program further including the detrimental effects of absorption within the dielectric material, and the less-than-perfect curves for the filter transmittance and reflectance. Clearly the round-CPC approach offers superior performance over the cross-CPC, and a great improvement over the prior art of phosphor-conversion white LEDs.

In a 4×4 configuration of the embodiment shown in FIG. 63A, the large dielectric CPC may become unwieldy in size and weight. In such a case, the cone-and-lens configuration of FIG. 6C would be an alternative embodiment, as exemplified in FIG. 72A, for embodiments including the system of FIG. 63A.

Figure 64A:
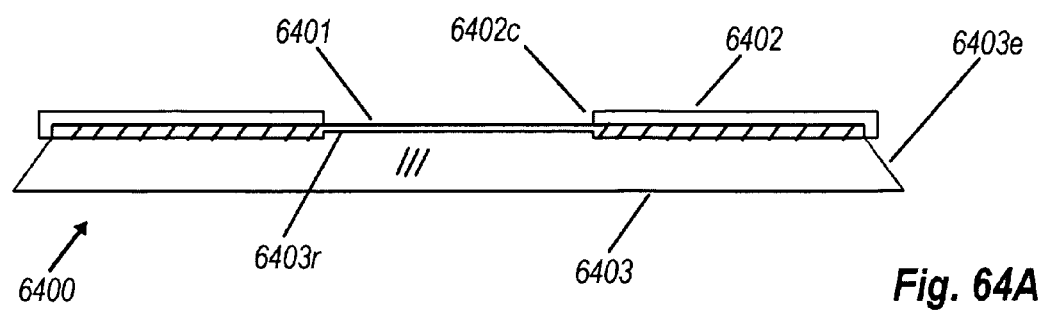
Figure 64B:
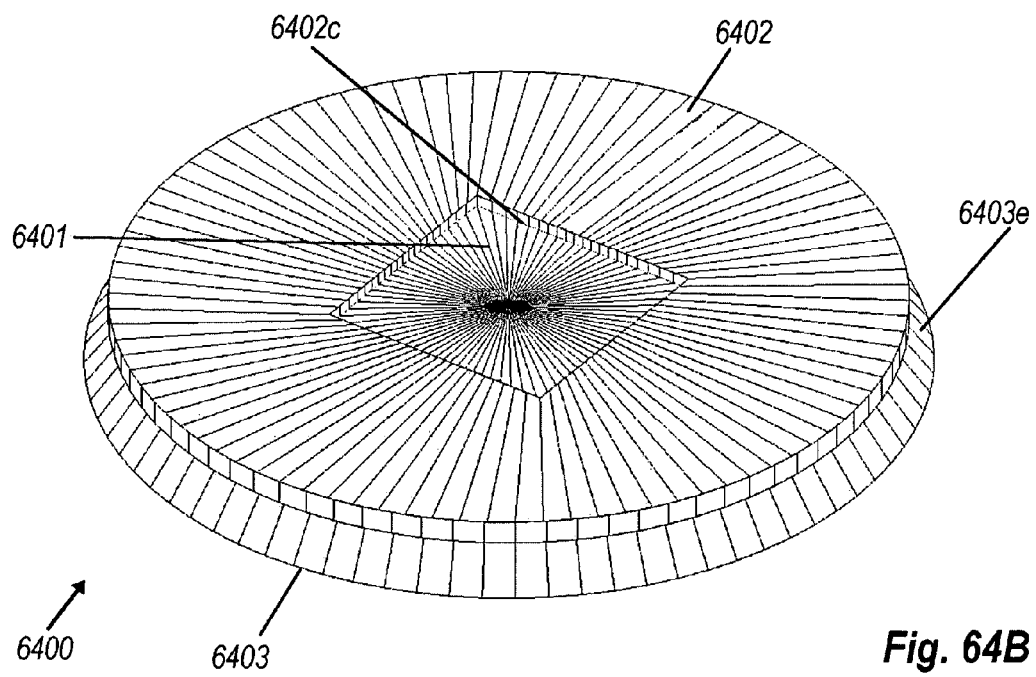

FIG. 64A is a cross-section, and FIG. 64B a perspective view, of remote phosphor 6400, comprising phosphor patch 6401, opaque diffuse reflector layer 6402 with square cutout 6402c, and transparent substrate 6403 with beveled edge 6403e matching the slope of large CPC 6303 of FIG. 63B. This will of course reduce the total light output because larger amounts of light must be recycled at some loss, but the increased luminance may be worth the sacrifice. Also, cutout 6402c could be any arbitrary shape, including irregular shapes, that is, shapes other than simple convex curves or polygons, such as an alphanumeric character. Phosphor patch 6401 has normal thickness (say 50 microns) inside the emitting square 6402c and greater thickness beneath diffuse reflector 6402. This causes most of the blue light thereupon to be converted to yellow light, which is more efficiently recycled than the original blue light. It is also possible, however, to have the layer below the diffuse reflector 6402 be the same thickness as, or thinner than, the phosphor inside the emitting square, since the effective phosphor path length below the diffuser is doubled. In FIG. 64A, transparent substrate 6403 has central square ridge 6403r to support the central thickness of phosphor patch 6401. Such a configuration is also suitable for a transparent phosphor, from which light extraction would otherwise be difficult because of its higher refractive index (about 1.8 vs. the 1.5 of the CPC). A non-uniform phosphor thickness can also be accommodated by other means, however, such as diffuse reflector 6402 having a lip that wraps around the inner boundary of phosphor below the diffuser area. In this approach the downward lip would end on a small outer boundary zone of the emitting phosphor layer, thus allowing, the bottom of transparent substrate 6403 to be made flat. This approach also has the advantage that part of the side emission of the thick phosphor layer is reflected back onto itself, possibly improving the uniformity of the externally emitting portion of the phosphor. Other approaches are easily conceived of once the fundamental invention is understood by those skilled in the arts relating to this invention.

Besides characters, other irregular or arbitrary shapes such as vehicle lamp-emission patterns could be depicted for imaging into the far field, with an option of non-uniform phosphor thickness for producing spatially variable luminance.

The configuration of FIGS. 64A and 64B is an example of the general idea, which is used in various embodiments of the present invention, of a phosphor shape that is cut from a monolithic piece and bonded to a transparent substrate. Alternatively, the phosphor patch can be made as a composite material where a phosphor layer is deposited on a suitable transparent substrate, such as a sheet or film in a volume production process. Such a composite phosphor can be made up as large sheet and then cut into parts using commercially known methods. The part is then bonded to the end of the recycling optic. This type of composite-phosphor approach can be in combination with any of the embodiments described herein or derived therefrom. Finally, the phosphor layer 6401 could be directly deposited onto the surface of transparent substrate 6403 via means such as ink jet printing or others approaches known to those skilled in this art, such as the electrophoretic deposition process developed and used by PhosphorTech of Lithia Springs, Ga., USA.

Returning to FIG. 62C, which illustrates the benefit of the diffuse cover of FIGS. 64A and 64B, it would be desirable to have means to create a higher luminance source, by reducing source area without a significant drop in extraction efficiency. This is possible if the reduction in extraction efficiency is less than the reduction in area. This area-reduction results in a reduction of $P_T$, which acts in accordance with curve 6253. For an LED with conformal phosphor source, if the derivative of curve 6253 is less than one, luminance will increase in spite of some lumen loss. For example, looking at the slope of the efficiency curve of the remote phosphor system modeled in FIG. 62C, there are sections of the curve where this applies. If one decreases the value of $P_T$ from point D on the curve by half, $P_T$ is reduced from approximately 0.22 to 0.11. The efficiency, however, only drops from 0.66 to approximately 0.58. So there is only 12% drop in efficiency when $P_T$ is reduced by 50%. In this instance there is a 76% increase in luminance at the expense of 8% loss in output.

It should be apparent that if one decreases the size of the phosphor emitting area by one half with a perfect diffuse cover, that this in effect reduces the value of $P_T$ for the uncovered emitting phosphor system by also one half. In such a perfect system, the value of $P_T$ is equal to the original value of $P_T$, times the fraction of area of the emitting phosphor compared to the total area of the covered and non-covered phosphor. If the diffuse cover is not a perfect reflector there will be of course extra losses in the system. There are materials, however, available with diffuse reflectance of 99%, as that produced by the W.L. Gore & Associates of Delaware, USA. Also, there are injection molded plastic materials available with ceramic or other fill (such as titanium dioxide), that have a diffuse reflectivity in the visible wavelength similar to the Gore material. The advantage of these hybrid plastic materials is that they can be used to make highly accurate parts at a low cost. Such materials are used currently to make mixing chambers used in backlights. High reflectivity specular mirrors with similar reflectivity numbers to the above-mentioned materials are also available and can also be used as a cover. The 3M Corporation of Minnesota, USA produces films in their Vikuiti product line that are suitable for this application. Also, high reflectance omni-directional specular reflectors are available on a variety of substrates from many optical manufacturers. One such company making such reflectors is JDS Uniphase of California, USA.

This novel approach to increasing luminance also could work for very high efficiency LEDs (which are expected to be commercially available in the near future), with and without phosphor, if the internal losses of these devices are very low. Already, LEDs nearly double the luminance of the active layer (which typically emits isotropically) by folding the light emitting toward the rear of the device back toward the front, with a highly reflective mirror. In a perfect LED (having no loss mechanisms), an aperture stop on the front surface, such as a specular or diffuse mirror, will increase the luminance of such devices. Also, in the case of a PC LED with conformal phosphor, there is no need for a phosphor layer to be located underneath the diffuse cover, since the device presumably will reflect all wavelengths equally well. Moreover, this approach is not limited to LEDs of a particular color or wavelength.

It should be apparent at this time that the remote phosphor embodiment of the present invention has a decided advantage over existing commercially available PC LEDs, with regard to use of the luminance boost described herein. The two points A and B in FIG. 62C represent the efficiency as a function of $P_T$ for a high performance PC LED with respectively flat and dome covers. These represent the state of the art in PC LEDs. If one models such LEDs as a function of $P_T$, it can be seen their efficiency curve (they fall on the same curve) is very steep at the useful values of $P_T$. Reducing the emitting area for these LEDs actually reduces the luminance and seriously reduces the extraction efficiency.

The diffuse reflector 6402 covering part of phosphor patch 6401 can be imagined to be changed into a complete enclosure of the phosphor patch, in effect removing the square cutout shown in. FIG. 64B. In contrast, FIG. 65A is a cutaway perspective view of remote phosphor system 6500, comprising blue LED 6501 radiating into first collimator 6502 (shown here as a round CPC), which collimates its light at output top plane 6502t. Long-pass dichroic reflector 6503 lies at 45 degree to collimator 6502, reflecting all the short wavelengths of blue light downward into second CPC 6504, also round and with the same 10° acceptance angle. This 'bluest' light hits a thick phosphor patch (not shown), which is enclosed by white reflector 6505, so that virtually all this blue light is totally converted into yellow light of much higher efficacy. The photoluminescent yellow light is emitted upward into CPC 6504, and is collimated onto conventional all-wavelength diagonal reflector 6506, thereafter forming yellow output beam 6507. The longer blue wavelengths which pass through filter 6503 will form blue output beam 6508. These blue and yellow beams can be recombined by any of the multi-wavelength methods of FIG. 40 through FIG. 50. The utility of their separation may lie in the possibility of separate spatial modulation, in order to pattern the recombined beam with a chromatic image. Spatial modulators, such as liquid crystal displays, are well known to those practiced in the art of image formation.

Extension cylinder 6509 of FIG. 65A is typical of the actual outer surfaces of such a device, wherein filter 6503 would be sandwiched between separate sliced cylinders of transparent dielectric and solid dielectric triangular prism 6506p, which prevents collimated light from CPC 6502 and 6504 being deflected (via refraction at the surface of filter 6503). Solid dielectric triangular prism 6506p also can support reflector 6506. Embodiment 6500 can also be configured with open reflectors in which case solid dielectric triangular prism 6506p is no longer required.

White reflector 6505 of FIG. 65A can also have incorporated into it apparatus for managing the heat generated in the phosphor conversion process. Many varieties of such apparatus, which can operate via either passive or active cooling principles, are well known to those skilled in the arts of thermal engineering. Thermal advantages over conventional conformal phosphor accrue to the remote phosphor because of its isolation from the heat of the source. A further thermal advantage accrues to the source as well, since less yellow phosphor-light is returned into it for partial absorption and consequent heat. Also, the phosphor's own heat generation is not added to that of the source. This heat can be exemplified with a one-Watt LED that produces 300 mW of blue light, and thus 700 mW of heat. If two thirds of this blue light is absorbed, or 200 mW, then about 10% of it becomes heat in the phosphor, leaving 180 mW of excitation. The longer wavelengths of the yellow light means that only 85% (153 mW) of this excitation becomes light energy and the remaining 15% (27 mW) is heat, for a total heat load of 47 mW. In a conformal phosphor, at least a third of the yellow light is absorbed in the die, totaling 100 mW extra heat, a 14% increase over that of the chip alone in the remote phosphor, the heat flux of 47 mW/mm² equals 50 suns, and thus will require extra cooling measures, since free convection in air is far too weak (one-Sun heat removal at 30° C. delta temperature) to cool the phosphor patch solely through its own surface area. The factor-of-five increase in phosphor-patch area on the round CPC 6303 of FIGS. 63A and 63B, over that of its LEDs, reduces its heat load to ten suns. Nonetheless, neglecting this matter could result in a phosphor over-temperature condition that could imperil the structural integrity of a dielectric CPC made of injected-molded plastic, without some means of removing the excess heat. Alternatively, the dielectric optic 6303 could be made of a high operating temperature material, one having higher conductivity and thermal diffusivity than typical plastics used for optical components. For example, quartz has a thermal conductivity of 3 W/m° K. versus 0.18 W/m° K. for acrylic. Also the thermal diffusivity of glasses is much higher than plastics, with quartz at 10 times greater. Other means can be employed to remove the heat from the remote phosphor for the dielectric-based remote phosphor embodiments. Referring back to FIGS. 64A and 64B, cover 6402 could be multi-layered with an inner reflective layer made of a high thermal conductivity ceramic material and an outer layer of copper or other high-conductivity material, suitably protected from environment. The ceramic and/or copper layers could extend much wider than the aperture, and could even include heat-exchange features such as fins. Active cooling could also be employed, such as forced air blowing by highly reliable miniature fans as found in most personal computers.

Referring back again to FIG. 65A, a further advantage of completely enclosing the outside surface of the phosphor patch with diffuse white reflector 6505, lies in the case of transparent phosphors formed using a single crystal with very little scattering. The high index (1.8) of this material causes extensive light trapping, making it less useful than a scattering phosphor when light must go through it. But with the diffuse reflector in contact with a transparent phosphor, light trapping is eliminated by the reflector's scattering. Thus this idea of a diffuse reflector around the phosphor is especially advantageous over the prior art for the utilization of transparent phosphors, which are commercially available, e.g., from Baikowski International Corporation of Charlotte, N.C. This is important because such phosphors have higher quantum efficiency than conventional scattering phosphors (95% vs. 90%). Also, transparent phosphor is very hard and strong, unlike the powder form of conventional phosphor. Thus it could be put into an injection mold and the reflective white cover molded onto it for good optical contact.

The dichroic reflector 6503 of FIG. 65A is described by FIG. 66A, showing graph 6600 with horizontal axis 6601 for wavelength in nanometers and vertical axes 6602R on the left, for reflectance and relative intensity, and 6602T on the right for transmittance, which in such non-absorbing filters as these amounts to 1-reflectance. Filter reflectance function 6603, which describes the wavelength characteristics of long-pass filter 6503, comprises a fully reflective portion 6603h, extending to 465 nm. This wavelength is only slightly longer than the 458 nm peak of blue LED spectrum 6604. Cliff portion 6603c of filter function 6603 falls to nearly zero by 475 nm. The portion of blue spectrum 6604 lying to the right of 6603c will become part of output beam 6508 of FIG. 65A. This light has the highest luminous efficacy of all the blue wavelengths from blue LED 6501 of FIG. 65A. It is not so long, however, as to be poor in color rendering. That is, using only the blue light past 470 nm (rather than the 500 nm of the filter in FIG. 11B) keeps both good color gamut in chromaticity and good color rendering. When the blue light shines through the phosphor patch, about half the unabsorbed blue is very short, nearly violet-looking wavelengths of ten times lower efficacy as compared with blue wavelengths past 470 nm. Thus using all of some wavelengths for transmission and all the rest for luminescence has superior efficacy over using all blue wavelengths the same, which ignores their huge differences in efficacy.

FIG. 65B is a side view of a further remote phosphor system 6510. Blue LED 6511 radiates into first collimator 6512, forming blue beam b. Inclined mirror 6513, which is transparent for longer wavelengths and partially reflective for blue wavelengths, reflects the short wavelengths of the blue light, similarly to filter 6503 of FIG. 65A. This short wavelength light is shown as beam s entering second concentrator 6514 (shown in this figure as a CPC) and being concentrated upon phosphor patch 6515, the bottom of which is surrounded by a white reflector (not shown), so that all its yellow light goes upwards and is collimated by CPC 6514 into yellow beam y. Diagonal yellow reflector 6516 sends yellow beam y out in coincidence with longwave-blue output beam bL, the two comprising a white narrow-angle (±10°) output beam with uniform luminance and chrominance. Auxiliary mirror 6517 recycles unabsorbed shortwave blue light back into CPC 6514. The square shape of LED 6511 and its subsequent incomplete filling of CPC 6512 is the only luminance decrement suffered by this preferred embodiment. Also shown are large heat exchanger 6518, for LED 6511, and small heat exchanger 6519 for phosphor patch 6515. Dotted lines 6510g denote tiny gaps similar to gaps 398 and 399 of FIG. 39B, and can be filled with a lower-index material such as a silicone, since their function is only to deflect glancing rays. Using such a material instead of an air gap greatly reduces the Fresnel reflectance of any rays crossing them at normal incidence. For example, if the index of refraction of the material of CPC 6502 and CPC 6504 is approximately 1.49 then the silicone fluid or gel should have an index of refraction of approximately 1.43.

Filter 6513 can alternatively be a long-pass filter, which has partial reflectance for some or all the blue wavelengths. FIG. 66B shows graph 6610 with horizontal axis 6611 for wavelength in nanometers and vertical axes 6612R on the left for % reflectance and 6612T on the right for % transmittance. Reflectance function 6613 comprises horizontal segment 6613 showing how filter 6513 is transparent in the longer wavelengths and is 70% reflective for wavelengths of blue LED 6511, so that 30% of the blue light will transmit through filter 6513 and directly exit the device. The remaining 70% of the blue light will be reflected by filter 6513, eventually striking phosphor patch 6515. The converted yellow light from the phosphor upon returning to filter 6516, which is a blue short-pass filter, will be reflected by filter 6516 and exit the device. Mirror 6517 recycles any blue light striking it back to phosphor patch 6515 for possible conversion.

FIG. 65C shows a further remote phosphor system with phosphor patch and LED in the same plane. Remote phosphor system 6520 comprises blue LED 6521, circularly symmetrical optic shown in this drawing as CPC 6522, diagonal all-wavelength mirror 6523, diagonal cyan-reflecting bandpass filter 6524, second circularly symmetrical optic shown in this drawing as CPC 6526 with diagonal all-wavelength mirror 6525, and diagonal yellow reflector 6528.

Cyan-reflector 6524 of FIG. 65C has filter reflectance curve 6605 of FIG. 66A, such that it transmits both the short-wavelength blue light that stimulates the phosphor and the yellow light emitted thereby, which has the spectral distribution graphed by curve 6606. Reflector 6524 only reflects the long-wavelength blue light into the white output beam formed by it and the yellow light reflected upward by mirror 6528. Flat mirror 6529 of FIG. 65C recycles any light sent downward to it by filter 6524 and sends it back to same, which in turn redirects it back to mirror 6525, the light eventually ending at phosphor patch 6515, where it has another chance to be converted.

Filter 6524 of FIG. 65C can alternatively be a long-pass filter, shown by FIG. 66C, which depicts graph 6630 with horizontal axis 6631 for wavelength in nanometers and vertical axis 6632 for % reflectance. Filter function 6633 comprises horizontal segment 6633h denoting a partial reflectance of 30% for a portion or the full range of blue wavelengths, as was described earlier, and steep-cutoff cliff 6633c. Dotted line 6636 graphs the reflectance of yellow filter 6528 of FIG. 65C, for spectral function 6635 of the phosphor.

The assemblage comprising filters 6528, 6524 and mirror of 6529 of FIG. 65C can be rotated about an axis defined by the line that connects the centers of mirror 6523 and 6525. If this assemblage is rotated 90° about this axis, then light exiting remote phosphor system 6520 will be in a direction perpendicular to the original direction. This is a very useful configuration if it is desired that the height of remote phosphor system 6520 needs to be at a minimum, as is sometimes required for an architectural alcove application. Also, a mechanical swivel can be incorporated into 6520 to allow rotational positioning of this assemblage, so the direction of the output beam is adjustable about said axis.

FIG. 65D shows an alternative remote phosphor embodiment to FIG. 65A, where the phosphor patch and LED lie approximately on the same plane. FIG. 65D depicts remote phosphor system 6530, comprising blue LED 6532 with thermal management device 6531. Blue light from LED 6532 is directed into first collimator 6533 (shown in this figure as a CPC), which collimates its light onto tilted long-pass dichroic filter 6534, having the same characteristics as filter 6503 of FIG. 65A, as described in FIG. 66A. Dichroic filter 6534 lies at 45 degree to collimator 6533 (shown in this figure as a CPC), reflecting all the short wavelengths of blue light leftward into second tilted long blue-pass dichroic filter 6536 (not visible). Filter 6536 has the same wavelength characteristics as filter 6534. Filter 6536 redirects the short blue wavelength light downward into optic 6537, which in turn concentrates the light onto thick phosphor patch 6538, which is enclosed by white reflector 6539, so that virtually all this blue light is converted into yellow light of much higher efficacy. White reflector 6539 incorporates a heat management element such as a heat exchanger with fins. The yellow converted light is emitted upward into optic 6537, and is collimated onto tilted long blue-pass filter 6536 thereafter forming yellow output beam 6540. The longer blue wavelengths which pass through filter 6534 will form blue output beam 6541. The blue and yellow beams can be recombined by any of the multi-wavelength methods of FIG. 40 through FIG. 50. Also shown are solid dielectric triangular prisms 6542, having sides 6535. Prisms 6542 prevent collimated light from collimators 6533 and 6537 from being deflected at the face of filters 6534 and 6536. Alternatively, embodiment 6530 can be configured with open reflectors in which case prisms 6542 are no longer required.

FIG. 65E is an alternative configuration of the embodiment shown in FIG. 65B, but where the LED and phosphor patch lie on the same plane. FIG. 65E depicts remote phosphor system 6545, comprising blue LED 6550 with thermal management device 6561. Blue light from LED 6550 is directed into first circularly symmetric collimator 6551 (which is shown in this case as a CPC), which collimates light into long-pass filter 6555 with partial reflectance for some or all of the blue wavelengths from blue LED 6550. Filter 6555 lets through a predetermined fraction of blue light and reflects the remainder of the blue light to all-wavelength reflector 6556. Blue light which is not reflected by filter 6555, exits as collimated blue beam b 6557. Light striking all-wavelength reflector 6556 is turned ninety degrees downward into circularly symmetrical concentrator 6559 (which is shown in this case as a CPC), where it strikes thick phosphor patch 6560, the bottom of which is surrounded by a white reflector (not shown), so that all its yellow light goes upwards and is collimated by 6559. All-wavelength mirror 6556 redirects this collimated light to blue short-pass filter 6553 (which is at a 45 degree angle with respect to it), reflecting all the yellow and longer wavelengths emitted by the phosphor patch out of the device as collimated yellow beam y 6558. Blue beam b 6557 and yellow beam y 6558 combine to produce white light. Mirror 6554 re-cycles blue light that is not reflected out by filter 6553 back to phosphor patch 6560, for possible conversion, via all-wavelength reflector 6556 and optic 6559. Dotted lines 6562 indicate where there are air-gaps required between the various components, similar to gaps 398 and 399 of FIG. 39B.

FIG. 66D depicts graph 6640 with horizontal axis 6641 for wavelength in nanometers and vertical axis 6642 for % reflectance. Filter function 6643, which corresponds to filter 6555 of FIG. 65E, comprises horizontal segment 6643h denoting a partial reflectance of 70% for a portion or the full range of blue wavelengths and steep-cutoff cliff 6643c. Dotted line 6646 is the reflectance function of filter 6553 of FIG. 65E, shaped to fit phosphor spectrum 6645.

Thermal management device 6561 is shown as being common to blue LED 6550 and phosphor patch 6560. However, in practice there can be a thermal break in this device so that the phosphor patch does not receive a significant amount of heat back from the LED and vice versa.

The efficiency of the remote phosphor system depends upon the effectiveness of its dichroic filter. To illustrate the performance of one example of a real filter, actual spectral transmittance measurement data has been made available by its manufacturer, JDS Uniphase of California, USA. The performance and other specifications relating to this filter were provided to this company by the Inventors so as to work in an actual remote phosphor system designed by the Inventors in the embodiment shown in FIGS. 63A and 64B. FIG. 67 shows graph 6700 with horizontal axis 6701 for immersed wavelength and vertical axis 6702 for percent transmittance. Theoretical performance is indicated by solid line 6703 and measured performance by dashed line 6704. Also shown is dotted line 6705, showing measured performance at 10° incidence angle within a dielectric of n=1.5, much as in the present invention. Transmitting spectral region T comprises values of 99.3 to 99.9%. Reflecting spectral region R comprises 99.9% reflectance, with unmeasurably small absorption. This demonstrates the feasibility of the invention.

Notwithstanding the superior efficiency of a round CPC, it is possible to utilize square CPCs in non-recirculating designs, utilizing wavelength-varying filters in the fashion of FIG. 48. To avoid the mismatch of squares with circles, it is possible to alter the configuration of FIG. 60A and cause large CPC 62 to have a larger acceptance angle, such as 14° or 15°, respectively resulting in 98% and 99% transfer efficiency (vs. 85% for 10°). FIG. 68A is a perspective view of remote phosphor system 680, comprising blue LED 681, 10° dielectric crossed CPC 682, blue-pass filter 683, 15° dielectric crossed CPC 684, and phosphor patch 685, which is 50% larger than LED 681. Unfortunately, CPC 683 has only a 90% efficiency R for recirculating light from phosphor patch 685. Accordingly, the following more practical non-recycling designs are presented for utilizing 10° and 15° square CPCs, They are shown with single LEDs and phosphor patches, but multiple blue LEDs could just as well be shown, as in FIG. 10A.

FIG. 68B is a view of a rectangular cross section CPC 6810. The face extending between edges 6812 and 6817 and the opposite face extending between edges 6814 and 6816 are shaped as a linearly extruded CPC profile. Also, the face extending between edge 6813 and straight line 6819 and the opposite face extending between edge 6811 and straight line 6820 are shaped as a linearly extruded CPC profile. The surface between straight line 6819 and edge 6815 and the opposite surface between straight line 6820 and edge 6818 are flat.

FIG. 69A is a side view of remote phosphor system 690. Blue LED 691 shines into CPC 692, which collimates its light into blue beam b with divergence ±α (here 10°). Diagonal mirror 693 sends these rays laterally into upper diagonal blue-reflecting mirror 695, which reflects a portion of the blue light outward, and also diagonal blue-reflecting mirror 694, which redirects it downwards into smaller second CPC 697, which is a rectangular cross section CPC similar to the one described in FIG. 68B. Phosphor patch 698 receives the blue light reflected by diagonal blue-reflecting mirror 694 and converts it to yellow light, which CPC 697 collimates into yellow output beam y (with larger divergence ±β, here 15°) which passes through mirrors 694 and 695. Large heat exchanger 699L cools blue LED 691 while small heat exchanger 699S cools phosphor patch 698. Dotted lines denote tiny air gaps similar to gaps 398 and 399 of FIG. 39B. This configuration has the optical drawback that the yellow and blue output beams will not properly combine because of their differing divergences α and β. The smaller size of upper blue-reflecting mirror 695 means that the beam is not spatially uniform either.

FIG. 69B shows the same system, but with the addition of holographic diffuser 690d, which widens the ±10° blue light from CPC 692 so that its divergence angle equals the ±15° from CPC 697. Blue-reflecting mirror 695 must be long enough to reflect all this blue light towards the exit port. Now the two beams will join in the far field to make white light. In the near field, however, the two beams are not coincident.

FIG. 69C shows the same system, but with the upper blue mirror shown split into two smaller mirrors 695s. Further such splitting into mirrors too small to discern would give a spatially uniform white output.

FIG. 70 shows remote phosphor system 7000. Blue LED 7010, cooled by large heat exchanger 7011, shines into first CPC 7020, which collimates its light to rays b with ±±10° divergence. Diagonal mirror 7030 transmits part of this light, after which it is spread to ±15° divergence by diffuser 7040. Then it passes through yellow-reflecting diagonal mirror 7050 and exits. Diagonal mirror 7030 also laterally reflects part of rays b, to blue-reflecting diagonal mirror 7070, which reflects them downward into second CPC 7080, which in turn concentrates them onto phosphor patch 7090 (cooled by heat exchanger 7091). Diagonal mirror 7030 could be a conventional beam-splitter (with about $\frac{2}{3}^{rd}$ reflectance, $\frac{1}{3}^{rd}$ transmittance), or alternatively a beam-splitting blue mirror as described in FIG. 66D, which is a partial reflecting, in the short-wavelengths, long-pass filter. Since second CPC 7080 has equal aperture to first CPC 7020 but a larger acceptance angle, phosphor patch 7090 is proportionately larger as well. Rod 7081 makes up for the shorter height of second CPC 7090 as compared with first CPC 7020. Dotted lines denote tiny air gaps similar to gaps 398 and 399 of FIG. 39B. The photoluminescent yellow light produced by phosphor patch 7090 shines into CPC 7080, which forms them into rays y with ±15° divergence, which pass through blue-reflecting diagonal mirror 7070 and strike diagonal folding mirror 7060, being reflected laterally to yellow-reflecting diagonal mirror 7050, which reflects them upwards to join the blue output to form and spatially and angularly uniform white output. Dotted lines denote gaps filled with a lower-index of refraction material such as a silicone. Their critical angle of 74° suffices to reflect glancing rays.

FIG. 71 is a perspective view of remote phosphor system 7100 based on the embodiment of FIG. 70, uniting the output of multiple blue LEDs and multiple phosphor patches into a single, highly uniform, narrow-angle white beam. Such a system would be advantageously applicable, for example, to automobile headlights. Blue LEDs 7110 are arrayed 4×4, each coupled to small crossed CPC 7120, which in turn are all joined to rectangular mixing duct 7130. Over it lie diagonal partial blue-mirrors 7140, reflecting some blue light laterally into diagonal blue mirrors 7150, thence downward into large CPCs 7160, which concentrate the blue light onto phosphor patches 7170. Their yellow light is collimated by large CPCs 7160 and passes through diagonal blue mirrors 7150, to strike diagonal folding mirrors 7180 and be reflected laterally inwards thereby. Diagonal blue-passing yellow mirrors 7190 send the yellow light out in coincidence with the blue light (which was widened by diffusers 7195) to form a white output beam. All the LEDs and phosphor patches conveniently lie in the same plane.

In scaling to higher power via a greater number of blue LEDs, for the embodiments of FIG. 63A and FIG. 63B, the dielectric CPC proves too bulky and expensive. Instead, the cone and lens arrangement of FIG. 6C can be utilized. Accordingly, FIG. 72A shows remote phosphor system 7200, with 32 blue LEDs 7201, each with its own crossed dielectric CPC 7202, arrayed in an incomplete square on the filter and mirror plane 7203. This configuration enables 77% of this plane to be covered, unlike the 64% of a full square. Large reflective cone 7205 is shown cutaway, to reveal phosphor patch 7206 with square central aperture 7207 having the same area as the 32 LEDs 7201. Cone 7205 has a metallic backing, connected to radial heat-exchanger fins 7210. Cone 7205 is not limited to the conical cross-section demanded by the use of mirror foil, but can also have a tailored cross-section, as would be made with injection molding. Such tailored shapes, known to those skilled in the field of nonimaging optics, are normally designed in conjunction with lens 7204, shown in FIG. 72B. Such combination lens/reflector optics can perform near the theoretical limit. In order to achieve such a high performance, the refractive lens should be fully multi-coated and the reflector should have near 100% reflectance over the required wavelengths. Multi-coated, high transmittance lenses are available from numerous sources. Very high reflectance coatings on non-developable surfaces are available from industry sources. Also, some high reflectance films such as those available from 3M of Minnesota, USA, have successfully been molded into non-developable shapes. Such films can also be used for making conical reflectors, such as Cone 7205, since a cone is a developable surface that can be made from flat film.

FIG. 72B is another perspective view of remote phosphor system 7200, showing small crossed dielectric CPCs 7202, reflector cone 7205, refractive lens 7204 and heat-exchanger fins 7210. Also shown is central phosphor aperture 7207, surrounded by diffuse reflector 7206, backed by a highly conductive material connected to fins 7210 for conductive removal of the 5 Watts of waste heat from phosphor patch 7206. This system should be able to produce about 4000 lumens, at a luminance of 40 candela/mm$^2$, exceeded only by arc lamps.

FIG. 73A shows a preferred embodiment of a side-emitting remote phosphor system which has separate short and long-wave output ports. Remote phosphor system 7300 of FIG. 73A uses the principle of FIG. 68A where the acceptance angle of the second optic is larger than the optic coupled to the blue LED. In this embodiment the second optic has a rectangular cross-section while the first has a square section. Remote phosphor system 7300 comprises blue LED 7301 which radiates into first cross-CPC 7313 (or other collimator having a square cross-section) having acceptance angle 7302, which collimates light from blue LED 7301 to tilted mirror 7305 and an optical train with acceptance angle 7308, which concentrates the light onto remote phosphor patch 7309 with highly reflective cover and heat exchanger (both not shown). The portion of said blue light that strikes tilted mirror 7305 is reflected and re-directed to a short-wavelength output port, whose beam output is indicated by arrow 7311. The portion of blue light not striking mirror 7305 passes into said optical train, which is comprised of tilted short-pass filter 7306 (as described by FIG. 11A) and rectangular cross-CPC 7314 (or other concentrator having a rectangular cross-section) shown here in section as a CPC. CPC 7314 has said acceptance angle 7308 larger than cross-CPC 7313 with said acceptance angle 7302. Light emanating from phosphor patch 7309 is collimated by rectangular cross-CPC 7314 toward tilted short-pass filter 7306, which reflects yellow and longer wavelength to long-wavelength output port, whose beam output is indicated by arrow 7312. Rectangular cross-section CPC 7314 has upper straight section 7310*u* and lower straight section 7310*l*, and in the orthogonal direction an expanding section (not shown), such as the geometry of FIG. 68B. The beam angle of short-wave blue light indicated by arrow 7311 can optionally be diffused to match the beam angle for the light from the long-wavelength output port. These blue and yellow beams can be recombined by any of the multi-wavelength methods of FIG. 40 through FIG. 50. One advantage of embodiment 7300 is that the device does not require any air gaps and can be manufactured as a single piece. LED 7301 and phosphor patch 7309 lie approximately on a common axis so that remote phosphor system 7300 is thin in the vertical direction, making it suitable for applications requiring this attribute. Alternatively, the device could be configured with several air-gaps and all optical surfaces being fully multi-coated.

FIG. 73B shows a preferred embodiment of a remote phosphor system which has separate contiguous blue and yellow output ports. Remote phosphor system 7320 of FIG. 73B uses the principle of FIG. 68A where the acceptance angle of the second optic is larger than the optic coupled to the blue LED. In this embodiment the second optic has a rectangular cross-section while the first has a square section. Remote phosphor system 7320 comprises blue LED 7321 which radiates into first cross-CPC 7329 (or other collimator having a square cross-section at each end), which collimates light from blue LED 7321 to tilted mirror 7323 and to diffuser 7324. The portion of the blue light striking diffuser 7324 (thick line) is expanded and exits the short-wavelength output port as beam output 7326. The portion of blue light reflected by mirror 7323 is again reflected by tilted yellow-pass filter 7325 towards the rectangular cross-section concentrator 7330, shown in section as a CPC on the bottom and a straight section on top. Concentrator 7330 has an acceptance angle equal to or greater than the output angle of cross-CPC 7329. Cross-CPC 7330 concentrates the blue light onto remote phosphor patch 7322 with highly reflective cover (not shown) and heat exchanger 7328. Light emanating upward from phosphor patch 7322 is collimated by rectangular cross-CPC 7330 toward tilted long-pass filter 7325, which transmits yellow and longer wavelength, and to flat output port 7331 forming yellow beam 7327. Diagonal prism 7332 is optically coupled to filter 7325 so that the yellow beam 7327 is not deflected when going out of the slanted surface of the filter. Instead it exits the block at normal incidence, thus undeflected. Rectangular cross-section CPC 7330 has a geometry similar to the one shown in FIG. 68B. Diffuser 7324 expands the beam of blue light so that its angular aperture matches that of the yellow light coming out of collimator 7330.

FIG. 73C shows an alternative configuration of the side-emitting embodiment of FIG. 73A of a remote phosphor system which has one common output port. Remote phosphor system 7340 of FIG. 73C uses the principle of FIG. 68A where the acceptance angle of the second optic is larger than the optic coupled to the blue LED. In this embodiment the second optic has a rectangular cross-section while the first has a square section. Remote phosphor system 7340 comprises blue LED 7341 which radiates into first cross-CPC 7347 (or other collimator having a square cross-section at each end) having acceptance angle 7342, which collimates light from blue LED 7341 to tilted mirror 7344 and an optical train with acceptance angle 7343, which concentrates the light onto remote phosphor patch 7342 with highly reflective cover and heat exchanger (both not shown). Mirror 7344 may be doubly curved and/or partially diffusive in such a way that the angular aperture of the blue light that is reflected on it increases from 7342 to 7343. The portion of said blue light that strikes tilted mirror 7344 is re-directed to an output port, whose beam output is indicated by arrow 7345. The portion of blue light not striking mirror 7344 passes into said optical train, which is comprised of tilted short-pass filter 7348 and rectangular cross-CPC 7346 (or other concentrator having a rectangular cross-section at each end) shown here in section as a CPC. CPC 7346 has said acceptance angle 7343 larger than cross-CPC 7347 with said acceptance angle 7342. Light emanating from phosphor patch 7342 is collimated by rectangular cross-CPC 7346 toward tilted short-pass filter 7348, which reflects yellow and longer wavelength to said output port, whose beam output is indicated by arrow 7345. One advantage of embodiment 7340 is that the device does not require any gaps and can be manufactured as a single piece. Alternatively, the device could be configured with gaps at the wider end of CPC 7347 and wider end of CPC 7346 and all optical surfaces at the gaps being either fully multi-coated (in the case of air gaps) or filled with a lower-index of refraction material such as a silicone. This modification would make said output port of a minimal size.

The color temperature of the remote phosphor systems described above is the result of how much blue light is let out by the various filters. Since the filters have an unalterable spectral reflectance function, this color temperature is not readily adjustable. Accordingly, the following five preferred embodiments have means to add a second blue LED so that all the light from the first blue LED is totally absorbed by the phosphor. Then the color temperature goes up with increased output from the second LED, or decreased output of the first LED, which powers the phosphor.

FIG. 74 shows remote phosphor system 7400, comprising first blue LED 7401, first collimator 7402 (shown as a CPC) optically coupled thereto with 10° concentration, second blue LED 7403, second collimator 7404 (shown as a CPC), optically coupled thereto with 15° concentration and oriented orthogonal to the first collimator 7402, inclined shortpass filter 7405 (described by FIG. 11A), concentrator 7406 (shown as a CPC) receiving light rays b1 from first collimator 7402 and concentrating them upon phosphor patch 7407 with highly reflective cover and heat exchanger (both not shown). Under the photostimulation of rays b1, phosphor 7407 radiates yellow light which is collimated into beam y by concentrator 7406 (acting as collimator for rays in the reverse direction). Inclined short-pass filter 7405 reflects said yellow light coincident with rays b2 coming directly from second collimator 7404. Changes in the output of second blue LED 7403, relative to the output of first collimator 7401, cause concomitant changes in the color temperature of the white output of coincident output beams y and b2.

FIG. 75 shows a similar system with the two LEDs and the phosphor patch conveniently in the same plane. Remote phosphor system 7500 comprises first blue LED 7501, optically coupled to first collimator 7502 (shown as a cross-CPC), which collimates its light to 10°, inclined long-pass filter 7503, inclined all-wavelength mirror 7504, concentrator 7505 (shown as a cross-CPC) with 15° acceptance angle, remote phosphor patch 7506 with highly reflective cover and heat exchanger (both not shown), second LED 7507, collimator 7508, which collimates its light to 15°, expander-mixer section 7509, inclined short-pass filter 7510, and five diagonal prism blocks 7511 with narrow gaps 7512, preferably filled with lower-index of refraction silicone. Collimated white output beam 7520 is composed of two coincident beams, yellow from the phosphor and blue from second blue LED 7507. Its color temperature is controlled by the relative outputs of the two blue LEDs.

FIG. 76 shows an alternative embodiment to that of FIG. 75, where the two LEDs and the phosphor patch are in the same plane, but having a central output beam location. Remote phosphor system 7600 comprises first blue LED 7601, optically coupled to first collimator 7610 (shown as a cross-CPC), which collimates its light to 10°, inclined all-wavelength mirrors 7605 and 7606, concentrator 7609 (shown as a cross-CPC) with 15° acceptance angle, remote phosphor patch 7603 with highly reflective cover and heat exchanger (both not shown), second LED 7602, collimator 7612, which collimates its light to 15°, expander-mixer section 7604, inclined short-pass filter 7607, and five diagonal prism blocks 7613 with narrow gaps 7611, preferably filled with lower-index of refraction silicone. Collimated white output beam 7608 is comprised of two coincident beams, yellow from the phosphor and blue from second blue LED 7602. Its color temperature is controlled by the relative outputs of the two blue LEDs.

The embodiment of FIG. 71 illustrates how an array of LEDs and an array of phosphor patches can be combined into a single output device by a logical extension of the principles taught in the embodiment of FIG. 70. Such logical extension can be applied for all the embodiments of the remote phosphor systems taught herein, except those embodiments, such as FIG. 65A and FIG. 65B, which have separate short-wave and long-wave output ports. In these instances an array of LEDs and array of phosphor patches can be accommodated but with the requirement that there are at least two output ports.

To further illustrate how a remote phosphor embodiment with a single output port can be logically extended to include an array of components, we accordingly provide the embodiment shown in FIG. 77. This embodiment is based on the principles taught in FIG. 75. FIG. 77 shows a system with the eight LEDs and four phosphor patches conveniently located on the same plane. Remote phosphor system 7700 comprises first array of blue LEDs 7702, optically coupled to first array of four collimators 7706 (shown as cross-CPCs), which collimates light to 10°, inclined long-pass filter 7709, inclined all-wavelength mirror 7708, array of four concentrators 7707 (shown as a cross-CPCs) with 15° acceptance angle, array of four remote phosphor patches 7701, each with highly reflective cover and heat exchanger (both not shown), second array of four LEDs 7703, array of four collimators 7704, which collimates light to 15°, expander-mixer section 7705, inclined short-pass filter 7710, and five diagonal prism blocks 7711 with narrow gaps 7713, preferably filled with lower-index of refraction material, such as silicone. Collimated white output beam 7712 from a single output port is comprised of two coincident beams, yellow from the phosphor and blue from second array of blue LEDs 7703. Its color temperature is controlled by the relative outputs of the two arrays of blue LEDs.

Other hybrid configurations are also possible for the embodiment of FIG. 77. For example, the array of four remote phosphor patches 7701 can be combined into one phosphor patch, by converting the array of four concentrators 7707 into a single collimator. This principle is illustrated in FIG. 71 by the large CPCs 7160, where each of the two large CPCs of 7160 accepts the light from four blue LEDs.

It would be beneficial to have a remote phosphor system where the color temperature of its white light is easily tunable to include a range of values. Such remote phosphor systems allow their color temperature to be tuned so as to meet a specification either during the manufacturing process or later in the field. Also, these systems could incorporate a feedback loop that measures the current color temperature of the device, and be configured with an electronic means of adjusting this color temperature to a required value or within a range of values. This is advantageous as blue LEDs can change their characteristics over their lifetime. The embodiments of FIGS. 78, 79 and 80 illustrate several ways of accomplishing this goal. FIG. 78 shows how this can be accomplished using a non-recycling remote phosphor system similar to FIG. 73C, whereas the embodiments of FIGS. 79 and 80 use the novel principle of partial recycling and partial non-recycling of yellow light. Such systems potentially can be configured to achieve very high luminance.

FIG. 78 shows remote phosphor system 7800, which allows the color temperature of its emitted white light to be tunable, by adjusting the ratio of the flux output of two blue LEDs. This embodiment is based on the principles taught in FIG. 73C, where in this embodiment blue LED 7341, collimator 7347 and tilted short-pass filter 7348 are replaced respectively by LEDs 7801 and 7802, collimators 7808 and 7807, and tilted short-pass filter 7803. Blue light emitted by blue LED 7801 is partially reflected by mirror/diffuser 7805, which diffuses this light so it matches the angular aperture of the yellow light coming out of collimator 7810. Also shown is an optional mixing section 7809 for homogenizing light received from collimator 7810. Yellow phosphor 7804 receives light from both blue LEDs 7802 and 7801, and therefore the yellow component of the emitted white light depends on the output of both blue LEDs. The blue component of the emitted white light, however, results only from the reflection of blue light from blue LED 7801 at mirror/diffuser 7805. Varying the output of blue LED 7801 respect to that of blue LED 7802 allows a considerable control over the color temperature of emitted white light 7806.

FIG. 79 shows remote phosphor system 7900 that has a tunable color temperature and employs a hybrid system that has partial recycling and partial non-recycling. Remote phosphor system 7900 comprises three blue LEDs 7903 and two phosphor patches 7901 and 7902, all five of which are co-planar. Collimator 7917 which receives blue light from central blue LED 7903 is configured so that its acceptance angle is equal to the acceptance angles of concentrators 7914 and 7912. In this embodiment this acceptance angle is set to 15° and the profiles of 7917, 7914 and 7912 are shown as CPCs. Embodiment 7900 further comprises right triangular short-pass filter 7908, all-wavelength folding mirrors 7904 and 7905, tilted long-pass filters 7906 and 7907, gaps 7910 fully multi-coated (in the case of air gaps) or filled with a lower-index of refraction material, and output port 7911. Blue light from central LED 7903 is collimated by collimator 7917, which directs it to mixer-section 7916, which can also be configured as an expander-mixer section similar to section 7509 of FIG. 75. Blue light from mixer-section 7916 is transmitted through a low-index of refraction gap (shown as a dotted line) and triangular short-pass filter 7908, whereupon it exits output port 7911. Light from right and left blue LEDs 7903 is collimated respectively by collimators 7913 and 7915 and long-pass filters 7907 and 7906, whereupon each blue beam is directed by all-wavelength folding mirrors 7905 and 7904 into an optical train which has an exit port having a remote phosphor patch. Each phosphor patch will have a highly reflective cover and typically a heat-management means (both not shown). Each half of 7900 operates in this regard the same as the embodiment of FIG. 75, as phosphor converted light is collimated and redirected to either all-wavelength folding mirrors 7905 or 7904, which in turn reflects in a horizontal direction. In the embodiment of FIG. 75 all of this horizontal light is directed to the output port. In system 7900 only the rays which strike triangular short-pass filter 7908 exit the output port. The non-exiting horizontally directed light, travels to the opposing half of the device, where it is reflected by an all-wavelength mirror, eventually to be concentrated onto an opposing phosphor patch. This yellow and longer wavelength light that strikes phosphor patches 7901 and 7902 will be scattered, collimated and redirected back toward triangular short-pass filter 7908, whereupon a portion of it will either exit to the output port or be recycled again.

The fraction of light that is intercepted by triangular short-pass filter 7908 is adjustable by choosing appropriate shape and acceptance angles for collimator 7917 and expander-mixer 7916. For example, if collimator 7917 and expander-mixer 7916 is replaced with collimator 7508 and expander-mixer 7509, then the fraction of light intercepted on each pass by short-pass filter 7908 will be 50%. The color temperature of system 7900 can be adjusted by varying the flux output of central blue LED of 7903, relative to the flux of the two blue LEDs that are designated for phosphor conversion.

In order to achieve maximum efficiency for system 7900, it is important that the optical transfer efficiency of each component is high especially in the recycling mode. This can be achieved in square-section collimator/concentrators by using more ideal optics than cross-CPCs, which are typically made of a material having a constant index of refraction. There are several approaches known to those skilled in the art of nonimaging optics that meet this criterion. One approach is to introduce ripples in the walls of cross-CPCs, and arriving at a solution or solutions by varying the shape of these ripples using an optimization algorithm. Another approach is to design the optics assuming it does not have a constant index of refraction. Variable index of refraction solutions are given in Chapter 6 of the book, *Nonimaging Optics* by R. Winston, J. C. Miñano and P. Benitez and published by Elsevier (2005), which is imported herein by reference in its entirety. In both these approaches each end of the optic is a square, whereas the intermediate sections may or may not be a square. Optical collimators and concentrators based on these and other approaches known to those skilled in art of nonimaging optics can also be used for any of the embodiments described herein.

FIG. 80 shows remote system 8000 which is an alternative embodiment of the one of FIG. 79 where the all-wavelength folding mirrors 7904 and 7905 are not required. This embodiment has the further advantage over the one of FIG. 79 that the number of components can be smaller. Remote phosphor system 8000 comprises, blue LEDs 8012, square-section collimators 8010, both on the left side, adjustable blue LED 8001 with collimator 8004, phosphor patches 8003. (with highly reflective cover and heat sinks not shown) and associated square-section concentrators 8005, optional mixing chamber 8006, all-wavelength mirrors 8008, tilted short-pass filter 8002, output port 8007 and gaps (shown as dotted lines). Flux of output port 8007 is represented by flux arrow 8011, which is the combined output of adjustable blue LED 8001 and reflected yellow and longer wavelengths from short-pass filter 8002. Light reflected by short-pass filter 8002 not exiting output port 8007 is reflected by all-wavelength mirrors 8008 and back to short-pass filter 8002, which in turn reflects it to the optical train of optional mixing chamber 8006, concentrators 8005, and finally back to phosphor patches 8003. Phosphor patches 8003 receive this non-exiting light, scattering and recycling it.

The embodiment of FIG. 80 is configured with two blue LEDs 8012 but this could easily be expanded by adding more paired elements 8010 and 8005 to the vertical stack. Also blue LED 8001 could also be configured as a larger array of LEDs by adding more LEDs and collimators 8004, by application of the principles of the embodiment of FIG. 77.

FIG. 77 shows a preferred embodiment with multiple LEDs and phosphor patches, enough to make it easy to envisage preferred embodiments with even greater numbers of LEDs and phosphor patches, which are difficult to illustrate clearly, as FIG. 72A shows. It is possible for these phosphor patches be green-emitting instead of the conventional yellow type, and some red LEDs added, as discussed regarding FIG. 10E. It is also possible that some blue LEDs stimulate the green phosphor while others contribute directly to the output beam. The red LEDs can either be located in second array of LEDs 7703 of FIG. 77 in which case short-pass filter 7710 directly above the red LEDs, must be changed to a long-pass filter to allow the red light to be transmitted while being reflective to the wavelengths of the green phosphor. Alternatively the red LEDs can be located within first array of LEDs 7701. This latter approach does not require a filter change to the system.

The green phosphor is advantageous over the green LEDs used in, for example, the preferred embodiments of FIG. 40 through FIG. 51, both because of its superior efficacy (green LEDs presently have much lower external quantum efficiency than blue LEDs, so much so that the green phosphor's conversion losses are far less) and because it has a wider wavelength range. This results in both better color rendering and less color separation by the eye's longitudinal chromatic aberration, which tends to cause noticeable artifacts in conventional narrowband RGB LEDs for such imaging applications as projection television and backlights. Such wavelength spreading is also possible with the blue and red LEDs in such an approach, by using both 450 nm and 472 nm blue LEDs, and several of the many red wavelengths available, such as 610, 625, and 640 nm. Such a multiwavelength light source can be run in color-sequential mode, with the red, green, and blue outputs, each powered separately for a third of the television frame-time to illuminate a monochrome spatial light modulator, such as an LCD. These have much higher throughput (30-50%) than conventional white-light color LCDs (3-5%), which have inefficient color filters that waste most of the input white light.

For luminance boosting, the multi-LED approach of FIG. 77 can be applied to the recycling configurations of FIG. 79 and FIG. 80, which show only single LEDs. Vigorous cooling of the LEDs enables them to be overdriven for maximal luminosity, while highly efficient recycling enables even smaller apertures than in FIG. 79 to be used without excessive sacrifice of overall luminosity. This approach enables the luminance levels of arc lamps (300 cd/mm$^2$ mean) to be achieved, without their cost, bulk, fragility, high temperatures, and short life. Arc lamps also require mixing and condensing optics (of mediocre optical efficiency at best) to overcome their nonuniform luminance and lack of a sharp border, leading to much lower deliverable luminance. The present invention, however, delivers maximal luminance in a narrow-angle (±15°) beam with high spatial uniformity and a very sharp border, with optical efficiency no worse than arc lamps. Moreover, such a solid-state lighting system offers both tunable output chromaticity for general lighting and color-sequential illumination for projection television, without the disadvantageous narrowband spectra of RGB LED systems of the prior art.

The description herein describes both individual optical elements and several embodiments that combine them as building blocks. One common theme of many of these elements and their combinations is preservation of source luminance through etendue preservation, using novel applications of the principles of non-imaging optics.

The preceding description of the presently contemplated best mode of practicing the optical transformer described herein is not to be taken in a limiting sense, but is made merely for the purpose of describing the general principles of the invention. The scope of the invention should be determined by reference to the claims.

It will be appreciated by those skilled in the art, in view of these teachings, that alternative embodiments may be implemented without deviating from the spirit or scope of the invention. This invention is to be limited only by the following claims, which include all such embodiments and modifications when viewed in conjunction with the above specification and accompanying drawings.

What is claimed is:

1. A multiwavelength light source comprising:
   at least one light source that emits light at a dominant wavelength;
   an optical filter that transmits light of prescribed wavelengths and reflects other wavelengths;
   an input collimating optical system that directs light from said at least one light source through said optical filter;
   an output optical system coupled to receive said light throughput from said optical filter, said output optical system configured as a concentrator and having an exit port on the opposite end;
   a phosphor patch formed on said exit port, said phosphor having a composition that luminesces, emitting light of wavelengths reflected by said filter in response to excitation from light generated by said at least one light source; and
   said phosphor patch having two surfaces, an inside surface receiving light from said output optical system and an opposing outside surface,
   wherein said phosphor patch is transmissive to light from said at least one light source and so that said outside surface of said phosphor patch is operable as an emitter of said light source, and
   wherein said output optical system has a shape that approximately collimates backscattered luminescence from said phosphor patch by directing said backscattered luminescence to said optical filter from which it is reflected back to said exit port.

2. The multiwavelength source of claim 1, wherein said at least one light source comprises at least one light emitting diode.

3. The multiwavelength source of claim 1 wherein said phosphor patch comprises a composite material comprising a phosphor layer deposited on a suitable transparent substrate; and
   said composite material is optically coupled to said exit port of said optical output system.

4. The multiwavelength source of claim 3 wherein said composite material is cut from a large composite sheet.

5. The multiwavelength light source of claim 1, wherein said phosphor patch has a thin edge and wherein the edge and part of said outside surface of said phosphor patch are masked by a reflecting wall with reflectance above 90%.

6. The multiwavelength light source of claim 5 wherein said reflecting wall is operable for increasing the luminance of the light source by said masking of said outside surface causing recycling of the masked light into the remaining clear aperture.

7. The multiwavelength light source of claim 5 wherein said output face over said phosphor patch has an irregularly shaped border.

8. The multiwavelength light source of claim 7 wherein said irregularly shaped border is in the shape of an automotive headlamp beam pattern.

9. The multiwavelength light source of claim 5 wherein said phosphor patch is a composite material comprising a phosphor layer deposited on a suitable transparent substrate; and said composite material is optically coupled to said exit port of said optical output system.

10. The multiwavelength light source of claim 9 wherein said composite material is cut from a large composite sheet.

11. The multiwavelength light source of claim 1 wherein said phosphor patch is provided with a heat sink.

12. The multiwavelength light source of claim 1, wherein said output concentrator is a nonimaging output concentrator and is circularly symmetric, with said collective reception of light output from said input collimators having an acceptance angle equal to the extreme diagonal of said light output.

13. The multiwavelength light source of claim 1,
    wherein said output optical system comprises a conicoid reflector wilt high specular reflectance on its interior surface and a plano-convex lens or lenslet array, with said plano face accepting light from said filter.

14. The multiwavelength light source of claim 13 where said conicoid reflector is provided with heat sink.

15. The multiwavelength light source of claim 1 wherein:
    said at least one light source comprises at least one LED that emits blue light;
    said optical filter comprises a shortpass blue filter; and
    said phosphor patch having a composition that emits longer-wavelength luminescence in response to said excitation by said blue light generated by said LEDs, the spectral distribution of said luminescence metamerically combining with said blue light to provide an approximately white light source.

16. A multiwavelength light source comprising:
a plurality of LEDs that emit light at and about a dominant wavelength;
a plurality of nonimaging input collimators comprising a dielectric material, each input collimator connected respectively to one of said plurality of LEDs;
a nonimaging output concentrator, said output concentrator coupled to collectively receive the light output from each of said input collimators on one end, said output concentrator having an exit port on the opposite end;
a shortpass filter at the interface between said input collimators and said output concentrator, said shortpass filter transmitting light of wavelengths less than a prescribed wavelength and reflecting light of wavelengths greater than a prescribed wavelength; and
a phosphor patch formed on said exit port, the material of said phosphor patch having a composition that luminesces in response to excitation from light generated by said LEDs,
wherein said phosphor patch has an inside surface receiving light from said output optical system and an opposing outside surface, and
wherein said phosphor patch is also partially transmissive to light from said LEDs, so that said outside surface of said phosphor patch comprises the emitter of said light source.

17. The multiwavelength light source of claim 16 wherein said phosphor patch has non-uniform thickness.

18. The multiwavelength light source of claim 16 wherein the edge and part of said emitter surface of said phosphor patch are masked by a reflecting wall with reflectance above 90%, forming an emitting exit face smaller than said emitter surface of said phosphor patch.

19. The multiwavelength light source of claim 18 wherein said exit face over said phosphor patch has an irregularly shaped border.

20. The multiwavelength light source of claim 19 wherein said irregularly shaped border is in the shape of an automotive headlamp beam pattern.

21. The multiwavelength light source of claim 16 wherein said phosphor patch comprises a composite material comprised of a phosphor material deposited on a suitable transparent substrate.

22. The multiwavelength source of claim 21 wherein said composite material is cut from a large composite sheet.

23. The multiwavelength light source of claim 16 wherein said phosphor patch is provided with a heat sink.

24. The multiwavelength light source of claim 16 wherein said phosphor patch has non-uniform thickness.

25. The multiwavelength light source of claim 16, wherein said nonimaging output concentrator is circularly symmetric, with said collective reception of light output from said input collimators having an acceptance angle equal to the extreme angular diagonal of said light output.

26. The multiwavelength light source of claim 16, wherein said output optical system comprises a conicoid reflector with high specular reflectance on its interior surface and a plano-convex lens or lenslet array, with said plano face accepting light from said filter.

27. The multiwavelength light source of claim 16 wherein:
said LEDs emit blue light;
said shortpass filter comprises a blue-pass filter; and
said material of said phosphor patch having a composition that emits approximately yellow luminescence in response to said excitation by said blue light generated by said LEDs, thereby providing an approximately white light source.

28. A multiwavelength light source comprising:
at least one LED that emits light at a dominant wavelength;
an input optical system coupled to said at least one LED and collimating its light;
one or more mirrors that direct a first part of the collimated light from the input optical system to an output port, and directs a second part of the collimated light from the input optical system to an intermediate optical system, said intermediate optical system configured as a concentrator and having an exit port on the opposite end; and
a phosphor patch formed on said exit port, the material of said phosphor patch having a composition that luminesces in response to excitation from light generated by said LEDs, light emitted by said phosphor patch being returned back through and out of said intermediate optical system, to an output port.

29. The multiwavelength light source of claim 28, wherein said phosphor patch has a thin edge and two surfaces, an inside surface receiving light from said intermediate optical system and an opposing outside surface;
said phosphor patch also being transmissive to light from said LED; and
a highly reflective surface covering said outside surface of said phosphor patch, causing light that would have been emitted by said outside surface of said phosphor patch to instead be returned along with light emitted by said inside surface back through and out of said intermediate optical system.

30. The multiwavelength light source of claim 29 wherein said reflective surface is provided with a heat sink.

31. The multiwavelength light source of claim 28,
wherein said one or more mirrors comprise one or more inclined optical filters that reflect collimated light from said input optical system of wavelengths less than a prescribed wavelength and transmit longer wavelengths to an output port, said prescribed wavelength lying within the spectrum of said LED so that said filters act as a spectral beamsplitter;
wherein said intermediate optical system returns said emitted light to said one or more optical filters; and
further comprising one or more all-wavelength mirrors that redirect emitted light received from said one or more optical filters to said output port.

32. The multiwavelength light source of claim 28 wherein light is output as two or more spatially separated beams comprising two or more spectral bands.

33. The multiwavelength light source of claim 28, wherein said mirrors comprise:
one or more inclined optical filters that partially transmits light of wavelengths less than a prescribed wavelength to said output port and partially reflects shorter wavelengths and transmits longer wavelengths, said partial transmission and reflection wavelengths lying within the spectrum of said LED so that said filter acts as a spectral beamsplitter and
one or more inclined optical short-pass filters that transmits light of wavelengths less than a prescribed wavelength and reflects light of longer wavelengths, and wherein said emitted light is returned to one or more said inclined short-pass filters that reflect said emitted light to said output port.

34. The multiwavelength light source of claim 33 wherein said intermediate optical system also comprises at least one of a folding mirror and one or more mirrors for redirecting shorter wavelength light not reflected by said short-pass filters back to said phosphor patch.

35. The multiwavelength light source of claim 28 wherein said LED and said phosphor patch lie approximately on the same plane.

36. The multiwavelength light source of claim 28, wherein:
said one or more mirrors comprise one or more inclined optical filters that partially transmit and partially reflect light shorter than a prescribed wavelength;
said prescribed wavelength lies within the spectrum of said LED so that said filter acts as a spectral beamsplitter;
said filter is transmissive to longer wavelengths than said prescribed wavelength and allowing said partially transmitted light to be directed to a short-wavelength said output port;
said intermediate optical system comprises one or more inclined long-pass filters;
said emitted light is returned to said long-pass filters; and
said long-pass filters are transmissive to said emitted light and directing said light to a long-wavelength output port.

37. The multiwavelength light source of claim 28, wherein:
said one or more mirrors comprise one or more inclined optical mirrors, said mirrors reflecting said light to one or more spectrally beam-splitting filters, said filters partially transmitting and partially reflecting said light shorter than a prescribed wavelength;
said prescribed wavelength lies within the spectrum of said LED so that said filter acts as a spectral beam splitter within said spectrum;
said filters are transmissive to longer wavelengths than said prescribed wavelength and allowing said partially reflected light to be directed to an output port;
said source further comprises one or more inclined optical short-pass filters that transmits light of wavelengths less than a prescribed wavelength and reflects light of longer wavelengths,
said intermediate optical system comprises one or more inclined mirrors;
light emitted by said phosphor patch is returned to said short-pass filters; and
said short-pass filters are reflective to said emitted light and directing said light to said output port.

38. The multiwavelength light source of claim 28 wherein said input collimating system and said intermediate optical system lie on a common axis.

39. The multiwavelength light source of claim 28 wherein said output port can be rotated about an axis.

40. The multiwavelength source of claim 39, wherein said first part of said light and said emitted light enter said rotatable output port along said axis of rotation.

41. The multiwavelength light source of claim 28, comprising:
wherein said one or more mirrors comprise one or more inclined optical mirrors that reflect a fraction of said light to one or more long-pass filters;
said long-pass filters reflecting light shorter than a prescribed wavelength to said outport port;

wherein said prescribed wavelength lies within the spectrum of said LED and said filters are transmissive to longer wavelengths than said prescribed wavelength;
said intermediate optical system coupled to receive the remainder of the light reflected from said inclined optical mirrors;
said intermediate optical system comprising one or more long-pass filters that reflect said remainder of light from said inclined mirrors to said exit port;
light emitted by said phosphor patch being returned to said long-pass filters;
wherein said long-pass filters are transmissive to said emitted light and direct said emitted light to said output port.

42. The multiwavelength light source of claim 28, wherein said input collimating optical system has an acceptance angle smaller than said intermediate optical system.

43. The multiwavelength light source of claim 28 wherein one or more diffusers widen the beam divergence angle of said first part of said light.

44. The multiwavelength light source of claim 28 wherein at least one of said input optical system and said intermediate optical system has one or more said concentrators whose cross-section is rectangular.

45. The multiwavelength light source of claim 28,
wherein said one or more mirrors comprise one or more filters that partially transmit and partially reflect said light shorter than a prescribed wavelength; wherein
said prescribed wavelength lies within the spectrum of said LED so that said filters act as a spectral beamsplitter; and
said spectral beamsplitters being reflective to longer wavelengths than said prescribed wavelength and angled so as to direct said partially transmitted light to one or more diffusers, said diffusers widening the beam divergence angle of said partially transmitted light, said beam directed to one or more short-pass filters;
wherein said short-pass filters are transmissive and direct said light to an output port;
said intermediate optical system comprising one or more inclined long-pass filters;
light emitted by said phosphor patch being returned to said long-pass filters;
wherein said long-pass filters are transmissive to said emitted light and direct said emitted light to one or more secondary folding mirrors;
wherein said secondary folding mirrors redirect emitted light to said short-pass filters, said short-pass filters reflecting said emitted light to said output port.

46. The multiwavelength source of claim 28 wherein said LED is an array of LEDs and said exit port is an array of exit ports and said phosphor patch is an array of phosphor patches.

47. The multiwavelength light source of claim 28,
wherein said one or more mirrors comprises one or more optical mirrors that redirects a portion of said collimated light to said output port;
said intermediate optical system comprising one or more inclined short-pass filters;
said phosphor patch being transmissive to light from said LED;
light emitted by said phosphor patch being returned to said short-pass filters;
wherein said short-pass filters are reflective to said emitted light and directing said light to said output port.

48. The multiwavelength light source of claim 47 wherein said output port includes both a short-wave output port and a long-wave output port.

49. The multiwavelength light source of claim 28 wherein said LED and said phosphor patch lie on approximately the same axis.

50. The multiwavelength light source of claim 28,
wherein said input collimating optical system directs a fraction of light from said at least one LED through a short-wave output port;
wherein said intermediate optical system comprises one or more inclined long-pass filters for redirecting reflected light from said one or more mirrors;
light emitted by said phosphor patch being returned to said long-pass filters which transmits said emitted light to a long-wave output port contiguous with said short-wave output port.

51. The multiwavelength light source of claim 28 wherein said LED and said phosphor patch is provided with a heat sink.

52. The multiwavelength light source of claim 28, further comprising:
a second at least one LED that emits light at a dominant wavelength; and
a second input optical system directing light from said second at least one LED and collimating said light through one or more said mirrors;
wherein said one or more mirrors transmits collimated light from said second LED to said intermediate optical system.

53. The multiwavelength light source of claim 52, wherein the proportion of said first part of said light to said second part of said light from said at least one LED is different from the proportion of said first part of said light to said second part of said light from said second at least one LED.

54. The multiwavelength light source of claim 52 operable as a variable color temperature source.

55. The multiwavelength source of claim 52 wherein said first LEDs is an array of LEDs, said second LEDs is an array of LEDs, said exit port is an array of exit ports and said phosphor patch is an array of phosphor patches.

56. The multiwavelength light source of claim 55 wherein:
said array of phosphor patches comprise one or more green phosphor patches;
said first or second array of LEDs comprises one or more red LEDs; and
for each red LED in said first array of LEDs, said mirrors receiving light from said red LEDs are long-pass filters that transmit red light from said one or more red LEDs and reflect light from said one or more phosphor patches of green phosphor to said output port.

57. The multiwavelength light source of claim 52 wherein said first and second LEDs and said phosphor patch is provided with a heat sink.

58. The multiwavelength light source of claim 52,
wherein said one or more mirrors comprises one or more inclined short-pass optical filters that transmits said collimated light for wavelengths less than a prescribed wavelength to said output port, said prescribed wavelength lying within the spectrum of said LED;
wherein said one or more inclined short-pass optical filters transmits collimated light from said second LED of wavelengths less than a prescribed wavelength to said intermediate optical system, said prescribed wavelength lying within the spectrum of said second at least one LED; and
wherein light emitted by said phosphor patch is returned to one or more said inclined short-pass filters that are reflective to said emitted light and that direct said emitted light to said output port.

59. The multiwavelength light source of claim 52, wherein
said one or more mirrors comprises one or more inclined short-pass optical filters that transmits said collimated light for wavelengths less than a prescribed wavelength to said output port, said prescribed wavelength lying within the spectrum of said LED;
said second input optical system collimating said light to one or more inclined long-pass optical filters;
said one or more inclined long-pass optical filters reflecting collimated light of wavelengths less than a prescribed wavelength lying within the spectrum of said second at least one LED to one or more all-wavelength folding mirrors;
said all-wavelength folding mirror reflecting said collimated light to said intermediate optical system;
light emitted by said phosphor patch being returned to one or more of said all-wavelength folding mirrors that direct said emitted light to said inclined short-pass filters which reflects said emitted light to a said output port.

60. The multiwavelength source of claim 52, wherein
said one or more mirrors comprises one or more inclined short-pass optical filters that transmits said collimated light for wavelengths less than a prescribed wavelength to said output port, said prescribed wavelength lying within the spectrum of said LED;
said second input optical system collimating said light from said second at least one LED to one or more inclined all-wavelength folding mirrors;
said one or more inclined all-wavelength folding mirrors reflecting collimated light of wavelengths less than a prescribed wavelength lying within the spectrum of said second at least one LED to one or more further all-wavelength folding mirrors;
said further all-wavelength folding mirrors reflecting said collimated light to said intermediate optical system;
light emitted by said phosphor patch being returned to one or more of said further all-wavelength folding mirrors that direct said emitted light to said inclined short-pass filters which reflects said emitted light to a said output port.

61. The multiwavelength light source of claim 28 configured for partial recycling and partial non-recycling.

62. The multiwavelength light source of claim 61 wherein said inclined short-pass optical filter is triangular in cross-section.

63. The multiwavelength light source of claim 28, wherein said one or more mirrors comprises a mirror positioned to reflect part of said collimated light and to be missed by another part of said collimated light.

* * * * *